(12) United States Patent
Komoto et al.

(10) Patent No.: US 11,901,391 B2
(45) Date of Patent: Feb. 13, 2024

(54) IMAGING DEVICE

(71) Applicant: SONY SEMICONDUCTOR SOLUTIONS CORPORATION, Kanagawa (JP)

(72) Inventors: Takeyoshi Komoto, Kanagawa (JP); Masahiko Nakamizo, Kanagawa (JP); Toshiaki Ono, Kanagawa (JP); Tomonori Yamashita, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 219 days.

(21) Appl. No.: 17/620,258

(22) PCT Filed: Jun. 26, 2020

(86) PCT No.: PCT/JP2020/025285
§ 371 (c)(1),
(2) Date: Dec. 17, 2021

(87) PCT Pub. No.: WO2020/262629
PCT Pub. Date: Dec. 30, 2020

(65) Prior Publication Data
US 2022/0367555 A1    Nov. 17, 2022

(30) Foreign Application Priority Data
Jun. 26, 2019   (JP) .................................. 2019-119099

(51) Int. Cl.
*H01L 27/146*   (2006.01)
*H01L 23/522*   (2006.01)
(Continued)

(52) U.S. Cl.
CPC .... *H01L 27/14636* (2013.01); *H01L 23/5225* (2013.01); *H01L 27/14634* (2013.01);
(Continued)

(58) Field of Classification Search
CPC .... H04N 25/79; H04N 25/75; H01L 23/5225; H01L 27/14612; H01L 27/1469;
(Continued)

(56) References Cited

U.S. PATENT DOCUMENTS 7,965,329 B2 * 6/2011 McCarten ......... H01L 27/14636
                                                    348/308
8,421,200 B2 * 4/2013 Tajika ............... H01L 21/76898
                                                    257/532

(Continued)

FOREIGN PATENT DOCUMENTS

JP    2006-019455    1/2006
JP    2007-294652    11/2007
(Continued)

OTHER PUBLICATIONS

International Search Report prepared by the Japan Patent Office dated Aug. 28, 2020, for International Application No. PCT/JP2020/025285, 3 pgs.

*Primary Examiner* — Pritham D Prabhakher
(74) *Attorney, Agent, or Firm* — SHERIDAN ROSS P.C.

(57) ABSTRACT

An imaging device of an embodiment has a first substrate, a second substrate, a wire, and a trench. The first substrate has a pixel having a photodiode and a floating diffusion that holds a charge converted by the photodiode. The second substrate has a pixel circuit that reads a pixel signal based on the charge held in the floating diffusion in the pixel, and is stacked on the first substrate. The wire penetrates the first substrate and the second substrate in a stacking direction, and electrically connects the floating diffusion in the first substrate to an amplification transistor in the pixel circuit of the second substrate. The trench is formed at least in the second substrate, runs in parallel with the wire, and has a (Continued)

depth equal to or greater than the thickness of a semiconductor layer in the second substrate.

17 Claims, 72 Drawing Sheets

(51) Int. Cl.
  *H04N 25/75* (2023.01)
  *H04N 25/79* (2023.01)
(52) U.S. Cl.
  CPC ....... *H01L 27/14645* (2013.01); *H04N 25/75* (2023.01); *H04N 25/79* (2023.01)
(58) Field of Classification Search
  CPC ......... H01L 27/14641; H01L 27/14645; H01L 27/14636; H01L 27/14634
  USPC ........................................................ 348/301
  See application file for complete search history.

(56) References Cited

U.S. PATENT DOCUMENTS

| | | | | |
|---|---|---|---|---|
| 8,482,645 B2* | 7/2013 | Takatsuka | ............. | H04N 25/60 348/241 |
| 8,872,097 B2* | 10/2014 | Sanson | ............. | H01L 27/14634 250/208.2 |
| 9,887,195 B1 | 2/2018 | Drab et al. | | |
| 9,992,431 B2* | 6/2018 | Takatsuka | ............. | H04N 25/60 |
| 10,136,085 B2* | 11/2018 | Takatsuka | ............. | H04N 25/60 |
| 10,396,116 B2* | 8/2019 | Tanaka | ............. | H04N 25/79 |
| 10,438,892 B2* | 10/2019 | Morita | ............. | H01L 23/53209 |
| 11,165,979 B2* | 11/2021 | Nishikawa | ............. | H04N 23/54 |
| 2006/0001174 A1 | 1/2006 | Matsui | | |
| 2007/0246816 A1 | 10/2007 | Tajika et al. | | |
| 2009/0322921 A1* | 12/2009 | Ishimoto | ............. | H04N 25/778 348/301 |
| 2010/0060764 A1 | 3/2010 | Mccarten | | |
| 2011/0242389 A1* | 10/2011 | Takatsuka | ............. | H04N 25/60 348/311 |
| 2012/0056252 A1* | 3/2012 | Aoki | ............. | H01L 27/14612 257/292 |
| 2012/0292490 A1 | 11/2012 | Sanson | | |
| 2015/0076327 A1* | 3/2015 | Amikawa | ............. | H04N 25/766 257/231 |
| 2017/0019618 A1* | 1/2017 | Koga | ............. | H01L 27/14636 |
| 2017/0280080 A1* | 9/2017 | Machida | ............. | H04N 25/57 |
| 2017/0324918 A1* | 11/2017 | Takatsuka | ............. | H04N 25/76 |
| 2018/0115727 A1* | 4/2018 | Yanagita | ............. | H01L 27/14607 |
| 2018/0218982 A1 | 8/2018 | Morita | | |
| 2018/0240834 A1 | 8/2018 | Tanaka | | |
| 2018/0255257 A1* | 9/2018 | Takatsuka | ............. | H04N 25/60 |
| 2018/0352181 A1* | 12/2018 | Nishikawa | ............. | H04N 25/75 |
| 2019/0052822 A1* | 2/2019 | Takatsuka | ............. | H04N 25/75 |

FOREIGN PATENT DOCUMENTS

| | | |
|---|---|---|
| JP | 2010-245506 | 10/2010 |
| JP | 2013-008952 | 1/2013 |
| JP | 2016-181884 | 10/2016 |
| JP | 2018-125396 | 8/2018 |
| JP | 2018-148567 | 9/2018 |
| WO | WO 2015/016140 | 2/2015 |
| WO | WO 2018/075099 | 4/2018 |

* cited by examiner

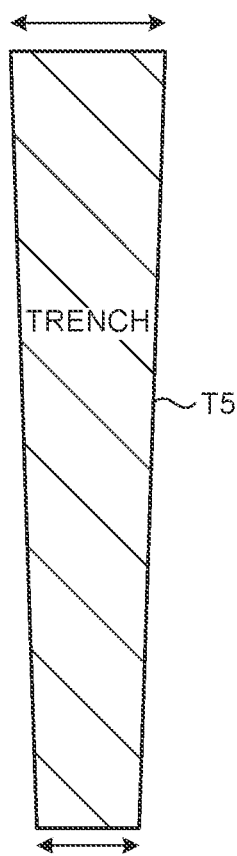

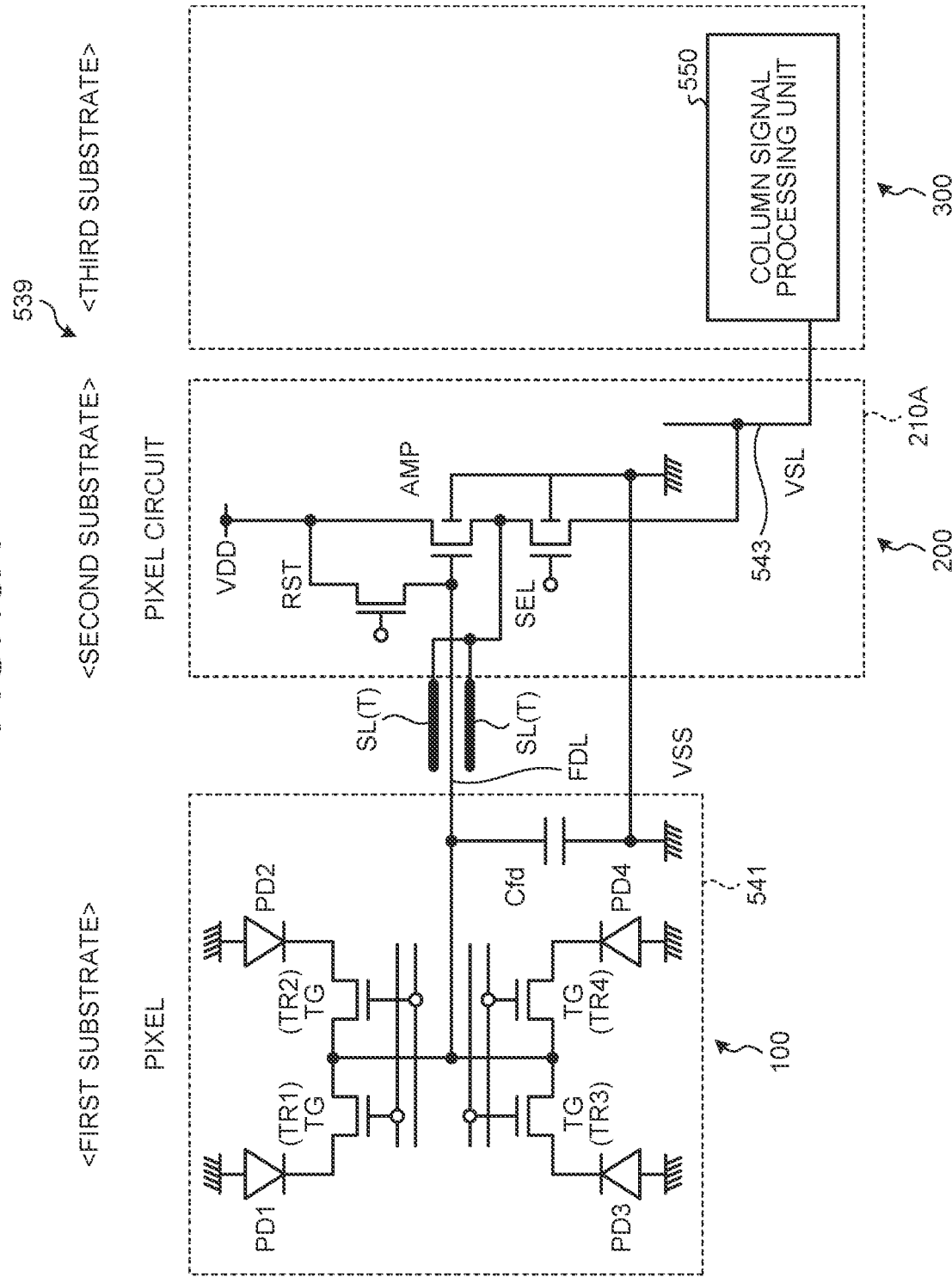

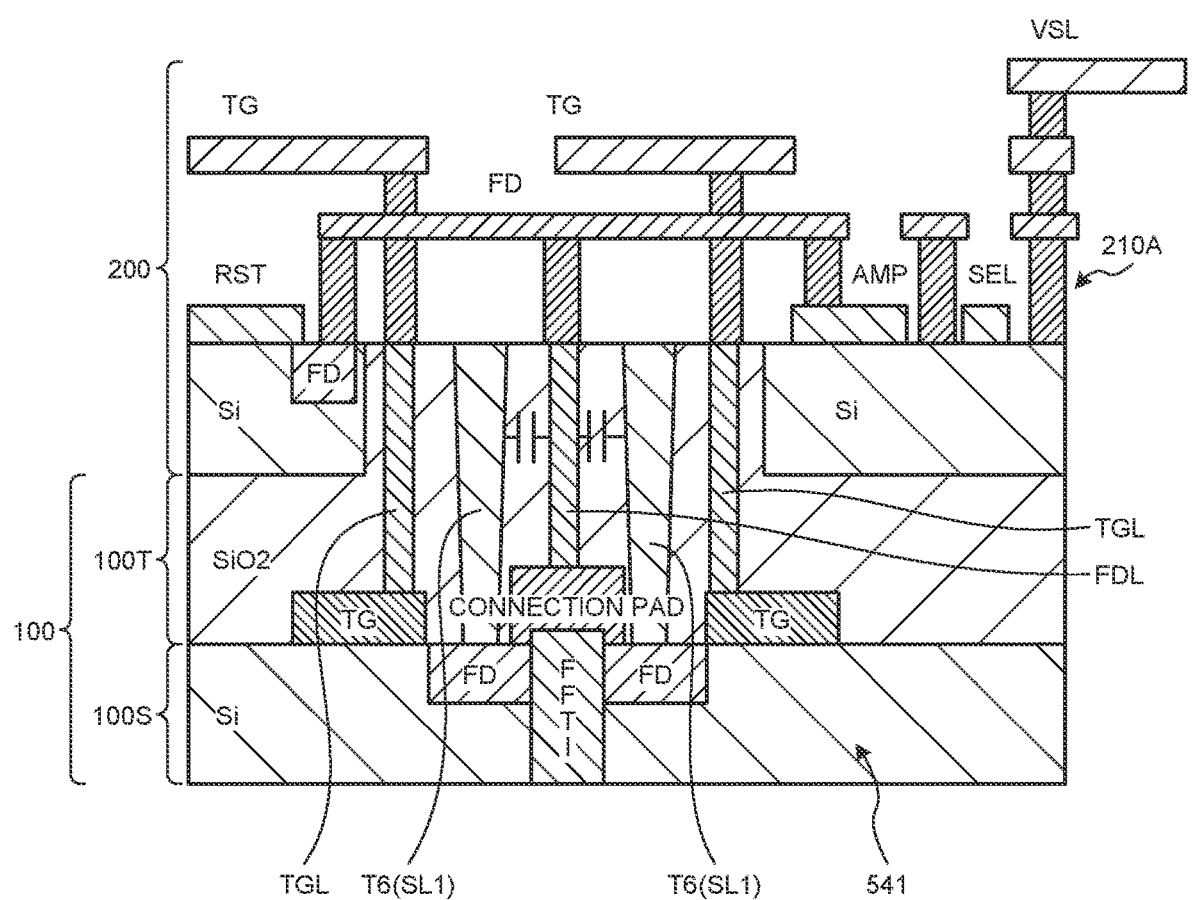

IMAGING DEVICE

CROSS REFERENCE TO RELATED APPLICATIONS

This application is a national stage application under 35 U.S.C. 371 and claims the benefit of PCT Application No. PCT/JP2020/025285 having an international filing date of 26 Jun. 2020, which designated the United States, which PCT application claimed the benefit of Japanese Patent Application No. 2019-119099 filed 26 Jun. 2019, the entire disclosures of each of which are incorporated herein by reference.

FIELD

The present disclosure relates to an imaging device.

BACKGROUND

In the related art, miniaturization of an area per pixel of an imaging device having a two-dimensional structure has been realized by introduction of fine processing and improvement of mounting density. In recent years, an imaging device having a three-dimensional structure has been developed in order to realize further miniaturization of the imaging device and densification of pixels. In the imaging device having a three-dimensional structure, for example, a semiconductor substrate having a plurality of sensor pixels and a semiconductor substrate having a signal processing circuit for processing a signal obtained by each sensor pixel are stacked on each other.

CITATION LIST

Patent Literature

Patent Literature 1: JP 2010-245506 A

SUMMARY

Technical Problem

By the way, in an imaging device having a three-dimensional structure, in a case where three layers of semiconductor chips are stacked, it is not possible to bond all the semiconductor substrates between the surfaces on the front surface side. In a case where three layers of semiconductor substrates are carelessly stacked, there is a possibility that a chip size is increased or miniaturization of an area per pixel is hindered due to a structure in which the semiconductor substrates are electrically connected to each other. Therefore, it is desirable to provide an imaging device having a three-layer structure which has the same chip size as before and does not hinder miniaturization of an area per pixel.

Furthermore, without being limited to the three-layer structure, the imaging device connects a floating diffusion in a pixel and a gate of an amplification transistor in a pixel circuit with a connection via as an FD wire. In the fine pixel, the region area of the connection via of the FD wire is about 45%. As a result, since the effective region of the pixel circuit is reduced, the arrangement area of the amplification transistor cannot be expanded.

Solution to Problem

To solve the problems described above, an imaging device of an embodiment has a first substrate, a second substrate, a wire, and a trench. The first substrate has a pixel having a photodiode and a floating diffusion that holds a charge converted by the photodiode. The second substrate has a pixel circuit that reads a pixel signal based on the charge held in the floating diffusion in the pixel, and is stacked on the first substrate. The wire penetrates the first substrate and the second substrate in a stacking direction, and electrically connects the floating diffusion in the first substrate to an amplification transistor in the pixel circuit of the second substrate. The trench is formed at least in the second substrate, runs in parallel with the wire, and has a depth equal to or greater than the thickness of a semiconductor layer in the second substrate.

Advantageous Effects of Invention

By reducing a parasitic capacitance of the wire, a charge-voltage conversion efficiency can be improved.

BRIEF DESCRIPTION OF DRAWINGS

FIG. 37 is a schematic plan view illustrating another example of a pixel isolation portion illustrated in FIG. 7A and the like.

FIG. 47 is a schematic view illustrating an example of a schematic sectional shape of the trench T5.

FIG. 48A is an equivalent circuit diagram illustrating an example of a configuration of a pixel sharing unit in an imaging device of Embodiment 2-3.

FIG. 49 is a schematic sectional view illustrating an example of a stacked structure of a first substrate and a second substrate in Embodiment 2-3.

DESCRIPTION OF EMBODIMENTS

Figure 1:
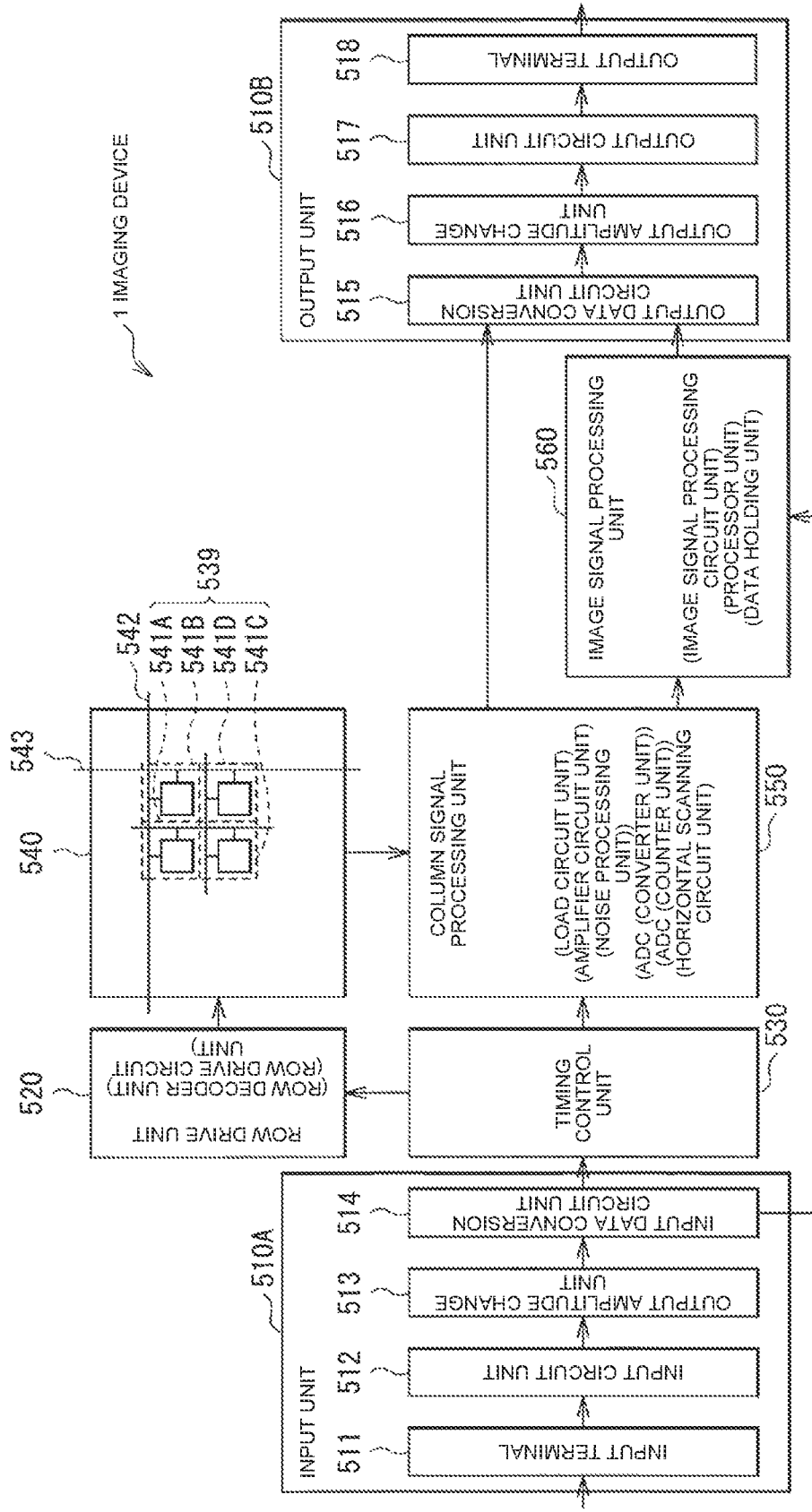
FIG. 1 is a block diagram illustrating an example of a functional configuration of an imaging device according to an embodiment of the present disclosure.

Hereinafter, embodiments of the present disclosure will be described in detail with reference to the drawings. Note that, in the following embodiments, the same parts are denoted by the same reference numerals, and redundant description will be omitted.

Hereinafter, modes for carrying out the present disclosure will be described in detail with reference to the drawings. Note that the description will be given in the following order.

1. Embodiment 1 (imaging device having stacked structure of three substrates)
2. First modification (first example of planar configuration)
3. Second modification (second example of planar configuration)
4. Third modification (third example of planar configuration)
5. Fourth modification (example in which contact portion between substrates is provided at central portion of pixel array portion)
6. Fifth modification (example of including planar transfer transistor)
7. Sixth modification (example in which one pixel is connected to one pixel circuit)
8. Seventh modification (configuration example of pixel isolation portion)
9. Embodiment 2
9.1 Problem to be solved by Embodiment 2
9.2 Outline of Embodiment 2
9.3 Specific example of Embodiment 2-1
9.3.1 Configuration of Embodiment 2-1
9.3.2 Operation and effect of Embodiment 2-1
9.3.3 Modification of Embodiment 2-1
9.4 Specific example of Embodiment 2-2
9.4.1 Configuration of Embodiment 2-2
9.4.2 Operation and effect of Embodiment 2-2
9.5 Specific example of Embodiment 2-3
9.5.1 Configuration of Embodiment 2-3
9.5.2 Operation and effect of Embodiment 2-3
10. Embodiment 3
10.1 Problem to be solved by Embodiment 3
10.2 Outline of Embodiment 3
10.3 Specific example of Embodiment 3-1
10.3.1 Configuration of Embodiment 3-1
10.3.2 Operation and effect of Embodiment 3-1
10.4 Specific example of Embodiment 3-2
10.4.1 Configuration of Embodiment 3-2
10.4.2 Operation and effect of Embodiment 3-2
10.5 Specific example of Embodiment 3-3
10.5.1 Configuration of Embodiment 3-3
10.5.2 Operation and effect of Embodiment 3-3
10.6 Specific example of Embodiment 3-4
10.6.1 Configuration of Embodiment 3-4
10.6.2 Operation and effect of Embodiment 3-4
10.7 Specific example of Embodiment 3-5
10.7.1 Configuration of Embodiment 3-5
10.7.2 Operation and effect of Embodiment 3-5
11. Application example (imaging system)
12. Application Example 1. Embodiment 1

[Functional Configuration of Imaging Device 1]

FIG. 1 is a block diagram illustrating an example of a functional configuration of an imaging device (imaging device 1) according to an embodiment of the present disclosure.

The imaging device 1 of FIG. 1 includes, for example, an input unit 510A, a row drive unit 520, a timing control unit 530, a pixel array portion 540, a column signal processing unit 550, an image signal processing unit 560, and an output unit 510B.

In the pixel array portion 540, pixels 541 are repeatedly arranged in an array. More specifically, a pixel sharing unit 539 including a plurality of pixels is a repeating unit, and the pixel sharing units 539 are repeatedly arranged in an array consisting of a row direction and a column direction. In the present specification, for convenience, the row direction may be referred to as an H direction, and the column direction orthogonal to the row direction may be referred to as a V direction. In the example of FIG. 1, one pixel sharing unit 539 includes four pixels (pixels 541A, 541B, 541C, and 541D). Each of the pixels 541A, 541B, 541C, and 541D has a photodiode PD (illustrated in FIG. 6 and the like described later). The pixel sharing unit 539 is a unit that shares one pixel circuit (a pixel circuit 210 of FIG. 4 described later). In other words, one pixel circuit (the pixel circuit 210 described later) is provided for every four pixels (pixels 541A, 541B, 541C, and 541D). The pixel circuit is operated in a time division manner, so that a pixel signal of each of the pixels 541A, 541B, 541C, and 541D is sequentially read. The pixels 541A, 541B, 541C, and 541D are arranged in, for example, 2 rows×2 columns. In the pixel array portion 540, a plurality of row drive signal lines 542 and a plurality of vertical signal lines (column read lines) 543 are provided together with the pixels 541A, 541B, 541C, and 541D. The row drive signal line 542 drives the pixels 541 which are included in each of the plurality of pixel sharing units 539 and are arranged side by side in the row direction in the pixel array portion 540. In the pixel sharing unit 539, each of the pixels arranged side by side in the row direction is driven. As will be described in detail later with reference to FIG. 4, the pixel sharing unit 539 is provided with a plurality of transistors. In order to drive each of the plurality of transistors, a plurality of row drive signal lines 542 are connected to one pixel sharing unit 539. The pixel sharing unit 539 is connected to the vertical signal line (column read line) 543. A pixel signal is read from each of the pixels 541A, 541B, 541C, and 541D included in the pixel sharing unit 539 through the vertical signal line (column read line) 543.

The row drive unit 520 includes, for example, a row address control unit that determines a position of a row for driving pixels, in other words, a row decoder unit, and a row drive circuit unit that generates a signal for driving the pixels 541A, 541B, 541C, and 541D.

The column signal processing unit 550 includes, for example, a load circuit unit that is connected to the vertical signal line 543 and forms a source follower circuit with the pixels 541A, 541B, 541C, and 541D (pixel sharing unit 539). The column signal processing unit 550 may have an amplifier circuit unit that amplifies a signal read from the pixel sharing unit 539 through the vertical signal line 543. The column signal processing unit 550 may have a noise processing unit. In the noise processing unit, for example, a noise level of the system is removed from the signal read from the pixel sharing unit 539 as a result of the photoelectric conversion.

The column signal processing unit 550 has, for example, an analog-to-digital converter (ADC). In the analog-to-digital converter, the signal read from the pixel sharing unit 539 or the noise-processed analog signal is converted into a digital signal. The ADC includes, for example, a comparator unit and a counter unit. In the comparator unit, an analog signal to be converted is compared with a reference signal to be compared. In the counter unit, the time until the comparison result in the comparator unit is inverted is measured. The column signal processing unit 550 may include a horizontal scanning circuit unit that performs control to scan the read column.

The timing control unit 530 supplies a signal for controlling timing to the row drive unit 520 and the column signal processing unit 550 on the basis of a reference clock signal or a timing control signal input to the device.

The image signal processing unit 560 is a circuit that performs various kinds of signal processing on data obtained as a result of photoelectric conversion, in other words, data obtained as a result of an imaging operation in the imaging device 1. The image signal processing unit 560 includes, for example, an image signal processing circuit unit and a data holding unit. The image signal processing unit 560 may include a processor unit.

An example of the signal processing executed in the image signal processing unit 560 is tone curve correction processing of giving a lot of gradation in a case where the AD converted imaging data is data obtained by imaging a dark subject, and reducing the gradations in a case where the AD converted imaging data is data obtained by imaging a bright subject. In this case, it is desirable to store characteristic data of the tone curve in the data holding unit of the image signal processing unit 560 in advance on the basis of which tone curve the gradation of the imaging data is corrected.

The input unit 510A is, for example, for inputting the reference clock signal, the timing control signal, the characteristic data, and the like from the outside of the device to the imaging device 1. The timing control signal is, for example, a vertical synchronization signal, a horizontal synchronization signal, or the like. The characteristic data is, for example, to be stored in the data holding unit of the image signal processing unit 560. The input unit 510A includes, for example, an input terminal 511, an input circuit unit 512, an input amplitude change unit 513, an input data conversion circuit unit 514, and a power supply unit (not illustrated).

The input terminal 511 is an external terminal for inputting data. The input circuit unit 512 is for taking a signal input to the input terminal 511 into the imaging device 1. In the input amplitude change unit 513, the amplitude of the signal taken by the input circuit unit 512 is changed to an amplitude that can be easily used inside the imaging device 1. In the input data conversion circuit unit 514, the arrangement of data strings of the input data is changed. The input data conversion circuit unit 514 includes, for example, a serial-to-parallel conversion circuit. In the serial-to-parallel conversion circuit, a serial signal received as input data is converted into a parallel signal. In the input unit 510A, the input amplitude change unit 513 and the input data conversion circuit unit 514 may not be provided. The power supply unit supplies power set to various voltages required inside the imaging device 1 on the basis of the power supplied from the outside to the imaging device 1.

When the imaging device 1 is connected to an external memory device, the input unit 510A may be provided with a memory interface circuit that receives data from the external memory device. Examples of the external memory device include a flash memory, an SRAM, and a DRAM.

The output unit 510B outputs image data to the outside of the device. The image data is, for example, image data captured by the imaging device 1, image data subjected to the signal processing by the image signal processing unit 560, and the like. The output unit 510B includes, for example, an output data conversion circuit unit 515, an output amplitude change unit 516, an output circuit unit 517, and an output terminal 518.

The output data conversion circuit unit 515 includes, for example, a parallel-to-serial conversion circuit, and in the output data conversion circuit unit 515, a parallel signal used inside the imaging device 1 is converted into a serial signal. The output amplitude change unit 516 changes the amplitude of a signal used inside the imaging device 1. The signal having the changed amplitude is easily used in an external device connected to the outside of the imaging device 1. The output circuit unit 517 is a circuit that outputs data from the inside of the imaging device 1 to the outside of the device, and the wire outside the imaging device 1 connected to the output terminal 518 is driven by the output circuit unit 517. At the output terminal 518, data is output from the imaging device 1 to the outside of the device. In the output unit 510B, the output data conversion circuit unit 515 and the output amplitude change unit 516 may not be provided.

When the imaging device 1 is connected to an external memory device, the output unit 510B may be provided with a memory interface circuit that outputs data to the external memory device. Examples of the external memory device include a flash memory, an SRAM, and a DRAM.

[Schematic Configuration of Imaging Device 1]

Figure 2:
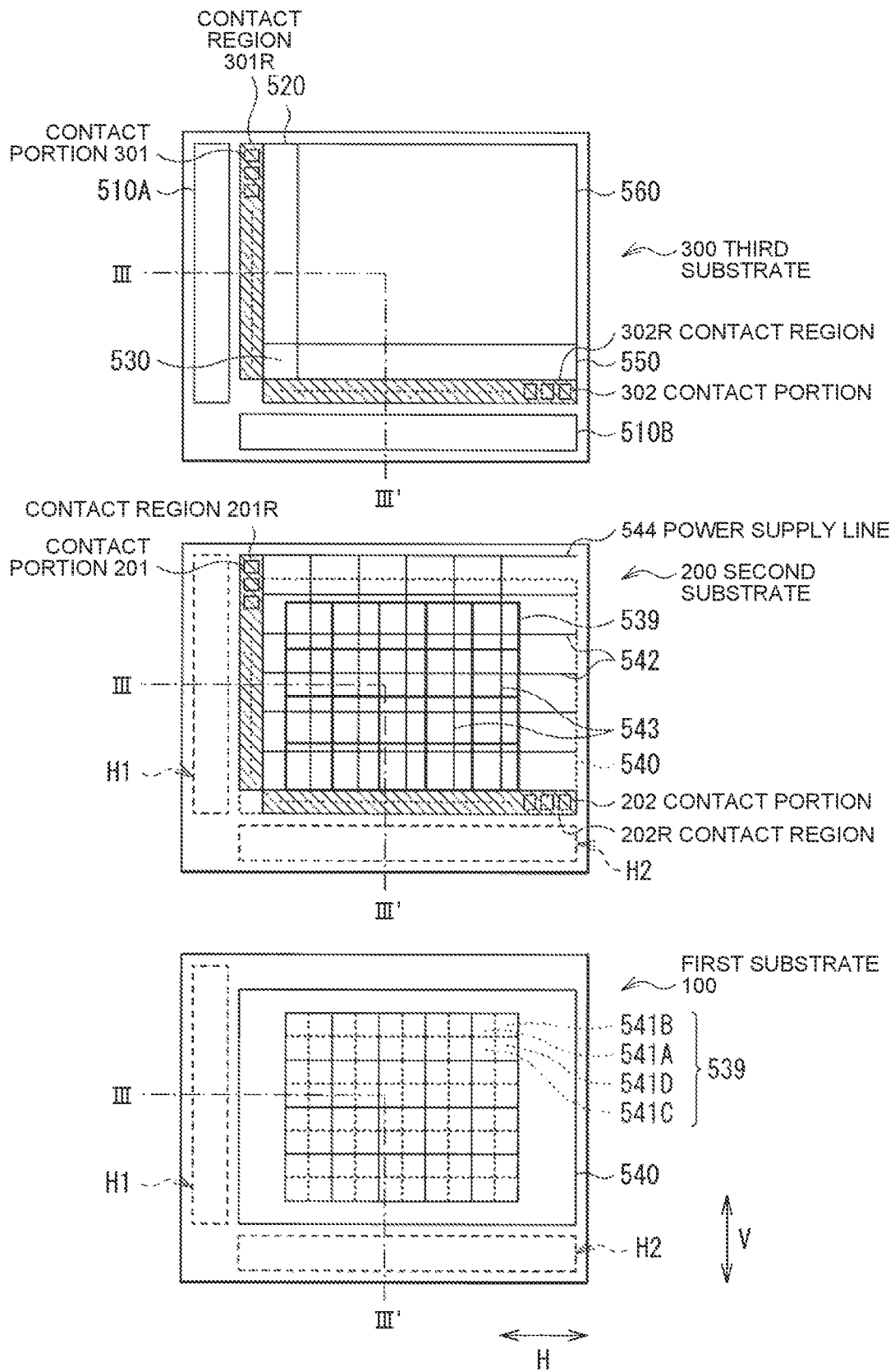
FIG. 2 is a schematic plan view illustrating a schematic configuration of the imaging device illustrated in FIG. 1.
Figure 3:
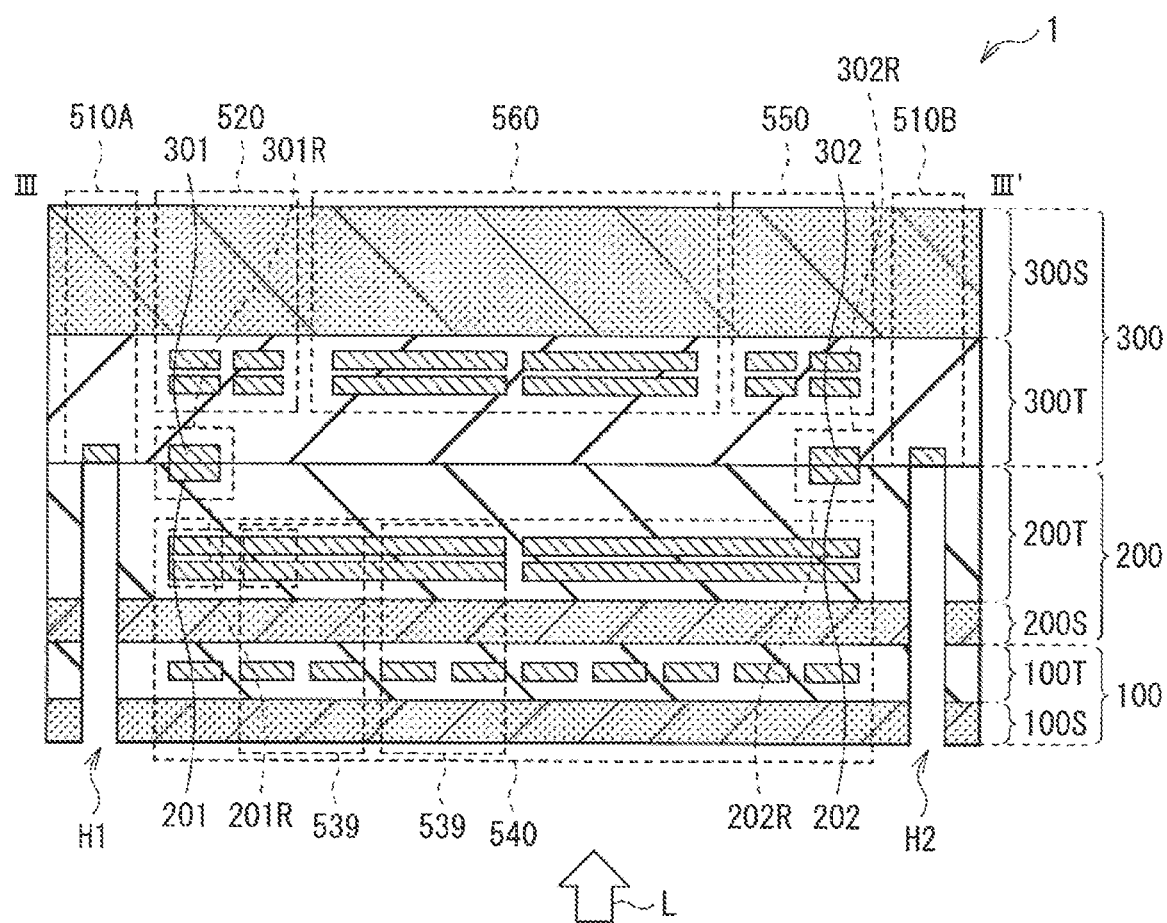
FIG. 3 is a schematic view illustrating a sectional configuration taken along line III-III' illustrated in FIG. 2.

FIGS. 2 and 3 illustrate an example of a schematic configuration of the imaging device 1. The imaging device 1 includes three substrates (a first substrate 100, a second substrate 200, and a third substrate 300). FIG. 2 schematically illustrates a planar configuration of each of the first substrate 100, the second substrate 200, and the third substrate 300, and FIG. 3 schematically illustrates a sectional configuration of the first substrate 100, the second substrate 200, and the third substrate 300 stacked on each other. FIG. 3 corresponds to the sectional configuration taken along line III-III' illustrated in FIG. 2. The imaging device 1 is an imaging device having a three-dimensional structure formed by bonding three substrates (the first substrate 100, the second substrate 200, and the third substrate 300). The first substrate 100 includes a semiconductor layer 100S and a wire layer 100T. The second substrate 200 includes a semiconductor layer 200S and a wire layer 200T. The third substrate 300 includes a semiconductor layer 300S and a wire layer 300T. Here, a combination of the wire and the interlayer insulating film around the wire included in each substrate of the first substrate 100, the second substrate 200, and the third substrate 300 is referred to as a wire layer (100T, 200T, 300T) provided on each substrate (the first substrate 100, the second substrate 200, and the third substrate 300) for convenience. The first substrate 100, the second substrate 200, and the third substrate 300 are stacked in this order, and the semiconductor layer 100S, the wire layer 100T, the semiconductor layer 200S, the wire layer 200T, the wire layer 300T, and the semiconductor layer 300S are arranged in this order along a stacking direction. Specific configurations of the first substrate 100, the second substrate 200, and the third substrate 300 will be described later. The arrow illustrated in FIG. 3 indicates an incident direction of light L on the imaging device 1. In the present specification, for convenience, in the following sectional views, the light incident side in the imaging device 1 may be referred to as the expression "down", "lower side", and "below", and the side opposite to the light incident side may be referred to as the expression "up", "upper side", and "above". In addition, in the present specification, for convenience, in a substrate including a semiconductor layer and a wire layer, a side of the substrate closer to the wire layer may be referred to as a front surface, and a side of the substrate closer to the semiconductor layer may be referred to as a back surface. The description of the specification is not limited to the above terms. The imaging device 1 is, for example, a back-illuminated imaging device in which light enters from the back surface side of the first substrate 100 having a photodiode.

Both the pixel array portion 540 and the pixel sharing unit 539 included in the pixel array portion 540 are configured using both the first substrate 100 and the second substrate 200. In the first substrate 100, a plurality of pixels 541A, 541B, 541C, and 541D that the pixel sharing unit 539 has are provided. Each of these pixels 541 has a photodiode (photodiode PD described later) and a transfer transistor (transfer transistor TR described later). In the second substrate 200, a pixel circuit (the pixel circuit 210 described later) that the pixel sharing unit 539 has is provided. The pixel circuit reads a pixel signal transferred from the photodiode of each of the pixels 541A, 541B, 541C, and 541D through the transfer transistor, or resets the photodiode. In addition to such a pixel circuit, the second substrate 200 has a plurality of row drive signal lines 542 extending in the row direction and a plurality of vertical signal lines 543 extending in the column direction. The second substrate 200 further has a power supply line 544 extending in the row direction. The third substrate 300 has, for example, the input unit 510A, the row drive unit 520, the timing control unit 530, the column signal processing unit 550, the image signal processing unit 560, and the output unit 510B. The row drive unit 520 is provided, for example, in a region where a portion of the row drive unit 520 overlaps the pixel array portion 540 in the stacking direction of the first substrate 100, the second substrate 200, and the third substrate 300 (hereinafter, simply referred to as a stacking direction). More specifically, the row drive unit 520 is provided in a region where the row drive unit 520 overlaps a portion near the end portion of the pixel array portion 540 in the H direction in the stacking direction (FIG. 2). The column signal processing unit 550 is provided, for example, in a region where a portion of the column signal processing unit 550 overlaps the pixel array portion 540 in the stacking direction. More specifically, the column signal processing unit 550 is provided in a region where the column signal processing unit 550 overlaps a portion near the end portion of the pixel array portion 540 in the V direction in the stacking direction (FIG. 2). Although not illustrated, the input unit 510A and the output unit 510B may be disposed in a portion other than the third substrate 300, and may be disposed on the second substrate 200, for example. Alternatively, the input unit 510A and the output unit 510B may be provided on the back surface (light incident surface) side of the first substrate 100. Note that the pixel circuit provided on the second substrate 200 may also be referred to as a pixel transistor circuit, a pixel transistor group, a pixel transistor, a pixel read circuit, or a read circuit as another name. In the present specification, the term "pixel circuit" is used.

The first substrate 100 and the second substrate 200 are electrically connected by, for example, a through-electrode (through-electrodes 120E and 121E of FIG. 6 described later). The second substrate 200 and the third substrate 300 are electrically connected through contact portions 201, 202, 301, and 302, for example. The contact portions 201 and 202 are provided on the second substrate 200, and the contact portions 301 and 302 are provided on the third substrate 300. The contact portion 201 of the second substrate 200 is in contact with the contact portion 301 of the third substrate 300, and the contact portion 202 of the second substrate 200 is in contact with the contact portion 302 of the third substrate 300. The second substrate 200 has a contact region 201R in which a plurality of contact portions 201 are provided and a contact region 202R in which a plurality of contact portions 202 are provided. The third substrate 300 has a contact region 301R in which a plurality of contact portions 301 are provided and a contact region 302R in which a plurality of contact portions 302 are provided. The contact regions 201R and 301R are provided between the pixel array portion 540 and the row drive unit 520 in the stacking direction (FIG. 3). In other words, the contact regions 201R and 301R are provided, for example, in a region where the row drive unit 520 (the third substrate 300) and the pixel array portion 540 (the second substrate 200) overlap each other in the stacking direction or in a region in the vicinity thereof. The contact regions 201R and 301R are disposed, for example, at an end portion of such a region in the H direction (FIG. 2). In the third substrate 300, for example, the contact region 301R is provided at a position overlapping a portion of the row drive unit 520, specifically, the end portion of the row drive unit 520 in the H direction (FIGS. 2 and 3). The contact portions 201 and 301 connect, for example, the row drive unit 520 provided on the third substrate 300 to the row drive signal line 542 provided on the second substrate 200. For example, the contact portions 201 and 301 may connect the input unit 510A provided on the third substrate 300 to the power supply line 544 and a reference potential line (a reference potential line VSS described later). The contact regions 202R and 302R are provided between the pixel array portion 540 and the column signal processing unit 550 in the stacking direction (FIG. 3). In other words, the contact regions 202R and 302R are provided, for example, in a region where the column signal processing unit 550 (the third substrate 300) and the pixel array portion 540 (the second substrate 200) overlap each other in the stacking direction or in a region in the vicinity thereof. The contact regions 202R and 302R are disposed, for example, at an end portion of such a region in the V direction (FIG. 2). In the third substrate 300, for example, the contact region 301R is provided at a position overlapping a portion of the column signal processing unit 550, specifically, the end portion of the column signal processing unit 550 in the V direction (FIGS. 2 and 3). The contact portions 202 and 302 are, for example, for connecting a pixel signal (a signal corresponding to the amount of charges generated as a result of photoelectric conversion in the photodiode) output from each of the plurality of pixel sharing units 539 included in the pixel array portion 540 to the column signal processing unit 550 provided on the third substrate 300. The pixel signal is transmitted from the second substrate 200 to the third substrate 300.

FIG. 3 is an example of a sectional view of the imaging device 1 as described above. The first substrate 100, the second substrate 200, and the third substrate 300 are electrically connected through the wire layers 100T, 200T, and 300T. For example, the imaging device 1 has an electrical connection portion that electrically connects the second substrate 200 to the third substrate 300. Specifically, the contact portions 201, 202, 301, and 302 are formed of electrodes formed of conductive materials. The conductive material is formed of, for example, a metal material such as copper (Cu), aluminum (Al), or gold (Au). The contact regions 201R, 202R, 301R, and 302R electrically connect the second substrate to the third substrate by directly bonding wires formed as electrodes, for example, and enable input and/or output of signals between the second substrate 200 and the third substrate 300.

The electrical connection portion that electrically connects the second substrate 200 to the third substrate 300 can be provided at a desired location. For example, as described as the contact regions 201R, 202R, 301R, and 302R in FIG. 3, the electrical connection portion may be provided in a region overlapping the pixel array portion 540 in the stacking direction. Furthermore, the electrical connection portion may be provided in a region not overlapping the pixel array portion 540 in the stacking direction. Specifically, the electrical connection portion may be provided in a region overlapping a peripheral portion arranged outside the pixel array portion 540, in the stacking direction.

The first substrate 100 and the second substrate 200 are provided with, for example, connection hole portions H1 and H2. The connection hole portions H1 and H2 penetrate the first substrate 100 and the second substrate 200 (FIG. 3). The connection hole portions H1 and H2 are provided outside the pixel array portion 540 (or a portion overlapping the pixel array portion 540) (FIG. 2). For example, the connection hole portion H1 is arranged outside the pixel array portion 540 in the H direction, and the connection hole portion H2 is arranged outside the pixel array portion 540 in the V direction. For example, the connection hole portion H1 reaches the input unit 510A provided in the third substrate 300, and the connection hole portion H2 reaches the output unit 510B provided in the third substrate 300. The connection hole portions H1 and H2 may be hollow or at least partially contain a conductive material. For example, a bonding wire is connected to an electrode formed as the input unit 510A and/or the output unit 510B. Alternatively, the electrode formed as the input unit 510A and/or the output unit 510B is connected to the conductive material provided in the connection hole portions H1 and H2. The conductive material provided in the connection hole portions H1 and H2 may be embedded in a portion or all of the connection hole portions H1 and H2, and the conductive material may be formed on the side walls of the connection hole portions H1 and H2.

In FIG. 3, the input unit 510A and the output unit 510B are provided in the third substrate 300, but the invention is not limited thereto. For example, by transmitting a signal of the third substrate 300 to the second substrate 200 through the wire layers 200T and 300T, the input unit 510A and/or the output unit 510B can be provided in the second substrate 200. Similarly, by transmitting a signal of the second substrate 200 to the first substrate 1000 through the wire layers 100T and 200T, the input unit 510A and/or the output unit 510B can be provided in the first substrate 100.

Figure 4:
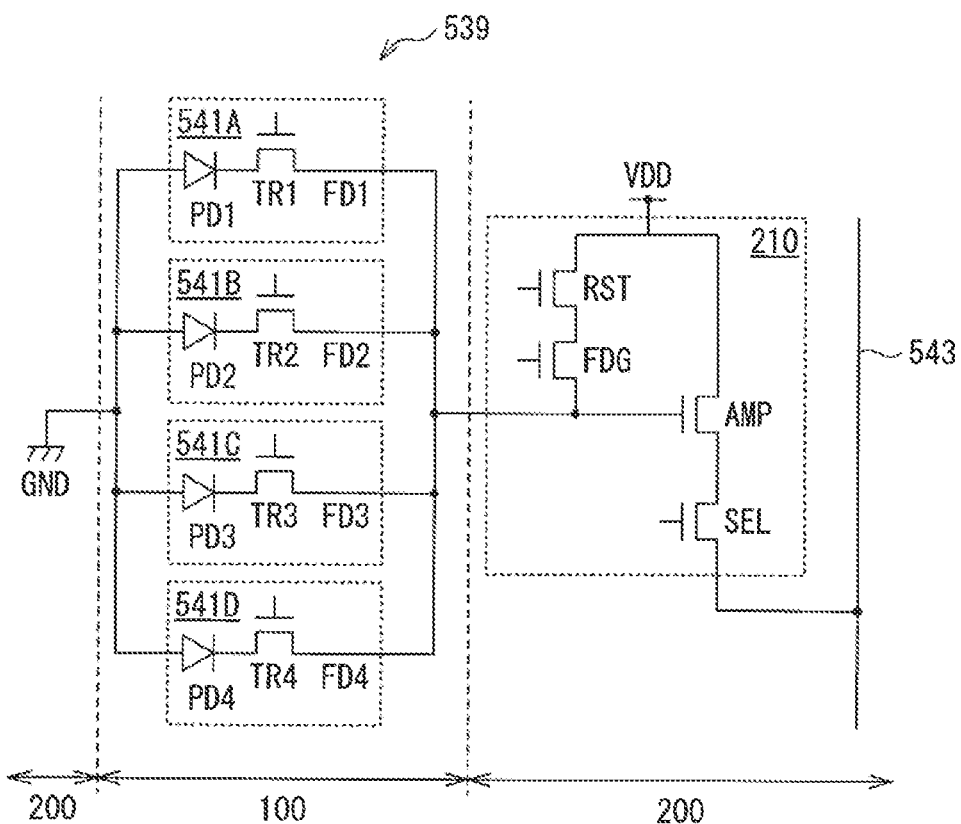
FIG. 4 is an equivalent circuit diagram of a pixel sharing unit illustrated in FIG. 1.

FIG. 4 is an equivalent circuit diagram illustrating an example of a configuration of the pixel sharing unit 539. The pixel sharing unit 539 includes a plurality of pixels 541 (FIG. 4 illustrates four pixels 541 of pixels 541A, 541B, 541C, and 541D), one pixel circuit 210 connected to the plurality of pixels 541, and the vertical signal line 543 connected to the pixel circuit 210. The pixel circuit 210 includes, for example, four transistors, specifically, an amplification transistor AMP, a selection transistor SEL, a reset transistor RST, and an FD conversion gain switching transistor FD. As described above, the pixel sharing unit 539 sequentially outputs the pixel signals of the four pixels 541 (pixels 541A, 541B, 541C, and 541D) included in the pixel sharing unit 539 to the vertical signal line 543 by operating one pixel circuit 210 in a time division manner. A status in which one pixel circuit 210 is connected to the plurality of pixels 541 and the pixel signals of the plurality of pixels 541 are output by one pixel circuit 210 in a time division manner is referred to as "the plurality of pixels 541 share one pixel circuit 210".

The pixels 541A, 541B, 541C, and 541D have common components. Hereinafter, in order to distinguish the components of the pixels 541A, 541B, 541C, and 541D from each other, an identification number 1 is assigned to the end of the reference numeral of the component of the pixel 541A, an identification number 2 is assigned to the end of the reference numeral of the component of the pixel 541B, an identification number 3 is assigned to the end of the reference numeral of the component of the pixel 541C, and an identification number 4 is assigned to the end of the reference numeral of the component of the pixel 541D. In a case where it is not necessary to distinguish the components of the pixels 541A, 541B, 541C, and 541D from each other, the identification numbers at the ends of the reference numerals of the components of the pixels 541A, 541B, 541C, and 541D are omitted.

The pixels 541A, 541B, 541C, and 541D have, for example, the photodiode PD, the transfer transistor TR electrically connected to the photodiode PD, and a floating diffusion FD electrically connected to the transfer transistor TR. In the photodiode PD (PD1, PD2, PD3, PD4), the cathode is electrically connected to the source of the transfer transistor TR, and the anode is electrically connected to the reference potential line (for example, ground). The photodiode PD photoelectrically converts the incident light, and generates a charge according to the amount of received light. The transfer transistor TR (transfer transistors TR1, TR2, TR3, and TR4) is, for example, an n-type complementary metal oxide semiconductor (CMOS) transistor. In the transfer transistor TR, the drain is electrically connected to the floating diffusion FD, and the gate is electrically connected to a drive signal line. This drive signal line is a part of the plurality of row drive signal lines 542 (refer to FIG. 1) connected to one pixel sharing unit 539. The transfer transistor TR transfers the charge generated in the photodiode PD to the floating diffusion FD. The floating diffusion FD (floating diffusions FD1, FD2, FD3, and FD4) is an n-type diffusion layer region formed in a p-type semiconductor layer. The floating diffusion FD is charge holding means for temporarily holding the charge transferred from the photodiode PD, and is charge-voltage conversion means for generating a voltage according to the charge amount.

The four floating diffusions FD (floating diffusions FD1, FD2, FD3, and FD4) included in one pixel sharing unit 539 are electrically connected to each other, and are electrically connected to the gate of the amplification transistor AMP and the source of the FD conversion gain switching transistor FDG. The drain of the FD conversion gain switching transistor FDG is connected to the source of the reset transistor RST, and the gate of the FD conversion gain switching transistor FDG is connected to the drive signal line. This drive signal line is a part of the plurality of row drive signal lines 542 connected to one pixel sharing unit 539. The drain of the reset transistor RST is connected to a power supply line VDD, and the gate of the reset transistor RST is connected to the drive signal line. This drive signal line is a part of the plurality of row drive signal lines 542 connected to one pixel sharing unit 539. The gate of the amplification transistor AMP is connected to the floating diffusion FD, the drain of the amplification transistor AMP is connected to the power supply line VDD, and the source of the amplification transistor AMP is connected to the drain of the selection transistor SEL. The source of the selection transistor SEL is connected to the vertical signal line 543, and the gate of the selection transistor SEL is connected to the drive signal line. This drive signal line is a part of the plurality of row drive signal lines 542 connected to one pixel sharing unit 539.

When the transfer transistor TR is turned on, the transfer transistor TR transfers the charge of the photodiode PD to the floating diffusion FD. The gate (transfer gate TG) of the transfer transistor TR includes, for example, a so-called vertical electrode, and is provided to extend from a front surface of a semiconductor layer (the semiconductor layer 100S in FIG. 6 described later) to a depth reaching the PD as illustrated in FIG. 6 described later. The reset transistor RST resets the potential of the floating diffusion FD to a predetermined potential. When the reset transistor RST is turned on, the potential of the floating diffusion FD is reset to the potential of the power supply line VDD. The selection transistor SEL controls the output timing of the pixel signal from the pixel circuit 210. The amplification transistor AMP generates a signal of a voltage according to the level of the charge held in the floating diffusion FD as a pixel signal. The amplification transistor AMP is connected to the vertical signal line 543 through the selection transistor SEL. The amplification transistor AMP constitutes a source follower together with the load circuit unit (refer to FIG. 1) connected to the vertical signal line 543 in the column signal processing unit 550. When the selection transistor SEL is turned on, the amplification transistor AMP outputs the voltage of the floating diffusion FD to the column signal processing unit 550 through the vertical signal line 543. The reset transistor RST, the amplification transistor AMP, and the selection transistor SEL are N-type MOS transistors, for example.

The FD conversion gain switching transistor FDG is used to change the gain of charge-voltage conversion in the floating diffusion FD. In general, a pixel signal is small at the time of performing imaging in a dark place. In a case where the capacitance of the floating diffusion FD (FD capacitance C) is large at the time of performing the charge-voltage conversion on the basis of $Q=CV$, V at the time of conversion into a voltage by the amplification transistor AMP becomes small. On the other hand, since the pixel signal becomes large at a bright place, the floating diffusion FD cannot receive the charge of the photodiode PD unless the FD capacitance C is large. Furthermore, the FD capacitance C needs to be large so that V at the time of conversion into a voltage by the amplification transistor AMP does not become too large (in other words, V becomes small). In view of these, when the FD conversion gain switching transistor FDG is turned on, the gate capacitance of the FD conversion gain switching transistor FDG is increased, so that the entire FD capacitance C is increased. On the other hand, when the FD conversion gain switching transistor FDG is turned off, the entire FD capacitance C is decreased. In this manner, by switching on and off of the FD conversion gain switching transistor FDG, the FD capacitance C can be made variable, and the conversion efficiency can be switched. The FD conversion gain switching transistor FDG is an N-type MOS transistor, for example.

Note that a configuration in which the FD conversion gain switching transistor FDG is not provided is also possible. In this case, for example, the pixel circuit 210 includes three transistors, for example, the amplification transistor AMP, the selection transistor SEL, and the reset transistor RST. The pixel circuit 210 has, for example, at least one of pixel transistors such as the amplification transistor AMP, the selection transistor SEL, the reset transistor RST, and the FD conversion gain switching transistor FDG.

The selection transistor SEL may be provided between the power supply line VDD and the amplification transistor AMP. In this case, the drain of the reset transistor RST is electrically connected to the power supply line VDD and the drain of the selection transistor SEL. The source of the selection transistor SEL is electrically connected to the drain of the amplification transistor AMP, and the gate of the selection transistor SEL is electrically connected to the row drive signal line 542 (refer to FIG. 1). The source of the amplification transistor AMP (the output end of the pixel circuit 210) is electrically connected to the vertical signal line 543, and the gate of the amplification transistor AMP is electrically connected to the source of the reset transistor RST. Note that, although not illustrated, the number of pixels 541 sharing one pixel circuit 210 may be other than four. For example, two or eight pixels 541 may share one pixel circuit 210.

Figure 5:
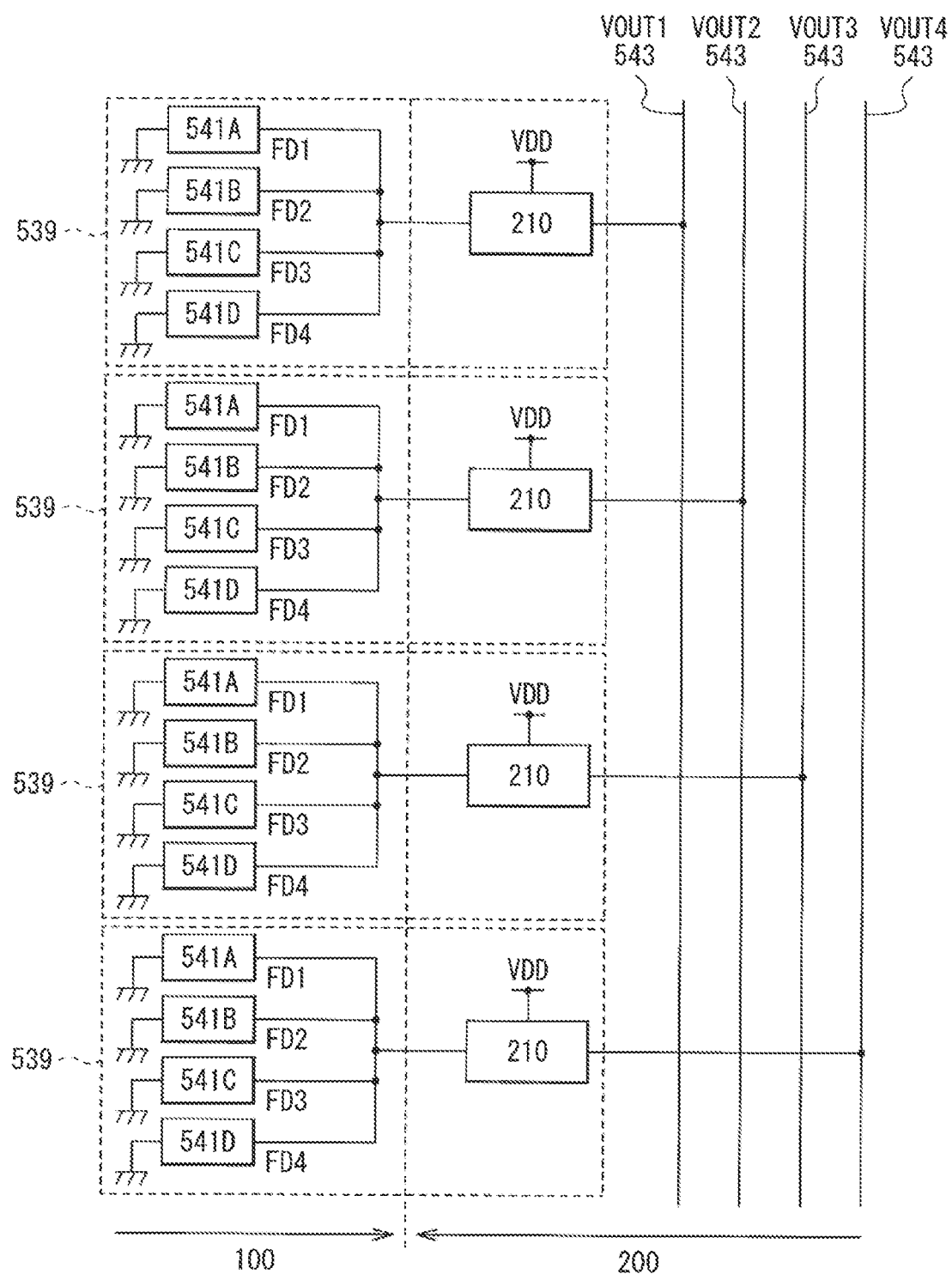
FIG. 5 is a diagram illustrating an example of a connection status between a plurality of pixel sharing units and a plurality of vertical signal lines.

FIG. 5 illustrates an example of a connection status between the plurality of pixel sharing units 539 and the vertical signal lines 543. For example, four pixel sharing units 539 arranged in the column direction are divided into four groups, and the vertical signal lines 543 are connected to the four groups, respectively. In order to simplify the description, FIG. 5 illustrates an example in which each of the four groups has one pixel sharing unit 539, but each of the four groups may include a plurality of pixel sharing units 539. As described above, in the imaging device 1, the plurality of pixel sharing units 539 arranged in the column direction may be divided into groups each including one or a plurality of pixel sharing units 539. For example, the vertical signal line 543 and the column signal processing unit 550 are connected to each group, and pixel signals can be simultaneously read from the respective groups. Alternatively, in the imaging device 1, one vertical signal line 543 may be connected to the plurality of pixel sharing units 539 arranged in the column direction. In this case, the pixel signals are sequentially read from the plurality of pixel sharing units 539 connected to one vertical signal line 543 in a time division manner.

[Specific Configuration of Imaging Device 1]

Figure 6:
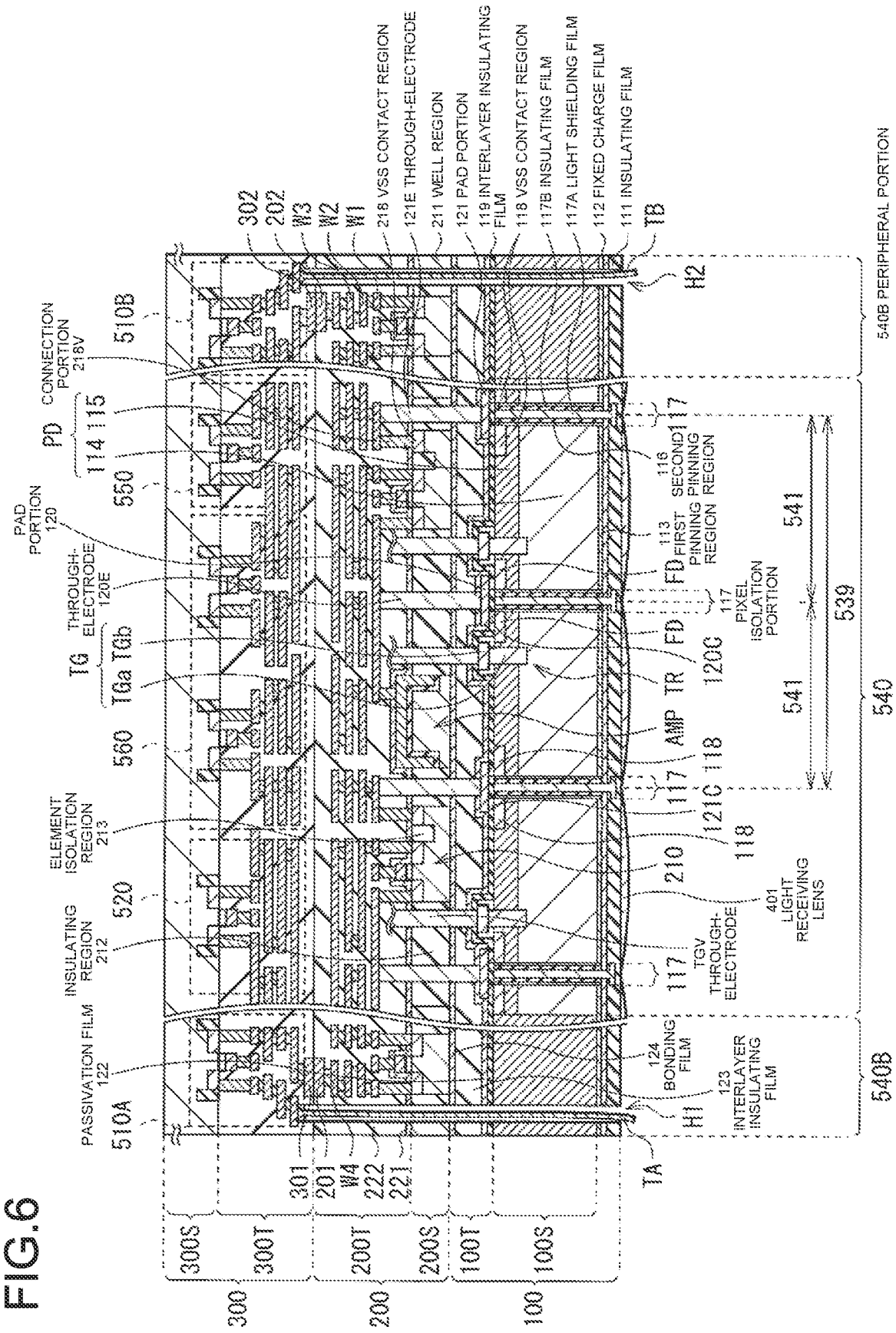
FIG. 6 is a schematic sectional view illustrating an example of a specific configuration of the imaging device illustrated in FIG. 3.

FIG. 6 illustrates an example of a sectional configuration in a direction perpendicular to the main surfaces of the first substrate 100, the second substrate 200, and the third substrate 300 of the imaging device 1. FIG. 6 schematically illustrates the positional relationship of the components for easy understanding, and may be different from the actual section. In the imaging device 1, the first substrate 100, the second substrate 200, and the third substrate 300 are stacked in this order. The imaging device 1 further has a light receiving lens 401 on the back surface side (light incident surface side) of the first substrate 100. A color filter layer (not illustrated) may be provided between the light receiving lens 401 and the first substrate 100. The light receiving lens 401 is provided in each of the pixels 541A, 541B, 541C, and 541D, for example. The imaging device 1 is, for example, a back-illuminated imaging device. The imaging device 1 has the pixel array portion 540 arranged in a central portion and a peripheral portion 540B arranged outside the pixel array portion 540.

The first substrate 100 has an insulating film 111, a fixed charge film 112, the semiconductor layer 100S, and the wire layer 100T in this order from the light receiving lens 401 side. The semiconductor layer 100S is formed of, for example, a silicon substrate. The semiconductor layer 100S has, for example, a p-well layer 115 in a portion of the front surface (the surface on the wire layer 100T side) and in the vicinity thereof, and an n-type semiconductor region 114 in the other region (region deeper than the p-well layer 115). For example, the n-type semiconductor region 114 and the p-well layer 115 constitute a pn junction type photodiode PD. The p-well layer 115 is a p-type semiconductor region.

Figure 7A:
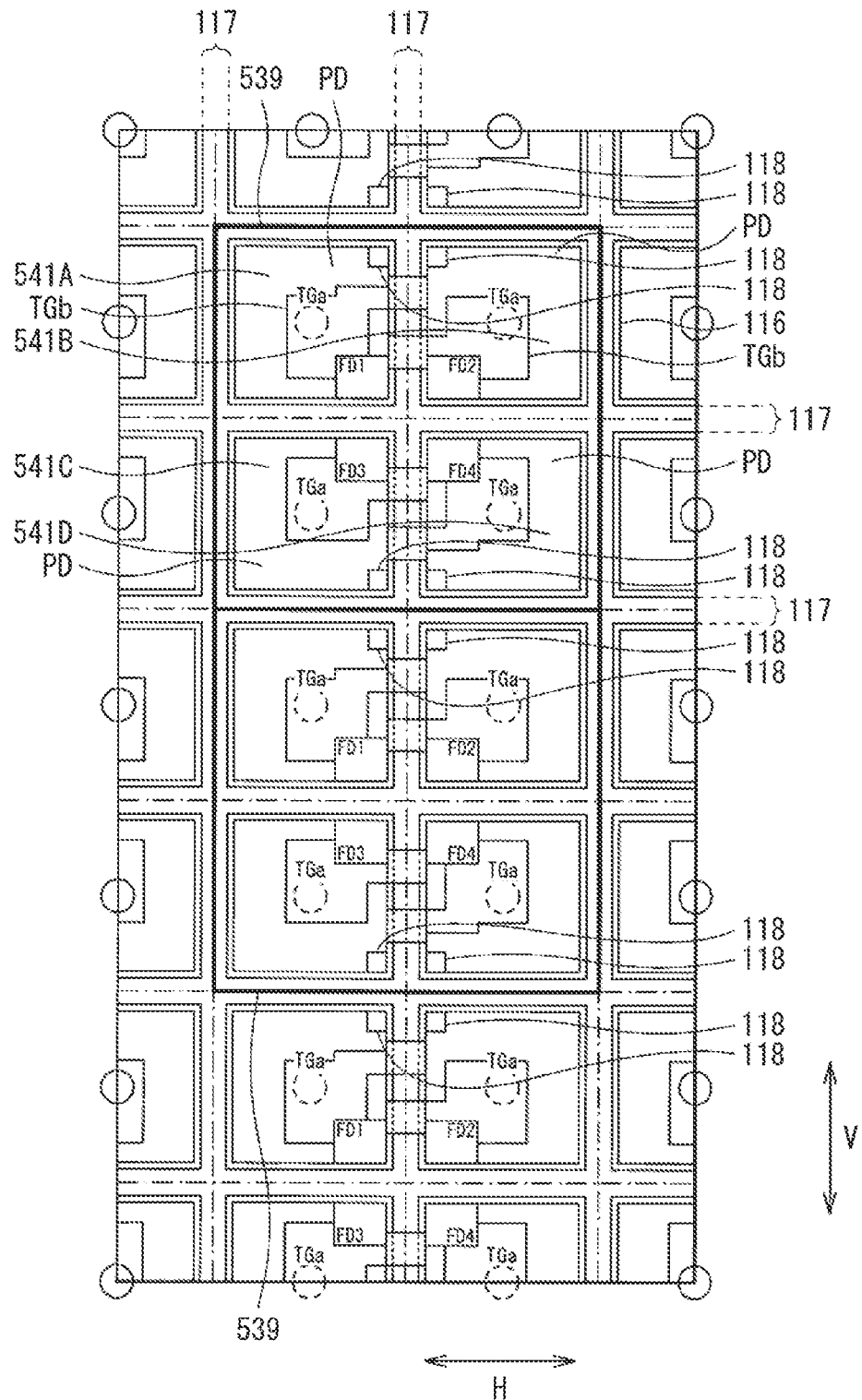
FIG. 7A is a schematic view illustrating an example of a planar configuration of a main part of a first substrate illustrated in FIG. 6.

FIG. 7A illustrates an example of a planar configuration of the first substrate 100. FIG. 7A mainly illustrates a planar configuration of a pixel isolation portion 117, the photodiode PD, the floating diffusion FD, a VSS contact region 118, and the transfer transistor TR of the first substrate 100. The configuration of the first substrate 100 will be described with reference to FIG. 7A together with FIG. 6.

The floating diffusion FD and the VSS contact region 118 are provided near the front surface of the semiconductor layer 100S. The floating diffusion FD includes an n-type semiconductor region provided in the p-well layer 115. The floating diffusion FD (floating diffusions FD1, FD2, FD3, and FD4) of each of the pixels 541A, 541B, 541C, and 541D is provided, for example, close to each other in the central portion of the pixel sharing unit 539 (FIG. 7A). Although details will be described later, the four floating diffusions (floating diffusions FD1, FD2, FD3, and FD4) included in the pixel sharing unit 539 are electrically connected to each other through electrical connection means (a pad portion 120 described later) in the first substrate 100 (more specifically, in the wire layer 100T). Further, the floating diffusion FD is connected from the first substrate 100 to the second substrate 200 (more specifically, from the wire layer 100T to the wire layer 200T) through the electrical means (the through-electrode 120E described later). In the second substrate 200 (more specifically, inside the wire layer 200T), the floating diffusion FD is electrically connected to the gate of the amplification transistor AMP and the source of the FD conversion gain switching transistor FDG by this electrical means.

The VSS contact region 118 is a region electrically connected to the reference potential line VSS, and is arranged away from the floating diffusion FD. For example, in the pixels 541A, 541B, 541C, and 541D, the floating diffusion FD is arranged at one end of each pixel in the V direction, and the VSS contact region 118 is arranged at the other end of each pixel in the V direction (FIG. 7A). The VSS contact region 118 includes, for example, a p-type semiconductor region. The VSS contact region 118 is connected to, for example, a ground potential or a fixed potential. As a result, the reference potential is supplied to the semiconductor layer 100S.

The transfer transistor TR is provided in the first substrate 100 together with the photodiode PD, the floating diffusion FD, and the VSS contact region 118. The photodiode PD, the floating diffusion FD, the VSS contact region 118, and the transfer transistor TR are provided in each of the pixels 541A, 541B, 541C, and 541D. The transfer transistor TR is provided on the front surface side (side opposite to the light incident surface side, the second substrate 200 side) of the semiconductor layer 100S. The transfer transistor TR has the transfer gate TG. The transfer gate TG includes, for example, a horizontal portion TGb facing the front surface of the semiconductor layer 100S and a vertical portion TGa provided in the semiconductor layer 100S. The vertical portion TGa extends in the thickness direction of the semiconductor layer 100S. One end of the vertical portion TGa is in contact with the horizontal portion TGb, and the other end of the vertical portion TGa is provided in the n-type semiconductor region 114. By configuring the transfer transistor TR with such a vertical transistor, transfer failure of the pixel signal hardly occurs, and the efficiency of reading the pixel signal can be improved.

The horizontal portion TGb of the transfer gate TG extends from a position facing the vertical portion TGa toward, for example, the central portion of the pixel sharing unit 539 in the H direction (FIG. 7A). As a result, the position of the through-electrode (through-electrode TGV described later) reaching the transfer gate TG in the H direction can be brought close to the position of the through-electrode (the through-electrodes 120E and 121E described later) connected to the floating diffusion FD and the VSS contact region 118 in the H direction. For example, the plurality of pixel sharing units 539 provided in the first substrate 100 have the same configuration (FIG. 7A).

Figure 7B:
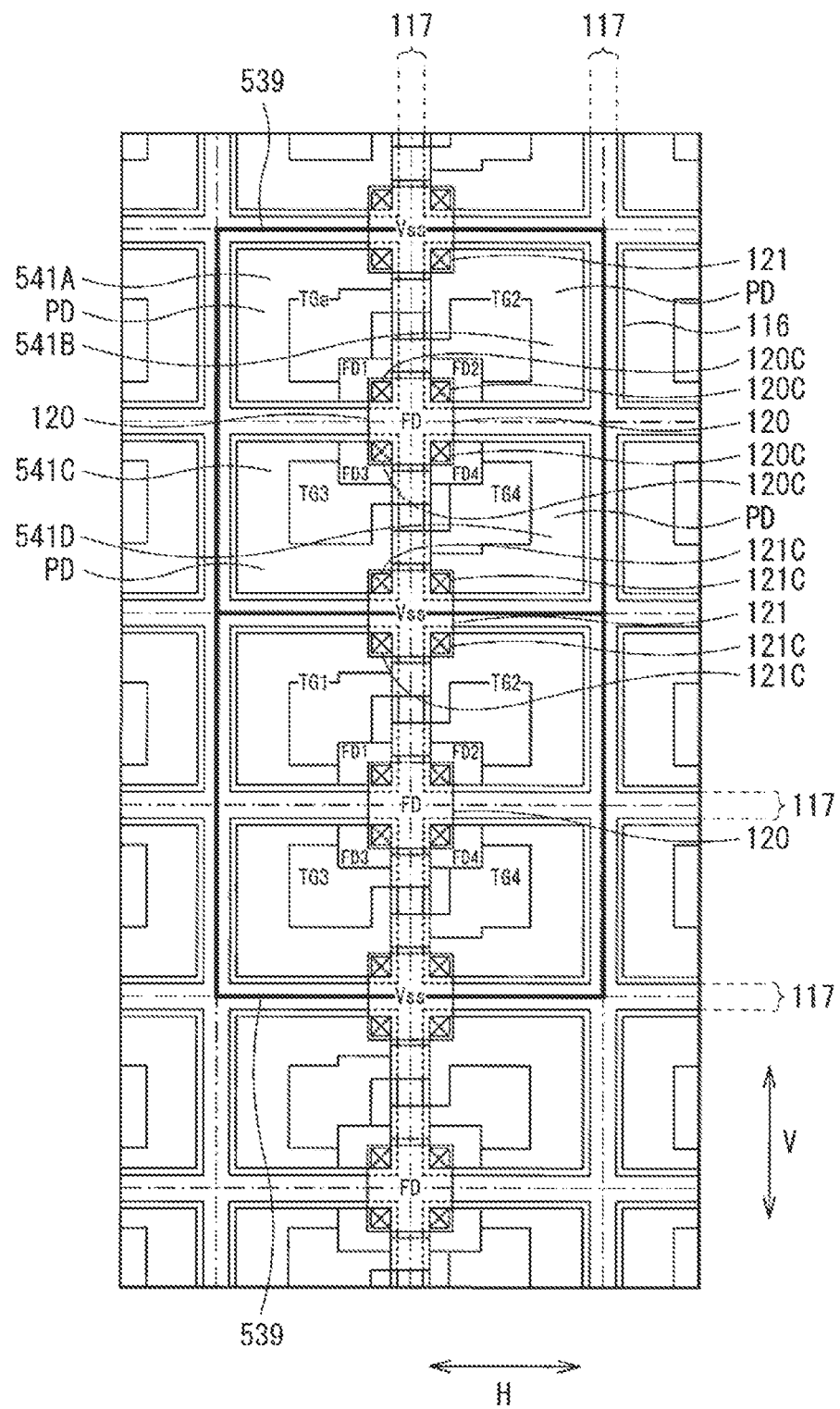
FIG. 7B is a schematic view illustrating a planar configuration of a pad portion together with the main part of the first substrate illustrated in FIG. 7A.

In the semiconductor layer 100S, the pixel isolation portion 117 that isolates the pixels 541A, 541B, 541C, and 541D from each other is provided. The pixel isolation portion 117 is formed to extend in the normal direction of the semiconductor layer 100S (direction perpendicular to the front surface of the semiconductor layer 100S). The pixel isolation portion 117 is provided to partition the pixels 541A, 541B, 541C, and 541D from each other, and has, for example, a grid-like planar shape (FIGS. 7A and 7B). For example, the pixel isolation portion 117 electrically and optically isolates the pixels 541A, 541B, 541C, and 541D from each other. The pixel isolation portion 117 includes, for example, a light shielding film 117A and an insulating film 117B. For example, tungsten (W) or the like is used for the light shielding film 117A. The insulating film 117B is provided between the light shielding film 117A and the p-well layer 115 or the n-type semiconductor region 114. The insulating film 117B is formed of, for example, silicon oxide (SiO). The pixel isolation portion 117 has, for example, a full trench isolation (FTI) structure, and penetrates the semiconductor layer 100S. Although not illustrated, the pixel isolation portion 117 is not limited to the FTI structure penetrating the semiconductor layer 100S. For example, a deep trench isolation (DTI) structure that does not penetrate the semiconductor layer 100S may be used. The pixel isolation portion 117 extends in the normal direction of the semiconductor layer 100S, and is formed in a partial region of the semiconductor layer 100S.

In the semiconductor layer 100S, for example, a first pinning region 113 and a second pinning region 116 are provided. The first pinning region 113 is provided near the back surface of the semiconductor layer 100S, and is arranged between the n-type semiconductor region 114 and the fixed charge film 112. The second pinning region 116 is provided on a side surface of the pixel isolation portion 117, specifically, between the pixel isolation portion 117 and the p-well layer 115 or the n-type semiconductor region 114. The first pinning region 113 and the second pinning region 116 are formed of, for example, a p-type semiconductor region.

The fixed charge film 112 having a negative fixed charge is provided between the semiconductor layer 100S and the insulating film 111. The first pinning region 113 of the hole accumulation layer is formed at the interface on a light receiving surface (back surface) side of the semiconductor layer 100S by the electric field induced by the fixed charge film 112. As a result, generation of dark current due to the interface state on the light receiving surface side of the semiconductor layer 100S is suppressed. The fixed charge film 112 is formed of, for example, an insulating film having a negative fixed charge. Examples of the material of the insulating film having a negative fixed charge include hafnium oxide, zircon oxide, aluminum oxide, titanium oxide, and tantalum oxide.

The light shielding film 117A is provided between the fixed charge film 112 and the insulating film 111. The light shielding film 117A may be provided continuously with the light shielding film 117A constituting the pixel isolation portion 117. The light shielding film 117A between the fixed charge film 112 and the insulating film 111 is selectively provided, for example, at a position facing the pixel isolation portion 117 in the semiconductor layer 100S. The insulating film 111 is provided to cover the light shielding film 117A. The insulating film 111 is formed of, for example, silicon oxide.

The wire layer 100T provided between the semiconductor layer 100S and the second substrate 200 has an interlayer insulating film 119, pad portions 120 and 121, a passivation film 122, an interlayer insulating film 123, and a bonding film 124 in this order from the semiconductor layer 100S side. The horizontal portion TGb of the transfer gate TG is provided in the wire layer 100T, for example. The interlayer insulating film 119 is provided over the entire front surface of the semiconductor layer 100S, and is in contact with the semiconductor layer 100S. The interlayer insulating film 119 is formed of, for example, a silicon oxide film. Note that the configuration of the wire layer 100T is not limited to the above description, and may be a configuration including a wire and an insulating film.

FIG. 7B illustrates the configuration of the pad portions 120 and 121 together with the planar configuration illustrated in FIG. 7A. The pad portions 120 and 121 are provided in a selective region on the interlayer insulating film 119. The pad portion 120 is for connecting the floating diffusions FD (floating diffusions FD1, FD2, FD3, and FD4) of the respective pixels 541A, 541B, 541C, and 541D to each other. For example, the pad portion 120 is arranged at the central portion of the pixel sharing unit 539 in plan view, for each pixel sharing unit 539 (FIG. 7B). The pad portion 120 is provided across the pixel isolation portion 117, and is arranged to overlap at least a part of each of the floating diffusions FD1, FD2, FD3, and FD4 (FIGS. 6 and 7B). Specifically, the pad portion 120 is formed in a region that overlaps at least a portion of each of the plurality of floating diffusions FD (floating diffusions FD1, FD2, FD3, and FD4) sharing the pixel circuit 210 and at least a portion of the pixel isolation portion 117 formed between the plurality of photodiodes PD (photodiodes PD1, PD2, PD3, and PD4) sharing the pixel circuit 210, in a direction perpendicular to the front surface of the semiconductor layer 100S. The interlayer insulating film 119 is provided with a connection via 120C for electrically connecting the pad portion 120 and the floating diffusions FD1, FD2, FD3, and FD4. The connection via 120C is provided in each of the pixels 541A, 541B, 541C, and 541D. For example, by embedding a portion of the pad portion 120 in the connection via 120C, the pad portion 120 and the floating diffusions FD1, FD2, FD3, and FD4 are electrically connected.

The pad portion 121 is for connecting the plurality of VSS contact regions 118 to each other. For example, the VSS contact region 118 provided in the pixels 541C and 541D of one pixel sharing unit 539 and the VSS contact region 118 provided in the pixels 541A and 541B of the other pixel sharing unit 539, the one pixel sharing unit 539 and the other pixel sharing unit 539 being adjacent in the V direction, are electrically connected by the pad portion 121. The pad portion 121 is provided across the pixel isolation portion 117, for example, and is arranged to overlap at least a portion of each of the four VSS contact regions 118. Specifically, the pad portion 121 is formed in a region that overlaps at least a portion of each of the plurality of VSS contact regions 118 and at least a portion of the pixel isolation portion 117 formed between the plurality of VSS contact regions 118, in a direction perpendicular to the front surface of the semiconductor layer 100S. The interlayer insulating film 119 is provided with a connection via 121C for electrically connecting the pad portion 121 and the VSS contact regions 118. The connection via 121C is provided in each of the pixels 541A, 541B, 541C, and 541D. For example, by embedding a portion of the pad portion 121 in the connection via 121C, the pad portion 121 and the VSS contact regions 118 are electrically connected. For example, the pad portion 120 and the pad portion 121 of each of the plurality of pixel sharing units 539 arranged in the V direction are arranged at substantially the same position in the H direction (FIG. 7B).

By providing the pad portion 120, the wire for the connection from each floating diffusion FD to the pixel circuit 210 (for example, the gate electrode of the amplification transistor AMP) can be reduced in the entire chip. Similarly, by providing the pad portion 121, the wire for supplying a potential to each VSS contact region 118 can be reduced in the entire chip. As a result, it is possible to reduce the area of the entire chip, suppress the electrical interference between the wires in the miniaturized pixel, and/or reduce the cost by reducing the number of components.

The pad portions 120 and 121 can be provided at desired positions in the first substrate 100 and the second substrate 200. Specifically, the pad portions 120 and 121 can be provided in either the wire layer 100T or an insulating region 212 of the semiconductor layer 200S. In a case where the pad portions 120 and 121 are provided in the wire layer 100T, the pad portions 120 and 121 may be in direct contact with the semiconductor layer 100S. Specifically, the pad portions 120 and 121 may be directly connected to at least a portion of each of the floating diffusion FD and/or the VSS contact region 118. In addition, the connection vias 120C and 121C may be provided from the floating diffusion FD and/or the VSS contact region 118 connected to the pad portions 120 and 121, respectively, and the pad portions 120 and 121 may be provided at desired positions of the wire layer 100T and the insulating region 2112 of the semiconductor layer 200S.

In particular, in a case where the pad portions 120 and 121 are provided in the wire layer 100T, the wire for the connection to the floating diffusion FD and/or the VSS contact region 118 in the insulating region 212 of the semiconductor layer 200S can be reduced. As a result, in the second substrate 200 where the pixel circuit 210 is formed, the area of the insulating region 212 for forming the through-wire for connecting the floating diffusion FD to the pixel circuit 210 can be reduced. Therefore, it is possible to secure a large area of the second substrate 200 where the pixel circuit 210 is formed. By securing the area of the pixel circuit 210, it is possible to form a large pixel transistor, and contribute to the improvement of the image quality by noise reduction or the like.

In particular, in a case where the FTI structure is used for the pixel isolation portion 117, since it is preferable to provide the floating diffusion FD and/or the VSS contact region 118 in each pixel 541, the wire that connects the first substrate 100 to the second substrate 200 can be greatly reduced by using the configurations of the pad portions 120 and 121.

Furthermore, as illustrated in FIG. 7B, for example, the pad portion 120 to which the plurality of floating diffusions FD are connected and the pad portion 121 to which the plurality of VSS contact regions 118 are connected are alternately arranged linearly in the V direction. Furthermore, the pad portions 120 and 121 are formed at positions surrounded by the plurality of photodiodes PD, the plurality of transfer gates TG, and the plurality of floating diffusions FD. As a result, in the first substrate 100 forming a plurality of elements, elements other than the floating diffusion FD and the VSS contact region 118 can be freely arranged, and the efficiency of the layout of the entire chip can be improved. Furthermore, symmetry in the layout of the elements formed in each pixel sharing unit 539 is secured, and variations in characteristics of each pixel 541 can be suppressed.

The pad portions 120 and 121 are formed of, for example, polysilicon (Poly Si), more specifically, doped polysilicon doped with impurities. The pad portions 120 and 121 are preferably formed of a conductive material having high heat resistance such as polysilicon, tungsten (W), titanium (Ti), or titanium nitride (TiN). As a result, the pixel circuit 210 can be formed after the semiconductor layer 200S of the second substrate 200 is bonded to the first substrate 100. Hereinafter, the reason will be described. Note that, in the following description, a method of forming the pixel circuit 210 after bonding the first substrate 100 and the semiconductor layer 200S of the second substrate 200 is referred to as a first manufacturing method.

Here, it is also conceivable to form the pixel circuit 210 on the second substrate 200 and then bond the second substrate 200 to the first substrate 100 (hereinafter referred to as a second manufacturing method). In the second manufacturing method, an electrode for electrical connection is formed in advance on each of the front surface of the first substrate 100 (the front surface of the wire layer 100T) and the front surface of the second substrate 200 (the front surface of the wire layer 200T). When the first substrate 100 and the second substrate 200 are bonded to each other, at the same time, the electrodes for electrical connection that are respectively formed on the front surface of the first substrate 100 and the front surface of the second substrate 200 are brought into contact with each other. As a result, the electrical connection is formed between the wire included in the first substrate 100 and the wire included in the second substrate 200. Therefore, by adopting the configuration of the imaging device 1 using the second manufacturing method, for example, manufacturing can be performed using an appropriate process according to the configuration of each of the first substrate 100 and the second substrate 200, and an imaging device with high quality and high performance can be manufactured.

In such a second manufacturing method, when the first substrate 100 and the second substrate 200 are bonded to each other, an error in alignment may occur due to a manufacturing apparatus for bonding. In addition, the first substrate 100 and the second substrate 200 have a size of, for example, about several tens of centimeters in diameter, but when the first substrate 100 and the second substrate 200 are bonded to each other, there is a possibility that expansion and contraction of the substrates occur in microscopic regions of the respective portions of the first substrate 100 and the second substrate 200. This expansion and contraction of the substrates is caused by a slight shift in the timing at which the substrates are brought into contact with each other. Due to such expansion and contraction of the first substrate 100 and the second substrate 200, an error may occur in the positions of the electrodes for electrical connection that are respectively formed on the front surface of the first substrate 100 and the front surface of the second substrate 200. In the second manufacturing method, it is preferable to take measures so that the electrodes of the first substrate 100 and the second substrate 200 are brought into contact with each other even if such an error occurs. Specifically, at least one, preferably both, of the electrodes of the first substrate 100 and the second substrate 200 is increased in consideration of the above error. Therefore, when the second manufacturing method is used, for example, the size (the size in the substrate planar direction) of the electrode formed on the front surface of the first substrate 100 or the second substrate 200 is larger than the size of the internal electrode extending from the inside of the first substrate 100 or the second substrate 200 to the front surface in the thickness direction.

On the other hand, the pad portions 120 and 121 are formed of a conductive material having heat resistance, so that the first manufacturing method can be used. In the first manufacturing method, after the first substrate 100 including the photodiode PD, the transfer transistor TR, and the like is formed, the first substrate 100 and the second substrate 200 (the semiconductor layer 2000S) are bonded to each other. In this case, the second substrate 200 is in a state in which patterns such as active elements and wire layers constituting the pixel circuit 210 are not formed. Since the second substrate 200 is in a state before the pattern is formed, even if an error occurs in the bonding position when the first substrate 100 and the second substrate 200 are bonded together, this bonding error does not cause an error in alignment between the pattern of the first substrate 100 and the pattern of the second substrate 200. This is because the pattern of the second substrate 200 is formed after the first substrate 100 and the second substrate 200 are bonded. When a pattern is formed on the second substrate, for example, in an exposure apparatus for pattern formation, the pattern is formed while the pattern formed on the first substrate is set as an alignment target. For the above reason, the error in the bonding position between the first substrate 100 and the second substrate 200 does not cause a problem in manufacturing the imaging device 1 in the first manufacturing method. For the same reason, the error due to the expansion and contraction of the substrate occurring in the second manufacturing method does not cause a problem in manufacturing the imaging device 1 in the first manufacturing method.

In the first manufacturing method, after the first substrate 100 and the second substrate 200 (the semiconductor layer 200S) are bonded in this manner, an active element is formed on the second substrate 200. Thereafter, the through-electrodes 120E and 121E and the through-electrode TGV (FIG. 6) are formed. In the formation of the through-electrodes 120E, 121E, and TGV, for example, patterns of the through-electrodes are formed from above the second substrate 200 using reduced projection exposure by an exposure apparatus. Since the reduced exposure projection is used, even if an error occurs in the alignment between the second substrate 200 and the exposure apparatus, the magnitude of the error is only a fraction (reciprocal of the reduced exposure projection magnification) of the error of the second manufacturing method in the second substrate 200. Therefore, by adopting the configuration of the imaging device 1 using the first manufacturing method, it is easy to align the elements formed on each of the first substrate 100 and the second substrate 200, and an imaging device with high quality and high performance can be manufactured.

The imaging device 1 manufactured using such a first manufacturing method has features different from those of the imaging device manufactured by the second manufacturing method. Specifically, in the imaging device 1 manufactured by the first manufacturing method, for example, the through-electrodes 120E, 121E, and TGV have substantially constant thicknesses (sizes in the substrate planar direction) from the second substrate 200 to the first substrate 100. Alternatively, when the through-electrodes 120E, 121E, and TGV have a tapered shape, the through-electrodes 120E, 121E, and TGV have a tapered shape with a constant inclination. In the imaging device 1 including such through-electrodes 120E, 121E, and TGV, the pixel 541 is easily miniaturized.

Here, when the imaging device 1 is manufactured by the first manufacturing method, since the active element is formed on the second substrate 200 after the first substrate 100 and the second substrate 200 (the semiconductor layer 200S) are bonded to each other, the first substrate 100 is also affected by the heating treatment necessary for forming the active element. Therefore, as described above, it is preferable to use a conductive material having high heat resistance for the pad portions 120 and 121 provided on the first substrate 100. For example, the pad portions 120 and 121 is preferably formed of a material having a higher melting point (that is, higher heat resistance) than at least a portion of the wire material included in the wire layer 200T of the second substrate 200. For example, a conductive material having high heat resistance such as doped polysilicon, tungsten, titanium, or titanium nitride is used for the pad portions 120 and 121. As a result, the imaging device 1 can be manufactured using the first manufacturing method.

The passivation film 122 is provided over the entire front surface of the semiconductor layer 100S so as to cover the pad portions 120 and 121, for example (FIG. 6). The passivation film 122 is formed of, for example, a silicon nitride (SiN) film. The interlayer insulating film 123 covers the pad portions 120 and 121 with the passivation film 122 interposed therebetween. The interlayer insulating film 123 is provided over the entire front surface of the semiconductor layer 100S, for example. The interlayer insulating film 123 is formed of, for example, a silicon oxide (SiO) film. The bonding film 124 is provided on a bonding surface between the first substrate 100 (specifically, the wire layer 100T) and the second substrate 200. That is, the bonding film 124 is in contact with the second substrate 200. The bonding film 124 is provided over the entire main surface of the first substrate 100. The bonding film 124 is formed of, for example, a silicon nitride film.

The light receiving lens 401 faces the semiconductor layer 100S with the fixed charge film 112 and the insulating film 111 interposed therebetween, for example (FIG. 6). The light receiving lens 401 is provided, for example, at a position facing the photodiode PD of each of the pixels 541A, 541B, 541C, and 541D.

The second substrate 200 has the semiconductor layer 200S and the wire layer 200T in this order from the first substrate 100 side. The semiconductor layer 200S is formed of a silicon substrate. In the semiconductor layer 200S, a well region 211 is provided over the thickness direction. The well region 211 is, for example, a p-type semiconductor region. The second substrate 20 is provided with the pixel circuit 210 arranged for each pixel sharing unit 539. The pixel circuit 210 is provided, for example, on the front surface side (wire layer 200T side) of the semiconductor layer 200S. In the imaging device 1, the second substrate 200 is bonded to the first substrate 100 such that the back surface side (the semiconductor layer 200S side) of the second substrate 200 faces the front surface side (the wire layer 100T side) of the first substrate 100. That is, the second substrate 200 is bonded to the first substrate 100 in a face-to-back manner.

Figure 8:
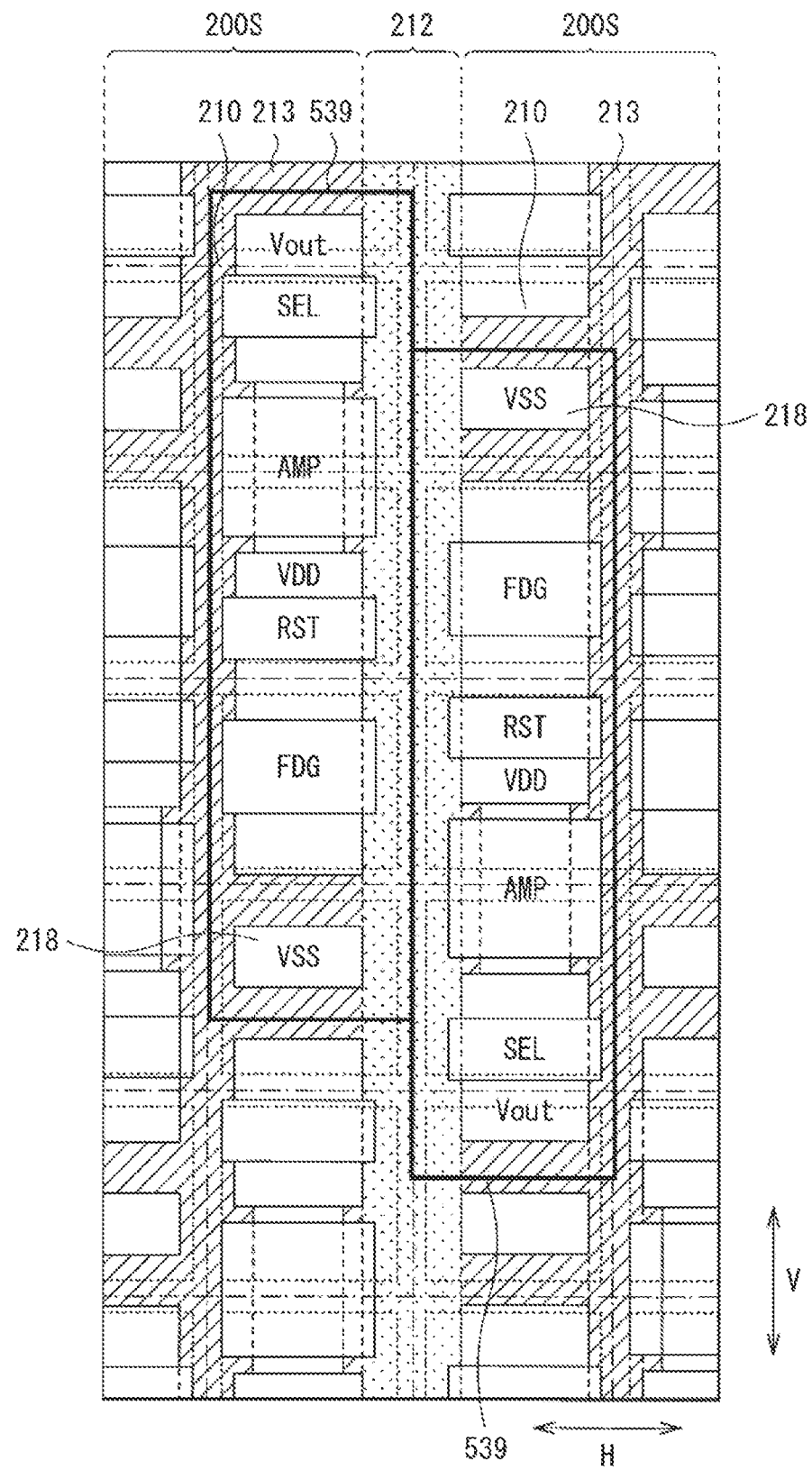
FIG. 8 is a schematic view illustrating an example of a planar configuration of a second substrate (semiconductor layer) illustrated in FIG. 6.
Figure 9:
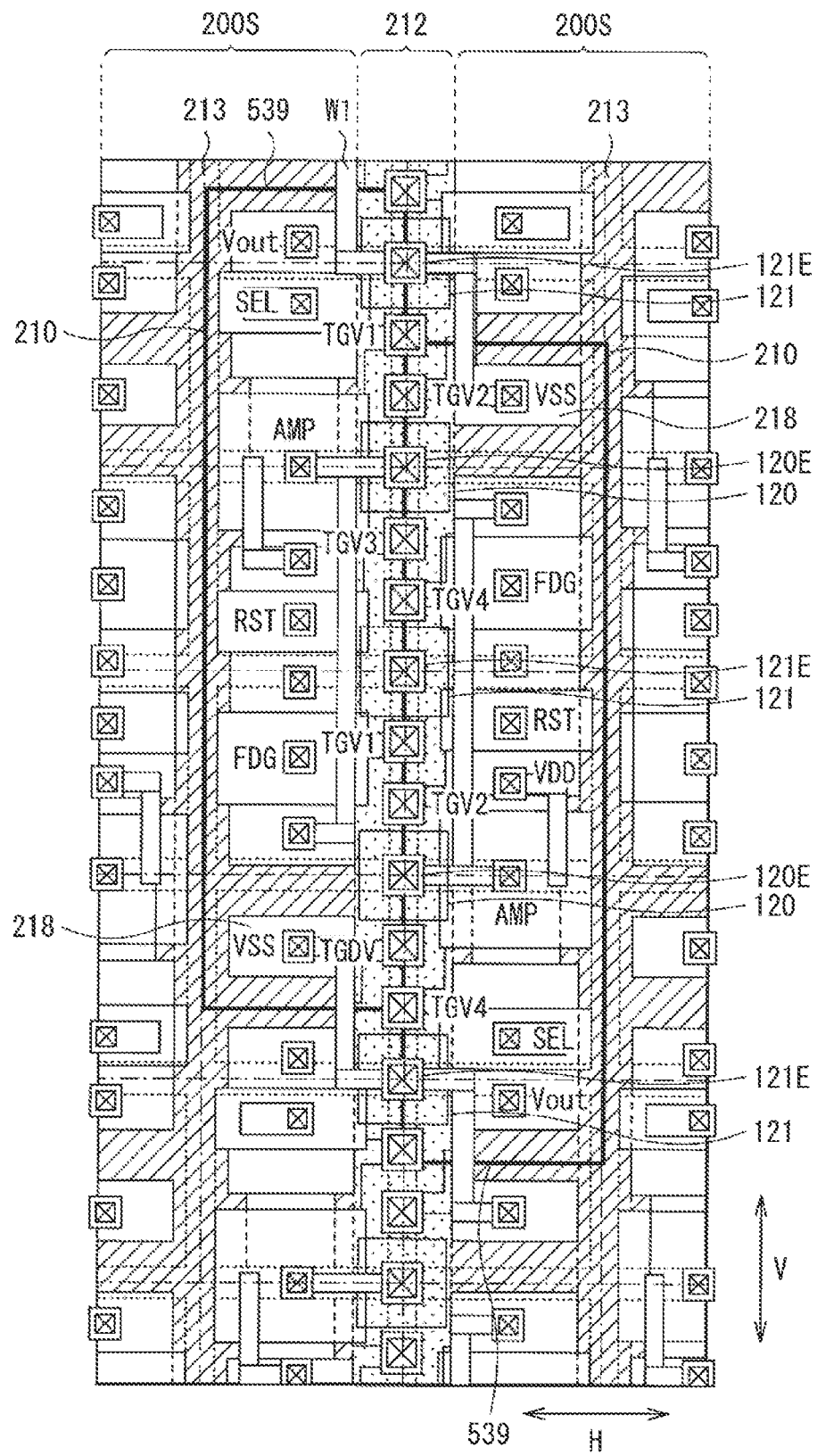
FIG. 9 is a schematic view illustrating an example of a planar configuration of a pixel circuit and the main part of the first substrate together with a first wire layer illustrated in FIG. 6.
Figure 10:
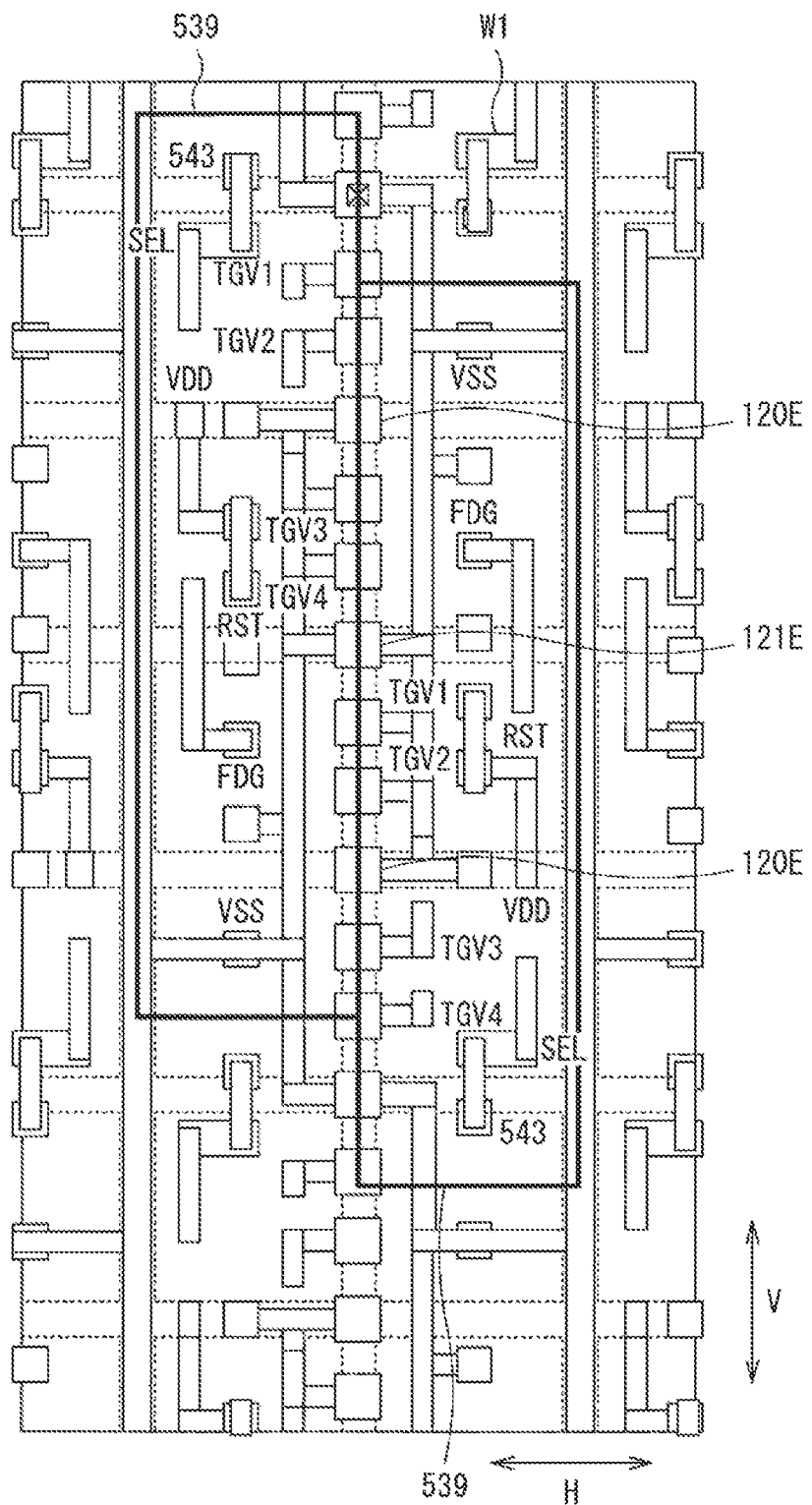
FIG. 10 is a schematic view illustrating an example of a planar configuration of the first wire layer and a second wire layer illustrated in FIG. 6.
Figure 11:
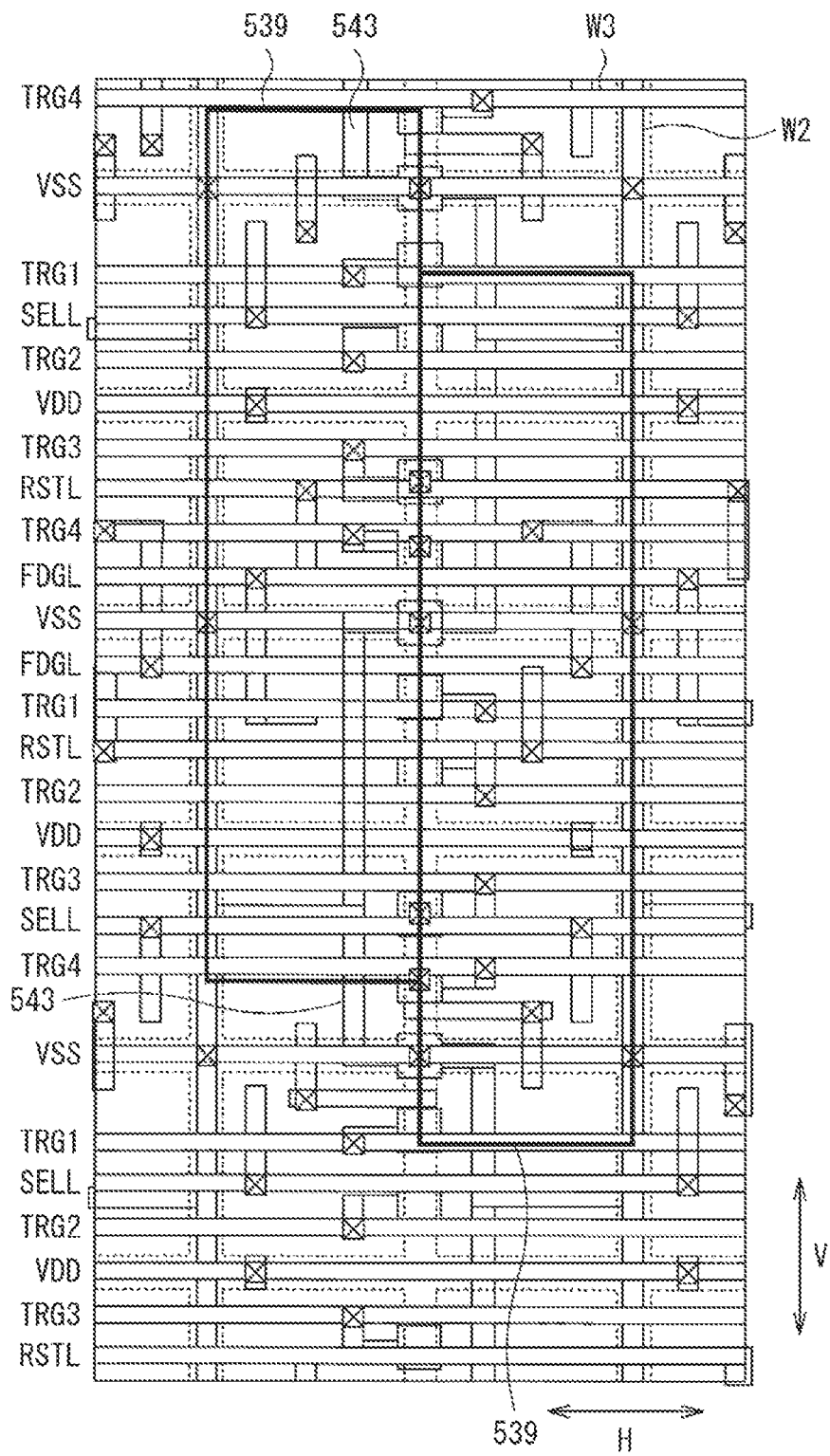
FIG. 11 is a schematic view illustrating an example of a planar configuration of the second wire layer and a third wire layer illustrated in FIG. 6.
Figure 12:
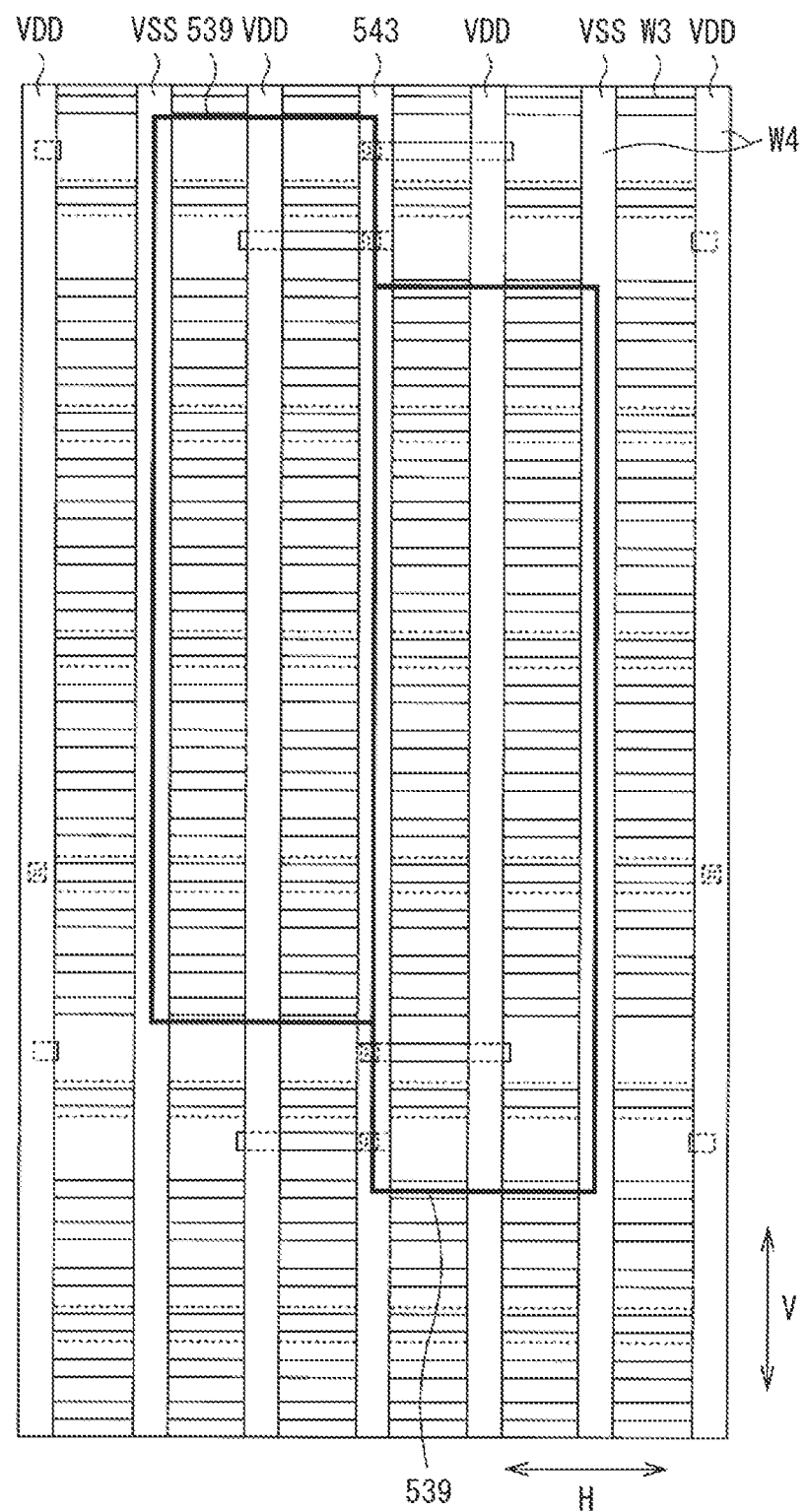
FIG. 12 is a schematic view illustrating an example of a planar configuration of the third wire layer and a fourth wire layer illustrated in FIG. 6.

FIGS. 8 to 12 schematically illustrate an example of the planar configuration of the second substrate 200. FIG. 8 illustrates a configuration of the pixel circuit 210 provided near the front surface of the semiconductor layer 200S. FIG. 9 schematically illustrates a configuration of the wire layer 200T (specifically, a first wire layer W1 described later), the semiconductor layer 200S connected to the wire layer 200T, and each part of the first substrate 100. FIGS. 10 to 12 illustrate an example of the planar configuration of the wire layer 200T. Hereinafter, the configuration of the second substrate 200 will be described with reference to FIGS. 8 to 12 together with FIG. 6. In FIGS. 8 and 9, the outer shape of the photodiode PD (the boundary between the pixel isolation portion 117 and the photodiode PD) is indicated by a broken line, and the boundary between the semiconductor layer 200S and an element isolation region 213 or an insulating region 214 in a portion overlapping the gate electrode of each transistor constituting the pixel circuit 210 is indicated by a dotted line. In a portion overlapping the gate electrode of the amplification transistor AMP, a boundary between the semiconductor layer 200S and the element isolation region 213 and a boundary between the element isolation region 213 and the insulating region 212 are provided on one side in a channel width direction.

The second substrate 200 is provided with the insulating region 212 that divides the semiconductor layer 200S, and the element isolation region 213 provided in a portion of the semiconductor layer 200S in the thickness direction (FIG. 6). For example, the through-electrodes 120E and 121E and the through-electrodes TGV (through-electrodes TGV1, TGV2, TGV3, and TGV4) of two pixel sharing units 539 connected to two pixel circuits 210 that are adjacent in the H direction are arranged in the insulating region 212 provided between the two pixel circuits 210 (FIG. 9).

The insulating region 212 has substantially the same thickness as the thickness of the semiconductor layer 200S (FIG. 6). The semiconductor layer 200S is divided by the insulating region 212. The through-electrodes 120E and 121E and the through-electrodes TGV are arranged in the insulating region 212. The insulating region 212 is formed of, for example, silicon oxide.

The through-electrodes 120E and 121E are provided to penetrate the insulating region 212 in the thickness direction. The upper ends of the through-electrodes 120E and 121E are connected to the wire (first wire W1, second wire W2, third wire W3, and fourth wire W4 described later) of the wire layer 200T. The through-electrodes 120E and 121E are provided to penetrate the insulating region 212, the bonding film 124, the interlayer insulating film 123, and the passivation film 122, and the lower ends of the through-electrodes 120E and 121E are connected to the pad portions 120 and 121 (FIG. 6). The through-electrode 120E is for electrically connecting the pad portion 120 and the pixel circuit 210. That is, the floating diffusion FD of the first substrate 100 is electrically connected to the pixel circuit 210 of the second substrate 200 by the through-electrode 120E. The through-electrode 121E is for electrically connecting the pad portion 121 and the reference potential line VSS of the wire layer 200T. That is, the VSS contact region 118 of the first substrate 100 is electrically connected to the reference potential line VSS of the second substrate 200 by the through-electrode 121E.

The through-electrode TGV is provided to penetrate the insulating region 212 in the thickness direction. The upper end of the through-electrode TGV is connected to the wire of the wire layer 200T. The through-electrode TGV is provided to penetrate the insulating region 212, the bonding film 124, the interlayer insulating film 123, the passivation film 122, and the interlayer insulating film 119, and the lower end of the through-electrode TGV is connected to the transfer gate TG (FIG. 6). Such a through-electrode TGV is for electrically connecting the transfer gate TG (transfer gates TG1, TG2, TG3, and TG4) of each of the pixels 541A, 541B, 541C, and 541D to the wire (a part of the row drive signal line 542, specifically, wires TRG1, TRG2, TRG3, and TRG4 in FIG. 11 described later) of the wire layer 200T. That is, the transfer gate TG of the first substrate 100 is electrically connected to the wire TRG of the second substrate 200 by the through-electrode TGV, and a drive signal is transmitted to each of the transfer transistors TR (the transfer transistors TR1, TR2, TR3, and TR4).

The insulating region 212 is a region for insulating the through-electrodes 120E and 121E and the through-electrode TGV, which are for electrically connecting the first substrate 100 to the second substrate 200, from the semiconductor layer 200S. For example, the through-electrodes 120E and 121E and the through-electrodes TGV (through-electrodes TGV1, TGV2, TGV3, and TGV4) connected to two pixel circuits 210 that are adjacent in the H direction are arranged in the insulating region 212 provided between the two pixel circuits 210 (the pixel sharing units 539). The insulating region 212 is provided, for example, to extend in the V direction (FIGS. 8 and 9). Here, by devising the arrangement of the horizontal portion TGb of the transfer gate TG, the through-electrode TGV is arranged such that the position of the through-electrode TGV in the H direction is close to the positions of the through-electrodes 120E and 121E in the H direction as compared with the position of the vertical portion TGa (FIGS. 7A and 9). For example, the through-electrode TGV is arranged at substantially the same position as the through-electrodes 120E and 120E in the H direction. As a result, the through-electrodes 120E and 121E and the through-electrode TGV can be collectively provided in the insulating region 212 extending in the V direction. As another arrangement example, it is also conceivable to provide the horizontal portion TGb only in a region overlapping the vertical portion TGa. In this case, the through-electrode TGV is formed substantially immediately above the vertical portion TGa, and for example, the through-electrode TGV is arranged substantially at the central portion of each pixel 541 in the H direction and the V direction. In this case, the position of the through-electrode TGV in the H direction greatly deviates from the positions of the through-electrodes 120E and 121E in the H direction. For example, the insulating region 212 is provided around the through-electrode TGV and the through-electrodes 120E and 121E in order to electrically insulate the through-electrode TGV and the through-electrodes 120E and 121E from the adjacent semiconductor layer 200S. In a case where the position of the through-electrode TGV in the H direction and the positions of the through-electrodes 120E and 121E in the H direction are greatly separated from each other, it is necessary to independently provide the insulating region 212 around each of the through-electrodes 120E, 121E, and TGV. As a result, the semiconductor layer 200S is finely divided. In comparison, the layout in which the through-electrodes 120E and 121E and the through-electrode TGV are collectively arranged in the insulating region 212 extending in the V direction can increase the size of the semiconductor layer 200S in the H direction. Therefore, a large area of the semiconductor element formation region in the semiconductor layer 200S can be secured. As a result, for example, the size of the amplification transistor AMP can be increased, and noise can be suppressed.

As described with reference to FIG. 4, the pixel sharing unit 539 has a structure in which the floating diffusions FD respectively provided in the plurality of pixels 541 are electrically connected, and the plurality of pixels 541 shares one pixel circuit 210. The floating diffusions FD are electrically connected by the pad portion 120 provided on the first substrate 100 (FIGS. 6 and 7B). The electrical connection portion (pad portion 120) provided on the first substrate 100 and the pixel circuit 210 provided on the second substrate 200 are electrically connected through one through-electrode 120E. As another structure example, it is also conceivable to provide an electrical connection portion between the floating diffusions FD on the second substrate 200. In this case, the pixel sharing unit 539 is provided with four through-electrodes respectively connected to the floating diffusions FD1, FD2, FD3, and FD4. Therefore, in the second substrate 200, the number of through-electrodes penetrating the semiconductor layer 200S is increased, and the insulating region 212 that insulates the periphery of these through-electrodes is increased. In comparison, in the structure in which the pad portion 120 is provided on the first substrate 100 (FIGS. 6 and 7B), the number of through-electrodes can be reduced, and the insulating region 212 can be reduced. Therefore, a large area of the semiconductor element formation region in the semiconductor layer 200S can be secured. As a result, for example, the size of the amplification transistor AMP can be increased, and noise can be suppressed.

The element isolation region 213 is provided on the front surface side of the semiconductor layer 200S. The element isolation region 213 has a shallow trench isolation (STI) structure. In the element isolation region 213, the semiconductor layer 200S is dug in the thickness direction (the direction perpendicular to the main surface of the second substrate 200), and an insulating film is embedded in the dug portion. This insulating film is formed of, for example, silicon oxide. The element isolation region 213 isolates the plurality of transistors constituting the pixel circuit 210 from each other in accordance with the layout of the pixel circuit 210. The semiconductor layer 200S (specifically, the well region 211) extends below the element isolation region 213 (deep portion of the semiconductor layer 200S).

Here, with reference to FIGS. 7A, 7B, and 8, a difference between the outer shape (the outer shape in the substrate planar direction) of the pixel sharing unit 539 on the first substrate 100 and the outer shape of the pixel sharing unit 539 on the second substrate 200 will be described.

In the imaging device 1, the pixel sharing unit 539 is provided over both the first substrate 100 and the second substrate 200. For example, the outer shape of the pixel sharing unit 539 provided on the first substrate 100 is different from the outer shape of the pixel sharing unit 539 provided on the second substrate 200.

In FIGS. 7A and 7B, the outline of the pixels 541A, 541B, 541C, and 541D is represented by a one-dot chain line, and the outer shape of the pixel sharing unit 539 is represented by a thick line. For example, the pixel sharing unit 539 of the first substrate 100 includes two pixels 541 (pixels 541A and 541B) arranged adjacent to each other in the H direction, and two pixels 541 (pixels 541C and 541D) arranged adjacent to each other in the V direction. That is, the pixel sharing unit 539 of the first substrate 100 includes four pixels 541 in adjacent 2 rows×2 columns, and the pixel sharing unit 539 of the first substrate 100 has a substantially square outer shape. In the pixel array portion 540, such pixel sharing units 539 are arranged adjacent to each other at a two-pixel pitch (a pitch corresponding to two pixels 541) in the H direction and a two-pixel pitch (a pitch corresponding to two pixels 541) in the V direction.

In FIGS. 8 and 9, the outline of the pixels 541A, 541B, 541C, and 541D is represented by a one-dot chain line, and the outer shape of the pixel sharing unit 539 is represented by a thick line. For example, the outer shape of the pixel sharing unit 539 of the second substrate 200 is smaller than that of the pixel sharing unit 539 of the first substrate 100 in the H direction, and is larger than that of the pixel sharing unit 539 of the first substrate 100 in the V direction. For example, the pixel sharing unit 539 of the second substrate 200 is formed in a size (region) corresponding to one pixel in the H direction, and is formed in a size corresponding to four pixels in the V direction. That is, the pixel sharing unit 539 of the second substrate 200 is formed in a size corresponding to the pixels arranged in adjacent 1 row×4 columns, and the pixel sharing unit 539 of the second substrate 200 has a substantially rectangular outer shape.

For example, in each pixel circuit 210, the selection transistor SEL, the amplification transistor AMP, the reset transistor RST, and the FD conversion gain switching transistor FDG are arranged in this order in the V direction (FIG. 8). By providing the outer shape of each pixel circuit 210 in a substantially rectangular shape as described above, four transistors (the selection transistor SEL, the amplification transistor AMP, the reset transistor RST, and the FD conversion gain switching transistor FDG) can be arranged side by side in one direction (V direction in FIG. 8). As a result, the drain of the amplification transistor AMP and the drain of the reset transistor RST can be shared in one diffusion region (diffusion region connected to the power supply line VDD). For example, the formation region of each pixel circuit 210 can be provided in a substantially square shape (refer to FIG. 21 described later). In this case, two transistors are arranged along one direction, and it is difficult to share the drain of the amplification transistor AMP and the drain of the reset transistor RST in one diffusion region. Therefore, by providing the formation region of the pixel circuit 210 in a substantially rectangular shape, the four transistors can be easily arranged close to each other, and the formation region of the pixel circuit 210 can be reduced. That is, the pixels can be miniaturized. Furthermore, when it is unnecessary to reduce the formation region of the pixel circuit 210, the formation region of the amplification transistor AMP can be increased, and noise can be suppressed.

For example, a VSS contact region 218 connected to the reference potential line VSS is provided near the front surface of the semiconductor layer 200S, in addition to the selection transistor SEL, the amplification transistor AMP, the reset transistor RST, and the FD conversion gain switching transistor FDG. The VSS contact region 218 includes, for example, a p-type semiconductor region. The VSS contact region 218 is electrically connected to the VSS contact region 118 of the first substrate 100 (the semiconductor layer 100S) through the wire of the wire layer 200T and the through-electrode 121E. The VSS contact region 218 is provided, for example, at a position adjacent to the source of the FD conversion gain switching transistor FDG with the element isolation region 213 interposed therebetween (FIG. 8).

Next, a positional relationship between the pixel sharing unit 539 provided on the first substrate 100 and the pixel sharing unit 539 provided on the second substrate 200 will be described with reference to FIGS. 7B and 8. For example, one pixel sharing unit 539 (for example, the upper side of the paper surface of FIG. 7B) of the two pixel sharing units 539 arranged in the V direction on the first substrate 100 is connected to one pixel sharing unit 539 (for example, the left side of the paper surface of FIG. 8) of the two pixel sharing units 539 arranged in the H direction on the second substrate 200. For example, the other pixel sharing unit 539 (for example, the lower side of the paper surface of FIG. 7B) of the two pixel sharing units 539 arranged in the V direction on the first substrate 100 is connected to the other pixel sharing unit 539 (for example, the right side of the paper surface of FIG. 8) of the two pixel sharing units 539 arranged in the H direction on the second substrate 200.

For example, in the two pixel sharing units 539 arranged in the H direction on the second substrate 200, the internal layout (arrangement of the transistors and the like) of one pixel sharing unit 539 is substantially equal to the layout obtained by inverting the internal layout of the other pixel sharing unit 539 in the V direction and the H direction. Hereinafter, effects obtained by this layout will be described.

In the two pixel sharing units 539 arranged in the V direction on the first substrate 100, each pad portion 120 is arranged at the central portion of the outer shape of the pixel sharing unit 539, that is, at the central portion of the pixel sharing unit 539 in the V direction and the H direction (FIG. 7B). On the other hand, since the pixel sharing unit 539 of the second substrate 200 has a substantially rectangular outer shape long in the V direction as described above, for example, the amplification transistor AMP connected to the pad portion 120 is arranged at a position shifted upward in the paper surface from the center of the pixel sharing unit 539 in the V direction. For example, when the internal layouts of the two pixel sharing units 539 arranged in the H direction on the second substrate 200 are the same, the distance between the amplification transistor AMP of one pixel sharing unit 539 and the pad portion 120 (for example, the pad portion 120 of the pixel sharing unit 539 on the upper side of the paper surface of FIG. 7) becomes relatively short. However, the distance between the amplification transistor AMP of the other pixel sharing unit 539 and the pad portion 120 (for example, the pad portion 120 of the pixel sharing unit 539 on the lower side of the paper surface of FIG. 7) becomes long. For this reason, the area of the wire required for the connection between the amplification transistor AMP and the pad portion 120 is increased, and the wire layout of the pixel sharing unit 539 may become complicated. This may affect miniaturization of the imaging device 1.

On the other hand, the internal layout of the two pixel sharing units 539 arranged in the H direction on the second substrate 200 are inverted at least in the V direction, so that the distance between the amplification transistor AMP and the pad portion 120 of both of the two pixel sharing units 539 can be shortened. Therefore, it is easy to miniaturize the imaging device 1 as compared with a configuration in which the internal layouts of the two pixel sharing units 539 arranged in the H direction on the second substrate 200 are the same. Note that the planar layouts of the plurality of pixel sharing units 539 of the second substrate 200 are bilaterally symmetrical in the range illustrated in FIG. 8, but are bilaterally asymmetrical when the layout of the first wire layer W1 illustrated in FIG. 9 described later is included.

Furthermore, it is preferable that the internal layouts of the two pixel sharing units 539 arranged in the H direction on the second substrate 200 are also inverted in the H direction. Hereinafter, the reason will be described. As illustrated in FIG. 9, each of the two pixel sharing units 539 arranged in the H direction on the second substrate 200 is connected to the pad portions 120 and 121 of the first substrate 100. For example, the pad portions 120 and 121 are arranged at the central portion of the two pixel sharing units 539 in the H direction (between the two pixel sharing units 539 arranged in the H direction), the two pixel sharing units 539 being arranged in the H direction on the second substrate 200. Therefore, the internal layouts of the two pixel sharing units 539 arranged in the H direction on the second substrate 200 are inverted also in the H direction, so that it is possible to reduce the distance between each of the plurality of pixel sharing units 539 of the second substrate 200 and the pad portions 120 and 121. That is, it is easier to miniaturize the imaging device 1.

Furthermore, the position of the outline of the pixel sharing unit 539 of the second substrate 200 may not be aligned with the position of any outline of the pixel sharing unit 539 of the first substrate 100. For example, in one pixel sharing unit 539 (for example, the left side of the paper surface of FIG. 9) of the two pixel sharing units 539 arranged in the H direction on the second substrate 200, the outline on one side (for example, the upper side of the paper surface of FIG. 9) in the V direction is arranged outside the outline, which is on one side in the V direction, of the corresponding pixel sharing unit 539 (for example, the upper side of the paper surface of FIG. 7B) of the first substrate 100. Furthermore, in the other pixel sharing unit 539 (for example, the right side of the paper surface of FIG. 9) of the two pixel sharing units 539 arranged in the H direction on the second substrate 200, the outline on the other side (for example, the lower side of the paper surface of FIG. 9) in the V direction is arranged outside the outline, which is on the other side in the V direction, of the corresponding pixel sharing unit 539 (for example, the lower side of the paper surface of FIG. 7B) of the first substrate 100. As described above, by arranging the pixel sharing unit 539 of the second substrate 200 and the pixel sharing unit 539 of the first substrate 100 with each other, the distance between the amplification transistor AMP and the pad portion 120 can be shortened. Therefore, it is easy to miniaturize the imaging device 1.

Furthermore, the positions of the outlines of the plurality of pixel sharing units 539 of the second substrate 200 may not be aligned. For example, the two pixel sharing units 539 arranged in the H direction on the second substrate 200 are arranged such that the positions of the outlines in the V direction are shifted. As a result, the distance between the amplification transistor AMP and the pad portion 120 can be shortened. Therefore, it is easy to miniaturize the imaging device 1.

The repetitive arrangement of the pixel sharing units 539 in the pixel array portion 540 will be described with reference to FIGS. 7B and 9. The pixel sharing unit 539 of the first substrate 100 has a size of two pixels 541 in the H direction and a size of two pixels 541 in the V direction (FIG. 7B). For example, in the pixel array portion 540 of the first substrate 100, the pixel sharing units 539 having a size corresponding to four pixels 541 are repeatedly arranged adjacent to each other at a two-pixel pitch (a pitch corresponding to two pixels 541) in the H direction and a two-pixel pitch (a pitch corresponding to two pixels 541) in the V direction. Alternatively, in the pixel array portion 540 of the first substrate 100, pairs of pixel sharing units 539 in which two pixel sharing units 539 are arranged adjacent to each other in the V direction may be provided. In the pixel array portion 540 of the first substrate 100, the pairs of pixel sharing units 539 are repeatedly arranged adjacent to each other at a two-pixel pitch (a pitch corresponding to two pixels 541) in the H direction and a four-pixel pitch (a pitch corresponding to four pixels 541) in the V direction. The pixel sharing unit 539 of the second substrate 200 has a size of one pixel 541 in the H direction and a size of four pixels 541 in the V direction (FIG. 9). For example, in the pixel array portion 540 of the second substrate 200, pairs of pixel sharing units 539, each pair including two pixel sharing units 539 having a size corresponding to the four pixels 541, are provided. The pixel sharing units 539 are arranged adjacent to each other in the H direction, and are arranged to be shifted in the V direction. In the pixel array portion 540 of the second substrate 200, the pairs of pixel sharing units 539 are repeatedly arranged adjacent to each other without a gap at a two-pixel pitch (a pitch corresponding to two pixels 541) in the H direction and a four-pixel pitch (a pitch corresponding to four pixels 541) in the V direction. Such repetitive arrangement of the pixel sharing units 539 enables the pixel sharing units 539 to be arranged without a gap. Therefore, it is easy to miniaturize the imaging device 1.

It is preferable that the amplification transistor AMP has, for example, a three-dimensional structure such as a Fin type (FIG. 6). As a result, the size of the effective gate width is increased, and noise can be suppressed. The selection transistor SEL, the reset transistor RST, and the FD conversion gain switching transistor FDG have, for example, a planar structure. The amplification transistor AMP may have a planar structure. Alternatively, the selection transistor SEL, the reset transistor RST, or the FD conversion gain switching transistor FDG may have a three-dimensional structure.

The wire layer 200T includes, for example, a passivation film 221, an interlayer insulating film 222, and a plurality of wires (first wire layer W1, second wire layer W2, third wire layer W3, and fourth wire layer W4). The passivation film 221 is, for example, in contact with the front surface of the semiconductor layer 200S, and covers the entire front surface of the semiconductor layer 200S. The passivation film 221 covers the gate electrode of each of the selection transistor SEL, the amplification transistor AMP, the reset transistor RST, and the FD conversion gain switching transistor FDG. The interlayer insulating film 222 is provided between the passivation film 221 and the third substrate 300. The plurality of wires (the first wire layer W1, the second wire layer W2, the third wire layer W3, and the fourth wire layer W4) are isolated by the interlayer insulating film 222. The interlayer insulating film 222 is formed of, for example, silicon oxide.

In the wire layer 200T, for example, the first wire layer W1, the second wire layer W2, the third wire layer W3, the fourth wire layer W4, and the contact portions 201 and 202 are provided in this order from the semiconductor layer 200S side, and these are insulated from each other by the interlayer insulating film 222. In the interlayer insulating film 222, a plurality of connection portions that connect the first wire layer W1, the second wire layer W2, the third wire layer W3, or the fourth wire layer W4 and lower layers thereof are provided. The connection portion is a portion in which a conductive material is embedded in a connection hole provided in the interlayer insulating film 222. For example, in the interlayer insulating film 222, a connection portion 218V that connects the first wire layer W1 and the VSS contact region 218 of the semiconductor layer 200S is provided. For example, the hole diameter of the connection portion connecting the elements of the second substrate 200 is different from the hole diameters of the through-electrodes 120E and 121E and the through-electrode TGV. Specifically, it is preferable that the hole diameter of the connection hole connecting the elements of the second substrate 200 is smaller than the hole diameters of the through-electrodes 120E and 121E and the through-electrode TGV. Hereinafter, the reason will be described. The depth of the connection portion (the connection portion 218V or the like) provided in the wire layer 200T is smaller than the depths of the through-electrodes 120E and 121E and the through-electrode TGV. Therefore, in the connection portion, the connection hole can be easily filled with the conductive material as compared with the through-electrodes 120E and 121E and the through-electrode TGV. By making the hole diameter of the connection portion smaller than the hole diameters of the through-electrodes 120E and 121E and the through-electrode TGV, it is easy to miniaturize the imaging device 1.

For example, the through-electrode 120E is connected to the gate of the amplification transistor AMP and the source of the FD conversion gain switching transistor FDG (specifically, the connection hole reaching the source of the FD conversion gain switching transistor FDG) by the first wire layer W1. The first wire layer W1 connects, for example, the through-electrode 121E to the connection portion 218V, and thereby the VSS contact region 218 of the semiconductor layer 200S and the VSS contact region 118 of the semiconductor layer 100S are electrically connected.

Next, a planar configuration of the wire layer 200T will be described with reference to FIGS. 10 to 12. FIG. 10 illustrates an example of a planar configuration of the first wire layer W1 and the second wire layer W2. FIG. 11 illustrates an example of a planar configuration of the second wire layer W2 and the third wire layer W3. FIG. 12 illustrates an example of a planar configuration of the third wire layer W3 and the fourth wire layer W4.

For example, the third wire layer W3 includes wires TRG1, TRG2, TRG3, TRG4, SELL, RSTL, and FDGL extending in the H direction (row direction) (FIG. 11). These wires correspond to the plurality of row drive signal lines 542 described with reference to FIG. 4. The wires TRG1, TRG2, TRG3, and TRG4 are for transmitting drive signals to the transfer gates TG1, TG2, TG3, and TG4, respectively. The wires TRG1, TRG2, TRG3, and TRG4 are respectively connected to the transfer gates TG1, TG2, TG3, and TG4 through the second wire layer W2, the first wire layer W1, and the through-electrode 120E. The wire SELL is for transmitting a drive signal to the gate of the selection transistor SEL, the wire RSTL is for transmitting a drive signal to the gate of the reset transistor RST, and the wire FDGL is for transmitting a drive signal to the gate of the FD conversion gain switching transistor FDG. The wires SELL, RSTL, and FDGL are respectively connected to the gates of the selection transistor SEL, the reset transistor RST, and the FD conversion gain switching transistor FDG through the second wire layer W2, the first wire layer W1, and the connection portion.

For example, the fourth wire layer W4 includes the power supply line VDD, the reference potential line VSS, and the vertical signal line 543 extending in the V direction (column direction) (FIG. 12). The power supply line VDD is connected to the drain of the amplification transistor AMP and the drain of the reset transistor RST through the third wire layer W3, the second wire layer W2, the first wire layer W1, and the connection portion. The reference potential line VSS is connected to the VSS contact region 218 through the third wire layer W3, the second wire layer W2, the first wire layer W1, and the connection portion 218V. In addition, the reference potential line VSS is connected to the VSS contact region 118 of the first substrate 100 through the third wire layer W3, the second wire layer W2, the first wire layer W1, the through-electrode 121E, and the pad portion 121. The vertical signal line 543 is connected to the source (Vout) of the selection transistor SEL through the third wire layer W3, the second wire layer W2, the first wire layer W1, and the connection portion.

The contact portions 201 and 202 may be provided at positions overlapping the pixel array portion 540 in plan view (for example, FIG. 3), or may be provided in the peripheral portion 540B outside the pixel array portion 540 (for example, FIG. 6). The contact portions 201 and 202 are provided on the front surface (surface on the wire layer 200T side) of the second substrate 200. The contact portions 201 and 202 are formed of metal such as copper (Cu) and aluminum (Al), for example. The contact portions 201 and 202 are exposed on the front surface (surface on the third substrate 300 side) of the wire layer 200T. The contact portions 201 and 202 are used for the electrical connection between the second substrate 200 and the third substrate 300 and for the bonding between the second substrate 200 and the third substrate 300.

FIG. 6 illustrates an example in which a peripheral circuit is provided in the peripheral portion 540B of the second substrate 200. This peripheral circuit may include a part of the row drive unit 520, a part of the column signal processing unit 550, or the like. Furthermore, as illustrated in FIG. 3, the peripheral circuit may not be arranged in the peripheral portion 540B of the second substrate 200, and the connection hole portions H1 and H2 may be arranged near the pixel array portion 540.

The third substrate 300 has, for example, the wire layer 300T and the semiconductor layer 300S in this order from the second substrate 200 side. For example, the front surface of the semiconductor layer 300S is provided on the second substrate 200 side. The semiconductor layer 300S is formed of a silicon substrate. A circuit is provided in a portion on the front surface side of the semiconductor layer 300S. Specifically, for example, at least a part of the input unit 510A, the row drive unit 520, the timing control unit 530, the column signal processing unit 550, the image signal processing unit 560, and the output unit 510B is provided in the portion on the front surface side of the semiconductor layer 300S. The wire layer 300T provided between the semiconductor layer 300S and the second substrate 200 includes, for example, an interlayer insulating film, a plurality of wire layers isolated by the interlayer insulating film, and the contact portions 301 and 302. The contact portions 301 and 302 are exposed on the front surface (the surface on the second substrate 200 side) of the wire layer 300T, the contact portion 301 is in contact with the contact portion 201 of the second substrate 200, and the contact portion 302 in contact with the contact portion 202 of the second substrate 200. The contact portions 301 and 302 are electrically connected to a circuit (for example, at least one of the input unit 510A, the row drive unit 520, the timing control unit 530, the column signal processing unit 550, the image signal processing unit 560, and the output unit 510B) formed in the semiconductor layer 300S. The contact portions 301 and 302 are formed of metal such as copper (Cu) and aluminum (Al), for example. For example, an external terminal TA is connected to the input unit 510A through the connection hole portion H1, and an external terminal TB is connected to the output unit 510B through the connection hole portion H2.

Here, features of the imaging device 1 will be described.

In general, an imaging device mainly includes a photodiode and a pixel circuit. Here, when the area of the photodiode is increased, the charge generated as a result of photoelectric conversion is increased, as a result, a signal/noise ratio (S/N ratio) of the pixel signal is improved, and the imaging device can output better image data (image information). On the other hand, when the size of the transistor (particularly, the size of the amplification transistor) included in the pixel circuit is increased, noise generated in the pixel circuit is reduced, as a result, the S/N ratio of the imaging signal is improved, and the imaging device can output better image data (image information).

However, in an imaging device in which a photodiode and a pixel circuit are provided on the same semiconductor substrate, if the area of the photodiode is increased in a limited area of the semiconductor substrate, the size of the transistor included in the pixel circuit may be reduced. Furthermore, if the size of the transistor included in the pixel circuit is increased, the area of the photodiode may be reduced.

In order to solve these problems, for example, the imaging device 1 of the embodiment uses a structure in which a plurality of pixels 541 share one pixel circuit 210, and the shared pixel circuit 210 is arranged to be superimposed on the photodiode PD. As a result, it is possible to realize making the area of the photodiode PD as large as possible and making the size of the transistor included in the pixel circuit 210 as large as possible within the limited area of the semiconductor substrate. As a result, the S/N ratio of the pixel signal can be improved, and the imaging device 1 can output better image data (image information).

When a structure in which the plurality of pixels 541 share one pixel circuit 210 and the pixel circuit is arranged to be superimposed on the photodiode PD is realized, a plurality of wires connected to one pixel circuit 210 extend from the floating diffusion FD of each of the plurality of pixels 541. In order to secure a large area of the semiconductor substrate 200 where the pixel circuit 210 is formed, for example, a connection wire which connects a plurality of extending wires to each other and integrates the plurality of extending wires into one can be formed. Similarly, for the plurality of wires extending from the VSS contact region 118, it is possible to form a connection wire that connects the plurality of extending wires to each other and integrates the plurality of extending wires into one.

For example, when the connection wire that connects the plurality of wires extending from the floating diffusion FD of each of the plurality of pixels 541 to each other is formed in the semiconductor substrate 200 where the pixel circuit 210 is formed, an area for forming a transistor included in the pixel circuit 210 may be reduced. Similarly, when the connection wire that connects and integrates the plurality of wires extending from the VSS contact region 118 of each of the plurality of pixels 541 is formed in the semiconductor substrate 200 where the pixel circuit 210 is formed, an area for forming a transistor included in the pixel circuit 210 may be reduced.

In order to solve these problems, for example, the imaging device 1 of the embodiment can have a structure in which the plurality of pixels 541 share one pixel circuit 210, the shared pixel circuit 210 is arranged to be superimposed on the photodiode PD, and the first substrate 100 is provided with the connection wire that connects the floating diffusions FD of the plurality of pixels 541 to each other and integrates them into one, and the connection wire that connects the VSS contact regions 118 included in the plurality of pixels 541 to each other and integrates them into one.

Here, when the above-described second manufacturing method is used as a manufacturing method for providing, on the first substrate 100, the connection wire that connects the floating diffusions FD of the plurality of pixels 541 to each other and integrates them into one, and the connection wire that connects the VSS contact regions 118 included in the plurality of pixels 541 to each other and integrates them into one, for example, it is possible to manufacture the first substrate 100 and the second substrate 200 using an appropriate process according to the configuration of each of the first substrate 100 and the second substrate 200, and an imaging device with high quality and high performance can be manufactured. In addition, the connection wire of the first substrate 100 and the second substrate 200 can be formed by an easy process. Specifically, in the case of using the second manufacturing method, an electrode connected to the floating diffusion FD and an electrode connected to the VSS contact region 118 are provided on the front surface of the first substrate 100 and the front surface of the second substrate 200, which are the bonding boundary surfaces of the first substrate 100 and the second substrate 200, respectively. Furthermore, even if positional deviation occurs between the electrodes provided on two substrate front surfaces when the first substrate 100 and the second substrate 200 are bonded together, it is preferable to enlarge the electrodes formed on the two substrate front surfaces such that the electrodes formed on the two substrate surfaces come into contact with each other. In this case, it is conceivable that it becomes difficult to arrange the electrode in a limited area of each pixel included in the imaging device 1.

In order to solve the problem that a large electrode is required at the bonding boundary surface between the first substrate 100 and the second substrate 200, for example, in the imaging device 1 of the embodiment, the above-described first manufacturing method can be used as a manufacturing method in which the plurality of pixels 541 share one pixel circuit 210 and the shared pixel circuit 210 is arranged to be superimposed on the photodiode PD. As a result, it is easy to align the elements formed on the first substrate 100 and the second substrate 200, and an imaging device with high quality and high performance can be manufactured. Furthermore, a unique structure generated by using this manufacturing method can be provided. That is, a structure in which the semiconductor layer 100S and the wire layer 100T of the first substrate 100, and the semiconductor layer 200S and the wire layer 200T of the second substrate 200 are stacked in this order, in other words, a structure in which the first substrate 100 and the second substrate 200 are stacked in a face-to-back manner is provided, and the through-electrodes 120E and 121E are provided which penetrate the semiconductor layer 200S and the wire layer 100T of the first substrate 100 from the front surface side of the semiconductor layer 200S of the second substrate 200, and reach the front surface of the semiconductor layer 100S of the first substrate 100.

In a structure in which the first substrate 100 is provided with the connection wire that connects the floating diffusions FD of the plurality of pixels 541 to each other and integrates the floating diffusions FD into one and the connection wire that connects the VSS contact regions 118 of the plurality of pixels 541 to each other and integrates the VSS contact regions 118 into one, when this structure and the second substrate 200 are stacked using the first manufacturing method and the pixel circuit 210 is formed on the second substrate 200, there is a possibility that the heating treatment required when forming the active element included in the pixel circuit 210 may affect the connection wire formed on the first substrate 100.

Therefore, in order to solve the problem that the heating treatment when the active element is formed affects the connection wire, it is desirable that in the imaging device 1 of the embodiment, a conductive material having high heat resistance is used for the connection wire that connects the floating diffusions FD of the plurality of pixels 541 to each other and integrates the floating diffusions FD into one and the connection wire that connects the VSS contact regions 118 of the plurality of pixels 541 to each other and integrates the VSS contact regions 118 into one. Specifically, as the conductive material having high heat resistance, a material having a melting point higher than that of at least a part of the wire material included in the wire layer 200T of the second substrate 200 can be used.

As described above, for example, the imaging device 1 according to the embodiment includes: (1) a structure in which the first substrate 100 and the second substrate 200 are stacked in a face-to-back manner (specifically, a structure in which the semiconductor layer 100S and the wire layer 100T of the first substrate 100, and the semiconductor layer 200S and the wire layer 200T of the second substrate 200 are stacked in this order); (2) a structure in which the through-electrodes 120E and 121E are provided which penetrate the semiconductor layer 200S and the wire layer 100T of the first substrate 100 from the front surface side of the semiconductor layer 200S of the second substrate 200, and reach the front surface of the semiconductor layer 100S of the first substrate 100; and (3) a structure in which the connection wire that connects the floating diffusions FD included in the plurality of pixels 541 to each other and integrates the floating diffusions FD into one and the connection wire that connects the VSS contact regions 118 included in the plurality of pixels 541 to each other and integrates the VSS contact regions 118 into one are formed of a conductive material having high heat resistance, so that, without providing a large electrode at the interface between the first substrate 100 and the second substrate 200, the first substrate 100 can be provided with the connection wire that connects the floating diffusions FD included in the plurality of pixels 541 to each other and integrates the floating diffusions FD into one, and the connection wire that connects the VSS contact regions 118 included in the plurality of pixels 541 to each other and integrates the VSS contact regions 118 into one.

[Operation of Imaging Device 1]

Figure 13:
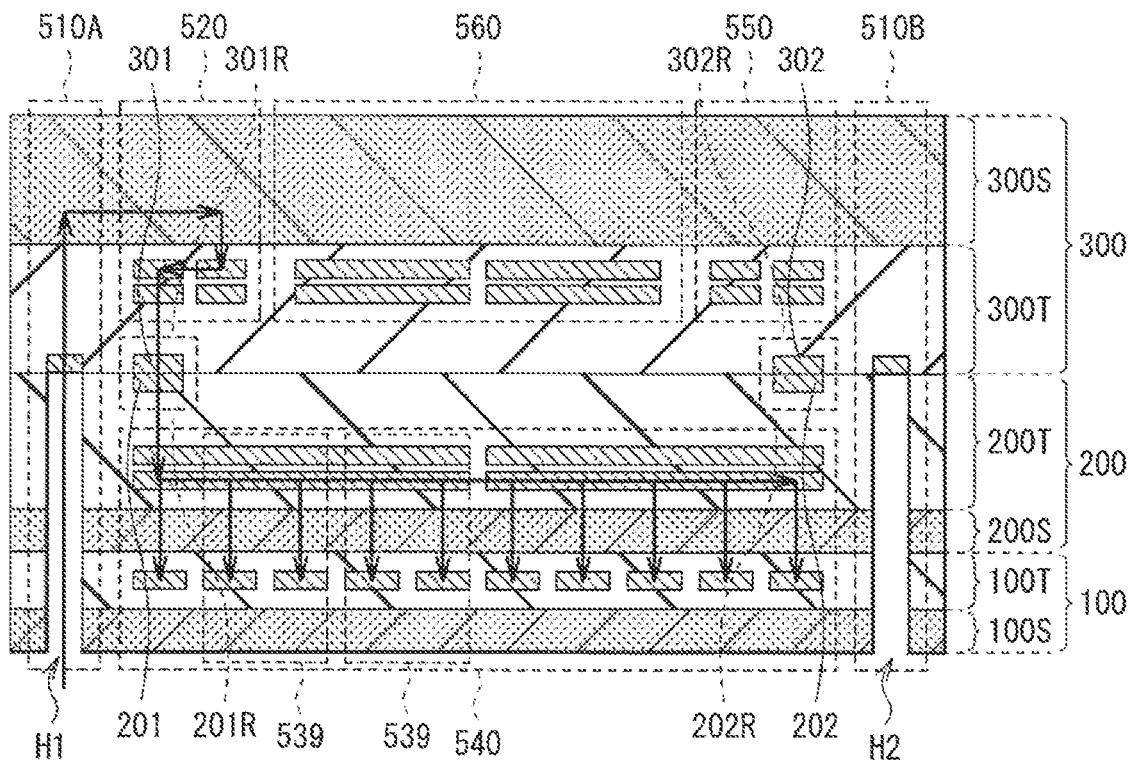
FIG. 13 is a schematic view for describing a path of an input signal to the imaging device illustrated in FIG. 3.
Figure 14:
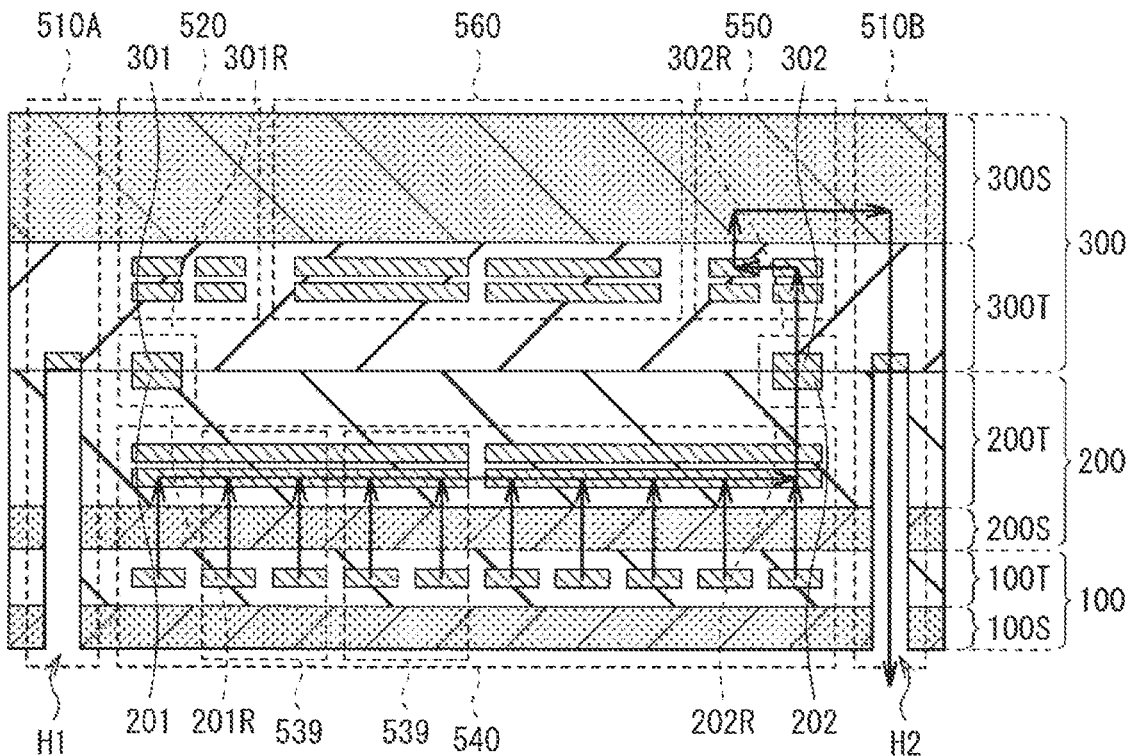
FIG. 14 is a schematic view for describing a signal path of a pixel signal of the imaging device illustrated in FIG. 3.

Next, the operation of the imaging device 1 will be described with reference to FIGS. 13 and 14. FIGS. 13 and 14 are obtained by adding arrows each indicating a path of each signal to FIG. 3. In FIG. 13, an input signal input to the imaging device 1 from the outside, and paths of a power supply potential and a reference potential are indicated by arrows. In FIG. 14, signal paths of the pixel signal output from the imaging device 1 to the outside are indicated by arrows. For example, an input signal (for example, a pixel clock and a synchronization signal) input to the imaging device 1 through the input unit 510A is transmitted to the row drive unit 520 of the third substrate 300, and the row drive unit 520 creates a row drive signal. The row drive signal is transmitted to the second substrate 200 through the contact portions 301 and 201. Further, the row drive signal reaches each pixel sharing unit 539 of the pixel array portion 540 through the row drive signal line 542 in the wire layer 200T. Among the row drive signals reaching the pixel sharing unit 539 of the second substrate 200, the drive signals other than the transfer gate TG are input to the pixel circuit 210, and each transistor included in the pixel circuit 210 is driven. The drive signal of the transfer gate TG is input to the transfer gates TG1, TG2, TG3, and TG4 of the first substrate 100 through the through-electrode TGV, and the pixels 541A, 541B, 541C, and 541D are driven (FIG. 13). Furthermore, the power supply potential and the reference potential supplied from the outside of the imaging device 1 to the input unit 510A (input terminal 511) of the third substrate 300 are transmitted to the second substrate 200 through the contact portions 301 and 201, and are supplied to the pixel circuit 210 of each of the pixel sharing units 539 through the wire in the wire layer 200T. The reference potential is also supplied to the pixels 541A, 541B, 541C, and 541D of the first substrate 100 through the through-electrode 121E. On the other hand, the pixel signal photoelectrically converted by the pixels 541A, 541B, 541C, and 541D of the first substrate 100 is transmitted to the pixel circuit 210 of the second substrate 200 for each pixel sharing unit 539 through the through-electrode 120E. The pixel signal based on this pixel signal is transmitted from the pixel circuit 210 to the third substrate 300 through the vertical signal line 543 and the contact portions 202 and 302. This pixel signal is processed by the column signal processing unit 550 and the image signal processing unit 560 of the third substrate 300, and then is output to the outside through the output unit 510B.

[Effects]

In the embodiment, the pixels 541A, 541B, 541C, and 541D (the pixel sharing unit 539) and the pixel circuit 210 are provided on different substrates (the first substrate 100 and the second substrate 200). As a result, the areas of the pixels 541A, 541B, 541C, and 541D and the pixel circuit 210 can be enlarged as compared with a case where the pixels 541A, 541B, 541C, and 541D and the pixel circuit 210 are formed on the same substrate. As a result, the amount of pixel signals obtained by photoelectric conversion can be increased, and the transistor noise of the pixel circuit 210 can be reduced. As a result, the signal/noise ratio of the pixel signal is improved, and the imaging device 1 can output better pixel data (image information). In addition, the imaging device 1 can be miniaturized (in other words, the pixel size can be reduced and the imaging device 1 can be downsized). The imaging device 1 can increase the number of pixels per unit area by reducing the pixel size, and can output an image with high quality.

Furthermore, in the imaging device 1, the first substrate 100 and the second substrate 200 are electrically connected to each other by the through-electrodes 120E and 121E provided in the insulating region 212. For example, a method of connecting the first substrate 100 and the second substrate 200 by bonding pad electrodes to each other, or a method of connecting the first substrate 100 and the second substrate 200 by the through-wire (for example, through Si via (TSV)) penetrating the semiconductor layer may be considered. As compared with such methods, the area required for the connection between the first substrate 100 and the second substrate 200 can be reduced by providing the through-electrodes 120E and 121E in the insulating region 212. As a result, the pixel size can be reduced, and the imaging device 1 can be further miniaturized. Furthermore, the resolution can be further increased by further miniaturizing the area per pixel. When it is not necessary to reduce the chip size, the formation region of the pixels 541A, 541B, 541C, and 541D and the pixel circuit 210 can be enlarged. As a result, the amount of pixel signals obtained by photoelectric conversion can be increased, and the noise of the transistor included in the pixel circuit 210 can be reduced. As a result, the signal/noise ratio of the pixel signal is improved, and the imaging device 1 can output better pixel data (image information).

Furthermore, in the imaging device 1, the pixel circuit 210, and the column signal processing unit 550 and the image signal processing unit 560 are provided on different substrates (the second substrate 200 and the third substrate 300). As a result, the area of the pixel circuit 210 and the areas of the column signal processing unit 550 and the image signal processing unit 560 can be enlarged as compared with a case where the pixel circuit 210, and the column signal processing unit 550 and the image signal processing unit 560 are formed on the same substrate. As a result, noise generated in the column signal processing unit 550 can be reduced, and an advanced image processing circuit can be mounted by the image signal processing unit 560. Therefore, the signal/noise ratio of the pixel signal is improved, and the imaging device 1 can output better pixel data (image information).

Furthermore, in the imaging device 1, the pixel array portion 540 is provided on the first substrate 100 and the second substrate 200, and the column signal processing unit 550 and the image signal processing unit 560 are provided on the third substrate 300. In addition, the contact portions 201, 202, 301, and 302 connecting the second substrate 200 and the third substrate 300 are formed above the pixel array portion 540. Therefore, the layout of the contact portions 201, 202, 301, and 302 can be freely made without receiving layout interference from various wires provided in the pixel array. Accordingly, the contact portions 201, 202, 301, and 302 can be used for the electrical connection between the second substrate 200 and the third substrate 300. By using the contact portions 201, 202, 301, and 302, for example, the column signal processing unit 550 and the image signal processing unit 560 have a higher degree of freedom in layout. As a result, noise generated in the column signal processing unit 550 can be reduced, and an advanced image processing circuit can be mounted by the image signal processing unit 560. Therefore, the signal/noise ratio of the pixel signal is improved, and the imaging device 1 can output better pixel data (image information).

Furthermore, in the imaging device 1, the pixel isolation portion 117 penetrates the semiconductor layer 100S. As a result, color mixing among the pixels 541A, 541B, 541C, and 541D can be suppressed even in a case where the distance between adjacent pixels (pixels 541A, 541B, 541C, and 541D) is shortened due to miniaturization of the area per pixel. As a result, the signal/noise ratio of the pixel signal is improved, and the imaging device 1 can output better pixel data (image information).

Furthermore, in the imaging device 1, the pixel circuit 210 is provided for each pixel sharing unit 539. As a result, as compared with a case where the pixel circuit 210 is provided in each of the pixels 541A, 541B, 541C, and 541D, the formation region of the transistors (the amplification transistor AMP, the reset transistor RST, the selection transistor SEL, and the FD conversion gain switching transistor FDG) constituting the pixel circuit 210 can be enlarged. For example, noise can be suppressed by increasing the formation region of the amplification transistor AMP. As a result, the signal/noise ratio of the pixel signal is improved, and the imaging device 1 can output better pixel data (image information).

Furthermore, in the imaging device 1, the pad portion 120 that electrically connects the floating diffusions FD (floating diffusions FD1, FD2, FD3, and FD4) of four pixels (pixels 541A, 541B, 541C, and 541D) is provided on the first substrate 100. As a result, the number of through-electrodes (the through-electrodes 120E) connecting the first substrate 100 and the second substrate 200 can be reduced as compared with a case where the pad portion 120 is provided on the second substrate 200. Therefore, the formation region of the transistor (semiconductor layer 200S) constituting the pixel circuit 210 can be secured with a sufficient size by reducing the insulating region 212. As a result, noise of the transistor included in the pixel circuit 210 can be reduced, the signal/noise ratio of the pixel signal can be improved, and the imaging device 1 can output better pixel data (image information).

Hereinafter, modifications of the imaging device 1 according to the above-described embodiment will be described. In the following modifications, the same reference numerals are given to the same configurations as those of the above-described embodiment.

2. First Modification

Figure 15:
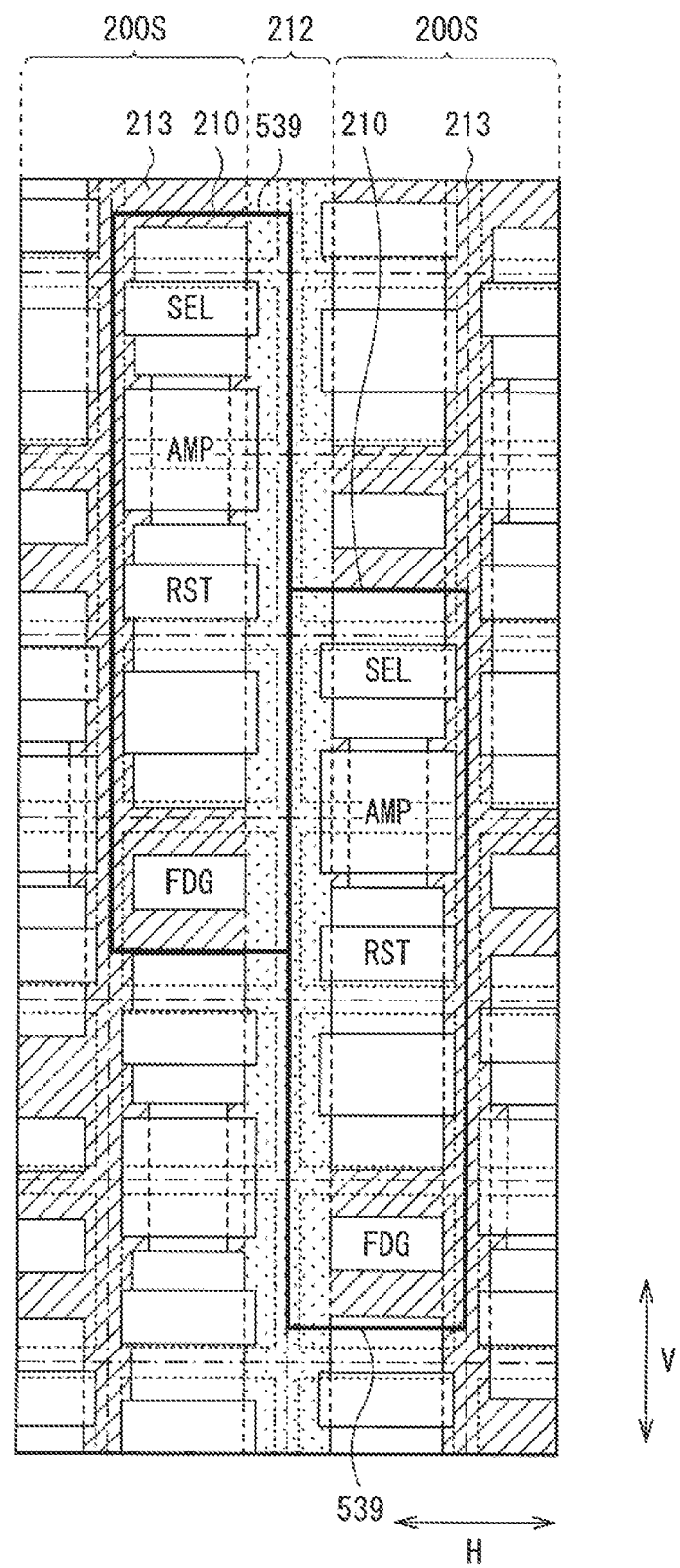
FIG. 15 is a schematic view illustrating a modification of the planar configuration of the second substrate (semiconductor layer) illustrated in FIG. 8.
Figure 16:
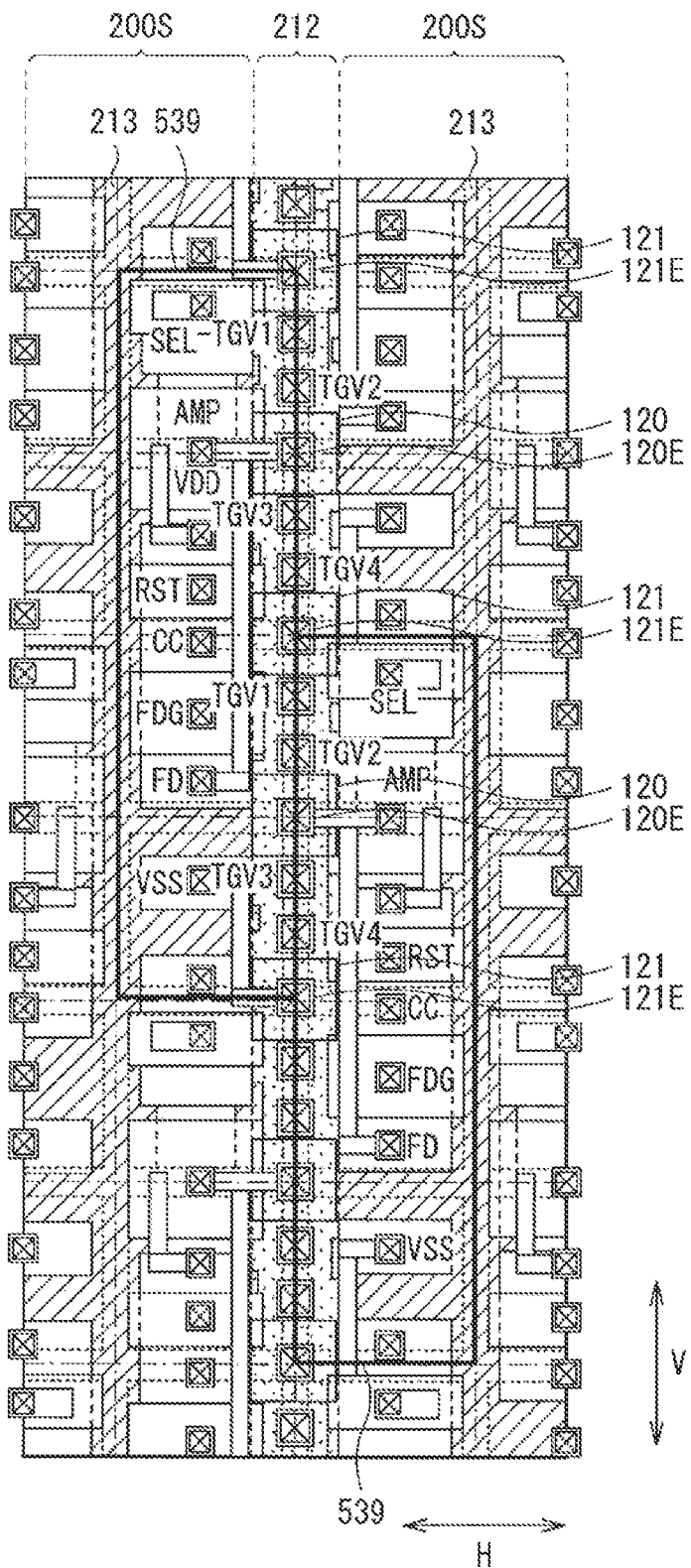
FIG. 16 is a schematic view illustrating a planar configuration of the first wire layer and the main part of the first substrate together with the pixel circuit illustrated in FIG. 15.
Figure 17:
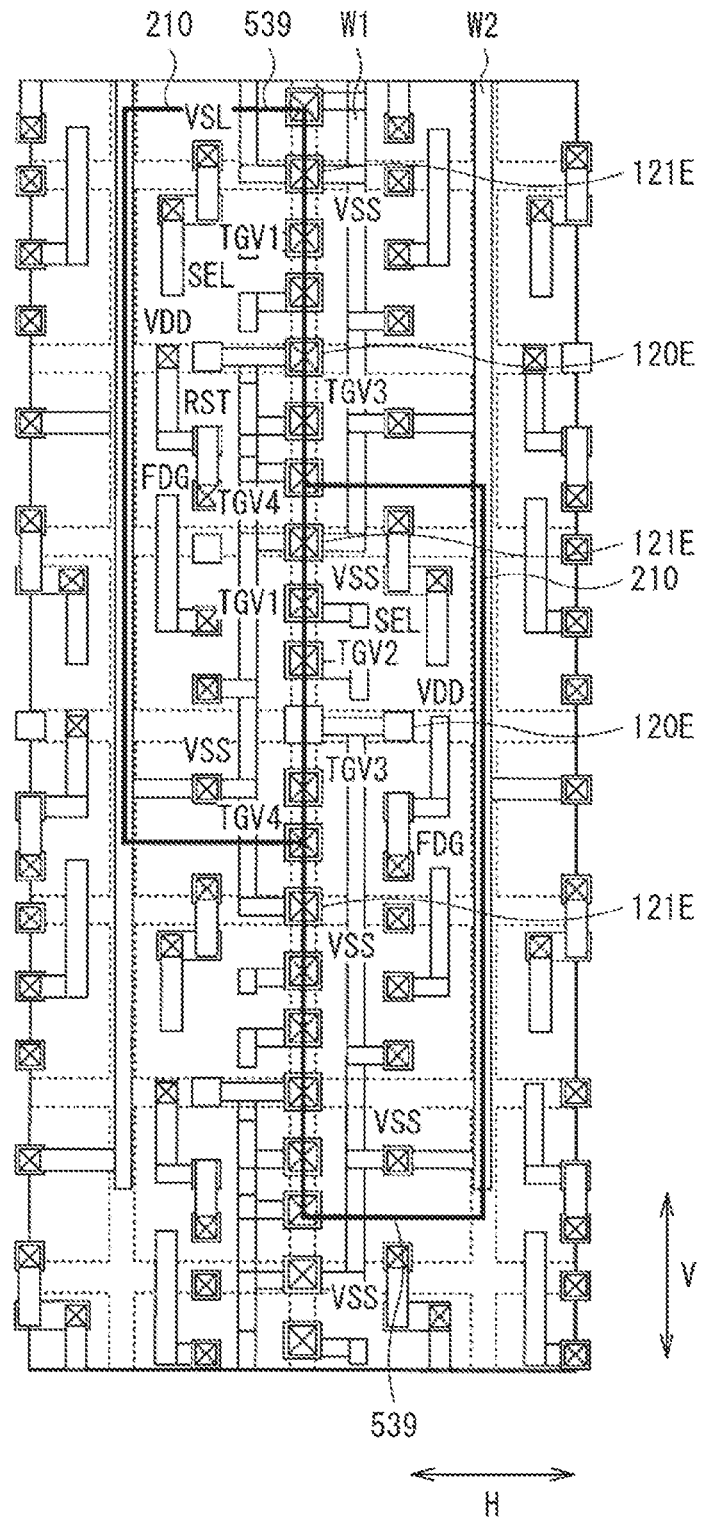
FIG. 17 is a schematic view illustrating an example of the planar configuration of the second wire layer together with the first wire layer illustrated in FIG. 16.
Figure 18:
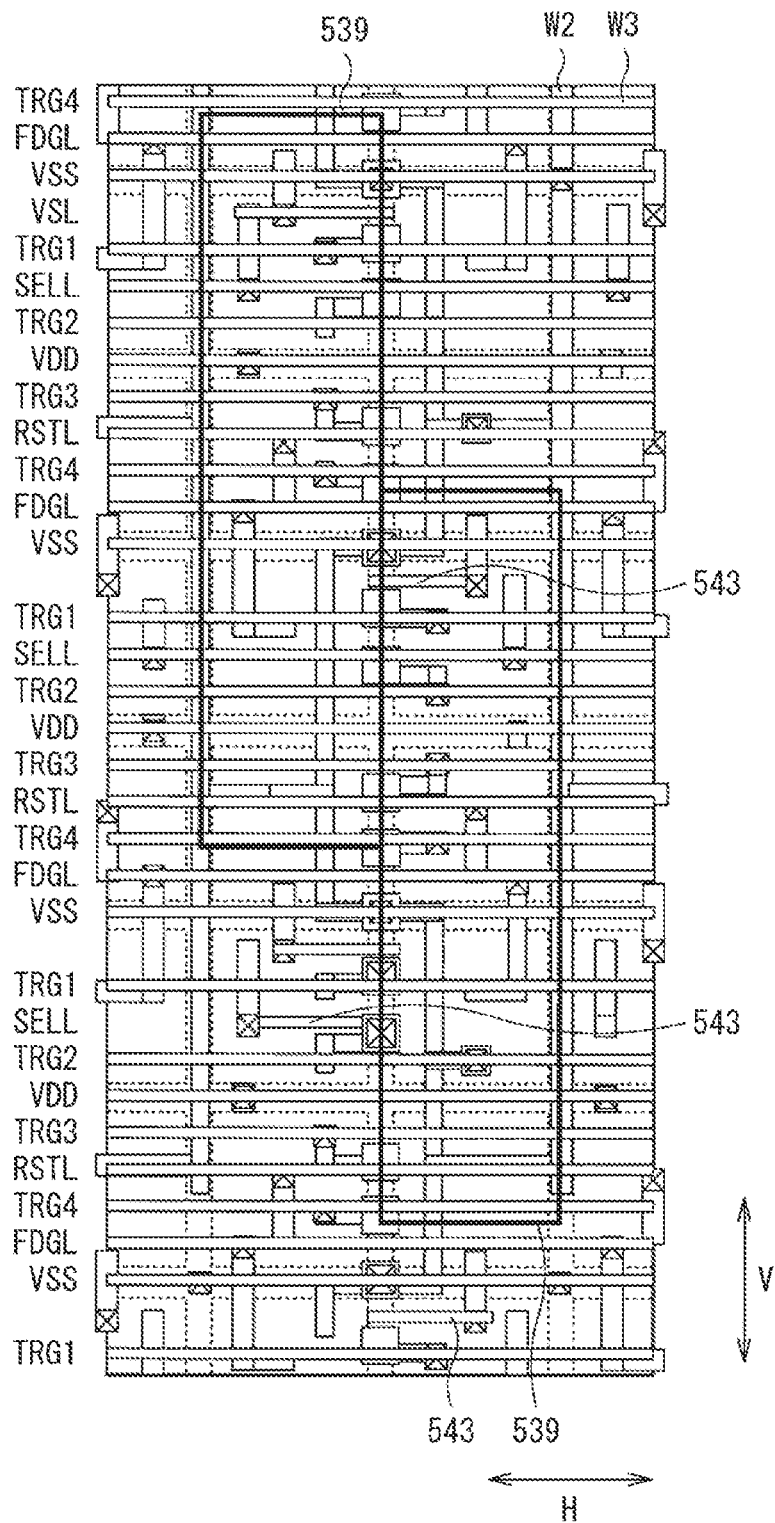
FIG. 18 is a schematic view illustrating an example of the planar configuration of the third wire layer together with the second wire layer illustrated in FIG. 17.
Figure 19:
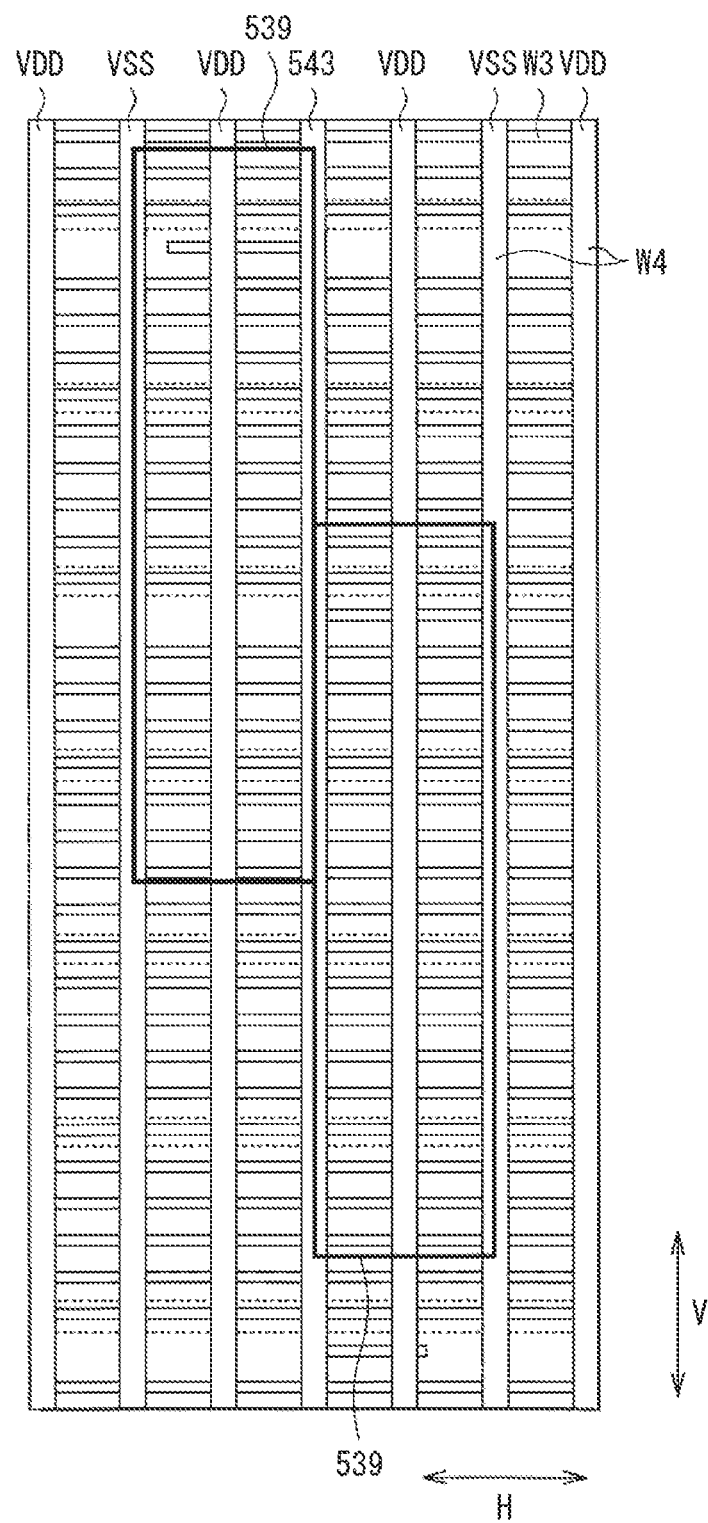
FIG. 19 is a schematic view illustrating an example of a planar configuration of the fourth wire layer together with the third wire layer illustrated in FIG. 18.

FIGS. 15 to 19 illustrate a modification of the planar configuration of the imaging device 1 according to the above-described embodiment. FIG. 15 schematically illustrates a planar configuration near the front surface of the semiconductor layer 200S of the second substrate 200, and corresponds to FIG. 8 described in the above-described embodiment. FIG. 16 schematically illustrates a configuration of the first wire layer W1, the semiconductor layer 200S connected to the first wire layer W1, and each part of the first substrate 100, and corresponds to FIG. 9 described in the above-described embodiment. FIG. 17 illustrates an example of a planar configuration of the first wire layer W1 and the second wire layer W2, and corresponds to FIG. 10 described in the above-described embodiment. FIG. 18 illustrates an example of a planar configuration of the second wire layer W2 and the third wire layer W3, and corresponds to FIG. 11 described in the above-described embodiment. FIG. 19 illustrates an example of a planar configuration of the third wire layer W3 and the fourth wire layer W4, and corresponds to FIG. 12 described in the above-described embodiment.

In the present modification, as illustrated in FIG. 16, of the two pixel sharing units 539 arranged in the H direction on the second substrate 200, the internal layout of one pixel sharing unit 539 (for example, the right side of the paper surface) is obtained by inverting the internal layout of the other pixel sharing unit 539 (for example, the left side of the paper surface) only in the H direction. In addition, the deviation in the V direction between the outline of one pixel sharing unit 539 and the outline of the other pixel sharing unit 539 is larger than the deviation (FIG. 9) described in the above-described embodiment. In this manner, by increasing the deviation in the V direction, the distance between the amplification transistor AMP of the other pixel sharing unit 539 and the pad portion 120 (the pad portion 120 on the other pixel sharing unit 539 (on the lower side of the paper surface) of the two pixel sharing units 539 arranged in the V direction illustrated in FIG. 7) connected thereto can be reduced. With such a layout, the first modification of the imaging device 1 illustrated in FIGS. 15 to 19 can make the area of the two pixel sharing units 539 arranged in the H direction the same as the area of the pixel sharing unit 539 of the second substrate 200 described in the above-described embodiment without inverting the planar layout of the two pixel sharing units in the V direction. Note that the planar layout of the pixel sharing unit 539 of the first substrate 100 is the same as the planar layout (FIGS. 7A and 7B) described in the above-described embodiment. Therefore, the imaging device 1 of the present modification can obtain the same effects as those of the imaging device 1 described in the above-described embodiment. The arrangement of the pixel sharing unit 539 of the second substrate 200 is not limited to the arrangement described in the above-described embodiment and the present modification.

3. Second Modification

Figure 20:
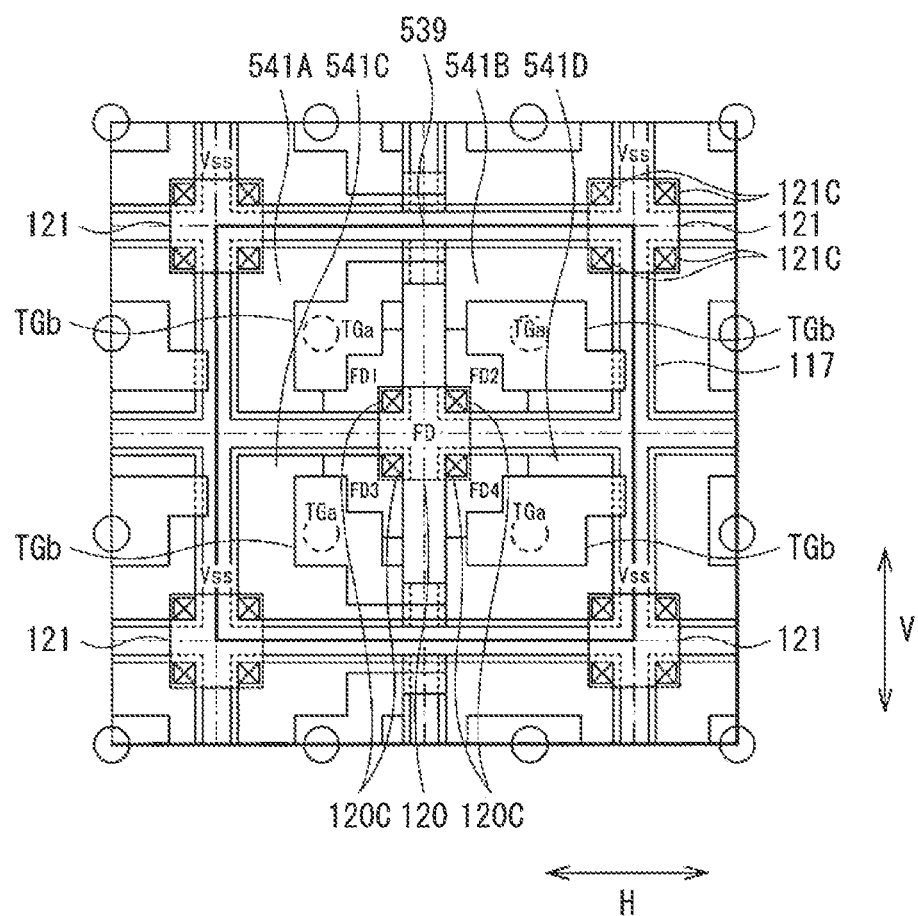
FIG. 20 is a schematic view illustrating a modification of the planar configuration of the first substrate illustrated in FIG. 7A.
Figure 21:
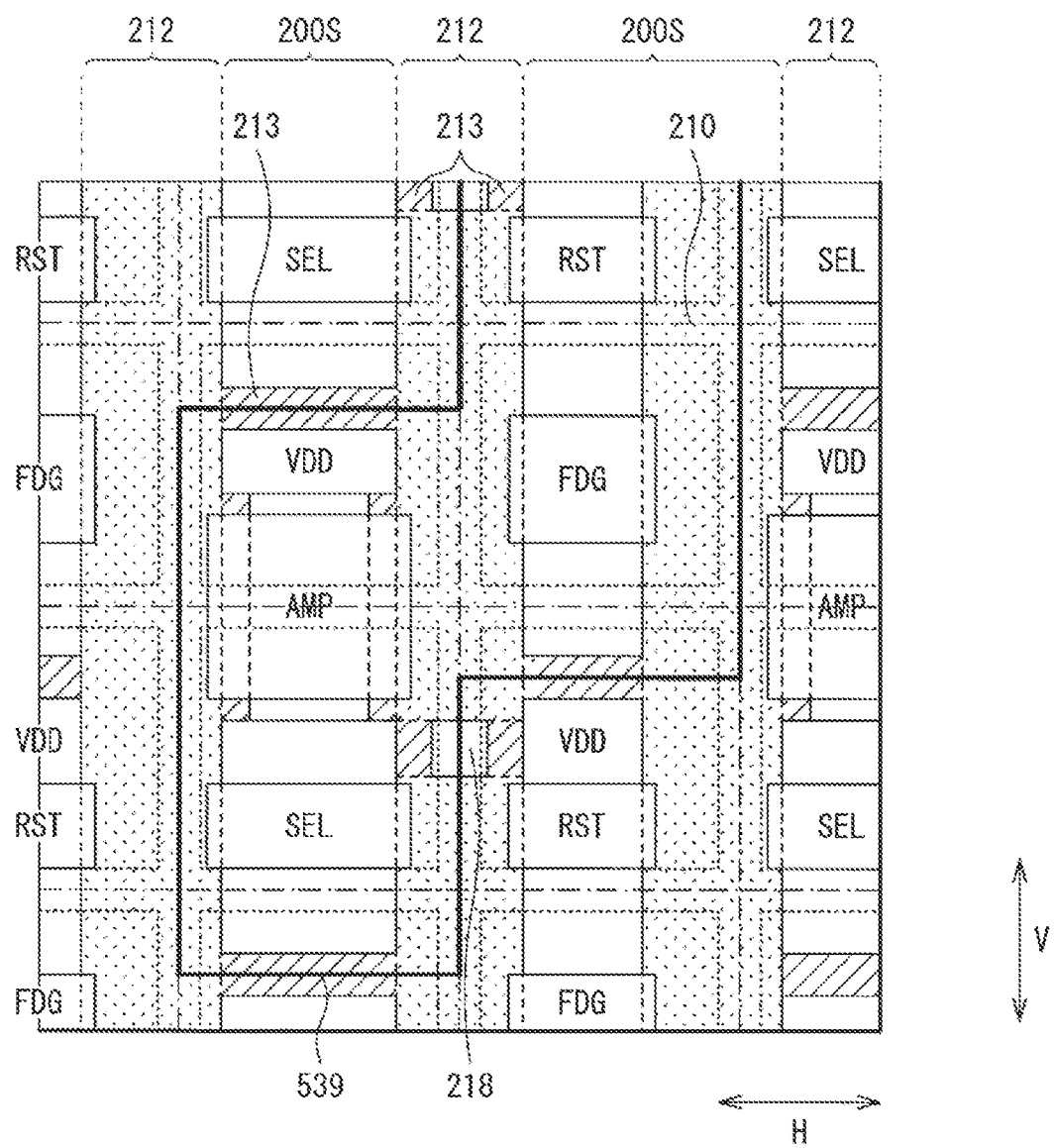
FIG. 21 is a schematic view illustrating an example of the planar configuration of the second substrate (semiconductor layer) stacked on the first substrate illustrated in FIG. 20.
Figure 22:
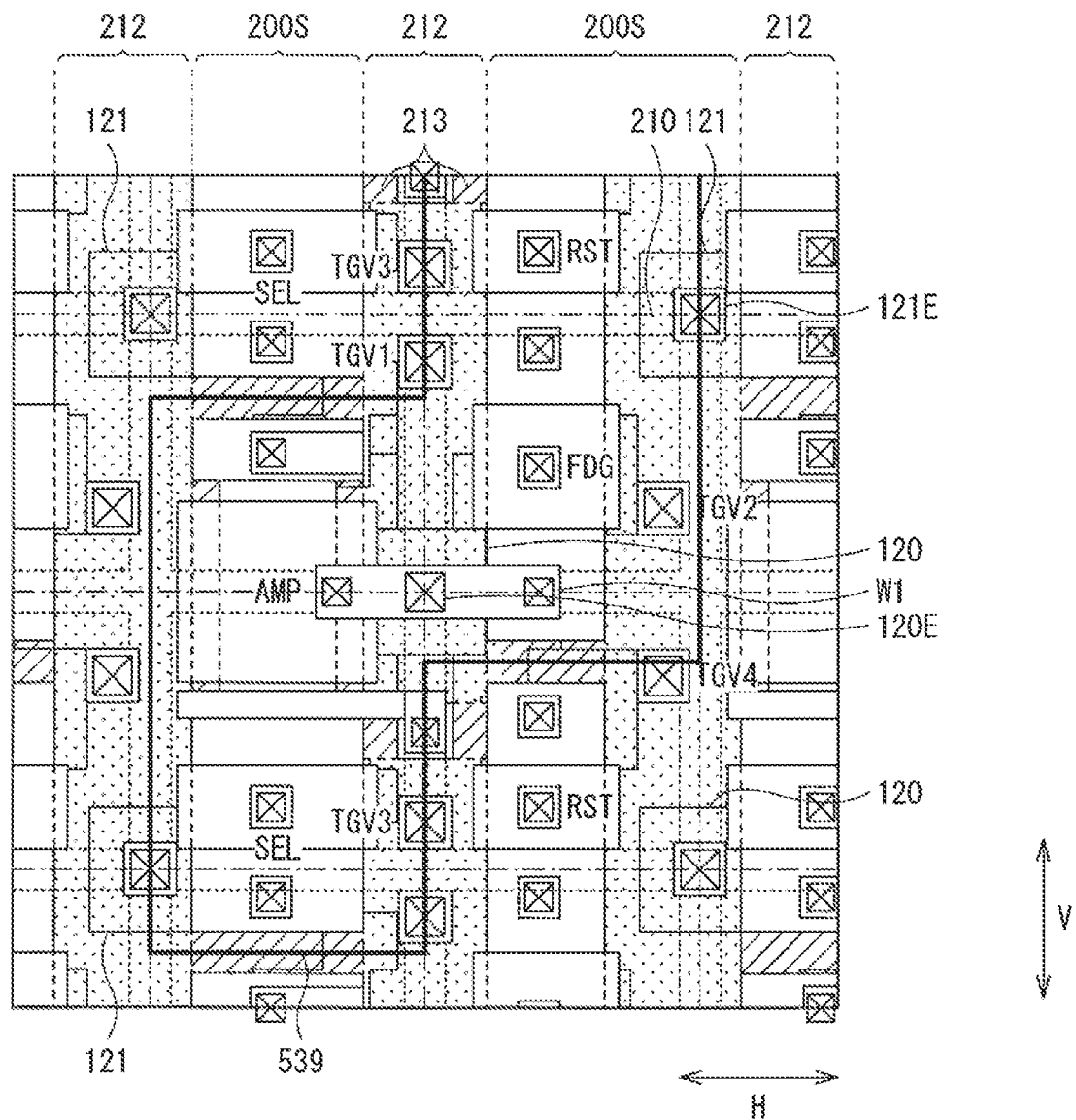
FIG. 22 is a schematic view illustrating an example of the planar configuration of the first wire layer together with the pixel circuit illustrated in FIG. 21.
Figure 23:
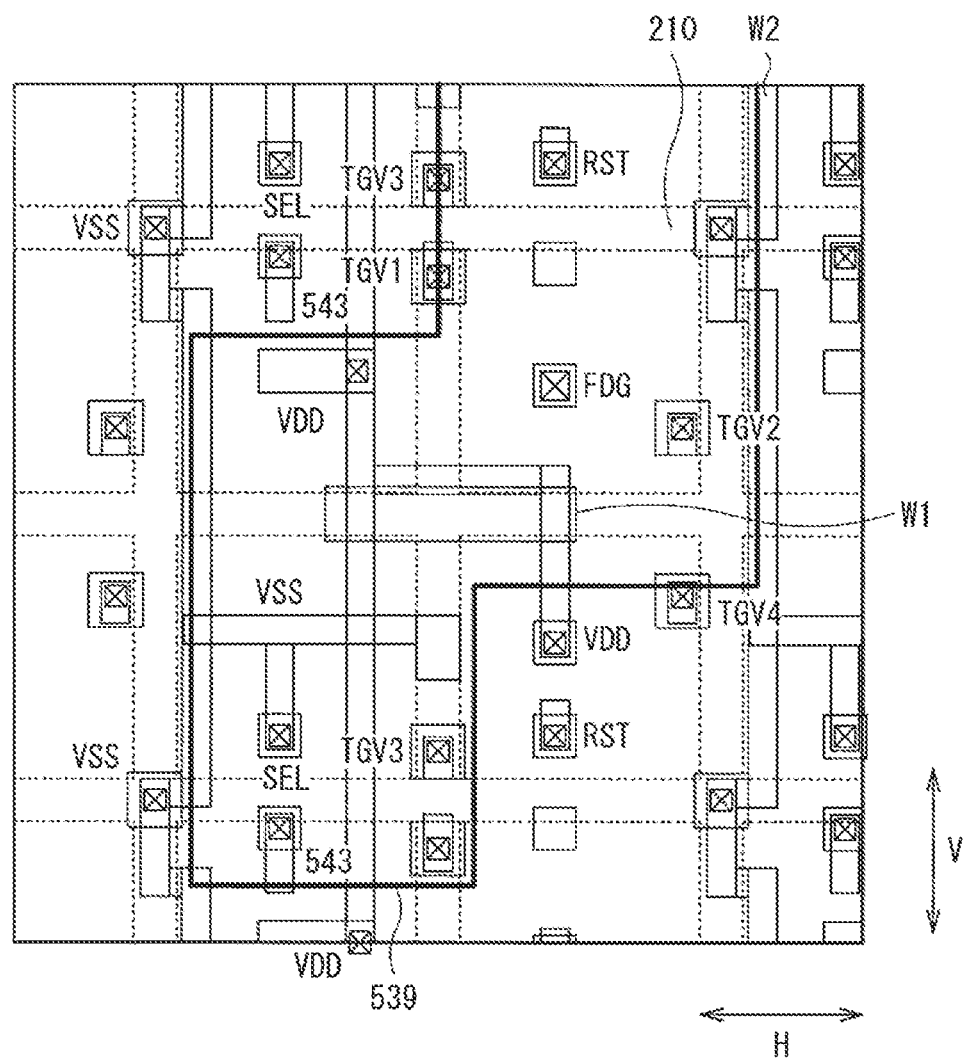
FIG. 23 is a schematic view illustrating an example of the planar configuration of the second wire layer together with the first wire layer illustrated in FIG. 22.
Figure 24:
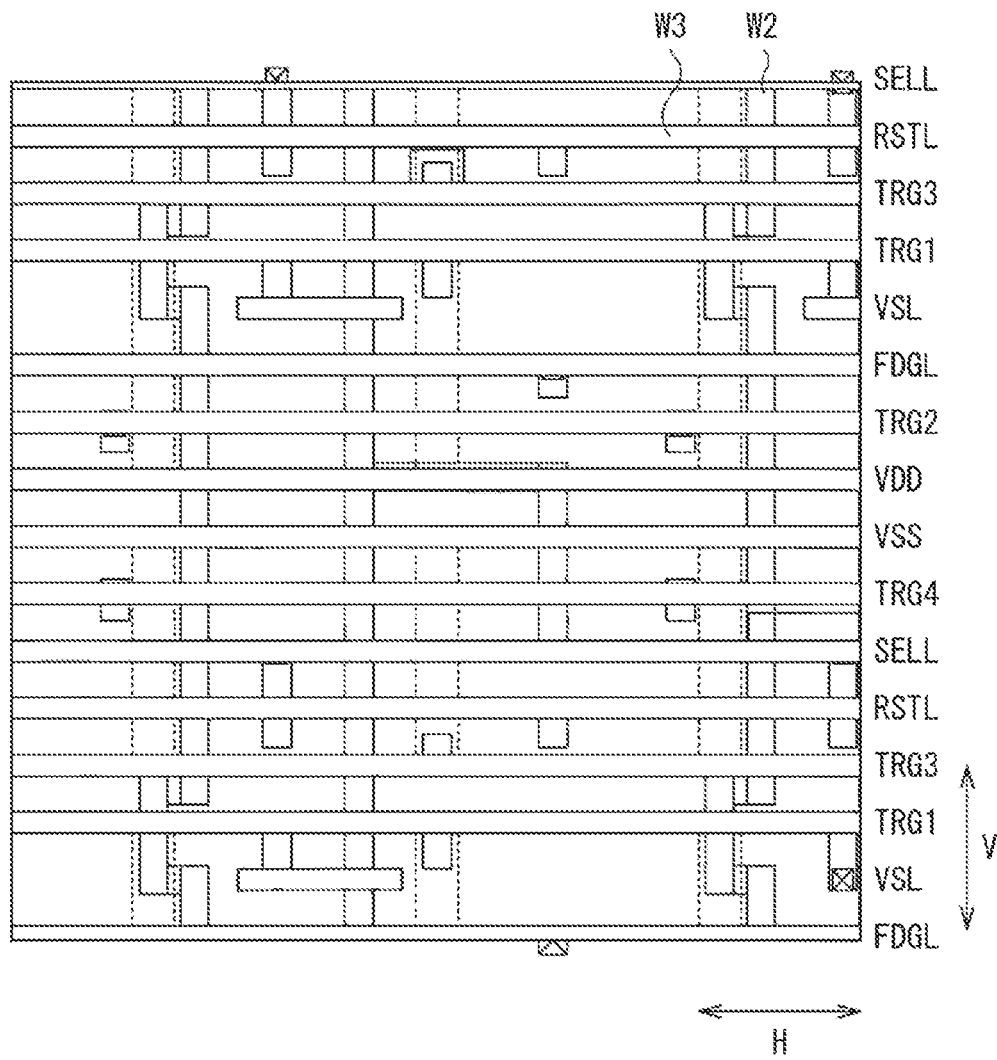
FIG. 24 is a schematic view illustrating an example of the planar configuration of the third wire layer together with the second wire layer illustrated in FIG. 23.
Figure 25:
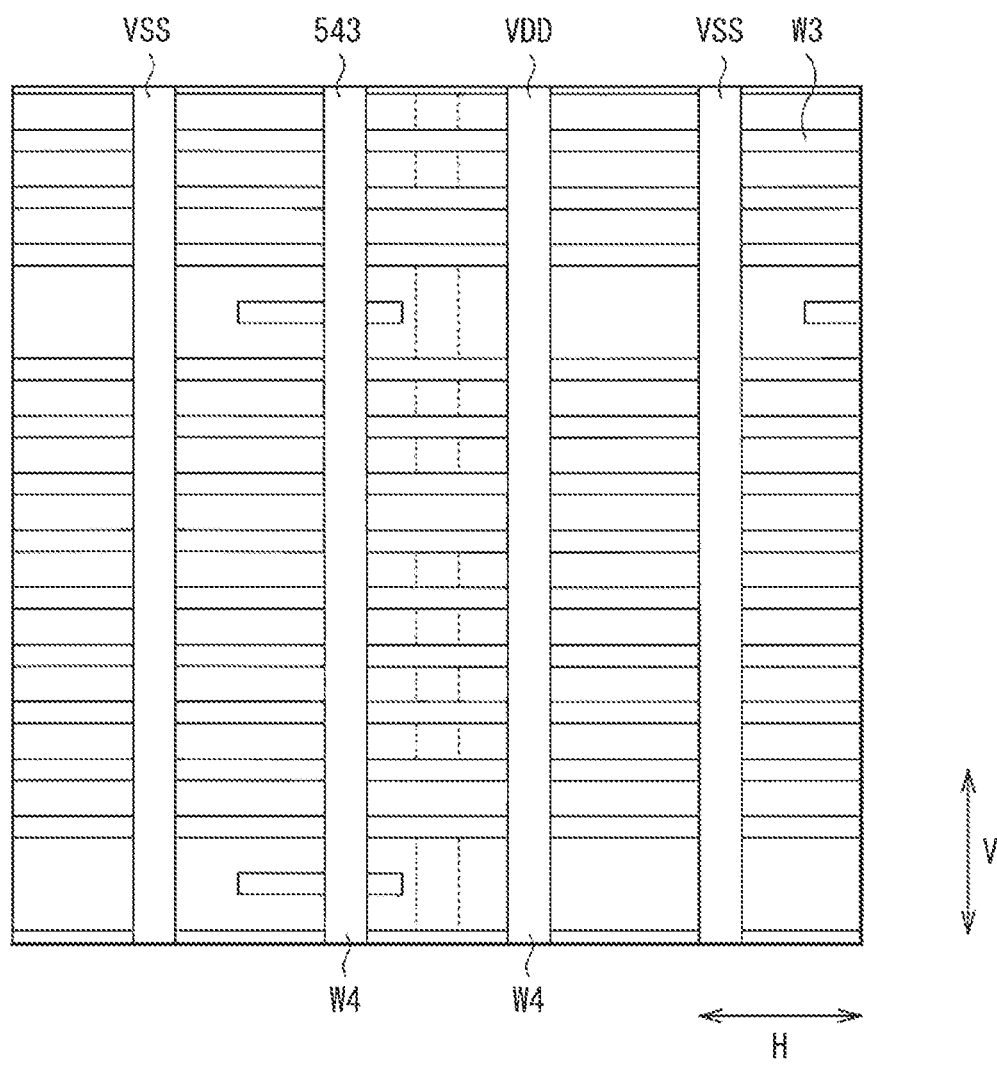
FIG. 25 is a schematic view illustrating an example of the planar configuration of the fourth wire layer together with the third wire layer illustrated in FIG. 24.

FIGS. 20 to 25 illustrate a modification of the planar configuration of the imaging device 1 according to the above-described embodiment. FIG. 20 schematically illustrates a planar configuration of the first substrate 100, and corresponds to FIG. 7A described in the above-described embodiment. FIG. 21 schematically illustrates a planar configuration near the front surface of the semiconductor layer 200S of the second substrate 200, and corresponds to FIG. 8 described in the above-described embodiment. FIG. 22 schematically illustrates a configuration of the first wire layer W1, the semiconductor layer 200S connected to the first wire layer W1, and each part of the first substrate 100, and corresponds to FIG. 9 described in the above-described embodiment. FIG. 23 illustrates an example of a planar configuration of the first wire layer W1 and the second wire layer W2, and corresponds to FIG. 10 described in the above-described embodiment. FIG. 24 illustrates an example of a planar configuration of the second wire layer W2 and the third wire layer W3, and corresponds to FIG. 11 described in the above-described embodiment. FIG. 25 illustrates an example of a planar configuration of the third wire layer W3 and the fourth wire layer W4, and corresponds to FIG. 12 described in the above-described embodiment.

In the present modification, the outer shape of each pixel circuit 210 has a substantially square planar shape (FIG. 21 and the like). In this respect, the planar configuration of the imaging device 1 of the present modification is different from the planar configuration of the imaging device 1 described in the above-described embodiment.

For example, the pixel sharing unit 539 of the first substrate 100 is formed over a pixel region of 2 rows×2 columns, and has a substantially square planar shape (FIG. 20), as described in the above-described embodiment. For example, in each pixel sharing unit 539, the horizontal portions TGb of the transfer gate TG1 and TG3 of the pixel 541A and the pixel 541C of one pixel column extend in a direction toward the central portion of the pixel sharing unit 539 in the H direction (more specifically, a direction toward the outer edges of the pixels 541A and 541C and a direction toward the central portion of the pixel sharing unit 539) from the position overlapping the vertical portion TGa, and the horizontal portions TGb of the transfer gates TG2 and TG4 of the pixel 541B and the pixel 541D of the other pixel column extend in a direction toward the outside of the pixel sharing unit 539 in the H direction (more specifically, a direction toward the outer edges of the pixels 541B and 541D and a direction toward the outside of the pixel sharing unit 539) from the position overlapping the vertical portion TGa. The pad portion 120 connected to the floating diffusion FD is provided at the central portion of the pixel sharing unit 539 (the central portion of the pixel sharing unit 539 in the H direction and the V direction), and the pad portion 121 connected to the VSS contact region 118 is provided at an end portion of the pixel sharing unit 539 at least in the H direction (in the H direction and the V direction in FIG. 20).

As another arrangement example, it is also conceivable to provide the horizontal portions TGb of the transfer gates TG1, TG2, TG3, and TG4 only in a region facing the vertical portion TGa. At this time, the semiconductor layer 200S is likely to be finely divided as described in the above-described embodiment. Therefore, it is difficult to form a large transistor of the pixel circuit 210. On the other hand, when the horizontal portions TGb of the transfer gates TG1, TG2, TG3, and TG4 extend in the H direction from the position overlapping the vertical portion TGa as in the above-described modification, the width of the semiconductor layer 200S can be increased as described in the above-described embodiment. Specifically, the positions of the through-electrodes TGV1 and TGV3 in the H direction which are connected to the transfer gates TG1 and TG3 can be arranged close to the position of the through-electrode 120E in the H direction, and the positions of the through-electrodes TGV2 and TGV4 in the H direction which are connected to the transfer gates TG2 and TG4 can be arranged close to the position of the through-electrode 121E in the H direction (FIG. 22). As a result, the width (the size in the H direction) of the semiconductor layer 200S extending in the V direction can be increased as described in the above-described embodiment. Therefore, it is possible to increase the size of the transistor of the pixel circuit 210, particularly, the size of the amplification transistor AMP. As a result, the signal/noise ratio of the pixel signal is improved, and the imaging device 1 can output better pixel data (image information).

The pixel sharing unit 539 of the second substrate 200 has, for example, substantially the same size as that of the pixel sharing unit 539 of the first substrate 100 in the H direction and the V direction, and is provided over, for example, a region corresponding to a pixel region of approximately 2 rows×2 columns. For example, in each pixel circuit 210, the selection transistor SEL and the amplification transistor AMP are arranged side by side in the V direction in one semiconductor layer 200S extending in the V direction, and the FD conversion gain switching transistor FDG and the reset transistor RST are arranged side by side in the V direction in one semiconductor layer 200S extending in the V direction. One semiconductor layer 200S provided with the selection transistor SEL and the amplification transistor AMP and one semiconductor layer 200S provided with the FD conversion gain switching transistor FDG and the reset transistor RST are arranged in the H direction through the insulating region 212. The insulating region 212 extends in the V direction (FIG. 21).

Here, the outer shape of the pixel sharing unit 539 of the second substrate 200 will be described with reference to FIGS. 21 and 22. For example, the pixel sharing unit 539 of the first substrate 100 illustrated in FIG. 20 is connected to the amplification transistor AMP and the selection transistor SEL which are provided on one side of the pad portion 120 in the H direction (the left side of the paper surface of FIG. 22), and the FD conversion gain switching transistor FDG and the reset transistor RST which are provided on the other side of the pad portion 120 in the H direction (the right side of the paper surface of FIG. 22). The outer shape of the pixel sharing unit 539 of the second substrate 200 including the amplification transistor AMP, the selection transistor SEL, the FD conversion gain switching transistor FDG, and the reset transistor RST is determined by the following four outer edges.

A first outer edge is an outer edge of one end (an upper end of the paper surface of FIG. 22) in the V direction of the semiconductor layer 200S including the selection transistor SEL and the amplification transistor AMP. The first outer edge is provided between the amplification transistor AMP included in the pixel sharing unit 539 and the selection transistor SEL included in the pixel sharing unit 539 adjacent to one side (the upper side of the paper surface of FIG. 22) of the pixel sharing unit 539 in the V direction. More specifically, the first outer edge is provided at the central portion of the element isolation region 213 in the V direction between the amplification transistor AMP and the selection transistor SEL. A second outer edge is an outer edge of the other end (a lower end of the paper surface of FIG. 22) in the V direction of the semiconductor layer 200S including the selection transistor SEL and the amplification transistor AMP. The second outer edge is provided between the selection transistor SEL included in the pixel sharing unit 539 and the amplification transistor AMP included in the pixel sharing unit 539 adjacent to the other side (the lower side of the paper surface of FIG. 22) of the pixel sharing unit 539 in the V direction. More specifically, the second outer edge is provided at the central portion of the element isolation region 213 in the V direction between the selection transistor SEL and the amplification transistor AMP. A third outer edge is an outer edge of the other end (a lower end of the paper surface of FIG. 22) in the V direction of the semiconductor layer 200S including the reset transistor RST and the FD conversion gain switching transistor FDG. The third outer edge is provided between the FD conversion gain switching transistor FDG included in the pixel sharing unit 539 and the reset transistor RST included in the pixel sharing unit 539 adjacent to the other side (the lower side of the paper surface of FIG. 22) of the pixel sharing unit 539 in the V direction. More specifically, the third outer edge is provided at the central portion of the element isolation region 213 in the V direction between the FD conversion gain switching transistor FDG and the reset transistor RST. A fourth outer edge is an outer edge of one end (an upper end of the paper surface of FIG. 22) in the V direction of the semiconductor layer 200S including the reset transistor RST and the FD conversion gain switching transistor FDG. The fourth outer edge is provided between the reset transistor RST included in the pixel sharing unit 539 and the FD conversion gain switching transistor FDG (not illustrated) included in the pixel sharing unit 539 adjacent to one side (the upper side of the paper surface of FIG. 22) of the pixel sharing unit 539 in the V direction. More specifically, the fourth outer edge is provided at the central portion of the element isolation region 213 (not illustrated) in the V direction between the reset transistor RST and the FD conversion gain switching transistor FDG.

In the outer shape of the pixel sharing unit 539 of the second substrate 200 including such first, second, third, and fourth outer edges, the third and fourth outer edges are arranged to be shifted to one side in the V direction (in other words, offset to one side in the V direction) with respect to the first and second outer edges. By using such a layout, both the gate of the amplification transistor AMP and the source of the FD conversion gain switching transistor FDG can be arranged as close as possible to the pad portion 120. Therefore, the area of the wire connecting the amplification transistor AMP and the FD conversion gain switching transistor FDG to the pad portion 120 is reduced, and the imaging device 1 can be easily miniaturized. Note that the VSS contact region 218 is provided between the semiconductor layer 200S including the selection transistor SEL and the amplification transistor AMP and the semiconductor layer 200S including the reset transistor RST and the FD conversion gain switching transistor FDG. For example, the plurality of pixel circuits 210 have the same arrangement.

The imaging device 1 including such a second substrate 200 can also obtain the same effects as those described in the above-described embodiment. The arrangement of the pixel sharing unit 539 of the second substrate 200 is not limited to the arrangement described in the above-described embodiment and the present modification.

4. Third Modification

Figure 26:
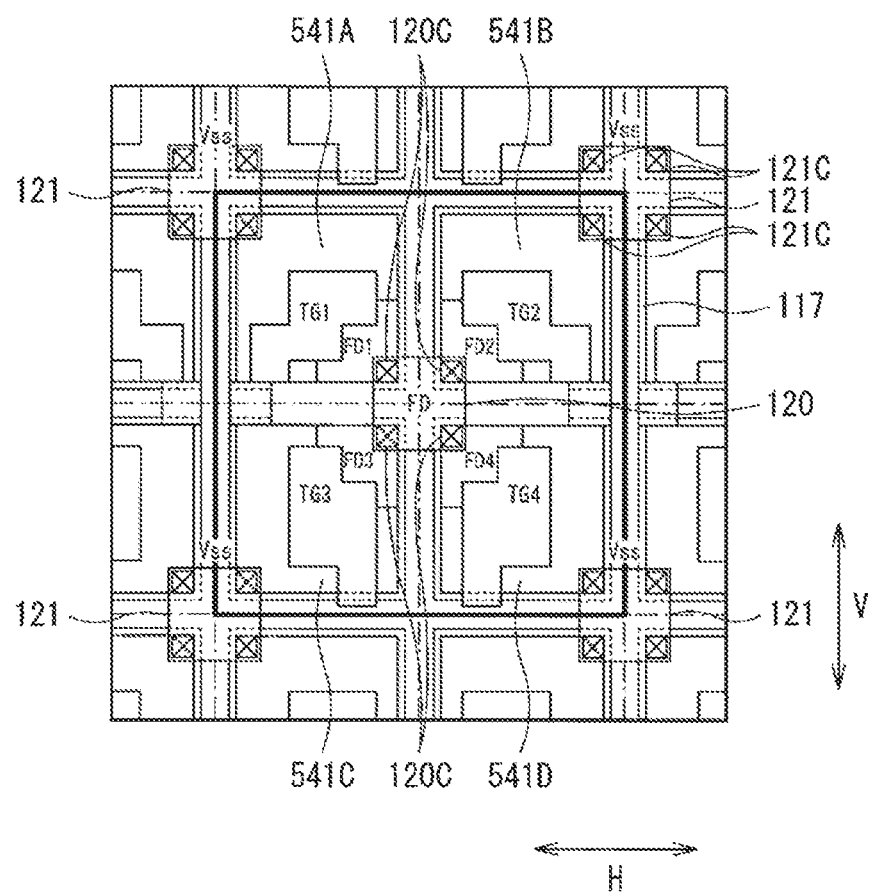
FIG. 26 is a schematic view illustrating another example of the planar configuration of the first substrate illustrated in FIG. 20.
Figure 27:
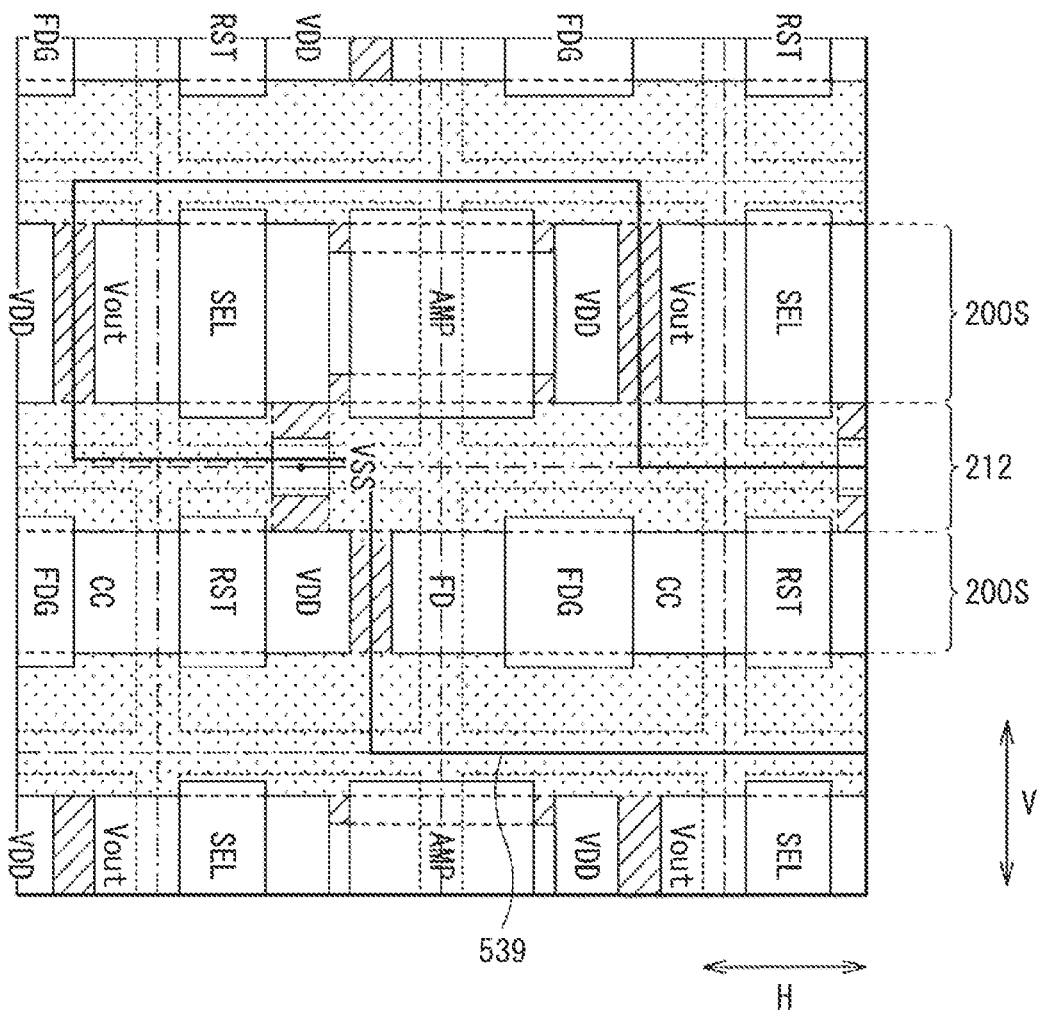
FIG. 27 is a schematic view illustrating an example of the planar configuration of the second substrate (semiconductor layer) stacked on the first substrate illustrated in FIG. 26.
Figure 28:
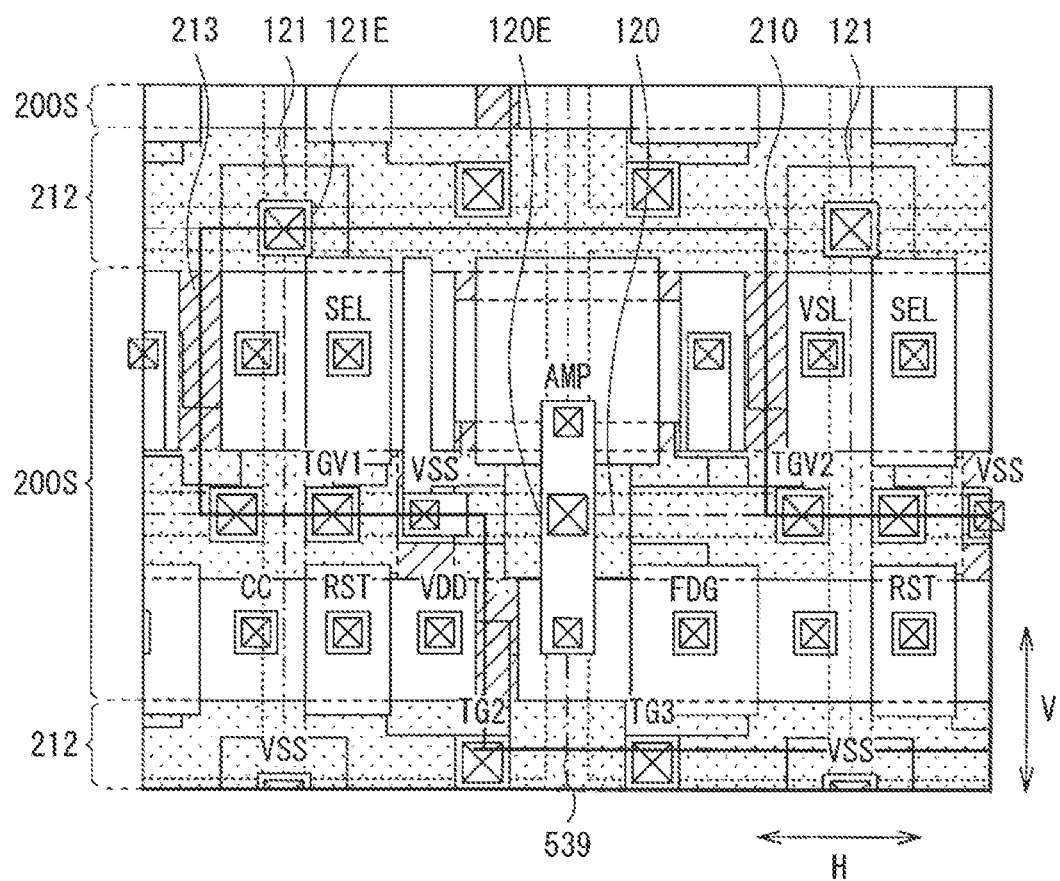
FIG. 28 is a schematic view illustrating an example of the planar configuration of the first wire layer together with the pixel circuit illustrated in FIG. 27.
Figure 29:
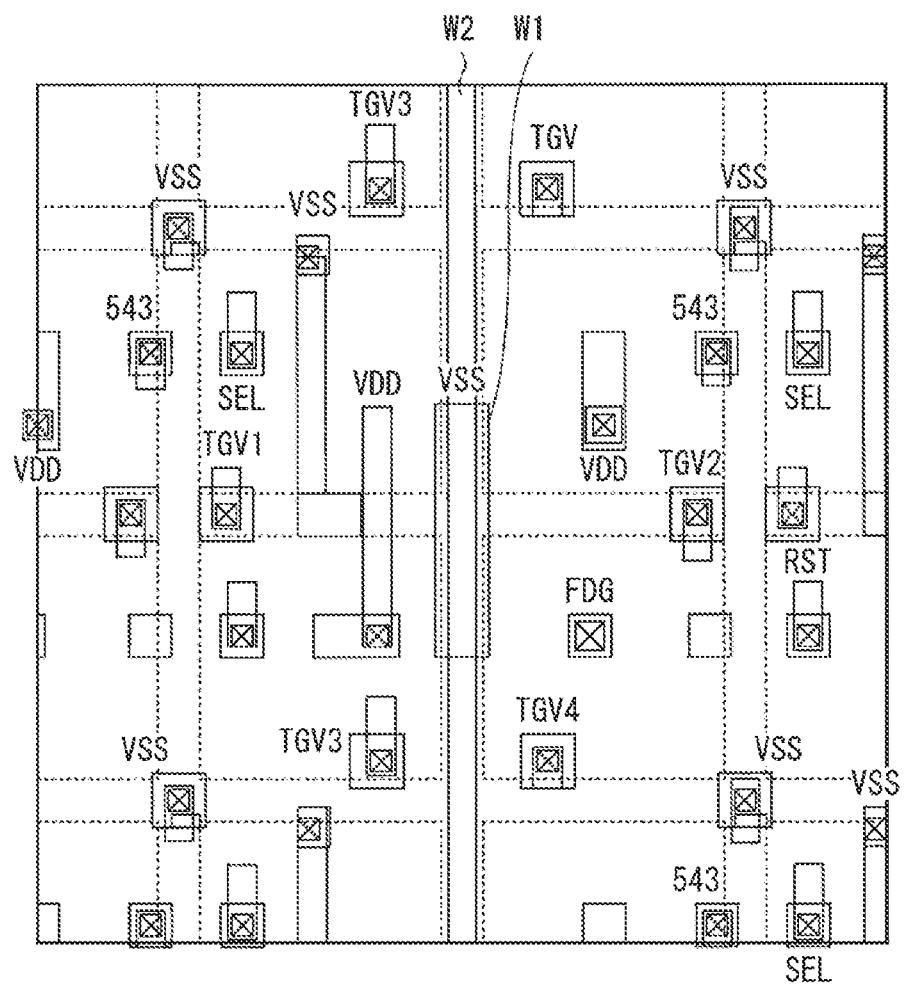
FIG. 29 is a schematic view illustrating an example of the planar configuration of the second wire layer together with the first wire layer illustrated in FIG. 28.
Figure 30:
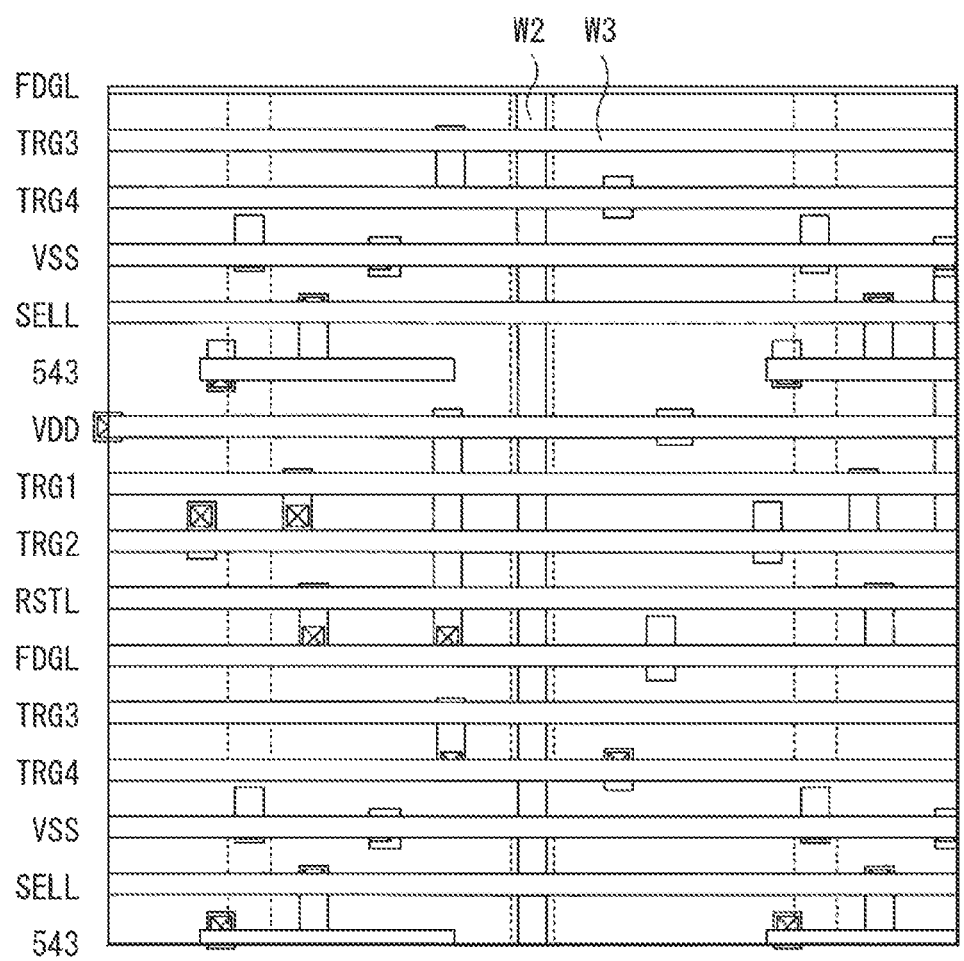
FIG. 30 is a schematic view illustrating an example of the planar configuration of the third wire layer together with the second wire layer illustrated in FIG. 29.
Figure 31:
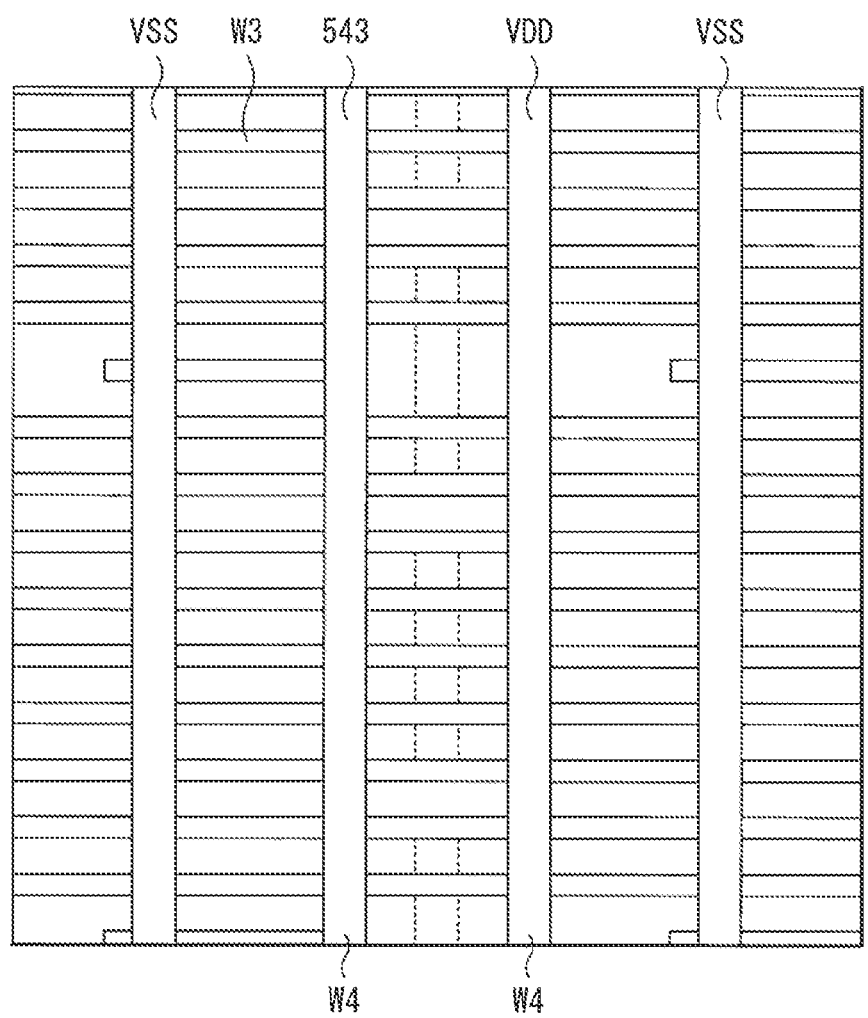
FIG. 31 is a schematic view illustrating an example of the planar configuration of the fourth wire layer together with the third wire layer illustrated in FIG. 30.

FIGS. 26 to 31 illustrate a modification of the planar configuration of the imaging device 1 according to the above-described embodiment. FIG. 26 schematically illustrates a planar configuration of the first substrate 100, and corresponds to FIG. 7B described in the above-described embodiment. FIG. 27 schematically illustrates a planar configuration near the front surface of the semiconductor layer 200S of the second substrate 200, and corresponds to FIG. 8 described in the above-described embodiment. FIG. 28 schematically illustrates a configuration of the first wire layer W1, the semiconductor layer 200S connected to the first wire layer W1, and each part of the first substrate 100, and corresponds to FIG. 9 described in the above-described embodiment. FIG. 29 illustrates an example of a planar configuration of the first wire layer W1 and the second wire layer W2, and corresponds to FIG. 10 described in the above-described embodiment. FIG. 30 illustrates an example of a planar configuration of the second wire layer W2 and the third wire layer W3, and corresponds to FIG. 11 described in the above-described embodiment. FIG. 31 illustrates an example of a planar configuration of the third wire layer W3 and the fourth wire layer W4, and corresponds to FIG. 12 described in the above-described embodiment.

In the present modification, the semiconductor layer 200S of the second substrate 200 extends in the H direction (FIG. 28). That is, the configuration substantially corresponds to a configuration obtained by rotating the planar configuration of the imaging device 1 illustrated in FIG. 21 and the like by 90 degrees.

For example, the pixel sharing unit 539 of the first substrate 100 is formed over a pixel region of 2 rows×2 columns, and has a substantially square planar shape (FIG. 26), as described in the above-described embodiment. For example, in each pixel sharing unit 539, the transfer gates TG1 and TG2 of the pixel 541A and the pixel 541B of one pixel row extend toward the central portion of the pixel sharing unit 539 in the V direction, and the transfer gates TG3 and TG4 of the pixel 541C and the pixel 541D of the other pixel row extend in a direction toward the outside of the pixel sharing unit 539 in the V direction. The pad portion 120 connected to the floating diffusion FD is provided at the central portion of the pixel sharing unit 539, and the pad portion 121 connected to the VSS contact region 118 is provided at an end portion of the pixel sharing unit 539 at least in the V direction (in the V direction and the H direction in FIG. 26). In this case, the positions of the through-electrodes TGV1 and TGV2 of the transfer gates TG1 and TG2 in the V direction approach the position of the through-electrode 120E in the V direction, and the positions of the through-electrodes TGV3 and TGV4 of the transfer gates TG3 and TG4 in the V direction approach the position of the through-electrode 121E in the V direction (FIG. 28). Therefore, the width (the size in the V direction) of the semiconductor layer 200S extending in the H direction can be increased for the same reason as described in the above-described embodiment. Therefore, the size of the amplification transistor AMP can be increased, and noise can be suppressed.

In each pixel circuit 210, the selection transistor SEL and the amplification transistor AMP are arranged side by side in the H direction, and the reset transistor RST is arranged at a position adjacent to the selection transistor SEL in the V direction with the insulating region 212 interposed between the selection transistor SEL and the reset transistor RST (FIG. 27). The FD conversion gain switching transistor FDG and the reset transistor RST are arranged side by side in the H direction. The VSS contact region 218 is provided in an island shape in the insulating region 212. For example, the third wire layer W3 extends in the H direction (FIG. 30), and the fourth wire layer W4 extends in the V direction (FIG. 31).

The imaging device 1 including such a second substrate 200 can also obtain the same effects as those described in the above-described embodiment. The arrangement of the pixel sharing unit 539 of the second substrate 200 is not limited to the arrangement described in the above-described embodiment and the present modification. For example, the semiconductor layer 200S described in the above-described embodiment and the first modification may extend in the H direction.

5. Fourth Modification

Figure 32:
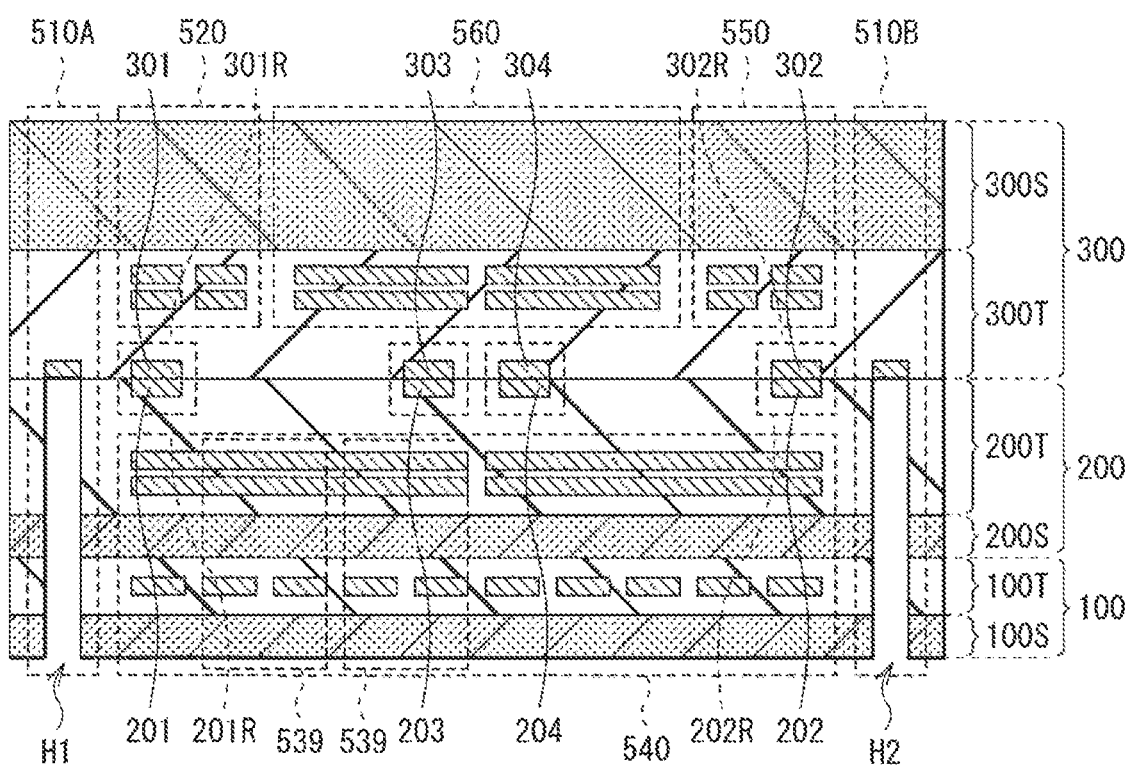
FIG. 32 is a schematic sectional view illustrating another example of the imaging device illustrated in FIG. 3.

FIG. 32 schematically illustrates a modification of the sectional configuration of the imaging device 1 according to the above-described embodiment. FIG. 32 corresponds to FIG. 3 described in the above-described embodiment. In the present modification, the imaging device 1 has contact portions 203, 204, 303, and 304 at positions facing the central portion of the pixel array portion 540, in addition to the contact portions 201, 202, 301, and 302. In this respect, the imaging device 1 of the present modification is different from the imaging device 1 described in the above-described embodiment.

The contact portions 203 and 204 are provided on the second substrate 200, and are exposed on a bonding surface with the third substrate 300. The contact portions 303 and 304 are provided on the third substrate 300, and are exposed on a bonding surface with the second substrate 200. The contact portion 203 is in contact with the contact portion 303, and the contact portion 204 is in contact with the contact portion 304. That is, in the imaging device 1, the second substrate 200 and the third substrate 300 are connected by the contact portions 203, 204, 303, and 304 in addition to the contact portions 201, 202, 301, and 302.

Figure 33:
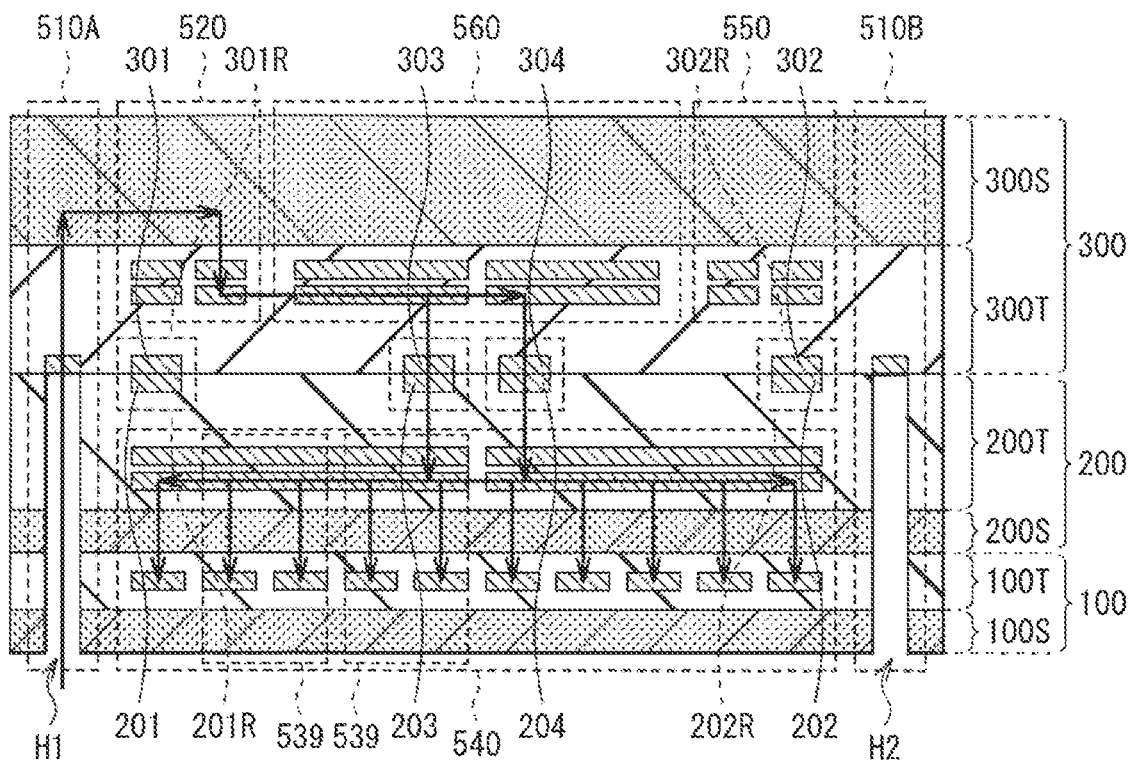
FIG. 33 is a schematic view for describing a path of an input signal to the imaging device illustrated in FIG. 32.
Figure 34:
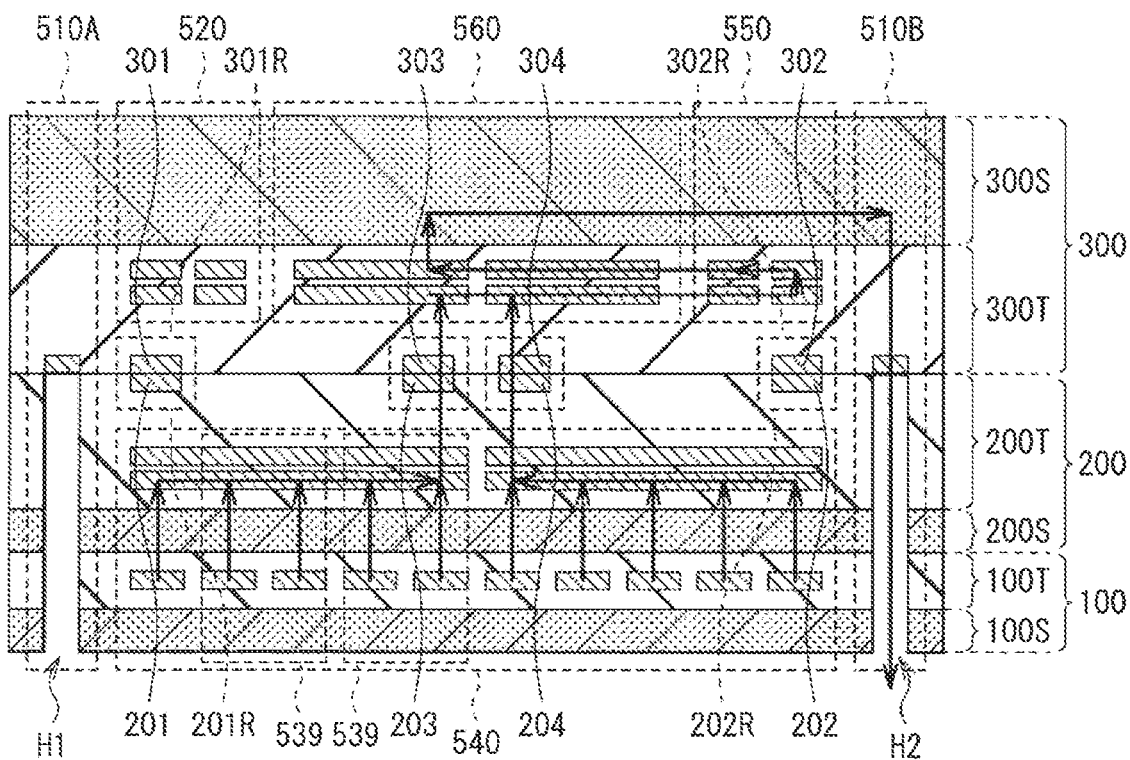
FIG. 34 is a schematic view for describing a signal path of a pixel signal of the imaging device illustrated in FIG. 32.

Next, the operation of the imaging device 1 will be described with reference to FIGS. 33 and 34. In FIG. 33, an input signal input to the imaging device 1 from the outside, and paths of a power supply potential and a reference potential are indicated by arrows. In FIG. 34, signal paths of the pixel signal output from the imaging device 1 to the outside are indicated by arrows. For example, an input signal input to the imaging device 1 through the input unit 510A is transmitted to the row drive unit 520 of the third substrate 300, and the row drive unit 520 creates a row drive signal. The row drive signal is transmitted to the second substrate 200 through the contact portions 303 and 203. Further, the row drive signal reaches each pixel sharing unit 539 of the pixel array portion 540 through the row drive signal line 542 in the wire layer 200T. Among the row drive signals reaching the pixel sharing unit 539 of the second substrate 200, the drive signals other than the transfer gate TG are input to the pixel circuit 210, and each transistor included in the pixel circuit 210 is driven. The drive signal of the transfer gate TG is input to the transfer gates TG1, TG2, TG3, and TG4 of the first substrate 100 through the through-electrode TGV, and the pixels 541A, 541B, 541C, and 541D are driven. Furthermore, the power supply potential and the reference potential supplied from the outside of the imaging device 1 to the input unit 510A (input terminal 511) of the third substrate 300 are transmitted to the second substrate 200 through the contact portions 303 and 203, and are supplied to the pixel circuit 210 of each of the pixel sharing units 539 through the wire in the wire layer 200T. The reference potential is also supplied to the pixels 541A, 541B, 541C, and 541D of the first substrate 100 through the through-electrode 121E. On the other hand, the pixel signal photoelectrically converted by the pixels 541A, 541B, 541C, and 541D of the first substrate 100 is transmitted to the pixel circuit 210 of the second substrate 200 for each pixel sharing unit 539. The pixel signal based on this pixel signal is transmitted from the pixel circuit 210 to the third substrate 300 through the vertical signal line 543 and the contact portions 204 and 304. This pixel signal is processed by the column signal processing unit 550 and the image signal processing unit 560 of the third substrate 300, and then is output to the outside through the output unit 510B.

The imaging device 1 including such contact portions 203, 204, 303, and 304 can also obtain the same effects as those described in the above-described embodiment. The position, the number, and the like of the contact portions can be changed according to the design of the circuit or the like of the third substrate 300 to which the wire is connected through the contact portions 303 and 304.

6. Fifth Modification

Figure 35:
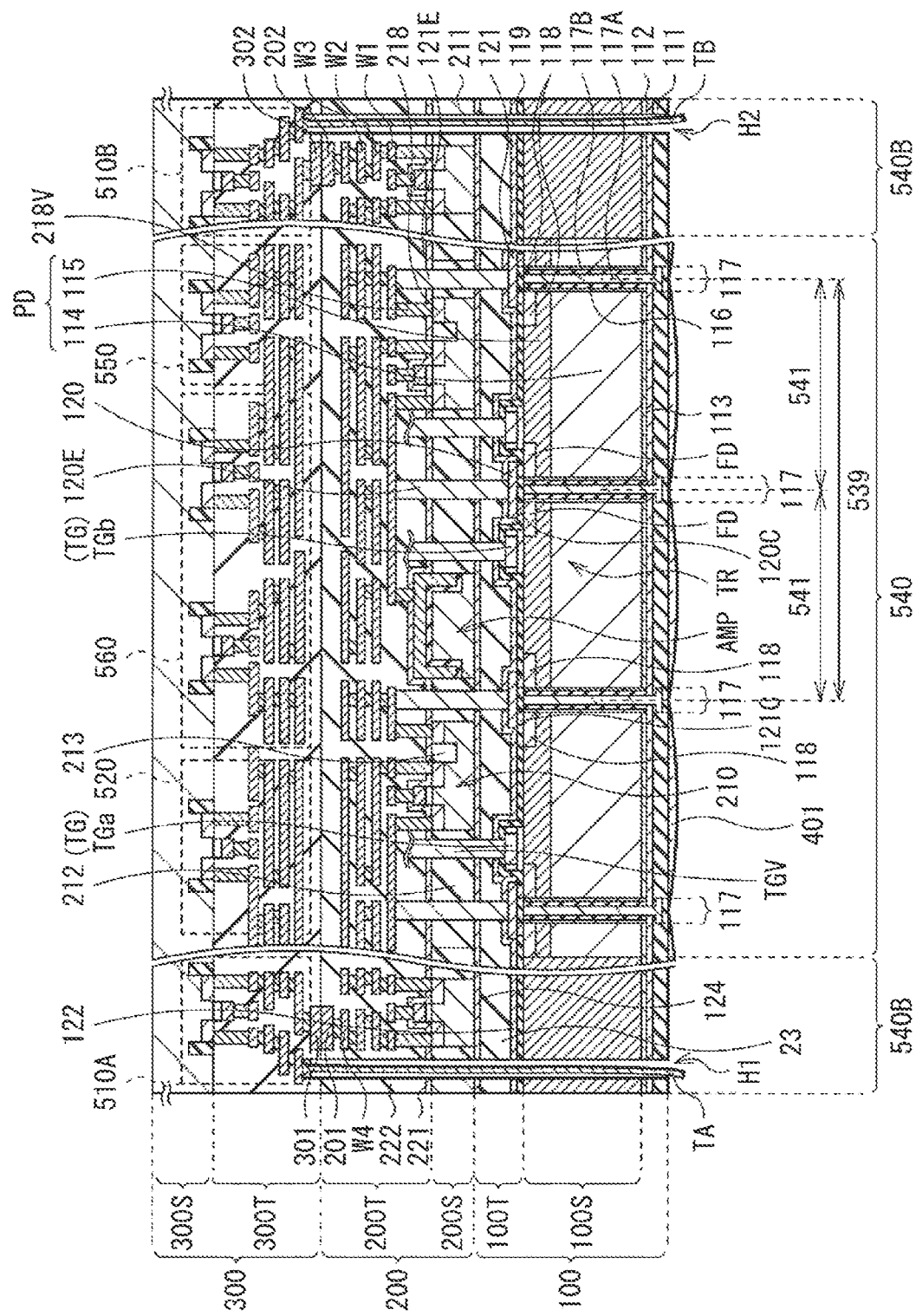
FIG. 35 is a schematic sectional view illustrating another example of the imaging device illustrated in FIG. 6.

FIG. 35 illustrates a modification of the sectional configuration of the imaging device 1 according to the above-described embodiment. FIG. 35 corresponds to FIG. 6 described in the above-described embodiment. In the present modification, the transfer transistor TR having a planar structure is provided on the first substrate 100. In this respect, the imaging device 1 of the present modification is different from the imaging device 1 described in the above-described embodiment.

In the transfer transistor TR, the transfer gate TG is configured only by the horizontal portion TGb. In other words, the transfer gate TG does not have the vertical portion TGa, and is provided to face the semiconductor layer 100S.

The imaging device 1 including such a transfer transistor TR having a planar structure can also obtain the same effects as those described in the above-described embodiment. Furthermore, it is also conceivable to form the photodiode PD closer to the front surface of the semiconductor layer 100S by providing the planar transfer gate TG on the first substrate 100 as compared with the case where the vertical transfer gate TG is provided on the first substrate 100, and thereby the saturation signal amount (Qs) is increased. In addition, it can be considered that, in the method of forming the planar transfer gate TG on the first substrate 100, the number of manufacturing steps is smaller and the photodiode PD is less likely to be adversely affected due to the manufacturing steps as compared with the method of forming the vertical transfer gate TG on the first substrate 100.

7. Sixth Modification

Figure 36:
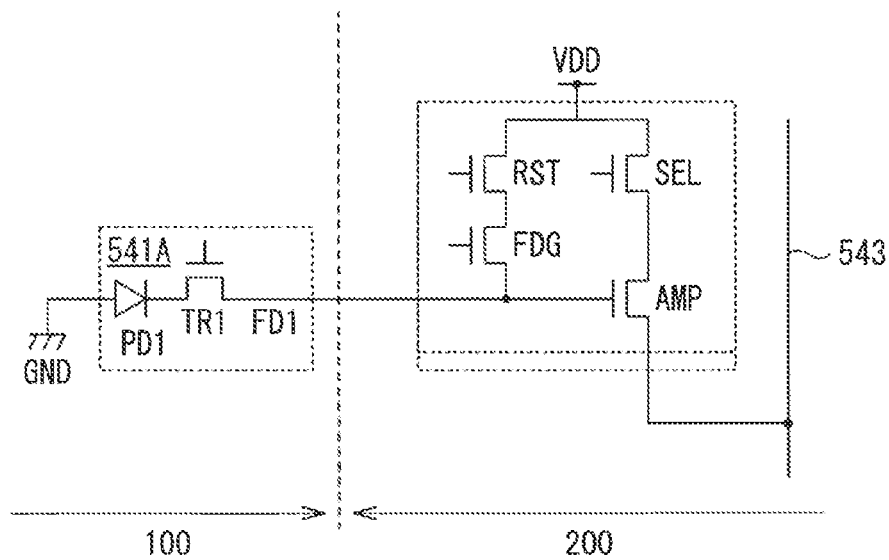
FIG. 36 is a diagram illustrating another example of the equivalent circuit illustrated in FIG. 4.

FIG. 36 illustrates a modification of the pixel circuit of the imaging device 1 according to the above-described embodiment. FIG. 36 corresponds to FIG. 4 described in the above-described embodiment. In the present modification, the pixel circuit 210 is provided for each pixel (pixel 541A). That is, the pixel circuit 210 is not shared by a plurality of pixels. In this respect, the imaging device 1 of the present modification is different from the imaging device 1 described in the above-described embodiment.

The imaging device 1 of the present modification is the same as the imaging device 1 described in the above-described embodiment in that the pixel 541A and the pixel circuit 210 are provided on different substrates (the first substrate 100 and the second substrate 200). Therefore, the imaging device 1 according to the present modification can also obtain the same effects as those described in the above-described embodiment.

8. Seventh Modification

Figure 37:
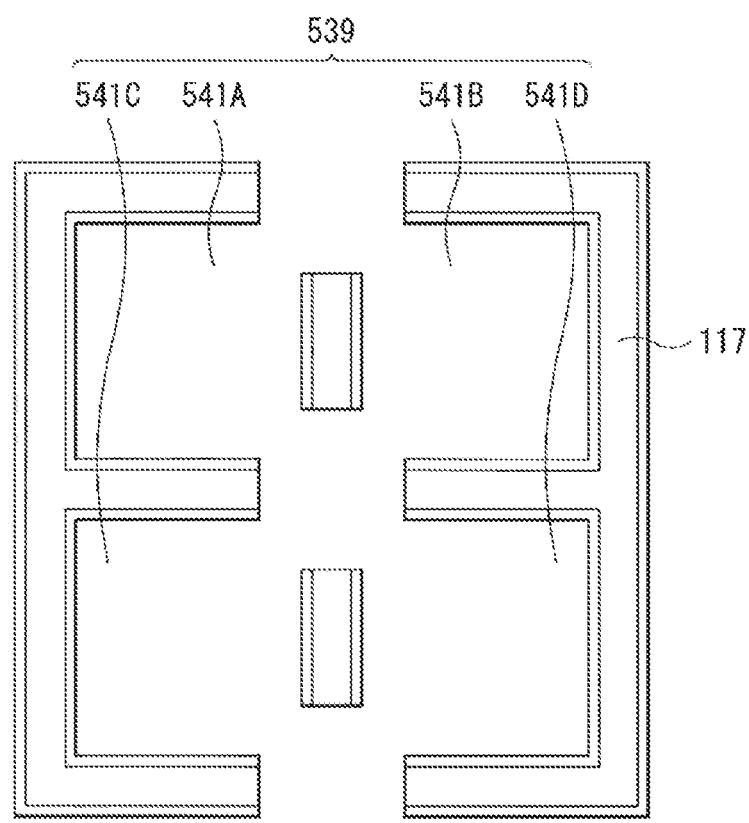

FIG. 37 illustrates a modification of the planar configuration of the pixel isolation portion 117 described in the above-described embodiment. A gap may be provided in the pixel isolation portion 117 surrounding each of the pixels 541A, 541B, 541C, and 541D. That is, the entire circumference of the pixels 541A, 541B, 541C, and 541D may not be surrounded by the pixel isolation portion 117. For example, the gap of the pixel isolation portion 117 is provided near the pad portions 120 and 121 (refer to FIG. 7B).

In the above-described embodiment, the example in which the pixel isolation portion 117 has the FTI structure penetrating the semiconductor layer 100S (refer to FIG. 6) has been described, but the pixel isolation portion 117 may have a configuration other than the FTI structure. For example, the pixel isolation portion 117 may not be provided to completely penetrate the semiconductor layer 100S, and may have a so-called deep trench isolation (DTI) structure.

9. Embodiment 2

9.1 Problem to be Solved by Embodiment 2

However, the floating diffusion FD in the pixel 541 and the gate of the amplification transistor AMP in the pixel circuit 210 are connected by a connection via as an FD wire FDL. In the fine pixel, the region area of the connection via of the FD wire FDL is about 45%. As a result, since the effective region of the pixel circuit 210 is reduced, the arrangement area of the amplification transistor AMP cannot be expanded.

In addition, the capacitance between the FD wire FDL and the gate of the amplification transistor AMP, and the capacitance between other connection vias running in parallel with the connection via of the FD wire FDL, for example, a TG wire TGL or a VSS wire VSS overlap the capacitance of the floating diffusion FD. Therefore, the FD capacitance is increased, the charge-voltage conversion efficiency is decreased, and the read noise cannot be reduced.

9.2 Outline of Embodiment 2

Therefore, the imaging device has a first substrate, a second substrate, a wire, and a trench. The first substrate has a pixel having a photodiode and a floating diffusion that holds the charge converted by the photodiode. The second substrate has a pixel circuit that reads a pixel signal based on the charge held in the floating diffusion in the pixel, and is stacked on the first substrate. The wire penetrates the first substrate and the second substrate in the stacking direction, and electrically connects the floating diffusion in the first substrate to an amplification transistor in the pixel circuit of the second substrate. The trench is formed at least in the second substrate, runs in parallel with the wire, and has a depth equal to or greater than the thickness of the semiconductor layer in the second substrate.

In the imaging device, a trench that runs in parallel with the wire, which electrically connects the floating diffusion in the first substrate to the amplification transistor in the pixel circuit of the second substrate, is formed in the second substrate at a depth equal to or greater than the thickness of the semiconductor layer in the second substrate. As a result, the parasitic capacitance of the wire is reduced, and the charge-voltage conversion efficiency is improved.

9.3 Specific Example of Embodiment 2-1

Figure 38:
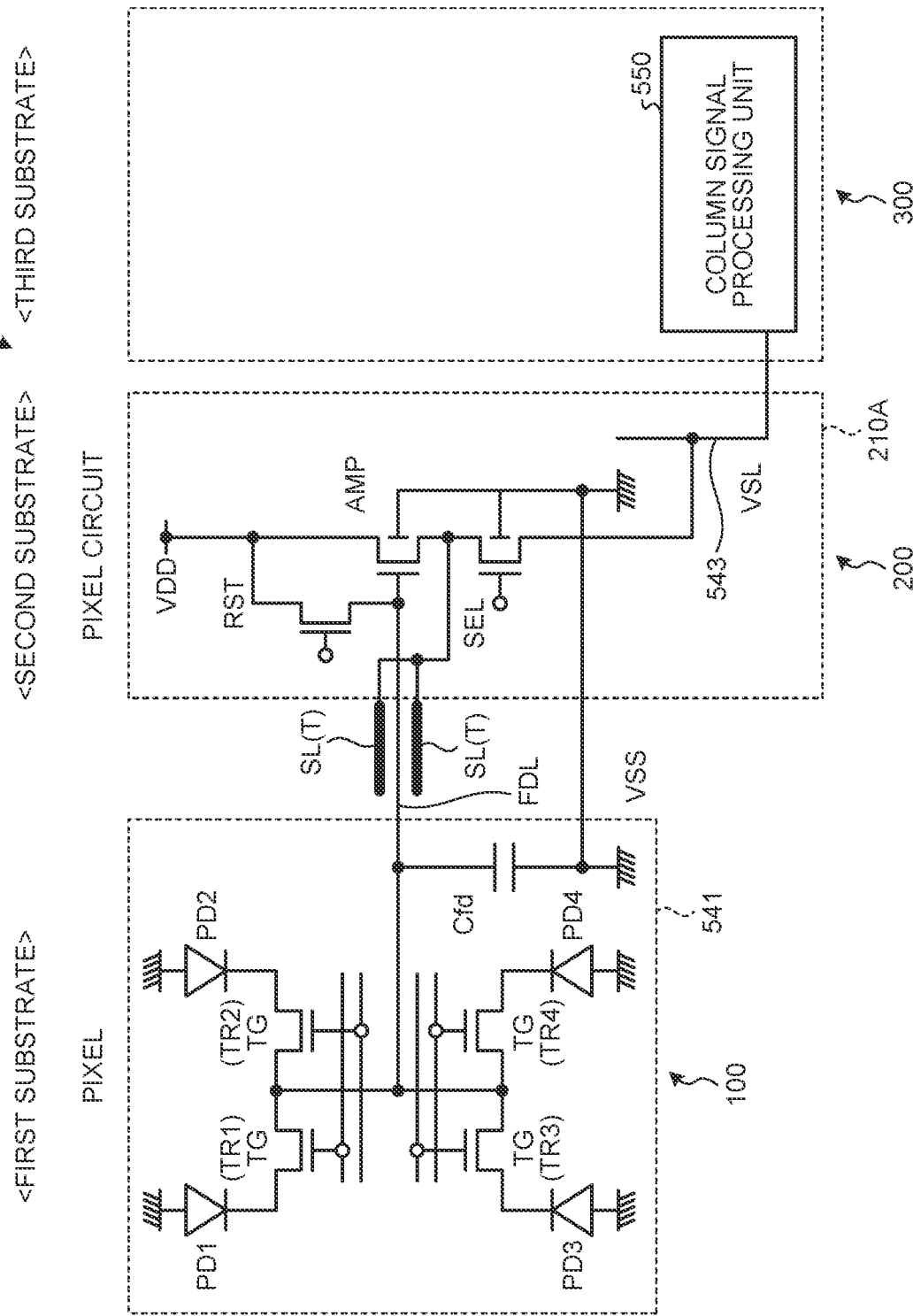
FIG. 38 is an equivalent circuit diagram illustrating an example of a configuration of a pixel sharing unit in an imaging device of Embodiment 2-1.

<9.3.1 Configuration of Embodiment 2-1>
FIG. 38 is an equivalent circuit diagram illustrating an example of a configuration of the pixel sharing unit 539 in the imaging device 1 of Embodiment 2-1. The imaging device 1 has a structure in which the first substrate 100, the second substrate 200, and the third substrate 300 are stacked. The first substrate 100 has the pixel 541 that perform photoelectric conversion. The second substrate 200 has a pixel circuit 210A that reads a pixel signal based on the charge output from the pixel 541. The third substrate 300 has a processing circuit that detects a pixel signal. The pixel sharing unit 539 has the pixel 541 and the pixel circuit 210A. The pixel 541 has four photodiodes PD, four transfer transistors TR that transfer the charge converted by each photodiode PD, and the floating diffusion FD that holds the charge transferred by the transfer transistor TR.

The pixel circuit 210A has, for example, the reset transistor RST, the amplification transistor AMP, the selection transistor SEL, the power supply line VDD, and the vertical signal line (VSL) 543. The reset transistor RST resets the potential of the floating diffusion FD to a predetermined potential. The amplification transistor AMP generates a signal of a voltage according to the level of the charge held in the floating diffusion FD as a pixel signal. The selection transistor SEL controls connection between the drain of the amplification transistor AMP and the vertical signal line 543. The floating diffusion FD of the first substrate 100 is electrically connected to the gate of the amplification transistor AMP in the pixel circuit 210A of the second substrate 200 by the FD wire FDL.

The vertical signal line 543 electrically connects each pixel circuit 210A to the column signal processing unit 550 in the processing circuit arranged on the third substrate 300. Then, the column signal processing unit 550 detects the pixel signal appearing in the vertical signal line 543 from each pixel circuit 210A.

The imaging device 1 has the FD wire FDL that connects the floating diffusion FD in the pixel 541 of the first substrate 100 to the gate of the amplification transistor AMP in the pixel circuit 210A of the second substrate 200. The FD wire FDL is formed as the connection via between the first substrate 100 and the second substrate 200. The imaging device 1 has a trench T that is formed in the second substrate 200 closer to the first substrate 100 side to run in parallel with the FD wire FDL. The trench T is in a state in which, for example, a conductive substance is embedded therein.

The source of the amplification transistor AMP in the pixel circuit 210A on the second substrate 200 and a shield wire SL made of a conductive substance embedded in the trench T are connected to have the same potential. By reducing the parasitic capacitance between the FD wire FDL and the shield wire SL to (1−(SF gain)) times, the capacitance of the FD wire FDL can be reduced to improve the charge-voltage conversion efficiency.

Figure 39:
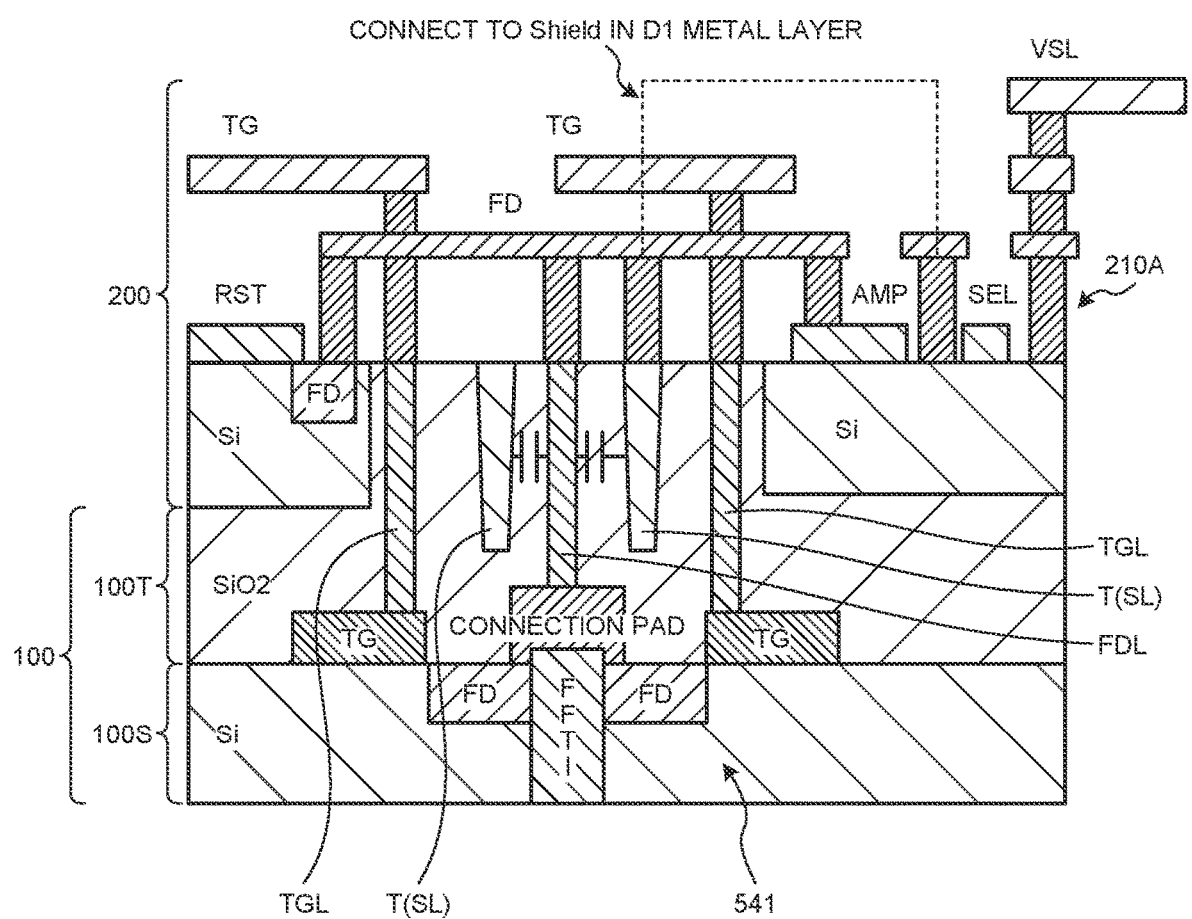
FIG. 39 is a schematic sectional view illustrating an example of a stacked structure of a first substrate and a second substrate in Embodiment 2-1.

FIG. 39 is a schematic sectional view illustrating an example of a stacked structure of the first substrate 100 and the second substrate 200 in Embodiment 2-1. The wire layer 100T between the semiconductor layer 100S in the first substrate 100 and the second substrate 200 is made of $SiO_2$ or the like, for example, and has a through-wire penetrating the wire layer 100T in the stacking direction. The first substrate 100 and the second substrate 200 are electrically connected to each other by the through-wire.

the through-wire has the TG wire TGL electrically connected to the gate (transfer gate TG) of the transfer transistor TR in the pixel 541, and the FD wire FDL connecting the gate of the amplification transistor AMP in the pixel circuit 210A to a connection pad of the floating diffusion FD. The trench T is formed between the TG wire TGL and the FD wire FDL in the wire layer 100T. Note that the depth of the trench T is equal to or greater than the thickness of the Si substrate of the second substrate 200, and is in a range that does not affect the floating diffusion FD formed in the first substrate 100. The shield wire SL is formed of, for example, a conductive material such as doped polysilicon or metal embedded in the trench T.

Figure 40:
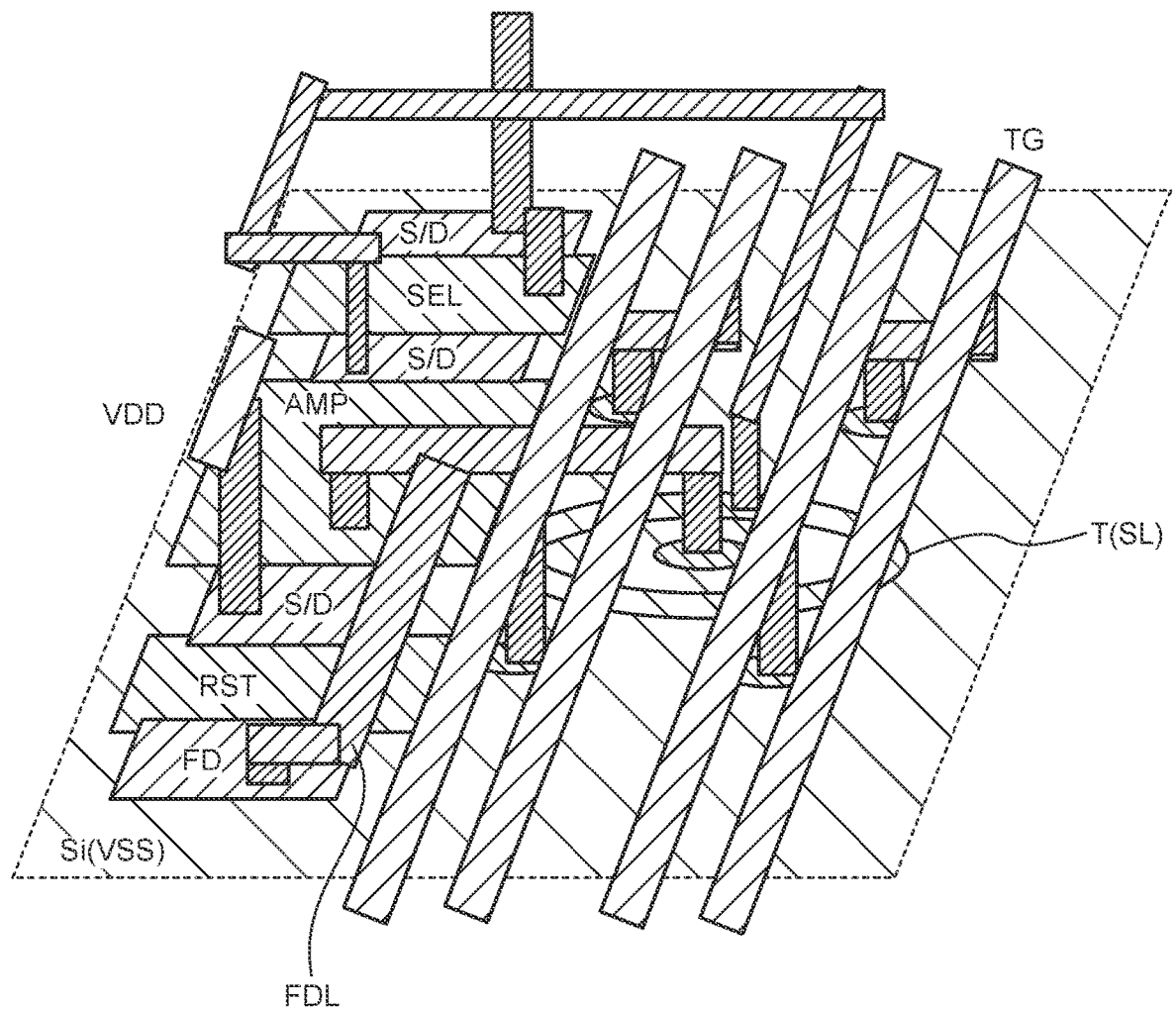
FIG. 40 is a schematic view illustrating an example of the stacked structure of the first substrate and the second substrate.

FIG. 40 is a schematic view illustrating an example of the stacked structure of the first substrate 100 and the second substrate 200. In a case where the shield wire SL (trench T) is viewed from the front surface (stacked surface) of the wire layer 100T, the shield wire SL is formed on the stacked surface of the wire layer 100T in a circular shape centered on the FD wire FDL. That is, the trench T running in parallel with the FD wire FDL is formed on the stacked surface of the wire device 100T such that the FD wire FDL is surrounded in a circular shape on the stacked surface in a state where the FD wire FDL and the TG wire TGL running in parallel with the FD wire FDL are electrically separated from each other.

<9.3.2 Operation and Effect of Embodiment 2-1>

In the imaging device 1 of Embodiment 2-1, the shield wire SL runs in parallel with the FD wire FDL penetrating and connecting the first substrate 100 and the second substrate 200. Furthermore, in the imaging device 1, the source of the amplification transistor AMP in the pixel circuit 210A on the second substrate 200 and the shield wire SL are electrically connected to have the same potential. As a result, since the parasitic capacitance between the FD wire FDL and the shield wire SL is reduced to (1−(SF gain)) times, the capacitance of the FD wire FDL can be reduced to improve the charge-voltage conversion efficiency. In addition, even in a case where one FD wire FDL runs in parallel with two TG wires TGL, the shield wire SL is arranged between each FD wire FDL and the TG wire TGL and between the FD wire FDL and another FD wire FDL. As a result, by reducing the parasitic capacitance of the FD wire FDL, the charge-voltage conversion efficiency can be improved.

<9.3.3 Modification of Embodiment 2-1>

Figure 41:
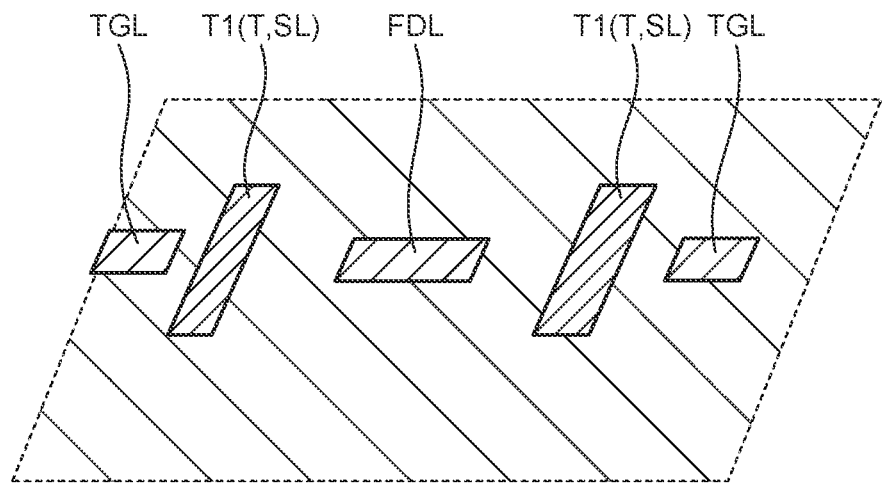
FIG. 41 is a schematic view illustrating an example of an arrangement configuration of trenches T1 on a surface of the second substrate.
Figure 42:
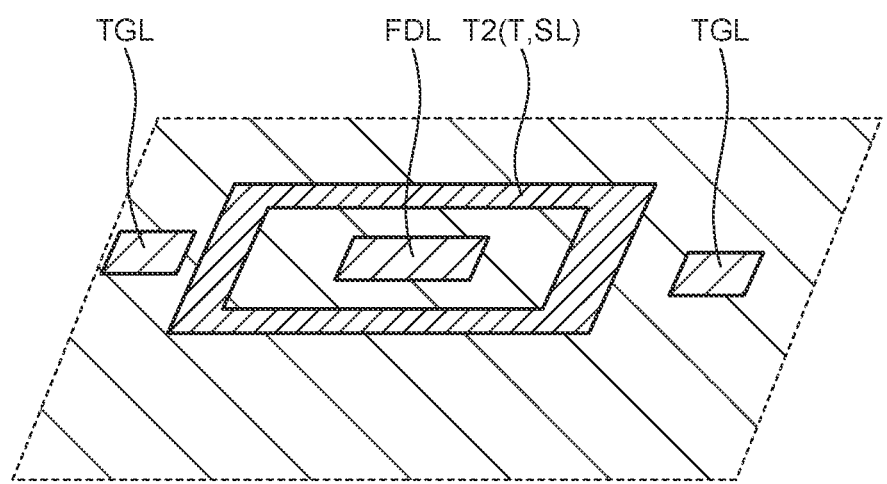
FIG. 42 is a schematic view illustrating an example of an arrangement configuration of a trench T2 on a surface of the second substrate.

In addition, the case where the shield wire SL is formed in a circular shape centered on the FD wire FDL in a case where the shield wire SL is viewed from the front surface (stacked surface) of the wire layer 100T has been exemplified, but the present disclosure is not limited thereto, and can be appropriately changed. FIG. 41 is a schematic view illustrating an example of an arrangement configuration of trenches T1 on a surface of the second substrate 200, and FIG. 5X is a schematic view illustrating an example of an arrangement configuration of a trench T2 on a surface of the second substrate 200. For example, in a case where the shield wire SL is viewed from the front surface (stacked surface) of the wire layer 100T, the parallel plate-shaped trench T1 illustrated in FIG. 41 may be used, or the rectangular trench T2 illustrated in FIG. 42 may be used, which can be appropriately changed.

Figure 43:
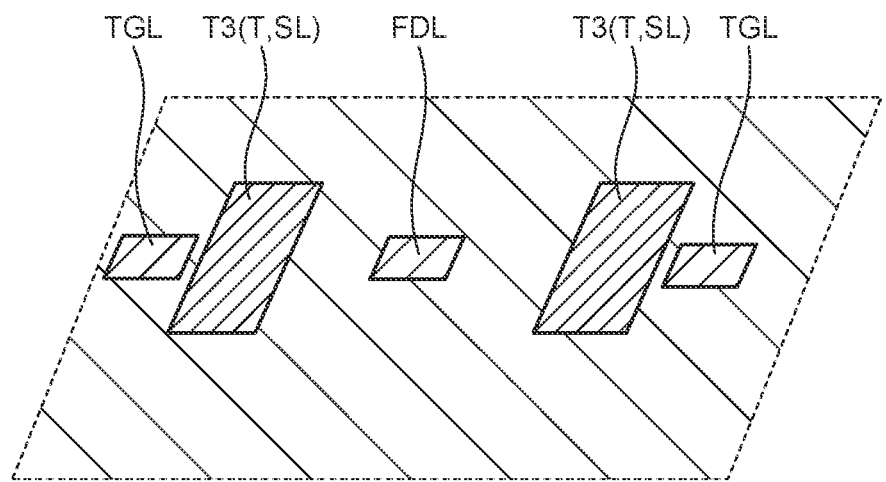
FIG. 43 is a schematic view illustrating an example of an arrangement configuration of trenches T3 on a surface of the second substrate.
Figure 44:
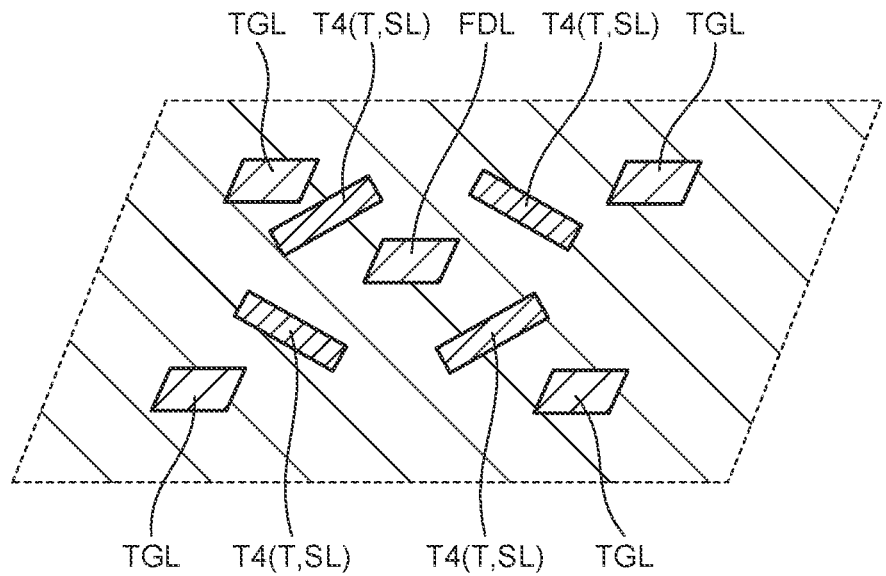
FIG. 44 is a schematic view illustrating an example of an arrangement configuration of trenches T4 on a surface of the second substrate.

FIG. 43 is a schematic view illustrating an example of an arrangement configuration of trenches T3 on a surface of the second substrate 200. In addition, the trench T may be arranged at a position electrically separating the FD wire FDL and the TG wire TGL from each other, and for example, the trench T3 larger than the width length of the FD wire FDL may be arranged with respect to the FD wire FDL illustrated in FIG. 43. FIG. 44 is a schematic view illustrating an example of an arrangement configuration of trenches T4 on a surface of the second substrate 200. In a case where the TG wire TGL is arranged on a diagonal line of the FD wire FDL illustrated in FIG. 44, the trench T4 may be arranged between the FD wire FDL on the diagonal line of the FD wire FDL and the TG wire TGL, and can be appropriately changed.

In the imaging device 1 of Embodiment 2-1, the case where the shield wire SL of the trench T in which the conductive material is embedded is formed in the wire layer 100T has been exemplified. However, a hollow trench T may be formed in the wire layer 100T as the shield wire SL without embedding the conductive material in the trench T, and can be appropriately changed.

Note that, as the selected pixel 541, for example, the pixel 541 selected on a row basis among one or a plurality of pixels 541 arranged in the row direction has been exemplified. However, the non-selected pixel 541 may be any pixel 541 other than the selected pixel 541, and can be appropriately changed.

As the selected pixel 541, the pixel 541 selected on a row basis has been exemplified, but, for example, the pixel 541 may be selected on a column basis among one to a plurality of pixels 541 arranged in the column direction, and can be appropriately changed.

The pixel 541 includes, for example, a total of four photodiodes PD of 2×2, but can be appropriately changed as long as the pixel 541 includes one or more photodiode PD without being limited to four photodiodes PD.

9.4 Specific Example of Embodiment 2-2

<9.4.1 Configuration of Embodiment 2-2>

In the imaging device 1 of Embodiment 2-2, the case where the trench T is arranged between one FD wire FDL and the TG wire TGL has been exemplified. However, the trench T may be disposed between four FD wires FDL and the TG wire TGL, and the embodiment thereof will be described below as Embodiment 2-2. The same components as those of Embodiment 2-1 are denoted by the same reference numerals, and the redundant description on the components and operations will be omitted.

Figure 45:
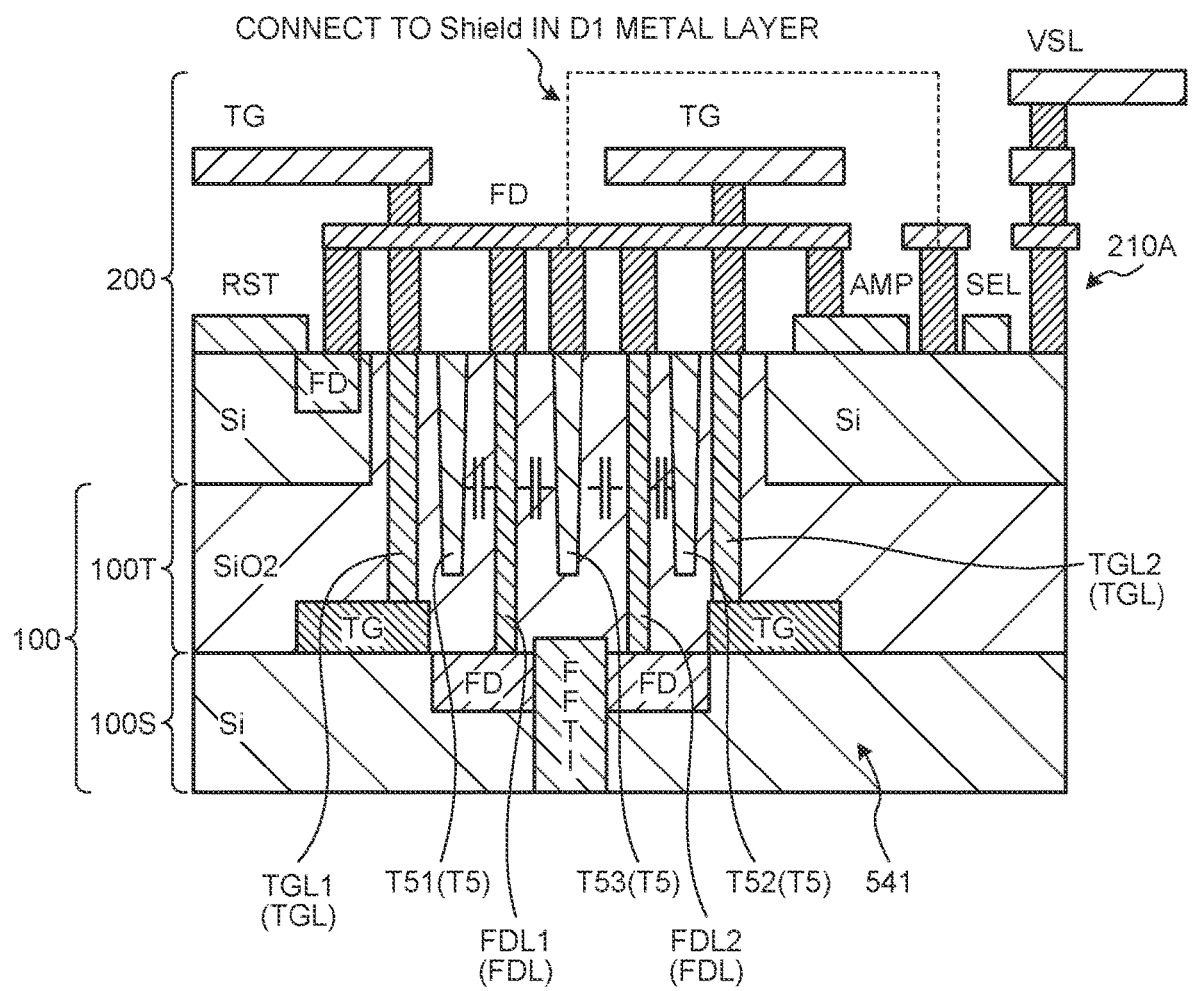
FIG. 45 is a schematic sectional view illustrating an example of a stacked structure of a first substrate and a second substrate in Embodiment 2-2.

FIG. 45 is a schematic sectional view illustrating an example of a stacked structure of the first substrate 100 and the second substrate 200 in Embodiment 2-2. The wire layer 100T has a first FD wire FDL1, a second FD wire FDL2, a first TG wire TGL1, and a second TG wire TGL2.

The wire layer 100T includes a first trench T51, a second trench T52, and a third trench T53. The first trench T51 is formed between the first TG wire TGL1 and the first FD wire FDL1, and electrically separates the first FD wire FDL1 from the first TG wire TGL1. The second trench T52 is formed between the second TG wire TGL2 and the second FD wire FDL2, and electrically separates the second TG wire TGL2 from the second FD wire FDL2. The third trench T53 is formed between the first FD wire FDL1 and the second FD wire FDL2, and electrically separates the first FD wire FDL1 from the second FD wire FDL2.

Figure 46A:
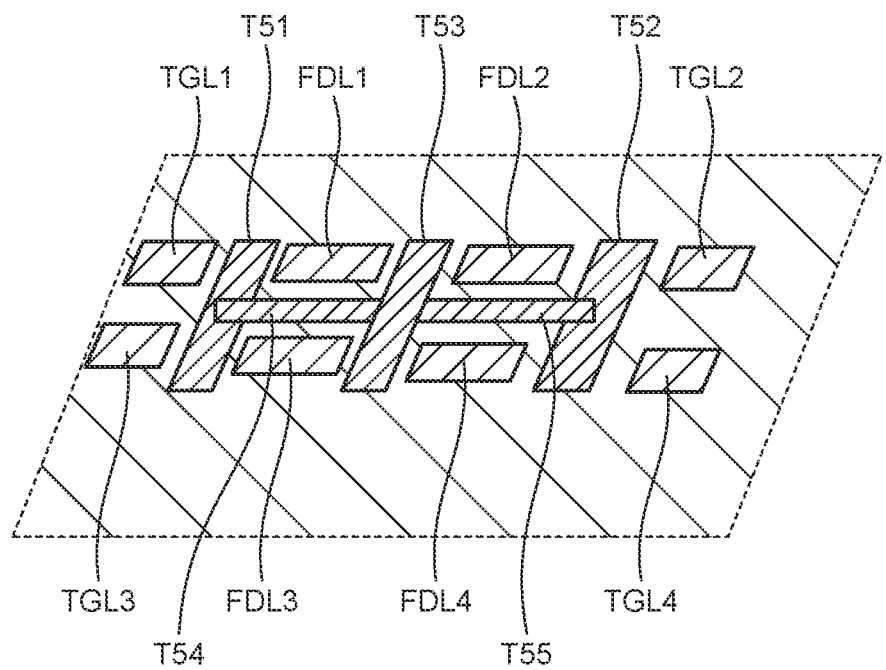
FIG. 46A is a schematic view illustrating an example of an arrangement configuration of trenches T5 on a surface of the second substrate.

FIG. 46A is a schematic view illustrating an example of an arrangement configuration of trenches T5 on a surface of the second substrate 200. In a case where the trenches T5 are viewed from the front surface (stacked surface) of the wire layer 100T, as illustrated in FIG. 46A, the trenches T5 include the first trench T51, the second trench T52, the third trench T53, a fourth trench T54, and a fifth trench T55. The first trench T51 electrically separates the first FD wire FDL1 from the first TG wire TGL1, and electrically separates a third FD wire FDL3 from a third TG wire TGL3. The third trench T53 electrically separates the first FD wire FDL1 from the second FD wire FDL2, and electrically separates the third FD wire FDL3 from a fourth FD wire FDL4. The second trench T52 electrically separates the second FD wire FDL2 from the second TG wire TGL2, and electrically separates the fourth FD wire FDL4 from a fourth TG wire TGL4. FIG. 47 is a schematic view illustrating an example of a schematic sectional shape of the trench T5. In the trench T5, as illustrated in FIG. 47, the hole size on the front surface (second substrate 200) side may be larger than the hole size on the back surface (first substrate 100) side, and can be appropriately changed.

Figure 46B:
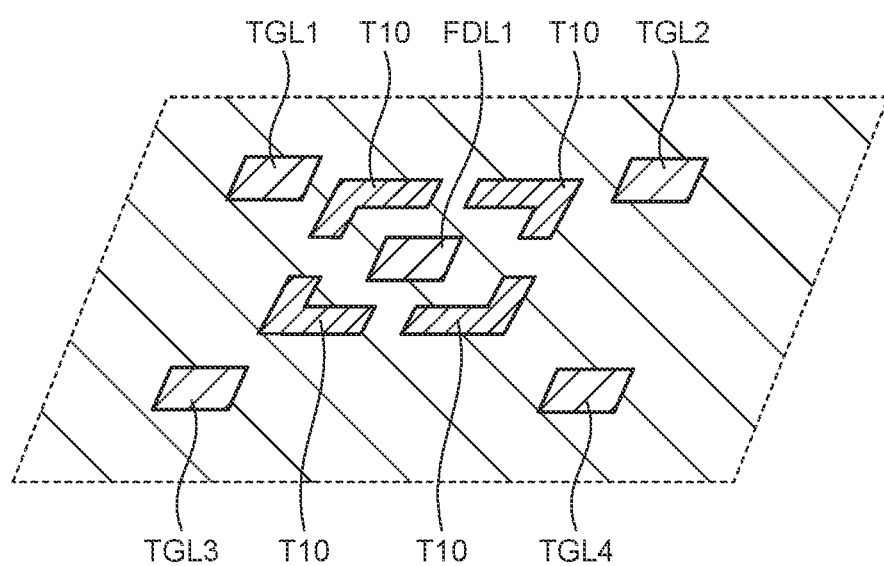
FIG. 46B is a schematic view illustrating an example of an arrangement configuration of trenches T10 on a surface of the second substrate.

The arrangement configuration of the trenches T can be appropriately changed, but may be as illustrated in FIGS. 46B to 46H. FIG. 46B is a schematic view illustrating an example of an arrangement configuration of trenches T10 on a surface of the second substrate 200. An L-shaped trench T10 may be arranged on each of the diagonal lines of the first FD wire FDL1 with respect to the TG wires TGL1 to TGL4 illustrated in FIG. 46B. In this case, the trenches T10 electrically separate the first FD wire FDL1 from the first TG wire TGL1, the first FD wire FDL1 from the second TG wire TGL2, the first FD wire FDL1 from the third TG wire TGL3, and the first FD wire FDL1 from the fourth TG wire TGL4.

Figure 46C:
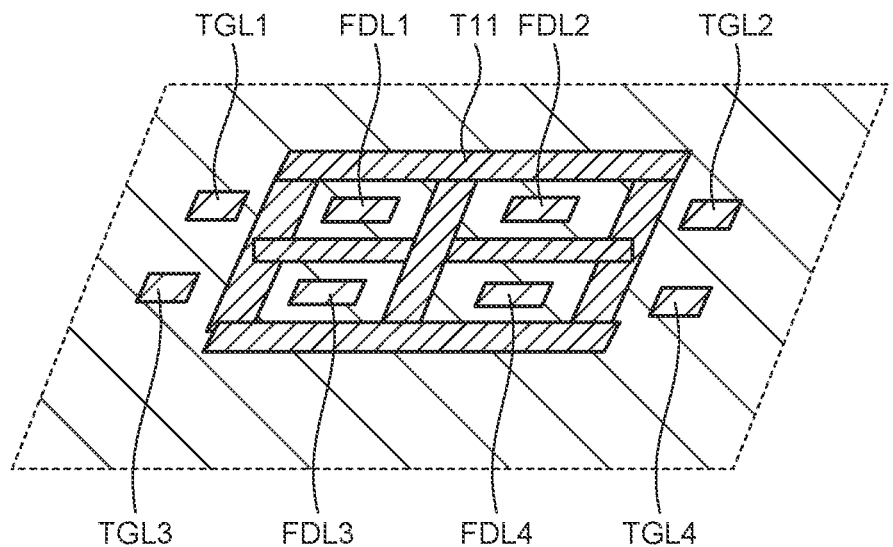
FIG. 46C is a schematic view illustrating an example of an arrangement configuration of trenches T11 on a surface of the second substrate.
Figure 46D:
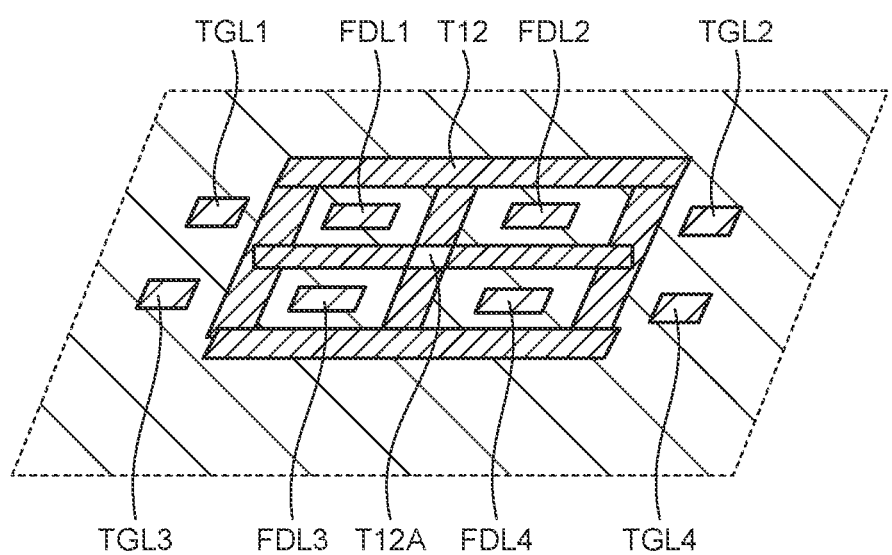
FIG. 46D is a schematic view illustrating an example of an arrangement configuration of trenches T12 on a surface of the second substrate.

FIG. 46C is a schematic view illustrating an example of an arrangement configuration of trenches T11 on a surface of the second substrate 200. As illustrated in FIG. 46C, each of the FD wires FDL1 to FDL4 may be surrounded by the trenches T11 in a lattice shape. The trenches electrically separate the FD wire FDL from the adjacent FD wire FDL, and the FD wire FDL from the adjacent TG wire TGL. FIG. 46D is a schematic view illustrating an example of an arrangement configuration of trenches T12 on a surface of the second substrate 200. As illustrated in FIG. 46D, each of the FD wires FDL1 to FDL4 may be surrounded by the trenches T12 in a lattice shape. At this time, the shield of a cross-shaped intersection T12A of the trenches T12 is omitted. As a result, it is needless to say that the FD wire FDL is electrically separated from the adjacent FD wire FDL and the FD wire FDL is electrically separated from the adjacent TG wire TGL, and it is possible to avoid a situation in which the processing depth of the intersection at the time of trench processing becomes deep.

Figure 46E:
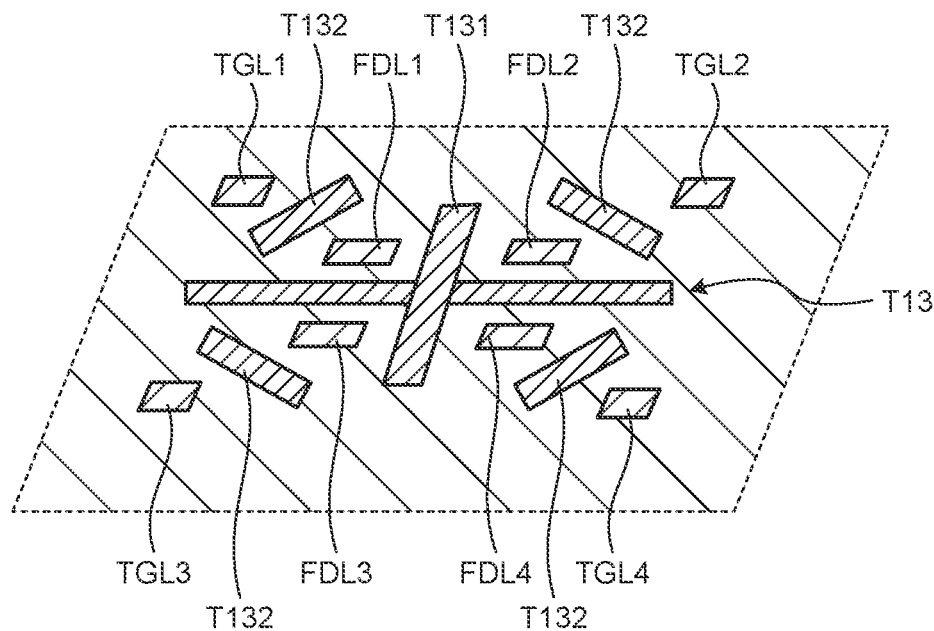
FIG. 46E is a schematic view illustrating an example of an arrangement configuration of trenches T13 on a surface of the second substrate.
Figure 46F:
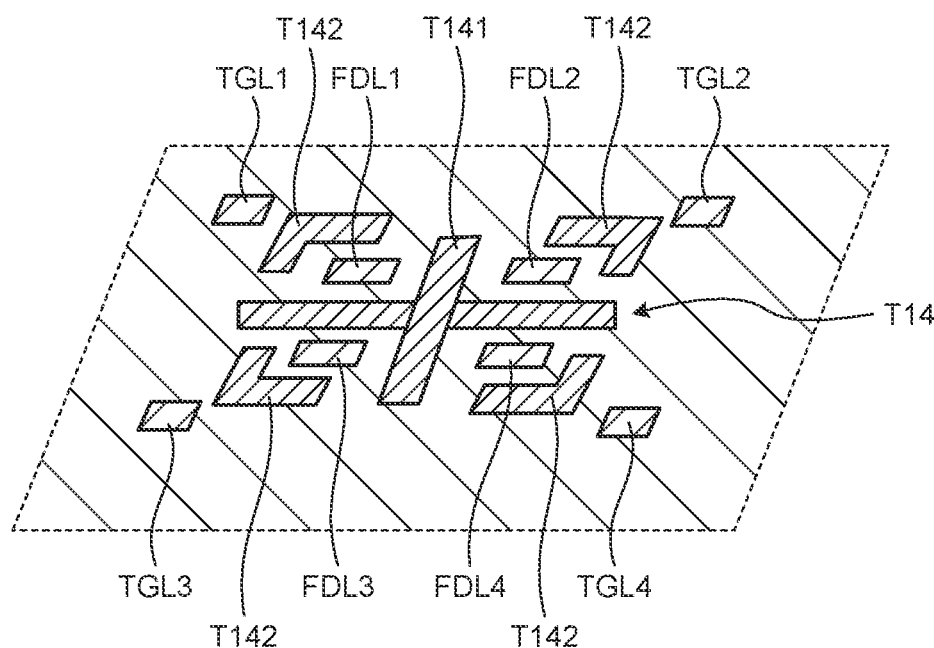
FIG. 46F is a schematic view illustrating an example of an arrangement configuration of trenches T14 on a surface of the second substrate.

FIG. 46E is a schematic view illustrating an example of an arrangement configuration of trenches T13 on a surface of the second substrate 200. The trenches T13 illustrated in FIG. 46E have a cross trench T131 and diagonal trenches T132. The cross trench T131 electrically separates the adjacent FD wires FDL from each other. The diagonal trench T132 electrically separates the FD wire FDL from the TG wire TGL on the diagonal line thereof. FIG. 46F is a schematic view illustrating an example of an arrangement configuration of trenches T14 on a surface of the second substrate 200. The trenches T14 illustrated in FIG. 46F have a cross trench T141 and diagonal trenches T142. The cross trench T141 electrically separates the adjacent FD wires FDL from each other. The diagonal trench T142 electrically separates the FD wire FDL from the TG wire TGL on the diagonal line thereof.

Figure 46G:
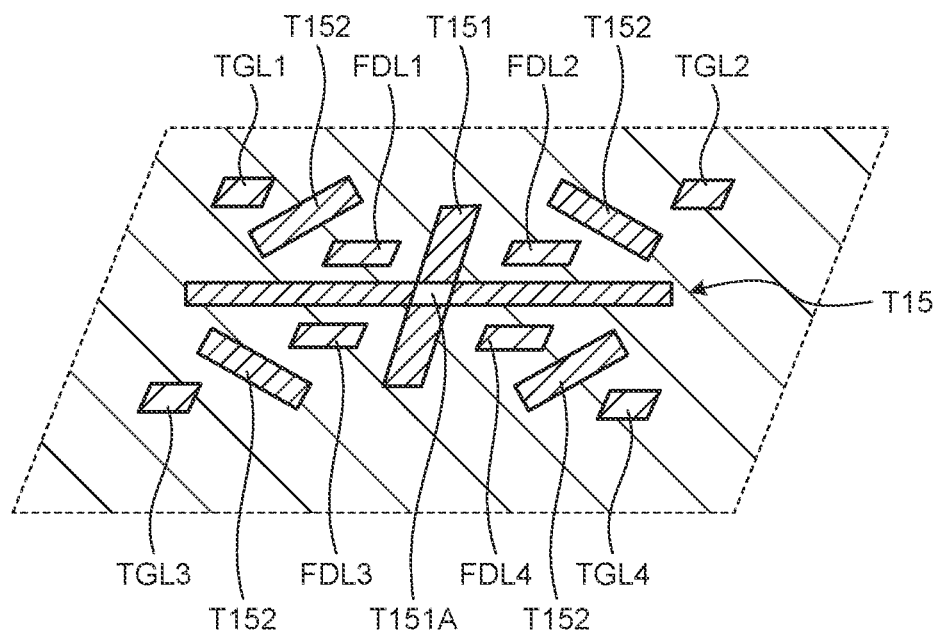
FIG. 46G is a schematic view illustrating an example of an arrangement configuration of trenches T15 on a surface of the second substrate.

FIG. 46G is a schematic view illustrating an example of an arrangement configuration of trenches T15 on a surface of the second substrate 200. The trenches T15 illustrated in FIG. 46G have a cross trench T151 and diagonal trenches T152. The cross trench T151 electrically separates the adjacent FD wires FDL from each other. The diagonal trench T152 electrically separates the FD wire FDL from the TG wire TGL on the diagonal line thereof. At this time, the shield of a cross-shaped intersection T151A of the cross trench T151 is omitted. As a result, it is needless to say that the FD wire FDL is electrically separated from the adjacent FD wire FDL and the FD wire FDL is electrically separated from the adjacent TG wire TGL, and it is possible to avoid a situation in which the processing depth of the intersection T151A at the time of trench processing becomes deep.

Figure 46H:
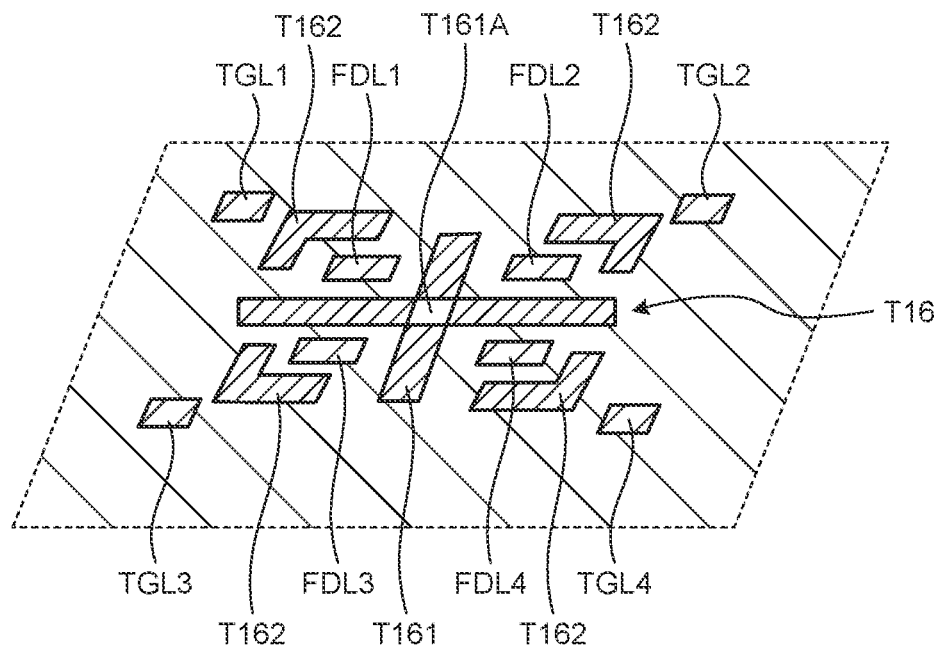
FIG. 46H is a schematic view illustrating an example of an arrangement configuration of trenches T16 on a surface of the second substrate.

FIG. 46H is a schematic view illustrating an example of an arrangement configuration of trenches T16 on a surface of the second substrate 200. The trenches T16 illustrated in FIG. 46H have a cross trench T161 and diagonal trenches T162. The cross trench T161 electrically separates the adjacent FD wires FDL from each other. The diagonal trench T162 electrically separates the FD wire FDL from the TG wire TGL on the diagonal line thereof. At this time, the shield of a cross-shaped intersection T161A of the cross trench T161 is omitted. As a result, it is needless to say that the FD wire FDL is electrically separated from the adjacent FD wire FDL and the FD wire FDL is electrically separated from the adjacent TG wire TGL, and it is possible to avoid a situation in which the processing depth of the intersection T161A at the time of trench processing becomes deep.

<9.4.2 Operation and Effect of Embodiment 2-2>

Even in a case where the four FD wires FDL1 to FDL4 run in parallel with the four TG wires TGL1 to TGL4, the trenches T5 that electrically separate each FD wire FDL from the TG wire TGL, and electrically separate the FD wire FDL from another FD wire FDL are arranged. As a result, by reducing the capacitance of the FD wire FDL, the charge-voltage conversion efficiency can be improved.

In the imaging device 1 of Embodiment 2-1, the case where the shield wire SL configured by the trench T in which the conductive material is embedded is arranged in the wire layer 100T has been exemplified. However, the material to be embedded in the trench T is not limited to the conductive material, and may be, for example, a gas, and the embodiment thereof will be described below as Embodiment 2-3.

9.5 Specific Example of Embodiment 2-3

<9.5.1 Configuration of Embodiment 2-3>

FIG. 48A is an equivalent circuit diagram illustrating an example of a configuration of the pixel sharing unit 539 in the imaging device 1 of Embodiment 2-3, and FIG. 49 is a schematic sectional view illustrating an example of a stacked structure of the first substrate 100 and the second substrate 200 in Embodiment 2-3. The imaging device 1 has the FD wire FDL that penetrates and connects the wire layer 100T between the semiconductor layer 100S in the first substrate 100 and the second substrate 200, and a trench T6 that runs in parallel with the FD wire FDL formed in the second substrate 200 closer to the first substrate 100 side.

The trench T6 is filled with and sealed with a gas having a low relative dielectric constant (ss) such as Air (1.00054), N2 (1.00057), He (1.00052), or Ar (1.00007) to form a shield wire SL1. By using an Air Gap having a relative dielectric constant lower than the relative dielectric constant (3.9) of $SiO_2$, the FD capacitance can be reduced to improve the charge-voltage conversion efficiency.

In the imaging device 1 of Embodiment 2-3, since the trench T6 filled with the gas having a low relative dielectric constant is arranged between the FD wire FDL and the TG wire TGL, the parasitic capacitance of the FD wire FDL is reduced to improve the charge-voltage conversion efficiency.

Note that, the case where the trench T6 is sealed with the gas having a low dielectric constant has been exemplified, but the trench T6 may be filled with an insulating film material having a low dielectric constant (Low-k), and can be appropriately changed.

In addition, the case where the depth of the trench T6 is set to be deeper than $SiO_2$ in the second substrate 200 and is set to a depth in a range that does not affect the floating diffusion FD on the first substrate 100 has been exemplified. However, the depth is not limited thereto, and may be set to the depth of the trench T6 of the shield wire SL1 illustrated in FIG. 49 as compared with the shield wire SL, and can be appropriately changed. In addition, for the wire layer 100T, for example, $SiO_2$ has been exemplified, but, for example, an insulating film material having a dielectric constant (Low-k) lower than $SiO_2$ may be used, and can be appropriately changed.

<9.5.2 Operation and Effect of Embodiment 2-3>

In the imaging device 1 of Embodiment 2-3, even in a case where one FD wire FDL runs in parallel with two TG wires TGL, the shield wire SL1 is disposed which electrically separates each FD wire FDL from the TG wire TGL and electrically separates the FD wire FDL from another FD wire FDL. As a result, by reducing the parasitic capacitance of the FD wire FDL, the charge-voltage conversion efficiency can be improved.

Figure 48B:
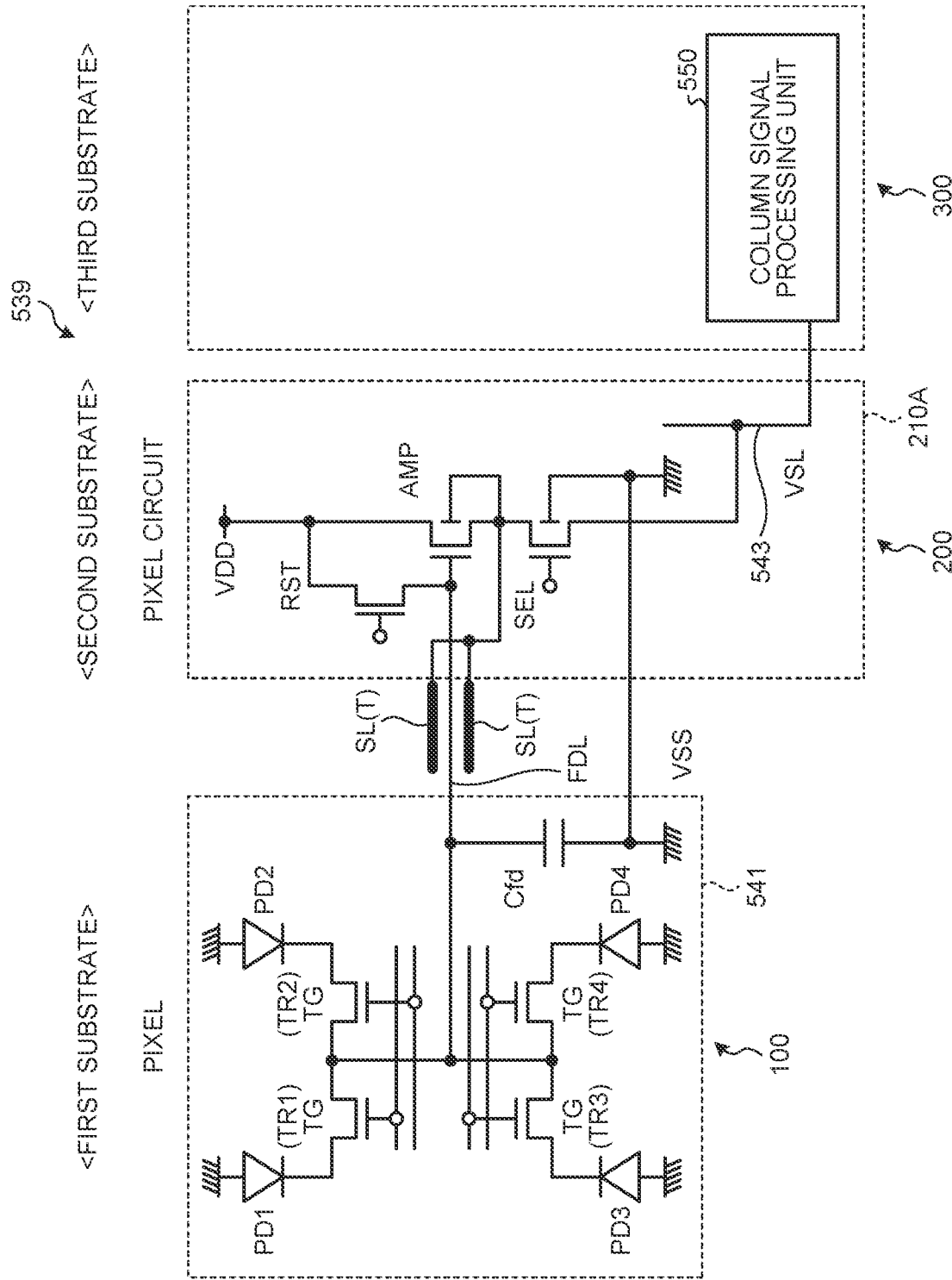
FIG. 48B is an equivalent circuit diagram illustrating another example of the configuration of the pixel sharing unit in the imaging device of Embodiment 2-3.

FIG. 48B is an equivalent circuit diagram illustrating another example of the configuration of the pixel sharing unit in the imaging device of Embodiment 2-3.

The pixel sharing unit in FIG. 48B is different from the pixel sharing unit in FIG. 48A in that the back gate of the amplification transistor AMP is connected to the source of the amplification transistor AMP.

Accordingly, since the gate-source voltage Vgs of the amplification transistor AMP is decreased, the potential of the reset level appearing in the vertical signal line (column read line) 543 is increased.

By the way, assuming that the lower limit of the signal potential level of the vertical signal line (column read line) 543 is determined by a load circuit included in the column signal processing unit 550, by connecting the back gate and the source of the amplification transistor AMP, it is possible to increase the amplitude of the signal (pixel signal) that can be handled in the vertical signal line (column read line) 543, and it is possible to improve the detection accuracy.

10. Embodiment 3

10.1 Problem to be Solved by Embodiment 3

For example, the charge obtained by photoelectric conversion of the photodiode PD is set as Qp, the FD capacitance of the floating diffusion FD is set as Cfd, and the gain of the source follower circuit is set as Gsf. In this case, the source follower output voltage Vsf is calculated by Vsf=Gsf*Qp/Cfd. Therefore, the signal/noise (S/N) ratio is improved when a large output voltage is obtained with the same light amount. However, as the FD capacitance (Cfd) is increased, the source follower output voltage (Vsf) is decreased. Therefore, the source follower output voltage (Vsf) can be increased by increasing the gain (Gsf) of the source follower circuit. However, the influence of the parasitic capacitance of the FD capacitance (Cfd) is large, and a decrease in the parasitic capacitance is required.

10.2 Outline of Embodiment 3

Therefore, the imaging device has the first substrate, the second substrate, the wire, and the shield wire. The first substrate has a pixel having a photodiode and a floating diffusion that holds the charge converted by the photodiode. The second substrate has a pixel circuit that reads a pixel signal based on the charge held in the floating diffusion in the pixel, and is stacked on the first substrate. The wire electrically connects the floating diffusion in the first substrate to the amplification transistor in the pixel circuit of the second substrate, and is formed on the first substrate and the second substrate. The shield wire electrically connects the gate of the amplification transistor and the source of the amplification transistor in a state where the well layer of the pixel circuit and the well layer of the amplification transistor in the pixel circuit are electrically isolated from each other, and shields the wire while running in parallel with the wire.

In the imaging device, the shield wire runs in parallel with the wire and shields the wire, the shield wire electrically connecting the gate of the amplification transistor and the source of the amplification transistor in a state where the well layer of the pixel circuit and the well layer of the amplification transistor are electrically isolated from each other. That is, the source of the amplification transistor and the well layer of the amplification transistor are connected to have the same potential, so that the substrate bias effect is eliminated, and the gain of the floating diffusion amplitude and the source amplitude of the amplification transistor is set to one. Further, the shield wire which draws out the source potential of the amplification transistor is arranged around the wire, and the wire coupled to the floating diffusion moves at the same amplitude as the floating diffusion. As a result, since the wire coupling capacitance is decreased, the capacitance of the floating diffusion is reduced to improve the charge-voltage conversion efficiency.

That is, in the imaging device, the capacitance of the floating diffusion due to the parasitic resistance of the wire is reduced to improve the charge-voltage conversion efficiency. Further, crosstalk with the adjacent wire can be suppressed by the shield wire.

10.3 Specific Example of Embodiment 3-1

<10.3.1 Configuration of Embodiment 3-1>

Figure 50A:
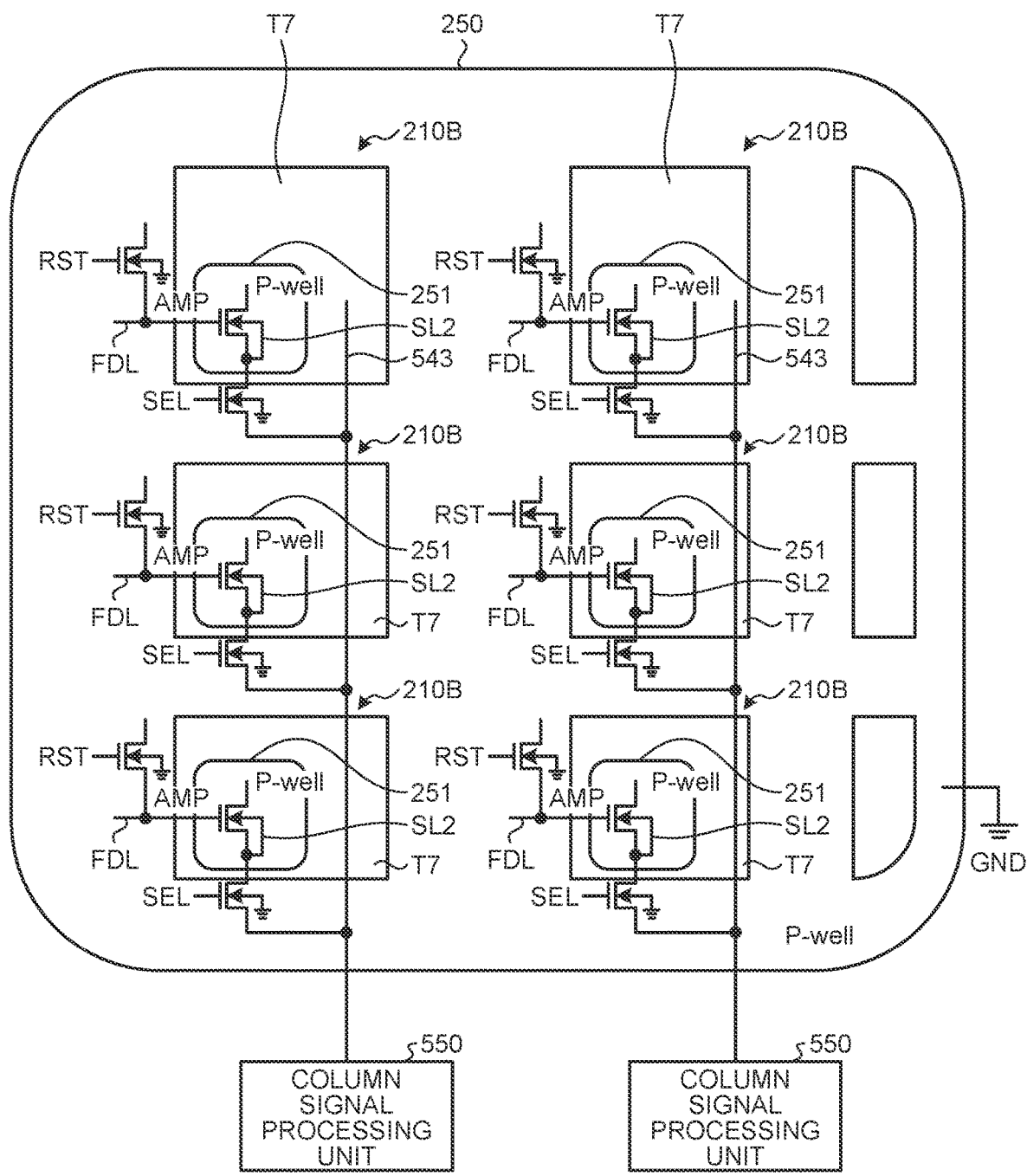
FIG. 50A is an equivalent circuit diagram illustrating an example of a configuration of a plurality of pixel circuits of a second substrate of Embodiment 3-1.

FIG. 50A is an equivalent circuit diagram illustrating an example of a configuration of a plurality of pixel circuits 210B of the second substrate 200 of Embodiment 3-1. The second substrate 200 includes a common p-well layer 250 common to all pixels and an independent p-well layer 251 of the amplification transistor AMP for each pixel 541, and the common p-well layer 250 and the independent p-well layer 251 are electrically isolated by a full trench (FTI) T7.

In the common p-well layer 250, the reset transistor RST and the selection transistor SEL in each pixel circuit 210B are formed. Since the common p-well layer 250 is connected to the GND potential, the back gates of the reset transistor RST and the selection transistor SEL are fixed to the GND potential.

On the other hand, in the independent p-well layer 251, the amplification transistor AMP in the pixel circuit 210B is formed. Since the independent p-well layer 251 is connected to the source of the amplification transistor AMP, the potential of the independent p-well layer 251 is changed following the source potential of the amplification transistor AMP. That is, since the back gate of the amplification transistor AMP and the source potential have the same potential, the gain of the source follower circuit becomes one.

For example, in a case where the back gate of the amplification transistor AMP is fixed to the GND potential, the substrate bias effect occurs according to the fluctuation of the source potential of the amplification transistor AMP, and the gain of the source follower circuit becomes a value around 0.85. As a result, since the independent p-well layer 251 follows the source potential of the amplification transistor AMP, the gain of the source follower circuit is increased by 17%, which leads to an increase of 17% of the source follower output voltage (Vsf).

Meanwhile, the column signal processing units 550 are respectively connected to the vertical signal lines (column read lines) 543, and the pixel signals are read out through the vertical signal lines (column read lines) 543.

Here, a configuration of the column signal processing unit 550 will be described.

Figure 50B:
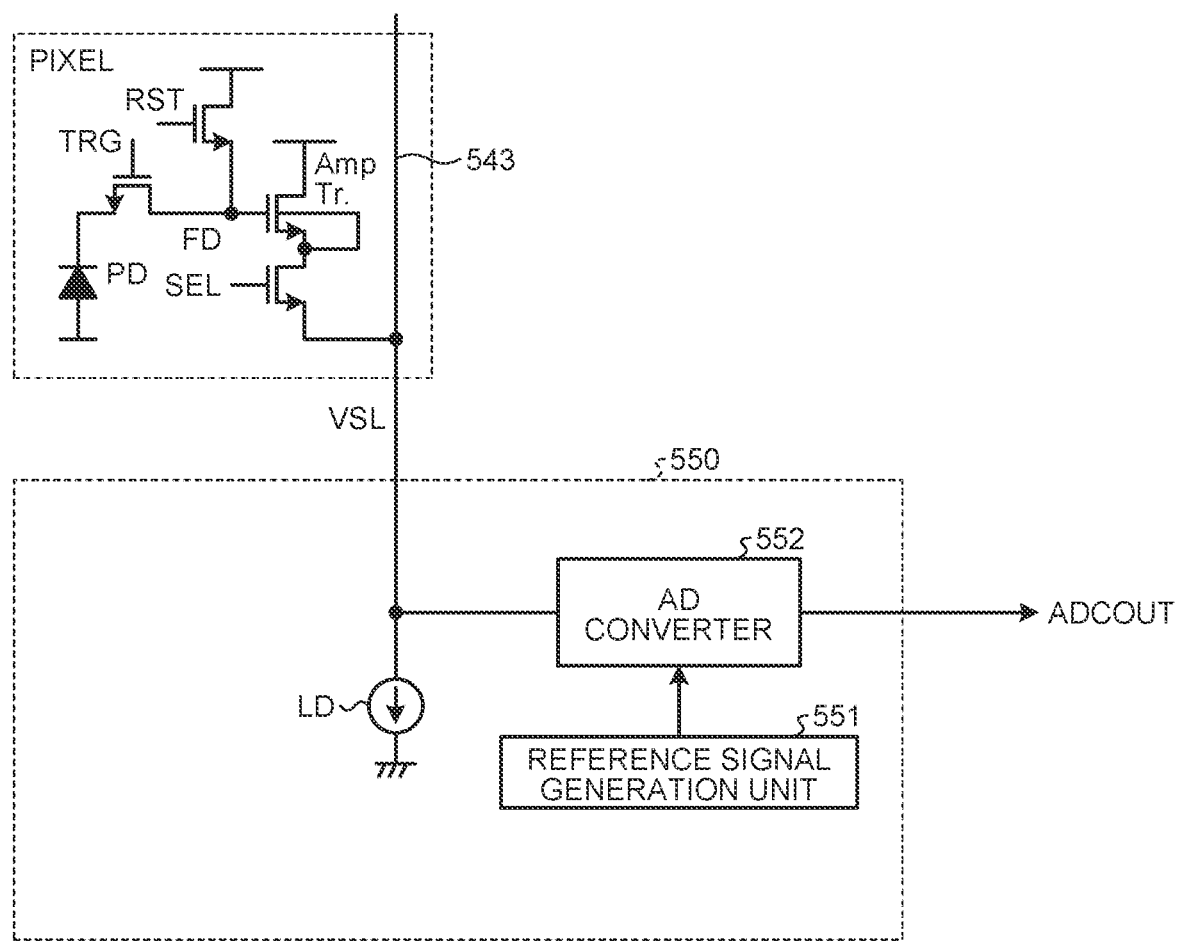
FIG. 50B is a schematic configuration block diagram of a column signal processing unit of a first aspect.

FIG. 50B is a schematic configuration block diagram of the column signal processing unit of a first aspect.

The column signal processing unit 550 includes, for example, a reference signal generation unit 551 configured as a constant voltage source, an AD converter 552 that performs AD conversion on the basis of the reference signal input from the reference signal generation unit 551, and a load circuit LD configured as a current source, and outputs an AD conversion output ADCOUT as pixel data according to the voltage of the vertical signal line (column read line) 543.

According to the above configuration, the read pixel signal can be converted into digital data and output.

Figure 50C:
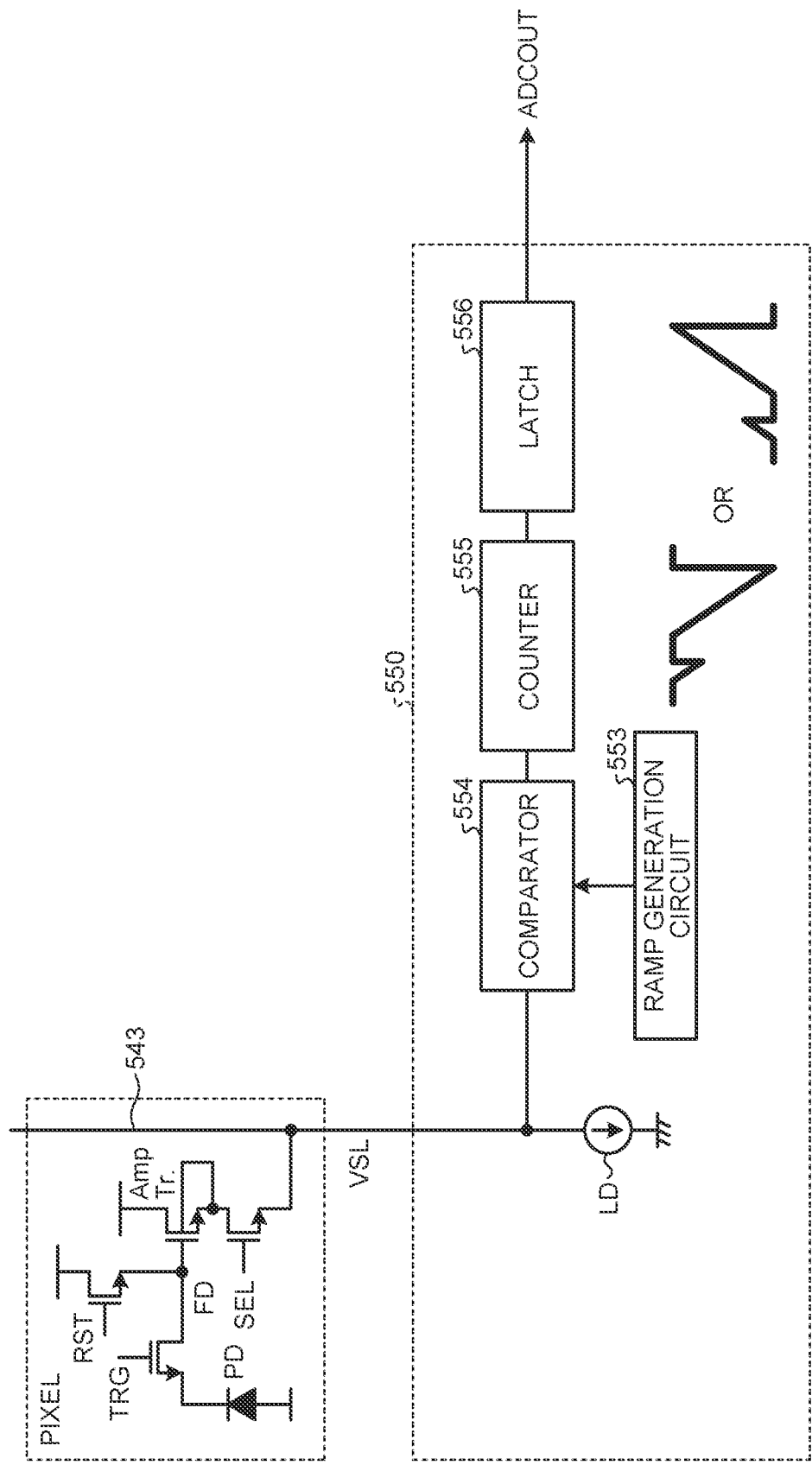
FIG. 50C is a schematic configuration block diagram of a column signal processing unit of a second aspect.

FIG. 50C is a schematic configuration block diagram of the column signal processing unit of a second aspect.

The column signal processing unit 550 of the second aspect is configured using a single-slope ADC.

The column signal processing unit 550 includes, for example, a RAMP generation circuit 553 that generates and outputs a RAMP waveform, a comparator 554 that compares a voltage of the pixel signal read through the vertical signal line (column read line) 543 with a voltage of the RAMP waveform and outputs a comparison result signal, a counter 555 that performs counting-up in a case where a level of the comparison result signal of the comparator 554 is, for example, an "H" level, and a latch 556 that takes in a count value of the counter 555 every predetermined time and outputs the AD conversion output ADCOUT as pixel data according to the voltage of the vertical signal line (column read line) 543.

Also with the above configuration, the read pixel signal can be converted into digital data and output.

Here, a circuit configuration example of the above-described comparator 554 will be described.

Figure 50D:
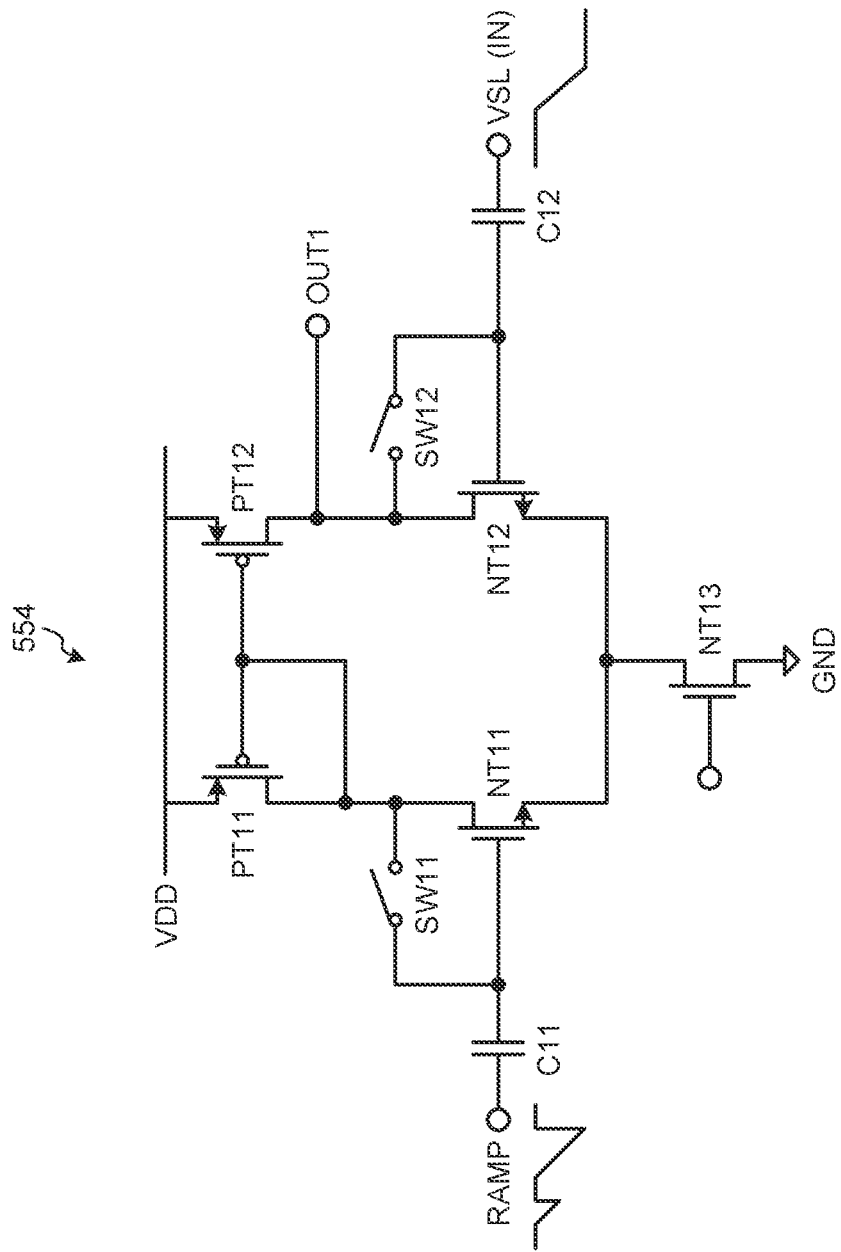
FIG. 50D is an explanatory diagram of a first configuration example of a comparator.

FIG. 50D is an explanatory diagram of a first configuration example of the comparator.

As illustrated in FIG. 50D, the comparator 554 includes P-type MOS (PMOS) transistors PT11 and PT12, N-type MOS (NMOS) transistors NT11 and NT12, capacitors C11 and C12, and switches SW11 and SW12.

In the above configuration, the source of the PMOS transistor PT11 and the source of the PMOS transistor PT12 are connected to a high potential-side power supply VDD.

The drain of the PMOS transistor PT11 is connected to the drain of the NMOS transistor NT11.

In addition, the drain and the gate of the PMOS transistor PT11 are connected, and the connection point thereof is connected to the gate of the PMOS transistor 12.

The drain of the PMOS transistor PT12 is connected to the drain of the NMOS transistor NT12, and the connection point thereof is an output terminal OUT1.

The source of the NMOS transistor NT11 and the source of the NMOS transistor NT12 are connected to each other, and the connection point thereof is connected to the drain of an NMOS transistor NT13.

Further, the drain of the NMOS transistor NT13 is connected to a low potential-side power supply GND.

The gate of the NMOS transistor NT11 is connected to one terminal of the capacitor C11, and the other terminal of the capacitor C11 is an input terminal to which the RAMP signal is input.

Furthermore, the gate of the NMOS transistor NT12 is connected to one terminal of the capacitor C12, and the other terminal of the capacitor C12 is an input terminal to which the pixel signal VSL is input.

As a result, in the comparator 554, the PMOS transistors PT11 and PT12 constitute a current mirror circuit, and the NMOS transistors NT11 and NT12 are operated as a differential comparison circuit using the NMOS transistor NT13 as a current source.

Figure 50E:
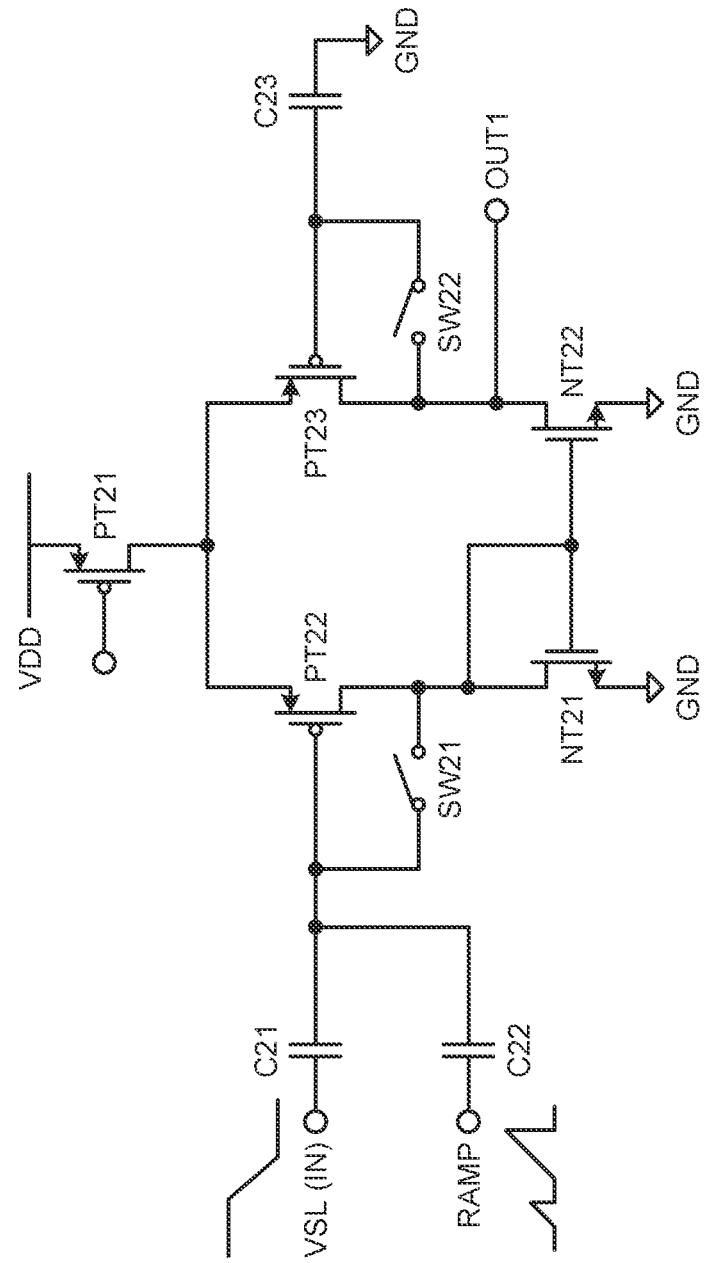
FIG. 50E is an explanatory diagram of a second configuration example of the comparator.

FIG. 50E is an explanatory diagram of a second configuration example of the comparator.

As illustrated in FIG. 50E, the comparator 554 includes PMOS transistors PT21 to PT23, NMOS transistors NT21 and NT22, capacitors C21 to C23, and switches SW21 and SW22.

In the above configuration, the source of the NMOS transistor NT21 and the source of the NMOS transistor NT22 are connected to the low potential-side power supply GND.

The drain of the NMOS transistor NT22 is connected to the gate of the NMOS transistor NT22 and the drain of the PMOS transistor PT22.

The drain of the NMOS transistor NT22 is connected to the drain of the PMOS transistor PT23 and the output terminal OUT1.

The source of the PMOS transistor PT22 is connected to the source of the PMOS transistor PT23 and the drain of the PMOS transistor PT21. The source of the PMOS transistor PT21 is connected to the high potential-side power supply VDD.

The NMOS transistor NT21 and the NMOS transistor NT22 constitute a current mirror circuit.

Furthermore, the gate of the PMOS transistor PT22 is connected to one terminal of the capacitor C21, and the other terminal of the capacitor C21 is an input terminal to which the pixel signal VSL is input.

The gate of the PMOS transistor PT22 is connected to one terminal of the capacitor C22, and the other terminal of the capacitor C22 is an input terminal to which the RAMP signal is input.

The capacitors C21 and C22 function as input capacitances.

As a result, the PMOS transistors PT21 to PT23 constitute a differential comparison circuit, and the differential comparison circuit functions as a comparator as the entire circuit.

Figure 50F:
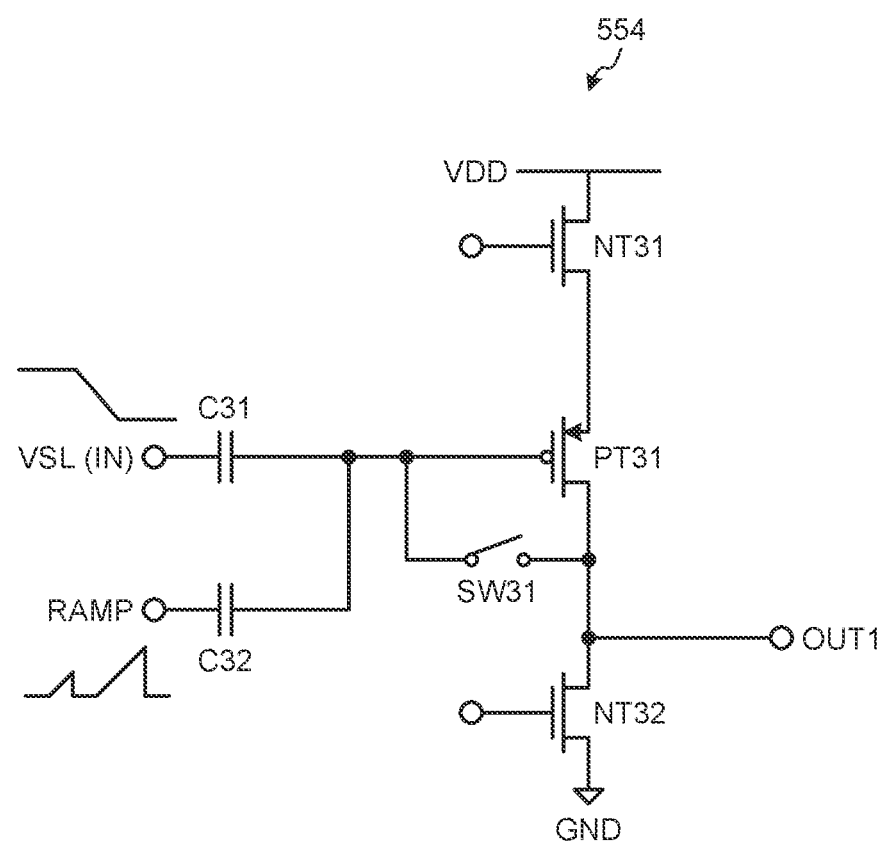
FIG. 50F is an explanatory diagram of a third configuration example of the comparator.

FIG. 50F is an explanatory diagram of a third configuration example of the comparator.

As illustrated in FIG. 50F, the comparator 554 includes a PMOS transistor PT31, NMOS transistors NT31 and NT32, capacitors C31 and C32, and a switch SW31.

In the above configuration, the drain of the NMOS transistor NT31 is connected to the high potential-side power supply VDD, and the source of the NMOS transistor NT31 is connected to the source of the PMOS transistor PT31.

The drain of the PMOS transistor PT31 is connected to the drain of the NMOS transistor PT32 and the output terminal OUT1.

The source of the NMOS transistor PT32 is connected to the low potential-side power supply GND.

Further, the switch SW31 is connected between the gate and drain terminals of the PMOS transistor PT31.

The gate of the PMOS transistor PT31 is connected to one terminal of the capacitor C31, and the other terminal of the capacitor C31 is an input terminal to which the pixel signal VSL is input.

The gate of the PMOS transistor PT31 is connected to one terminal of the capacitor C32, and the other terminal of the capacitor C32 is an input terminal to which the RAMP signal is input.

The capacitors C31 and C32 function as input capacitances.

As a result, a comparison circuit is formed by the voltage division ratio of the PMOS transistor PT31 and the NMOS transistors NT31 and NT32, and the comparison circuit functions as a comparator as the entire circuit.

Next, a column signal processing unit of a third aspect will be described.

Figure 50G:
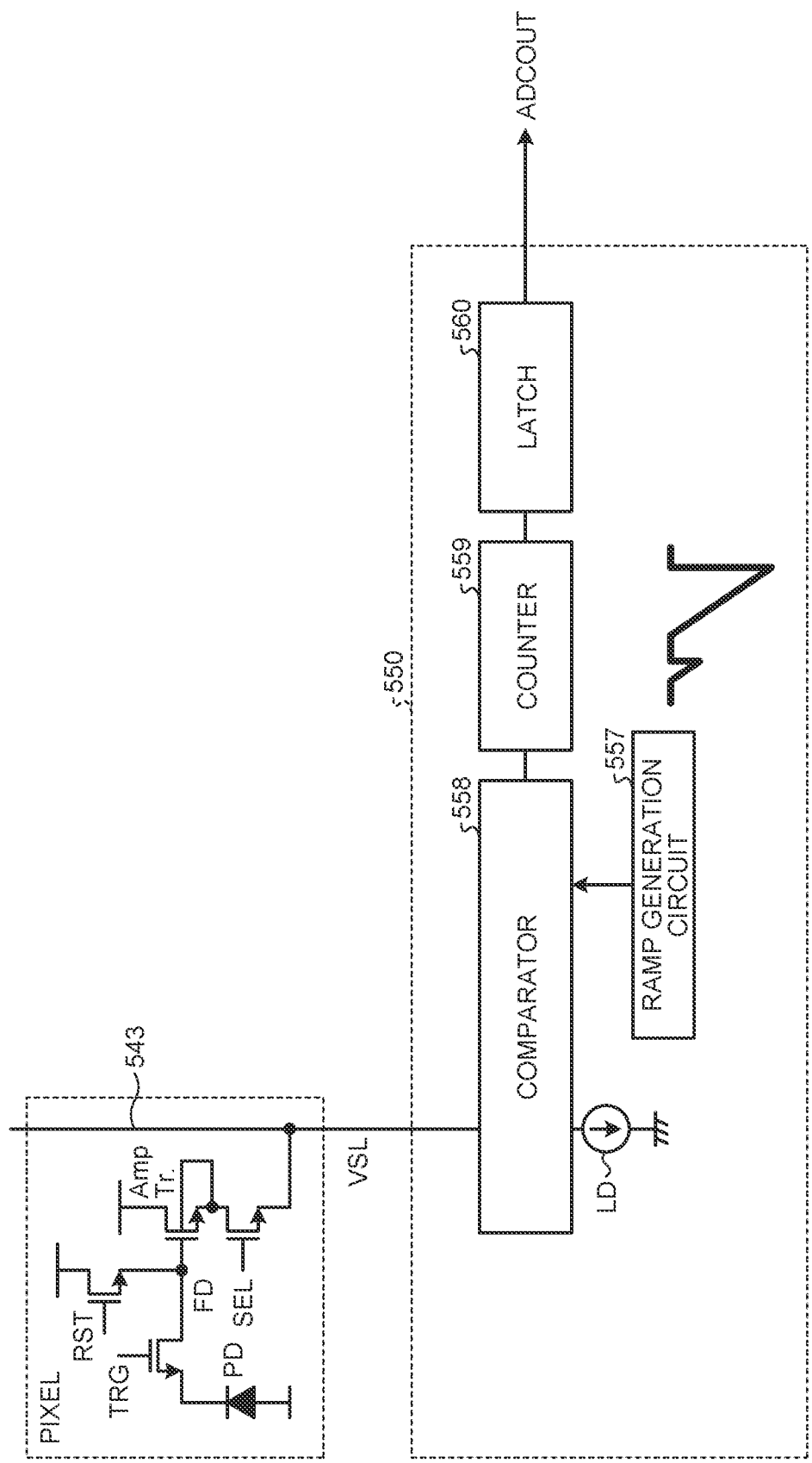
FIG. 50G is a schematic configuration block diagram of a column signal processing unit of a third aspect.

FIG. 50G is a schematic configuration block diagram of the column signal processing unit of the third aspect.

The column signal processing unit 550 of the third aspect includes, for example, a RAMP generation circuit 557 that generates and outputs a RAMP waveform, a comparator 558 that compares a voltage of the pixel signal read through the vertical signal line (column read line) 543 with a voltage of the RAMP waveform and outputs a comparison result signal, a counter 559 that performs counting-up in a case where a level of the comparison result signal of the comparator 558 is, for example, an "H" level, and a latch 560 that takes in a count value of the counter 559 every predetermined time and outputs the AD conversion output ADCOUT as pixel data according to the voltage of the vertical signal line (column read line) 543.

In the column signal processing unit 550 of the third aspect, the current generated by the load circuit LD is connected to the vertical signal line (column read line) 543 through the comparator 558, the bias current is simultaneously applied to the amplification transistor AMP and the comparator 558 constituting the pixel by the current flowing through the load circuit LD, and therefore, the consumption current can be reduced.

Figure 50H:
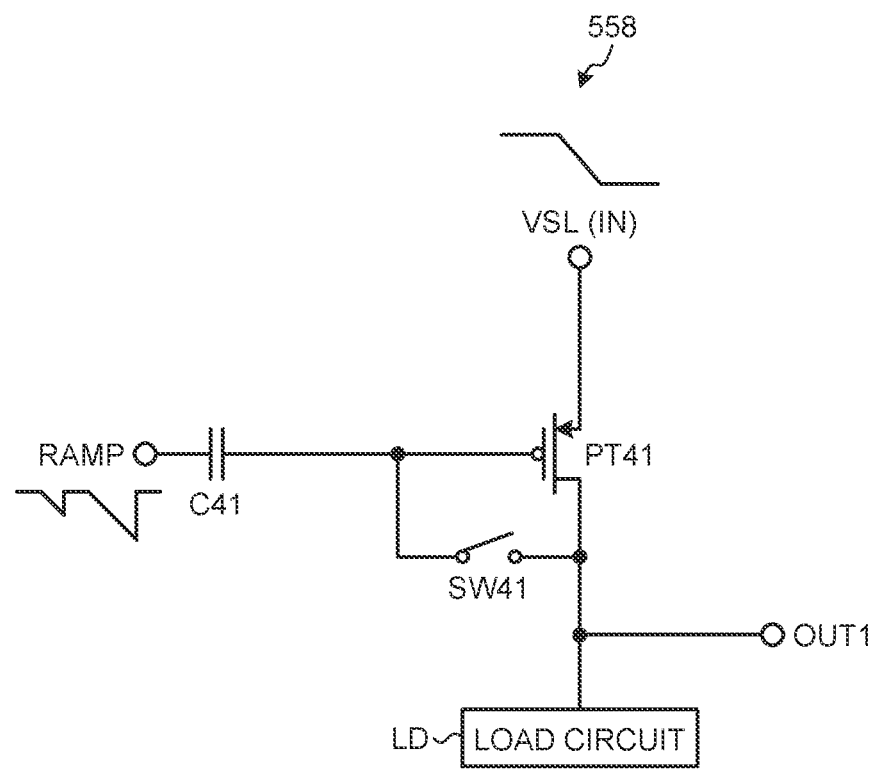
FIG. 50H is an explanatory diagram of a configuration example of the third aspect.

FIG. 50H is an explanatory diagram of a configuration example of the comparator of the third aspect.

As illustrated in FIG. 50H, the comparator 558 includes a PMOS transistor PT41, a capacitor C41, a switch SW41, and a load circuit LD.

In the above configuration, the source of the PMOS transistor PT41 is an input terminal to which the pixel signal VSL is input, and the drain of the PMOS transistor PT41 is connected to the load circuit LD and the output terminal OUT1.

Further, the switch SW41 is connected between the gate and drain terminals of the PMOS transistor PT41.

The gate of the PMOS transistor PT41 is connected to one terminal of the capacitor C41, and the other terminal of the capacitor C41 is an input terminal to which the RAMP signal is input.

The capacitor C41 functions as an input capacitance.

As a result, a comparison circuit that outputs an output signal according to the gate-source voltage of the PMOS transistor PT41 is configured, and functions as a comparator as the entire circuit.

Next, a column signal processing unit of a fourth aspect will be described.

Figure 50I:
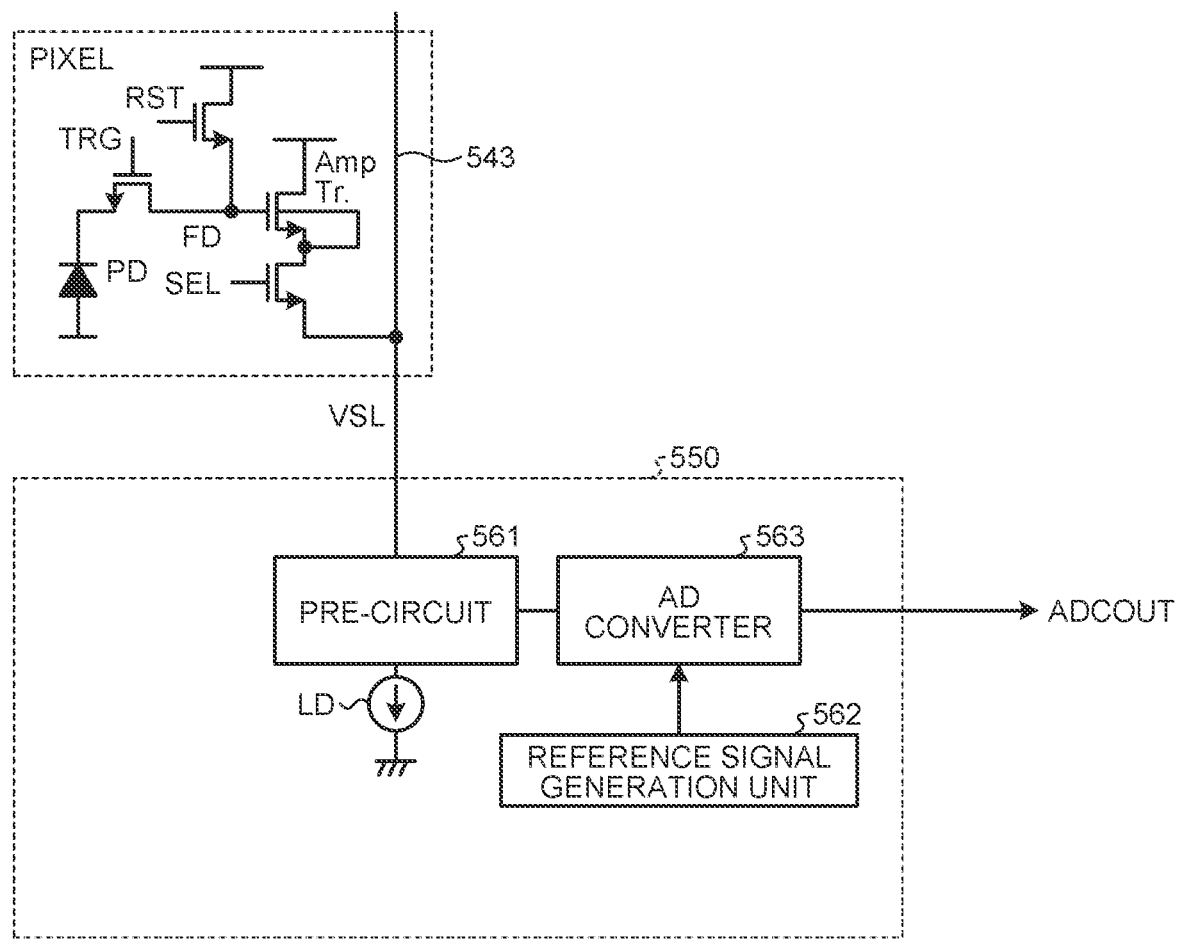
FIG. 50I is a schematic configuration block diagram of a column signal processing unit of a fourth aspect.

FIG. 50I is a schematic configuration block diagram of the column signal processing unit of the fourth aspect.

The column signal processing unit 550 of the fourth aspect includes a load circuit LD, a pre-circuit 561 that connects the current generated by the load circuit LD to the vertical signal line (column read line) 543, a reference signal generation unit 562 configured as, for example, a constant voltage source, and an AD converter 563 that performs AD conversion on the basis of the reference signal input from the reference signal generation unit 562.

Here, a configuration example of the pre-circuit 561 will be described.

Figure 50J:
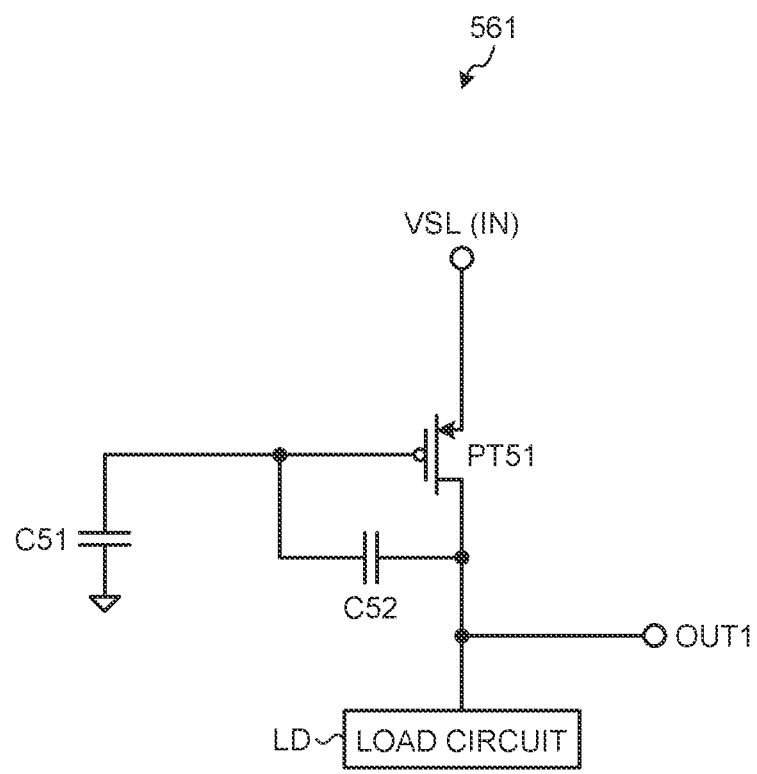
FIG. 50J is an explanatory diagram of a configuration example of a pre-circuit.

FIG. 50J is an explanatory diagram of a configuration example of the pre-circuit.

As illustrated in FIG. 50J, the pre-circuit 561 includes a PMOS transistor PT51, capacitors C51 and C52, and a load circuit LD.

In the above configuration, the source of the PMOS transistor PT51 is an input terminal to which the pixel signal VSL is input, and the drain of the PMOS transistor PT51 is connected to the load circuit LD and the output terminal OUT1.

Further, the capacitor C52 is connected between the gate and drain terminals of the PMOS transistor PT41. The capacitor C52 functions as a feedback capacitance.

In addition, the capacitor C51 functions as a reference capacitance, one terminal of the capacitor C51 is connected to the gate of the PMOS transistor PT41, and the other terminal of the capacitor C51 is connected to the low potential-side power supply GND.

The pre-circuit 561 is configured as a current reuse column amplifier (CRCA).

According to the above configuration, the gate-source voltage of the PMOS transistor PT51 fluctuates according to the pixel signal VSL input to the source of the PMOS transistor PT51, and the drain current of the PMOS transistor PT51 is changed. The output voltage Vout corresponding to the drain current is output from the output terminal OUT1 through the drain of the PMOS transistor PT51.

As described above, the pre-circuit 561 functions as a comparison circuit that effectively outputs an output signal according to the pixel signal VSL, and functions as an amplifier as the entire circuit.

Figure 51:
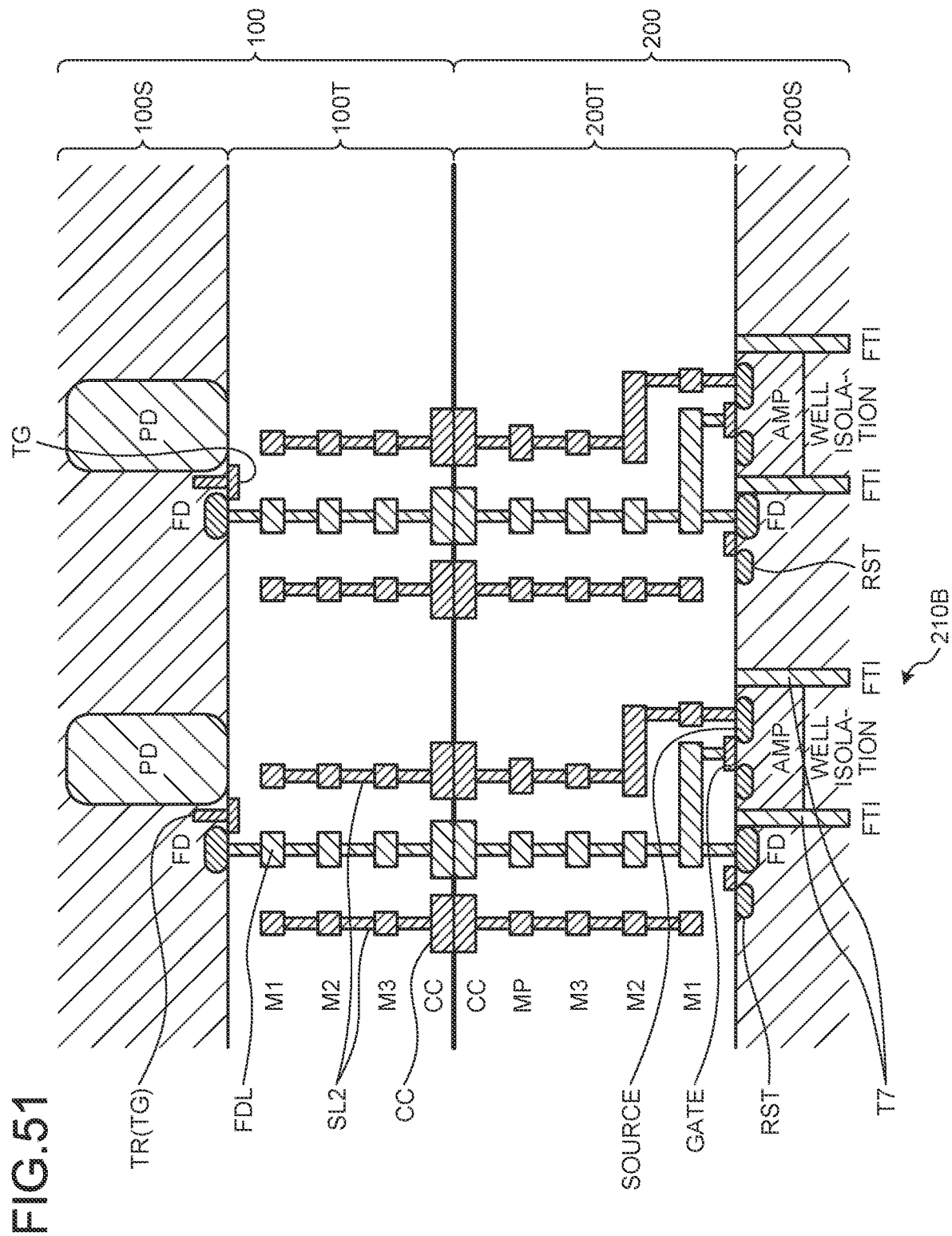
FIG. 51 is a schematic sectional view illustrating an example of a stacked structure of a first substrate and a second substrate in Embodiment 3-1.

FIG. 51 is a schematic sectional view illustrating an example of a stacked structure of the first substrate 100 and the second substrate 200 in Embodiment 3-1. The first substrate 100 includes the photodiode PD, the transfer transistor TR, and the floating diffusion FD. The pixel circuit 210B on the second substrate 200 includes the reset transistor RST, the amplification transistor AMP, the selection transistor SEL, and the FD wire FDL. The wire layer 100T including a plurality of layers (M1 to M3) on the first substrate 100 and the wire layer 200T including a plurality of layers (MP to M1) on the second substrate 200 are connected by a Cupper-Cupper junction CC.

The wire layers 100T and 200T penetrate from the first substrate 100 to the second substrate 200, and the FD wire FDL connecting the floating diffusion FD for each pixel 541 on the first substrate 100 to the amplification transistor AMP in the pixel circuit 210B on the second substrate 200 is arranged.

The amplification transistor AMP for each pixel 541 of the independent p-well layer 251 on the second substrate 200 is electrically isolated from the common p-well layer 250 by the full trench T7. The gate of the amplification transistor AMP is connected to the FD wire FDL, the drain of the amplification transistor AMP is connected to the independent p-well layer 251, and the source of the amplification transistor AMP is connected to the drain of the selection transistor SEL. In addition, the source of the amplification transistor AMP is electrically connected to a shield wire SL2 that runs in parallel with the FD wire FDL and is connected to each layer in the wire layer 100T and the wire layer 200T.

The shield wire SL2 is a wire of the source potential of the amplification transistor AMP (=back gate potential of the amplification transistor AMP). The shield wire SL2 is arranged to cover the FD wire FDL. The shield wire SL2 is arranged such that the coupling capacitance between the floating diffusion FD and the source of the amplification transistor AMP is large, and the coupling capacitance between the floating diffusion FD and the wire other than the floating diffusion FD is as small as possible. The shield wire SL2 extends from the wire layer 200T to the wire layer 100T through a joint portion CC between the wire layer 100T of the first substrate 100 and the wire layer 200T of the second substrate 200, and is arranged to cover the FD wire FDL.

Since the independent p-well layer 251 is connected to the source of the amplification transistor AMP, the potential of the independent p-well layer 251 is changed following the source potential of the amplification transistor AMP. That is, since the back gate of the amplification transistor AMP and the source potential have the same potential, the gain of the source follower circuit becomes one. The gate potential amplitude and the source potential amplitude of the amplification transistor AMP become equal. That is, the potential of the shield wire SL2 is also changed following the change amount of the floating diffusion FD potential of the FD wire FDL. Therefore, no charge transfer occurs between the FD wire FDL and the shield wire SL2, and the capacitance value between the FD wire FDL and the shield wire SL2 is decreased. As a result, even if the coupling between the FD wire FDL and the shield wire SL2 is large, it can be ignored as the capacitance of the floating diffusion FD at the time of the actual read operation. Then, since the arrangement is made such that the coupling between the FD wire FDL and the other wire is as small as possible, the capacitance of the floating diffusion FD becomes a small value. That is, since the parasitic capacitance of the floating diffusion FD capacitance is decreased, the source follower output voltage Vsf can be increased.

In addition, since the shield wire SL2 is arranged between the FD wires FDL of the adjacent pixels 541, each FD wire FDL can be shielded by the shield wire SL2. As a result, the occurrence of crosstalk between the adjacent FD wires FDL can be suppressed.

If the periphery of the FD wire FDL is shielded by the potential of this node, the FD wire follows at the same amplitude as the potential of the floating diffusion FD, so that the inter-wire capacitance appears to be zero, and thus the FD capacitance can be reduced.

In a state where the independent p-well layer 251 of the amplification transistor AMP for each pixel 541 is isolated by the full trench T7, the source of the amplification transistor AMP and the independent p-well layer 251 are connected to have the same potential. As a result, the substrate bias effect is eliminated, and the gain of the amplitude of the floating diffusion FD potential and the source potential amplitude of the amplification transistor AMP is set to one.

In order to cover the periphery of the FD wire FDL with the shield wire SL2 which draws the source potential of the amplification transistor AMP, the wire coupled to the floating diffusion FD moves at the same amplitude as the floating diffusion FD. As a result, since the wire coupling capacitance appears to be zero, the floating diffusion FD capacitance can be reduced to improve charge-voltage conversion efficiency.

Figure 52:
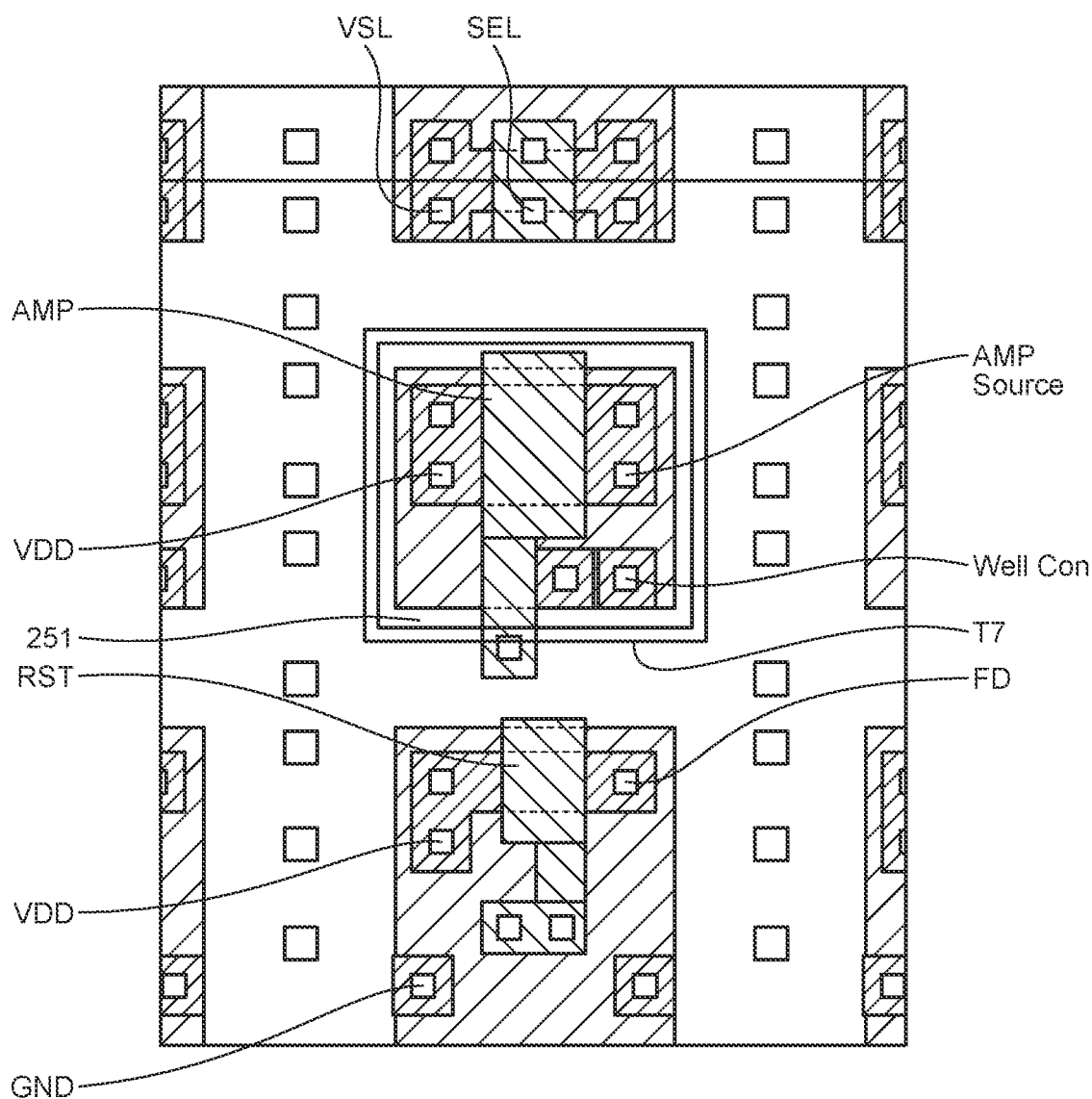
FIG. 52 is a schematic view illustrating an example of a planar configuration of a pixel circuit.

FIG. 52 is a schematic view illustrating an example of a planar configuration of the pixel circuit 210B. In the pixel circuit 210B, in a state where the common p-well layer 250 and the independent p-well layer 251 are electrically isolated by the full trench T7, the reset transistor RST and the selection transistor SEL are arranged in the common p-well layer 250, and the amplification transistor AMP is arranged in the independent p-well layer 251. Note that the common p-well layer 250 of the reset transistor RST and the selection transistor SEL is fixed to the GND potential.

Figure 53:
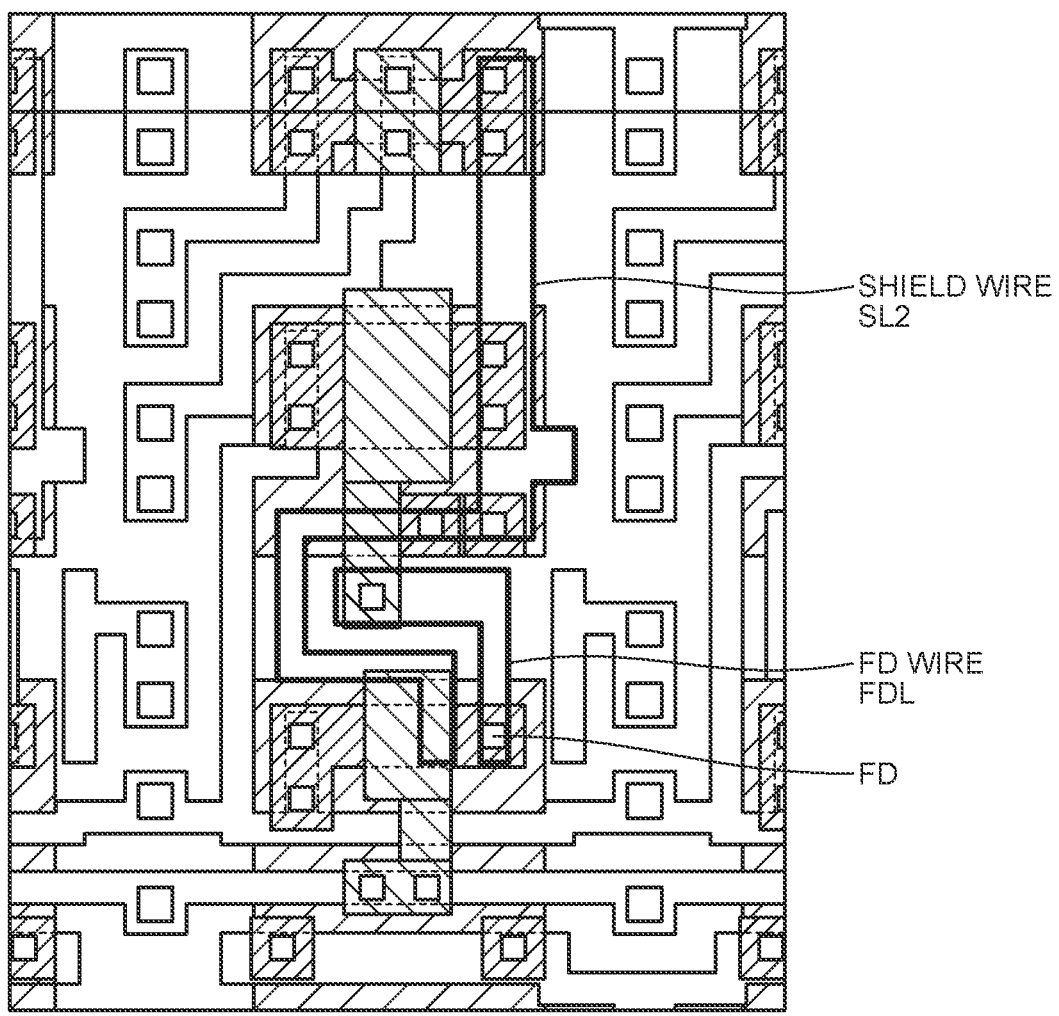
FIG. 53 is a schematic view illustrating an example of a planar configuration in which an FD wire FDL and a shield wire SL2 overlap the front surface of the pixel circuit illustrated in FIG. 52.

FIG. 53 is a schematic view illustrating an example of a planar configuration in which the FD wire FDL and the shield wire SL2 overlap the front surface of the pixel circuit 210B illustrated in FIG. 52. The FD wire FDL electrically connects the floating diffusion FD in the pixel 541 to the gate of the amplification transistor AMP and the source of the reset transistor RST. Further, the shield wire SL2 electrically connects the source of the amplification transistor AMP to the drain of the selection transistor SEL, and electrically connects the independent p-well layer 251 to the source of the amplification transistor AMP. The shield wire SL2 electrically connected to the source potential of the amplification transistor AMP is arranged to cover the periphery of the FD wire FDL, and is laid out to increase the coupling therebetween.

<10.3.2 Operation and Effect of Embodiment 3-1>

In the imaging device 1, the common p-well layer 250 and the independent p-well layer 251 of the amplification transistor AMP are electrically isolated from each other, and the FD wire FDL is shielded by the shield wire SL2 connecting the gate of the amplification transistor AMP to the source of the amplification transistor AMP. That is, by connecting the source of the amplification transistor AMP and the independent p-well layer 251 of the amplification transistor AMP to have the same potential, the substrate bias effect is eliminated, and the gain of the floating diffusion FD amplitude and the source amplitude of the amplification transistor AMP is set to one. Further, by arranging the shield wire SL2, which draws the source potential of the amplification transistor AMP, around the FD wire FDL, the wire coupled to the floating diffusion FD moves at the same amplitude as the floating diffusion FD. As a result, since the wire coupling capacitance is decreased, the FD capacitance is reduced to improve the charge-voltage conversion efficiency.

That is, in the imaging device 1, the capacitance of the FD capacitance due to the parasitic resistance of the FD wire FDL is reduced to improve the charge-voltage conversion efficiency. Further, crosstalk between the adjacent floating diffusions FD can be suppressed by the shield wire SL2.

Note that, in Embodiment 3-1, an example has been described in which full trench isolation is used as a structure for individually isolating the p-well layer of the amplification transistor AMP, but the present invention is not limited thereto, and other means may be used as long as the p-well layer can be individually isolated.

The shield wire SL2 shields a portion of the FD wire FDL passing through the second substrate 200 and the first substrate 100, in the FD wire FDL connecting the amplification transistor AMP in the second substrate 200 to the floating diffusion FD in the first substrate 100. In the FD wire FDL, a portion of the FD wire FDL passing through the wire layer 100T of the first substrate 100 and the wire layer 200T of the second substrate 200 is shielded. However, the shield wire SL2 may shield a portion of the FDL wire FDL passing through the wire layer 200T of the second substrate 200 in the FD wire FDL, and the embodiment thereof will be described below as Embodiment 3-2.

10.4 Specific Example of Embodiment 3-2

<10.4.1 Configuration of Embodiment 3-2>

Figure 54:
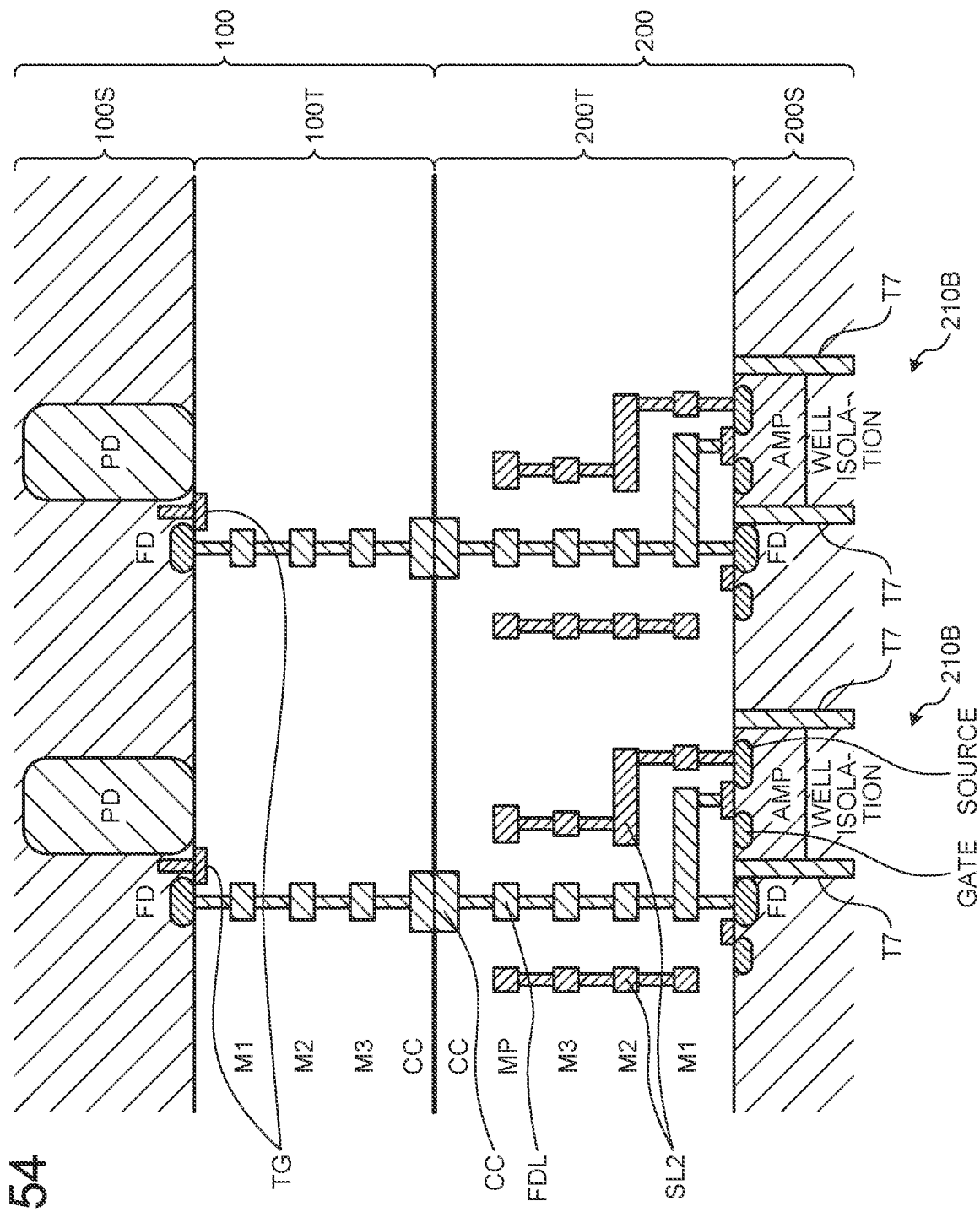
FIG. 54 is a schematic sectional view illustrating an example of a stacked structure of a first substrate and a second substrate in Embodiment 3-2.

FIG. 54 is a schematic sectional view illustrating an example of a stacked structure of the first substrate 100 and the second substrate 200 in Embodiment 3-2. Embodiment 3-2 is an example of a case where an arrangement number of the joint portions CC between the wire layer 100T and the wire layer 200T is restricted when the pixel size is reduced, for example. The wire layer 100T and the wire layer 200T have the FD wire FDL penetrating from the first substrate 100 side to the second substrate 200. The FD wire FDL electrically connects the floating diffusion FD of the first substrate 100 to the gate of the amplification transistor AMP in the pixel circuit 210 on the second substrate 200. The shield wire SL2 shields a portion of the FDL wire FDL passing through the wire layer 200T in the second substrate 200 in the FD wire FDL.

<10.4.2 Operation and Effect of Embodiment 3-2>

In a case where the number of the joint portions CC is restricted due to the reduction in the size of the pixel 541, the shield wire SL2 is limited to the shield of only the FD wire FDL in the wire layer 200T on the second substrate 200 side. For example, in a case where only one joint portion CC can be arranged in one pixel, the FD wire FDL can penetrate the wire layer 100T and the wire layer 200T to connect the wire layer 100T to the wire layer 200T, but the source potential of the amplification transistor AMP cannot be extended to the wire layer 100T on the first substrate 100 side. In this case, the shield wire SL2 is arranged to cover the FD wire FDL only in the wire layer 200T in the second substrate 200. As a result, the effect of reducing the floating diffusion FD capacitance of the wire layer 100T on the first substrate 100 side cannot be obtained, and the FD capacitance is slightly increased as compared with the FD capacitance in Embodiment 3-1. However, the effect of reducing the FD capacitance in the wire layer 200T on the second substrate 200 side can be obtained. It is also possible to cope with pixel reduction.

10.5 Specific Example of Embodiment 3-3

<10.5.1 Configuration of Embodiment 3-3>

Figure 55:
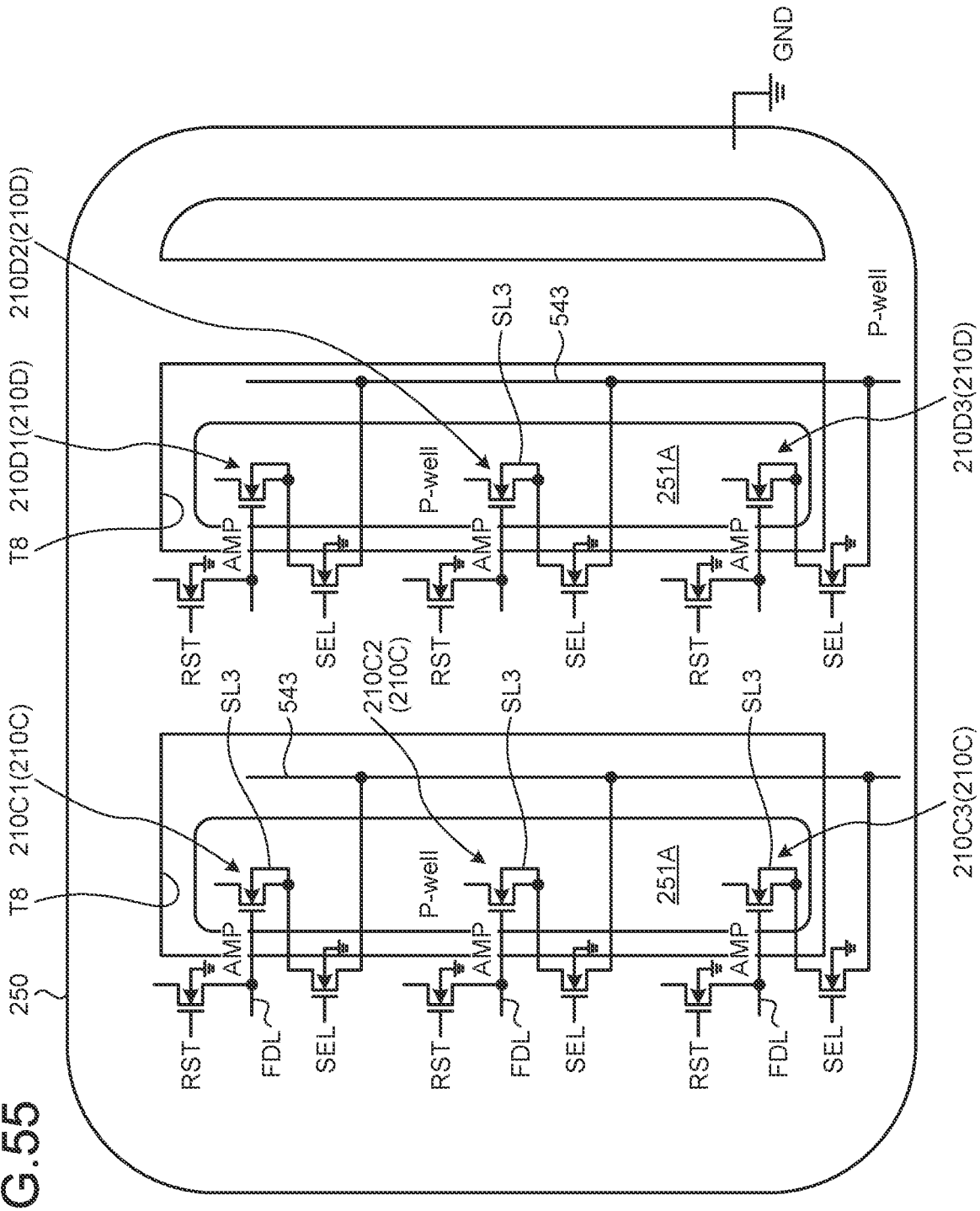
FIG. 55 is an equivalent circuit diagram illustrating an example of a configuration of a plurality of pixel circuits of a second substrate of Embodiment 3-3.

FIG. 55 is an equivalent circuit diagram illustrating an example of a configuration of a plurality of pixel circuits 210C and 210D of the second substrate 200 of Embodiment 3-3. The pixel circuit 210C electrically isolates the independent p-well layer 251A in which a group of the amplification transistor AMP of the plurality of pixel circuits 541 adjacent in the column direction is arranged from the common p-well layer 250 in which a group of the reset transistors RST and the selection transistors SEL adjacent in the column direction is arranged by a full trench T8. Furthermore, the pixel circuit 210D is in a row different from that of the pixel circuit 210C. Then, the pixel circuit 210D electrically isolates the independent p-well layer 251A in which a group of the amplification transistor AMP of the plurality of pixel circuits adjacent in the column direction is arranged from the common p-well layer 250 in which a group of the reset transistors RST and the selection transistors SEL adjacent in the column direction is arranged by the full trench T8.

The amplification transistors AMP to be simultaneously read are amplification transistors AMP adjacent in the row direction. Therefore, in a case where the pixels 541 are sequentially read on a row basis, the pixel signals of the amplification transistors AMP adjacent in the column direction are not read at the same time while the amplification transistors AMP read the pixel signals. Therefore, in a state where the independent p-well layers 251A of the amplification transistors AMP adjacent in the row direction are isolated, the independent p-well layers 251A of the amplification transistors AMP adjacent in the column direction are made common. That is, the well layer potentials of the group of the amplification transistors AMP adjacent in the column direction are common, and the well layer potentials of the group of the amplification transistors AMP adjacent in the column direction on the next row are also common.

Therefore, while the amplification transistor AMP of the pixel circuit 210C1 reads the pixel signal, the well layer potentials of the group of the amplification transistors AMP of the pixel circuits 210C2 and 210C3 on this column have the same potential as the source potential of the amplification transistor AMP of the pixel circuit 210C1. Furthermore, the well layer potentials of the amplification transistors AMP of the pixel circuits 210C2 and 210C3 have also the same potential as the source potential of the amplification transistor AMP of the pixel circuit 210C1. However, since the amplification transistors AMP of the other pixel circuits 210C2 and 210C3 adjacent in the column direction are in the non-read period, the selection transistor SEL is turned off and is not operated as an amplification circuit, so that there is no particular influence.

In a case where the pixels 541 are sequentially read on a row basis, for example, it can be said that what is read at the same time as the amplification transistor AMP of the pixel circuit 210C1 is the amplification transistor AMP of the pixel circuit 210D1 adjacent in the row direction. Therefore, the well layer potential of the amplification transistor AMP of the pixel circuit 210C1 and the well layer potential of the amplification transistor AMP of the pixel circuit 210D1 adjacent in the row direction have different potentials depending on the pixel signal amount, and thus, it is necessary to isolate the two well layers. That is, it is necessary to isolate the well layers of the pixels 541 to be simultaneously read, but there is no problem even if the well layers of the pixels 541 that are not simultaneously read may be common.

<10.5.2 Operation and Effect of Embodiment 3-3>

Therefore, even in a case where the p-well layers cannot be independently isolated for each pixel due to the reduction of the pixel 541 or the like, the same effects as those of Example 2-2 can be obtained by isolating the p-well layers only in the row direction.

10.6 Specific Example of Embodiment 3-4

<10.6.1 Configuration of Embodiment 3-4>

The imaging device of Embodiment 3-4 is, for example, a pixel imaging device including a charge holding unit for a global shutter. The global shutter mode is basically a mode of performing global exposure in which exposure of all pixels is simultaneously started and exposure of all pixels is simultaneously ended. Here, all the pixels mean all the pixels in the portion appearing in the image, and dummy pixels and the like are excluded. In addition, if the time difference and the distortion of the image are sufficiently small so as not to cause a problem, a mode of moving a region where global exposure is performed while performing global exposure in units of a plurality of rows (for example, several tens of rows) instead of performing global exposure on all pixels at the same time is also included in the global shutter mode. In addition, a mode of performing global exposure on pixels in a predetermined region instead of all the pixels in the portion appearing in the image is also included in the global shutter mode.

Figure 56:
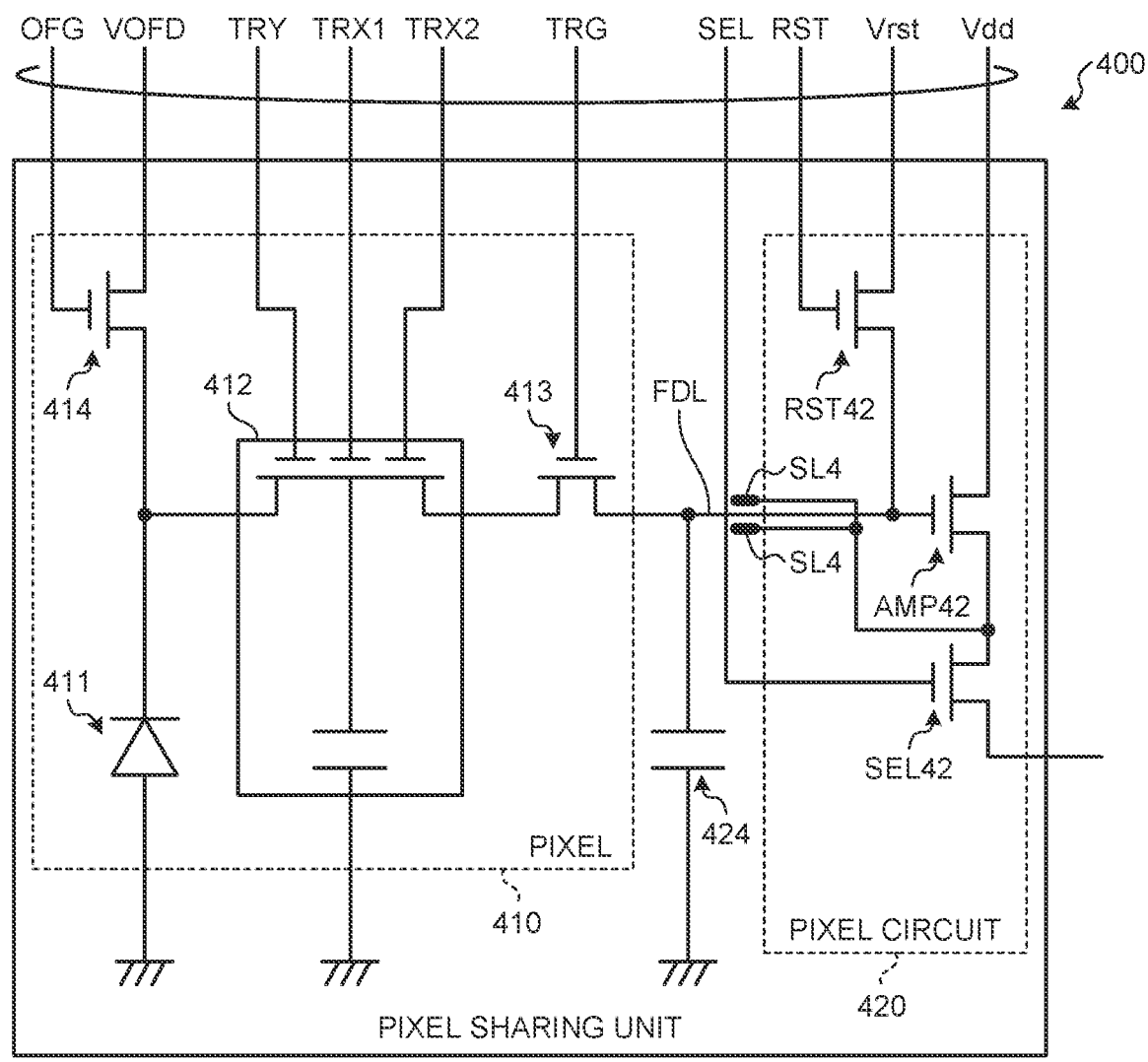
FIG. 56 is an equivalent circuit diagram illustrating an example of a configuration of a pixel sharing unit of a global shutter mode imaging device of Embodiment 3-4.

FIG. 56 is an equivalent circuit diagram illustrating an example of a configuration of a pixel sharing unit 400 of the global shutter mode imaging device of Embodiment 3-4. The pixel sharing unit 400 in the global shutter mode imaging device has a pixel 410 and a pixel circuit 420. The pixel 410 has a photodiode 411, a charge holding unit 412, a transfer transistor TR413, and an overflow transistor 414. Further, the pixel circuit 420 has a reset transistor RST42, an amplification transistor AMP42, a selection transistor SEL42, and a floating diffusion FD42.

The reset transistor RST42 has a drain connected to the power supply VDD and a source connected to the floating diffusion FD42. The reset transistor RST42 initializes, that is, resets the floating diffusion FD42 according to the drive signal applied to the gate electrode thereof. For example, when the reset transistor RST42 is turned on by the drive signal, the potential of the floating diffusion FD42 is reset to the voltage level of the power supply VDD. That is, the floating diffusion FD42 is initialized.

The floating diffusion FD42 converts the charges transferred from the photodiode PD through a transfer transistor 413 and the charge holding unit 412 into electric signals (for example, voltage signals), and outputs the electric signals. The reset transistor RST42 is connected to the floating diffusion FD42, and the vertical signal line VSL is connected to the floating diffusion FD42 through the amplification transistor AMP42 and the selection transistor SEL42.

The amplification transistor AMP42 outputs an electric signal according to the potential of the floating diffusion FD42. The amplification transistor AMP42 constitutes, for example, a source follower circuit with a constant current source provided in the column signal processing unit. The selection transistor SEL42 is turned on when the pixel is selected, and outputs an electric signal from the floating diffusion FD42 through the amplification transistor AMP42, to the column signal processing unit through the vertical signal line VSL.

In the pixel sharing unit 400 in such a global shutter mode imaging device, the pixel 410 is formed on the first substrate 100, the pixel circuit 420 is formed on the second substrate 200, and the pixel 410 and the pixel circuit 420 are connected by the FD wire FDL.

The second substrate 200 includes a common p-well layer common to all pixels and an independent p-well layer for each amplification transistor AMP42, and the common p-well layer and the independent p-well layer are electrically isolated by a full trench (FTI). In the common p-well layer, the reset transistor RST42 and the selection transistor SEL42 in each pixel circuit 420 are formed. Since the common p-well layer is connected to the GND potential, the back gates of the reset transistor RST42 and the selection transistor SEL42 are fixed to the GND potential.

On the other hand, in the independent p-well layer, the amplification transistor AMP42 in the pixel circuit 420 is formed. Since the independent p-well layer is connected to the source of the amplification transistor AMP42, the potential of the independent p-well layer is changed following the source potential of the amplification transistor AMP42. That is, since the back gate of the amplification transistor AMP42 and the source potential have the same potential, the gain of the source follower circuit becomes one.

That is, the gate potential amplitude and the source potential amplitude of the amplification transistor AMP42 become equal. That is, the potential of a shield wire SL4 is also changed following the change amount of the FD potential of the FD wire FDL. Therefore, no charge transfer occurs between the FD wire FDL and the shield wire SL4, and the capacitance value between the FD wire FDL and the shield wire SL4 is decreased. Therefore, even if the coupling between the FD wire FDL and the shield wire SL4 is large, it can be ignored as the FD capacitance at the time of the actual read operation. Then, since the arrangement is made such that the coupling between the FD wire FDL and the other wire is as small as possible, the FD capacitance becomes a small value. That is, since the parasitic capacitance of the FD capacitance is decreased, the source follower output voltage Vsf can be increased.

<10.6.2 Operation and Effect of Embodiment 3-4>

The pixel sharing unit 400 in the global shutter mode imaging device of Embodiment 3-4 is in a state in which the common p-well layer is electrically isolated from the independent p-well layer of the amplification transistor AMP42. Furthermore, in the pixel sharing unit 400, the FD wire FDL is shielded by the shield wire SL4 connecting the gate of the amplification transistor AMP42 to the source of the amplification transistor AMP42. That is, by connecting the source of the amplification transistor AMP42 and the independent p-well layer of the amplification transistor AMP42 to have the same potential, the substrate bias effect is eliminated, and the gain of the FD amplitude and the source amplitude of the amplification transistor AMP42 is set to one. Furthermore, the periphery of the FD wire FDL is shielded by the shield wire SL4 which draws the source potential of the amplification transistor AMP42, so that the wire coupled to the floating diffusion FD moves at the same amplitude as the floating diffusion FD. As a result, since the wire coupling capacitance is decreased, the FD capacitance is reduced to improve the charge-voltage conversion efficiency.

That is, in the pixel sharing unit 400 in the global shutter mode imaging device, the S/N ratio of the pixel signal is improved by improving the charge-voltage conversion efficiency while suppressing an increase in the FD capacitance due to the parasitic resistance of the FD wire FDL. Further, crosstalk between the adjacent floating diffusions FD can be suppressed by the shield wire SL4.

10.7 Specific Example of Embodiment 3-5

<10.7.1 Configuration of Embodiment 3-5>

Figure 57:
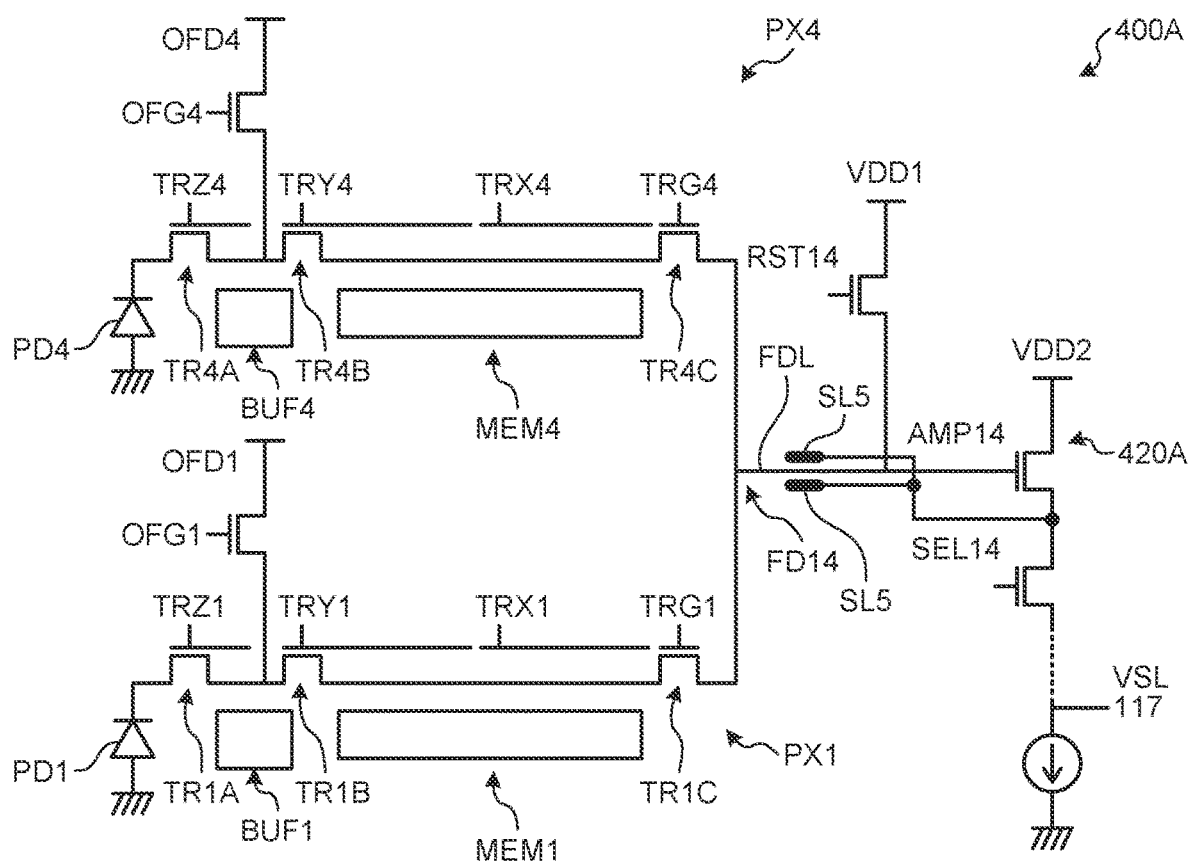
FIG. 57 is an equivalent circuit diagram illustrating an example of a configuration of a pixel sharing unit of a memory-holding type global shutter mode imaging device of Embodiment 3-5.

FIG. 57 is an equivalent circuit diagram illustrating an example of a configuration of a pixel sharing unit 400A of a memory-holding type global shutter mode imaging device of Embodiment 3-5. The pixel sharing unit 400A has pixels PX1 and PX4 and a pixel circuit 420A. The pixel PX1 has a photodiode PD1, first to third transfer transistors TR1A to TR1C, a charge holding unit MEM1, a discharge transistor OFG1, a discharge unit OFD1, and a buffer BUF1. The first transfer transistor TR1A includes a transfer gate TRZ1, the second transfer transistor TR1B includes a transfer gate TRY1 and a transfer gate TRX1, and the third transfer transistor TR1C includes a transfer gate TRG1.

Similarly, the pixel PX4 has a photodiode PD4, first to third transfer transistors TR4A to TR4C, a charge holding unit MEM4, a discharge transistor OFG4, a discharge unit OFD4, and a buffer BUF4. The first transfer transistor TR4A includes a transfer gate TRZ4, the second transfer transistor TR4B includes a transfer gate TRY4 and a transfer gate TRX4, and the third transfer transistor TR4C includes a transfer gate TRG4.

Further, the pixel PX1 and the pixel PX4 share the pixel circuit 420A such as power supplies VDD1 and VDD2, a floating diffusion FD14, a reset transistor RST14, an amplification transistor AMP14, and a selection transistor SEL14.

In this example, the first to third transfer transistors TR1A to TR1C and the first to third transfer transistors TR4A to TR4C are N-type MOS transistors. Further, the reset transistor RST14, the amplification transistor AMP14, and the selection transistor SEL14 are also N-type MOS transistors. Drive signals are supplied to the gate electrodes of the first to third transfer transistors TR1A to TR1C and the first to third transfer transistors TR4A to TR4C by a vertical drive unit and a horizontal drive unit on the basis of drive control of a system control unit. Furthermore, drive signals are supplied to the respective gate electrodes of the reset transistor RST14, the amplification transistor AMP14, and the selection transistor SEL14 by the vertical drive unit and the horizontal drive unit on the basis of the drive control of the system control unit. These drive signals are pulse signals in which a high-level state is an active state (on state) and a low-level state is an inactive state (off state). Note that, hereinafter, setting the drive signal to the active state is also referred to as turning on the drive signal, and setting the drive signal to the inactive state is also referred to as turning off the drive signal.

The photodiodes PD1 and PD4 are photoelectric conversion elements including, for example, PN-junction photodiodes, and are configured to receive light from a subject, generate charges according to the amount of received light by photoelectric conversion, and accumulate the charges.

The charge holding units MEM1 and MEM4 are provided between the photodiode PD1 and the floating diffusion FD14 and between the photodiode PD4 and the floating diffusion FD14, respectively. Furthermore, the charge holding units MEM1 and MEM4 are regions that temporarily hold charges generated and accumulated in the photodiodes PD1 and PD4 until the charges are transferred to the floating diffusion FD14 in order to realize a global shutter function.

The first transfer transistor TR1A and the second transfer transistor TR1B are sequentially arranged between the photodiode PD1 and the charge holding unit MEM1. The third transfer transistor TR1C is arranged between the charge holding unit MEM1 and the floating diffusion FD14. The first transfer transistor TR1A and the second transfer transistor TR1B are configured to transfer the charges accumulated in the photodiode PD1 to the charge holding unit MEM1 according to the drive signal applied to the gate electrodes thereof.

Similarly, the first transfer transistor TR4A and the second transfer transistor TR4B are sequentially arranged between the photodiode PD4 and the charge holding unit MEM4. The third transfer transistor TR4C is arranged between the charge holding unit MEM4 and the floating diffusion FD14. The first transfer transistor TR4A and the second transfer transistor TR4B are configured to transfer the charges accumulated in the photodiode PD4 to the charge holding unit MEM4 according to the drive signal applied to the gate electrodes thereof.

The third transfer transistor TR1C and the third transfer transistor TR4C transfer the charges temporarily held in the charge holding unit MEM1 and the charge holding unit MEM4 to the floating diffusion FD14 according to the drive signal applied to the gate electrodes.

In the pixels PX1 and PX4, for example, it is assumed that the second transfer transistors TR1B and TR4B are turned off and the third transfer transistors TR1C and TR4C are turned on. In this case, the charges respectively held in the charge holding units MEM1 and MEM4 are transferred to the floating diffusion FD14 through the third transfer transistors TR1C and TR4C.

The buffers BUF1 and BUF4 are charge accumulation regions formed between the first transfer transistor TR1A and the second transfer transistor TR1B, respectively. The reset transistor RST14 has a drain connected to the power supply VDD1 and a source connected to the floating diffusion FD14. The reset transistor RST14 initializes, that is, resets the floating diffusion FD14 according to the drive signal applied to the gate electrode thereof. For example, when the reset transistor RST14 is turned on by the drive signal, the potential of the floating diffusion FD14 is reset to the voltage level of the power supply VDD1. That is, the floating diffusion FD14 is initialized.

The floating diffusion FD14 converts the charges transferred from the photodiodes PD1 and PD4 through the first to third transfer transistors TR1A to TR1C and TR4A to TR4C and the charge holding units MEM1 and MEM4 into electric signals (for example, voltage signals) and outputs the electric signals. The reset transistor RST14 is connected to the floating diffusion FD14, and a vertical signal line VSL117 is connected to the floating diffusion FD14 through the amplification transistor AMP14 and the selection transistor SEL14.

The amplification transistor AMP14 outputs an electric signal according to the potential of the floating diffusion FD14. The amplification transistor AMP14 constitutes, for example, a source follower circuit with a constant current source provided in the column signal processing unit. The selection transistor SEL14 is turned on when the pixel PX is selected, and outputs an electric signal from the floating diffusion FD14 through the amplification transistor AMP14, to the column signal processing unit through the vertical signal line VSL117.

The pixels PX1 and PX4 further include the discharge units OFD1 and OFD4 in addition to the floating diffusion FD14 as transfer destinations of charges of the photodiodes PD1 and PD4, respectively. The discharge transistor OFG1 is arranged between the first transfer transistor TR1A and the second transfer transistor TR1B, and the discharge transistor OFG4 is arranged between the first transfer transistor TR4A and the second transfer transistor TR4B.

The discharge transistor OFG1 has a drain connected to the discharge unit OFD1 and a source connected to a wire connecting the first transfer transistor TR1A to the second transfer transistor TR1B. Similarly, the discharge transistor OFG4 has a drain connected to the discharge unit OFD4 and a source connected to a wire connecting the first transfer transistor TR4A to the second transfer transistor TR4B. The discharge transistors OFG1 and OFG4 initialize, that is, reset the photodiodes PD1 and PD4 according to the drive signals applied to the respective gate electrodes. Resetting the photodiodes PD1 and PD4 means depleting the photodiodes PD1 and PD4.

In addition, the discharge transistors OFG1 and OFG4 form overflow paths, respectively, and discharge the charges overflowing from the photodiodes PD1 and PD4 to the discharge units OFD1 and OFD4, respectively. As described above, in the pixels PX1 and PX4 of the embodiment, the discharge transistors OFG1 and OFG4 can directly reset the photodiodes PD1 and PD4.

The pixel PX1, the pixel PX4, and the floating diffusion FD14 are arranged on the first substrate 100, and the pixel circuit 420A such as the reset transistor RST14, the amplification transistor AMP14, and the selection transistor SEL14 is arranged on the second substrate 200. Further, the floating diffusion FD of the first substrate 100 and the gate of the amplification transistor AMP14 of the second substrate 200 are connected by the FD wire FDL.

The second substrate 200 includes a common p-well layer common to all pixels and an independent p-well layer for each amplification transistor AMP14 of the pixels, and the common p-well layer and the independent p-well layer are electrically isolated by a full trench (FTI). In the common p-well layer, the reset transistor RST14 and the selection transistor SEL14 in each pixel circuit 420 are formed. Since the common p-well layer is connected to the GND potential, the back gates of the reset transistor RST14 and the selection transistor SEL14 are fixed to the GND potential.

On the other hand, in the independent p-well layer, the amplification transistor AMP14 in the pixel circuit 420 is formed. Since the independent p-well layer is connected to the source of the amplification transistor AMP14, the potential of the independent p-well layer is changed following the source potential of the amplification transistor AMP14. That is, since the back gate of the amplification transistor AMP14 and the source potential have the same potential, the gain of the source follower circuit becomes one.

That is, the gate potential amplitude and the source potential amplitude of the amplification transistor AMP14 become equal. That is, the potential of a shield wire SL5 is also changed following the change amount of the FD potential of the FD wire FDL. Therefore, no charge transfer occurs between the FD wire FDL and the shield wire SL5, and the capacitance value between the FD wire FDL and the shield wire SL5 is decreased. Therefore, even if the coupling between the FD wire FDL and the shield wire SL5 is large, it can be ignored as the FD capacitance at the time of the actual read operation. Then, since the arrangement is made such that the coupling between the FD wire FDL and the other wire is as small as possible, the FD capacitance becomes a small value. That is, since the parasitic capacitance of the FD capacitance is decreased, the source follower output voltage Vsf can be increased.

<10.7.2 Operation and Effect of Embodiment 3-5>

The pixel sharing unit 400A in the memory-holding type global shutter mode imaging device of Embodiment 3-5 is in a state in which the common p-well layer is electrically isolated from the independent p-well layer of the amplification transistor AMP. In the pixel sharing unit 400A, the FD wire FDL is shielded by the shield wire SL5 connecting the gate of the amplification transistor AMP14 to the source of the amplification transistor AMP14. That is, by connecting the source of the amplification transistor AMP14 and the independent p-well layer of the amplification transistor AMP14 to have the same potential, the substrate bias effect is eliminated, and the gain of the FD amplitude and the source amplitude of the amplification transistor AMP14 is set to one. The periphery of the FD wire FDL is shielded by the shield wire SL5 which draws the source potential of the amplification transistor AMP14, so that the wire coupled to the floating diffusion FD14 moves at the same amplitude as the floating diffusion FD14. As a result, since the wire coupling capacitance is decreased, the FD capacitance is reduced to improve the charge-voltage conversion efficiency.

That is, in memory-holding type global shutter mode imaging device, the S/N ratio of the pixel signal can be improved by improving the charge-voltage conversion efficiency while suppressing an increase in the FD capacitance due to the parasitic resistance of the FD wire FDL. Further, crosstalk between the adjacent floating diffusions FD14 can be suppressed by the shield wire SL5.

In the embodiments and modifications of the present disclosure, examples of a method of forming each layer, each film, each element, and the like described above include a physical vapor deposition method (PVD method), a CVD method, and the like. Examples of the PVD method include a vacuum vapor deposition method using resistance heating or high frequency heating, an electron beam (EB) vapor deposition method, various sputtering methods (magnetron sputtering method, RF-DC coupled bias sputtering method, electron cyclotron resonance (ECR) sputtering method, counter target sputtering method, high frequency sputtering method, and the like), an ion plating method, a laser ablation method, and a molecular beam epitaxy (MBE) method, a laser transfer method, and the like. Examples of the CVD method include a plasma CVD method, a thermal CVD method, an MOCVD method, and an optical CVD method. Further, other methods include an electroplating method, an electroless plating method, and a spin coating method; an immersion method; a cast method; a microcontact printing method; a drop cast method; various printing methods such as a screen printing method, an inkjet printing method, an offset printing method, a gravure printing method, and a flexographic printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Examples of a patterning method of each layer include chemical etching such as shadow mask, laser transfer, and photolithography, and physical etching using ultraviolet rays, laser, or the like. In addition, examples of the planarization technology include a CMP method, a laser planarization method, and a reflow method. That is, the imaging device 1 according to the embodiments and the modifications of the present disclosure can be easily and inexpensively manufactured using an existing semiconductor device manufacturing process.

In the above description, an example in which the amplification transistor AMP, the selection transistor SEL, and the reset transistor RST constituting the pixel circuit 210 of the second substrate 211 are formed on the same semiconductor substrate has been described, but the second substrate 211 may be formed of a plurality of semiconductor substrates.

In this case, if the amplification transistor AMP is arranged at a position far from the floating diffusion, capacitance is formed between the amplification transistor AMP and the floating diffusion, which may cause a decrease in conversion efficiency.

Therefore, it is preferable that, among the amplification transistor AMP, the selection transistor SEL, and the reset transistor RST, at least the amplification transistor AMP and the floating diffusion are formed on the same semiconductor substrate, and the remaining transistors are formed on another semiconductor substrate.

In this case, if a channel width W of the amplification transistor AMP can be increased, noise is reduced. Therefore, by adopting the above configuration in which the second substrate is formed of a plurality of semiconductors, an area that can be allocated to the amplification transistor AMP can be increased, and noise can be reduced to improve the performance.

11. Application Example

Figure 58:
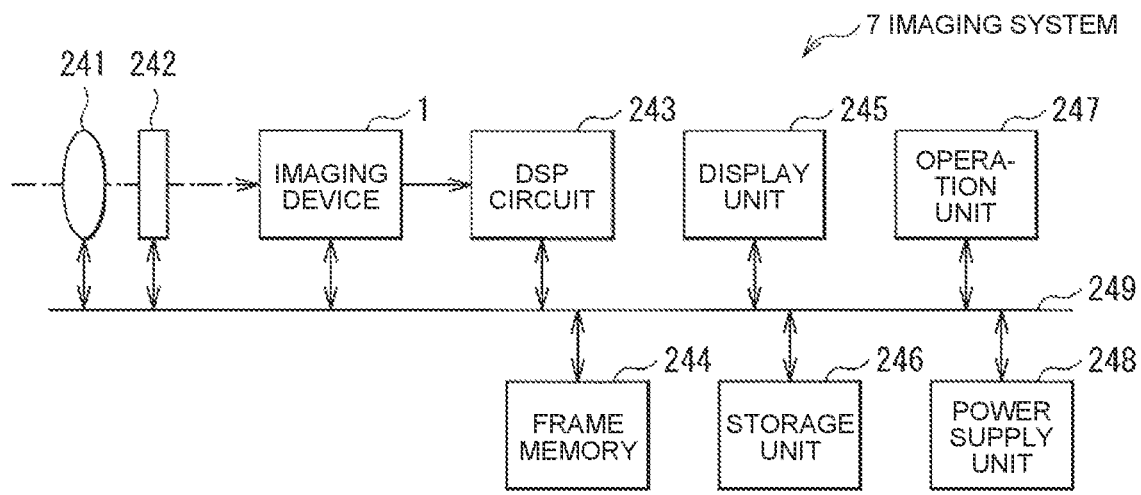
FIG. 58 is a diagram illustrating an example of a schematic configuration of an imaging system including the imaging device according to the embodiments and the modifications thereof described above.

FIG. 58 illustrates an example of a schematic configuration of an imaging system 7 including the imaging device 1 according to the embodiments and the modifications thereof described above.

The imaging system 7 is, for example, electronic equipment such as an imaging device such as a digital still camera or a video camera, or a portable terminal device such as a smartphone or a tablet terminal. The imaging system 7 includes, for example, the imaging device 1 according to the embodiments and the modifications thereof described above, a DSP circuit 243, a frame memory 244, a display unit 245, a storage unit 246, an operation unit 247, and a power supply unit 248. In the imaging system 7, the imaging device 1 according to the embodiments and the modifications thereof described above, the DSP circuit 243, the frame memory 244, the display unit 245, the storage unit 246, the operation unit 247, and the power supply unit 248 are connected to each other through a bus line 249.

The imaging device 1 according to the embodiments and the modifications thereof described above outputs image data according to incident light. The DSP circuit 243 is a signal processing circuit that processes a signal (image data) output from the imaging device 1 according to the embodiments and the modifications thereof described above. The frame memory 244 temporarily holds the image data processed by the DSP circuit 243 in units of frames. The display unit 245 includes, for example, a panel-type display device such as a liquid crystal panel or an organic electro luminescence (EL) panel, and displays a moving image or a still image captured by the imaging device 1 according to the embodiments and the modifications thereof described above. The storage unit 246 records the image data of the moving image or the still image captured by the imaging device 1 according to the embodiments and the modifications thereof described above, in a recording medium such as a semiconductor memory or a hard disk. The operation unit 247 issues an operation command for various functions of the imaging system 7 in accordance with an operation by the user. The power supply unit 248 appropriately supplies various power supplies serving as operation power sources of the imaging device 1 according to the embodiments and the modifications thereof described above, the DSP circuit 243, the frame memory 244, the display unit 245, the storage unit 246, and the operation unit 247 to these supply targets.

Next, an imaging procedure in the imaging system 7 will be described.

Figure 59:
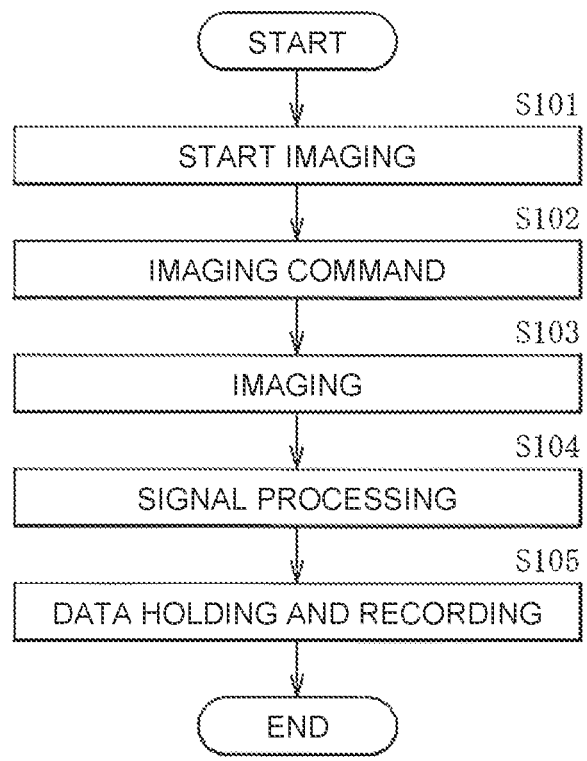
FIG. 59 is a diagram illustrating an example of an imaging procedure of the imaging system illustrated in FIG. 58.

FIG. 59 illustrates an example of a flowchart of an imaging operation in the imaging system 7. The user instructs start of imaging by operating the operation unit 247 (Step S101). Then, the operation unit 247 transmits an imaging command to the imaging device 1 (Step S102). When receiving the imaging command, the imaging device 1 (specifically, a system control circuit 36) executes imaging by a predetermined imaging method (Step S103).

The imaging device 1 outputs image data obtained by imaging to the DSP circuit 243. Here, the image data is data for all the pixels of the pixel signal generated on the basis of the charge temporarily held in the floating diffusion FD. The DSP circuit 243 performs predetermined signal processing (for example, noise reduction processing) on the basis of the image data input from the imaging device 1 (Step S104). The DSP circuit 243 causes the frame memory 244 to hold the image data subjected to the predetermined signal processing, and the frame memory 244 causes the storage unit 246 to store the image data (Step S105). In this manner, imaging in the imaging system 7 is performed.

In the present application example, the imaging device 1 according to the embodiments and the modifications thereof described above is applied to the imaging system 7. As a result, since the imaging device 1 can be downsized or have high definition, it is possible to provide a small-sized or high-definition imaging system 7.

12. Application Example

First Application Example

The technology according to the present disclosure (present technology) can be applied to various products. For example, the technology according to the present disclosure may be realized as a device mounted on any type of moving body such as an automobile, an electric vehicle, a hybrid electric vehicle, a motorcycle, a bicycle, a personal mobility, an airplane, a drone, a ship, and a robot.

Figure 60:
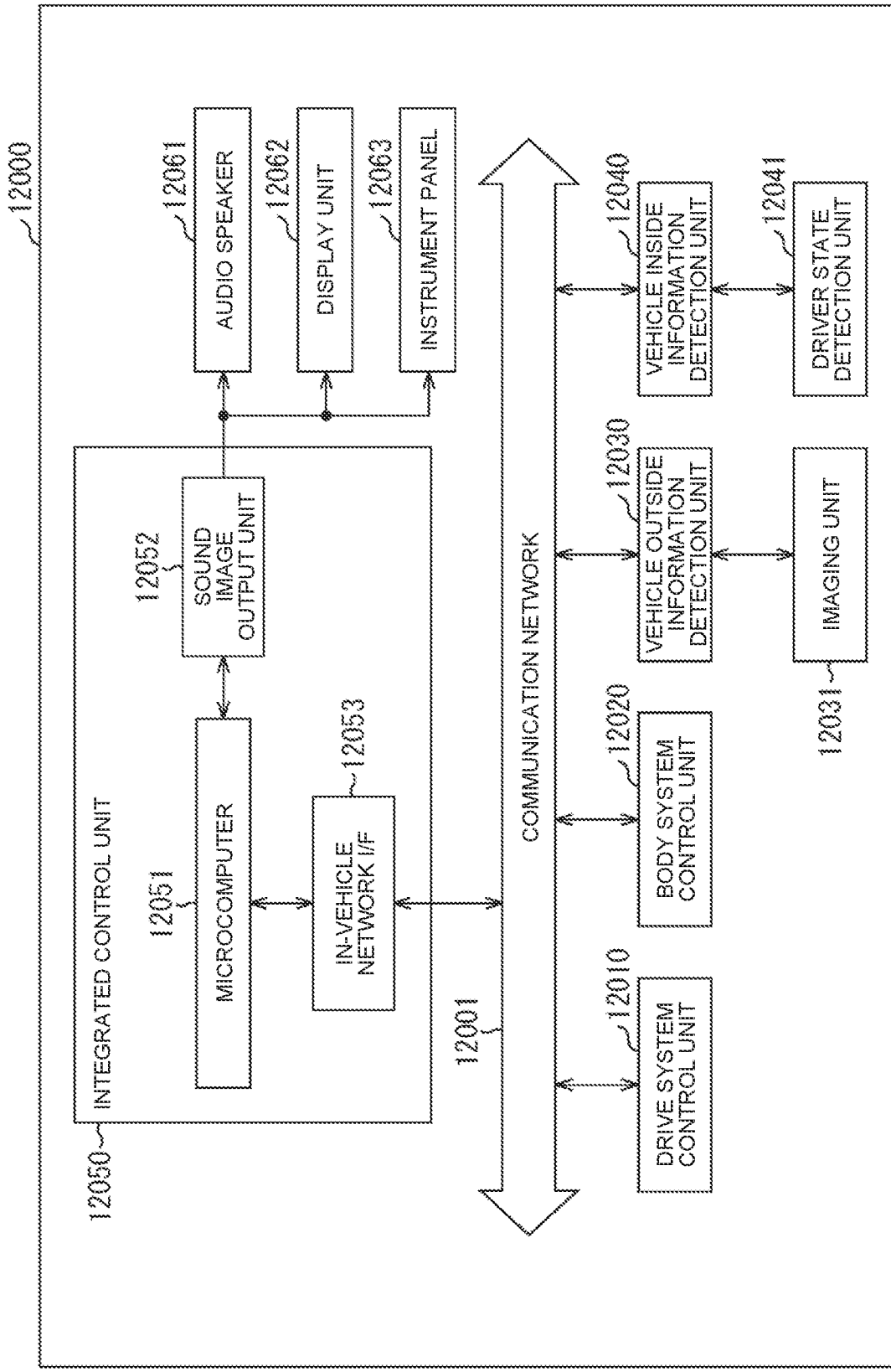
FIG. 60 is a block diagram illustrating an example of a schematic configuration of a vehicle control system.

FIG. 60 is a block diagram illustrating a schematic configuration example of a vehicle control system which is an example of a moving body control system to which the technology according to the present disclosure can be applied.

A vehicle control system 12000 includes a plurality of electronic control units connected through a communication network 12001. In the example illustrated in FIG. 60, the vehicle control system 12000 includes a drive system control unit 12010, a body system control unit 12020, a vehicle outside information detection unit 12030, a vehicle inside information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices relating to a drive system of a vehicle according to various programs. For example, the drive system control unit 12010 functions as a control device of a driving force generation device for generating a driving force of the vehicle such as an internal combustion engine or a driving motor, a driving force transmission mechanism for transmitting the driving force to wheels, a steering mechanism for adjusting a steering angle of the vehicle, a braking device for generating a braking force of the vehicle, and the like.

The body system control unit 12020 controls operations of various devices mounted on the vehicle body according to various programs. For example, the body system control unit 12020 functions as a control device of a keyless entry system, a smart key system, a power window device, or various lamps such as a headlamp, a back lamp, a brake lamp, a blinker, or a fog lamp. In this case, radio waves transmitted from a portable device that replaces the key or signals of various switches can be input to the body system control unit 12020. The body system control unit 12020 receives an input of these radio waves or signals, and controls a door lock device, a power window device, a lamp, and the like of the vehicle.

The vehicle outside information detection unit 12030 detects information on the outside of the vehicle on which the vehicle control system 12000 is mounted. For example, an imaging unit 12031 is connected to the vehicle outside information detection unit 12030. The vehicle outside information detection unit 12030 causes the imaging unit 12031 to capture an image of the outside of the vehicle, and receives the captured image. The vehicle outside information detection unit 12030 may perform object detection processing or distance detection processing of a person, a vehicle, an obstacle, a sign, a character on a road surface, or the like on the basis of the received image.

The imaging unit 12031 is an optical sensor that receives light and outputs an electric signal according to the amount of received light. The imaging unit 12031 can output the electric signal as an image or can output the electric signal as distance measurement information. Furthermore, the light received by the imaging unit 12031 may be visible light or invisible light such as infrared rays.

The vehicle inside information detection unit 12040 detects information on the inside of the vehicle. For example, a driver state detection unit 12041 that detects a state of a driver is connected to the vehicle inside information detection unit 12040. The driver state detection unit 12041 includes, for example, a camera that images the driver, and the vehicle inside information detection unit 12040 may calculate a fatigue degree or a concentration degree of the driver or may determine whether or not the driver is dozing off on the basis of the detection information input from the driver state detection unit 12041.

The microcomputer 12051 can calculate a control target value of the driving force generation device, the steering mechanism, or the braking device on the basis of the information on the inside and the outside of the vehicle acquired by the vehicle outside information detection unit 12030 or the vehicle inside information detection unit 12040, and can output a control command to the drive system control unit 12010. For example, the microcomputer 12051 can perform cooperative control for the purpose of implementing functions of an advanced driver assistance system (ADAS) including collision avoidance or impact mitigation of the vehicle, follow-up traveling based on an inter-vehicle distance, vehicle speed maintenance traveling, vehicle collision warning, vehicle lane departure warning, or the like.

Furthermore, the microcomputer 12051 controls the driving force generation device, the steering mechanism, the braking device, or the like on the basis of the information on the surroundings of the vehicle acquired by the vehicle outside information detection unit 12030 or the vehicle inside information detection unit 12040, and thereby performs cooperative control for the purpose of automatic driving or the like in which the vehicle autonomously travels without depending on the operation of the driver.

Furthermore, the microcomputer 12051 can output a control command to the body system control unit 12020 on the basis of the information on the outside of the vehicle acquired by the vehicle outside information detection unit 12030. For example, the microcomputer 12051 can control the headlamp according to the position of a preceding vehicle or an oncoming vehicle detected by the vehicle outside information detection unit 12030, and thereby can perform cooperative control for the purpose of preventing glare, such as switching from a high beam to a low beam.

The sound image output unit 12052 transmits an output signal of at least one of a sound or an image, to an output device capable of visually or audibly notifying an occupant of the vehicle or the outside of the vehicle of information. In the example of FIG. 60, an audio speaker 12061, a display unit 12062, and an instrument panel 12063 are illustrated as the output device. The display unit 12062 may include, for example, at least one of an on-board display and a head-up display.

Figure 61:
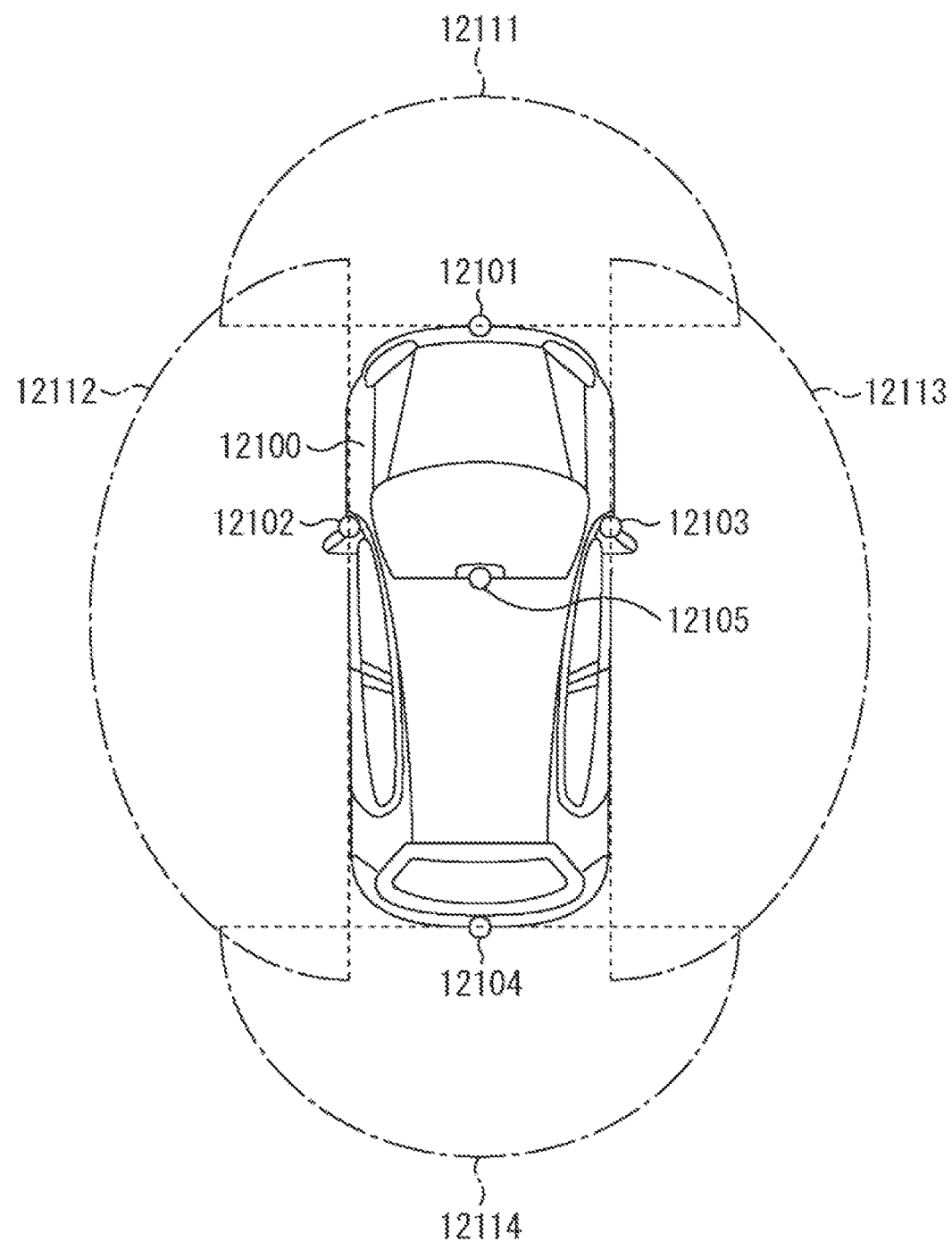
FIG. 61 is an explanatory diagram illustrating an example of installation positions of a vehicle outside information detection unit and an imaging unit.

FIG. 61 is a diagram illustrating an example of an installation position of the imaging unit 12031.

In FIG. 61, a vehicle 12100 has imaging units 12101, 12102, 12103, 12104, and 12105 as the imaging unit 12031.

The imaging units 12101, 12102, 12103, 12104, and 12105 are provided, for example, at positions such as a front nose, a side mirror, a rear bumper, a back door, and an upper portion of a windshield in a vehicle interior of the vehicle 12100. The imaging unit 12101 provided at the front nose and the imaging unit 12105 provided at the upper portion of the windshield in the vehicle interior mainly acquire images of a portion in front of the vehicle 12100. The imaging units 12102 and 12103 provided at the side mirrors mainly acquire images of portions on the sides of the vehicle 12100. The imaging unit 12104 provided on the rear bumper or the back door mainly acquires an image of a portion behind the vehicle 12100. The front images acquired by the imaging units 12101 and 12105 are mainly used for detecting a preceding vehicle, a pedestrian, an obstacle, a traffic light, a traffic sign, a lane, or the like.

FIG. 61 illustrates an example of imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, by superimposing image data captured by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 obtains a distance to each three-dimensional object in the imaging ranges 12111 to 12114 and a temporal change of the distance (relative speed with respect to the vehicle 12100) on the basis of the distance information obtained from the imaging units 12101 to 12104, and thereby can extract, as a preceding vehicle, a three-dimensional object which is traveling at a predetermined speed (for example, 0 km/h or more) in substantially the same direction as the vehicle 12100, in particular, the closest three-dimensional object on a traveling path of the vehicle 12100. Furthermore, the microcomputer 12051 can set an inter-vehicle distance to be secured in advance with the preceding vehicle, and can perform automatic brake control (including follow-up stop control), automatic acceleration control (including follow-up start control), and the like. As described above, it is possible to perform cooperative control for the purpose of automatic driving or the like in which the vehicle autonomously travels without depending on the operation of the driver.

For example, on the basis of the distance information obtained from the imaging units 12101 to 12104, the microcomputer 12051 can classify three-dimensional object data regarding the three-dimensional objects into two-wheeled vehicles, ordinary vehicles, large vehicles, pedestrians, and other three-dimensional objects such as utility poles, extract the three-dimensional object data, and use the three-dimensional object data for automatic avoidance of obstacles. For example, the microcomputer 12051 identifies obstacles around the vehicle 12100 as obstacles that can be visually recognized and obstacles that are difficult to be visually recognized by the driver of the vehicle 12100. Then, the microcomputer 12051 determines a collision risk indicating a risk of collision with each obstacle, and when the collision risk is a set value or more and there is a possibility of collision, the microcomputer 12051 can perform driving assistance for collision avoidance by outputting an alarm to the driver through the audio speaker 12061 or the display unit 12062 or performing forced deceleration or avoidance steering through the drive system control unit 12010.

At least one of the imaging units 12101 to 12104 may be an infrared camera that detects infrared rays. For example, the microcomputer 12051 can recognize a pedestrian by determining whether or not a pedestrian is present in the captured images of the imaging units 12101 to 12104. Such pedestrian recognition is performed by, for example, a procedure of extracting feature points in the captured images of the imaging units 12101 to 12104 as infrared cameras, and a procedure of performing pattern matching processing on a series of feature points indicating an outline of an object to determine whether or not the object is a pedestrian. When the microcomputer 12051 determines that a pedestrian is present in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like indicating a pedestrian at a desired position.

An example of the moving body control system to which the technology according to the present disclosure can be applied has been described above. The technology according to the present disclosure can be applied to the imaging unit 12031 among the configurations described above. Specifically, the imaging device 1 according to the embodiments and the modifications thereof described above can be applied to the imaging unit 12031. By applying the technology according to the present disclosure to the imaging unit 12031, it is possible to obtain a high-definition captured image with little noise, and thus, it is possible to perform control with high accuracy using the captured image in the moving body control system.

Second Application Example

Figure 62:
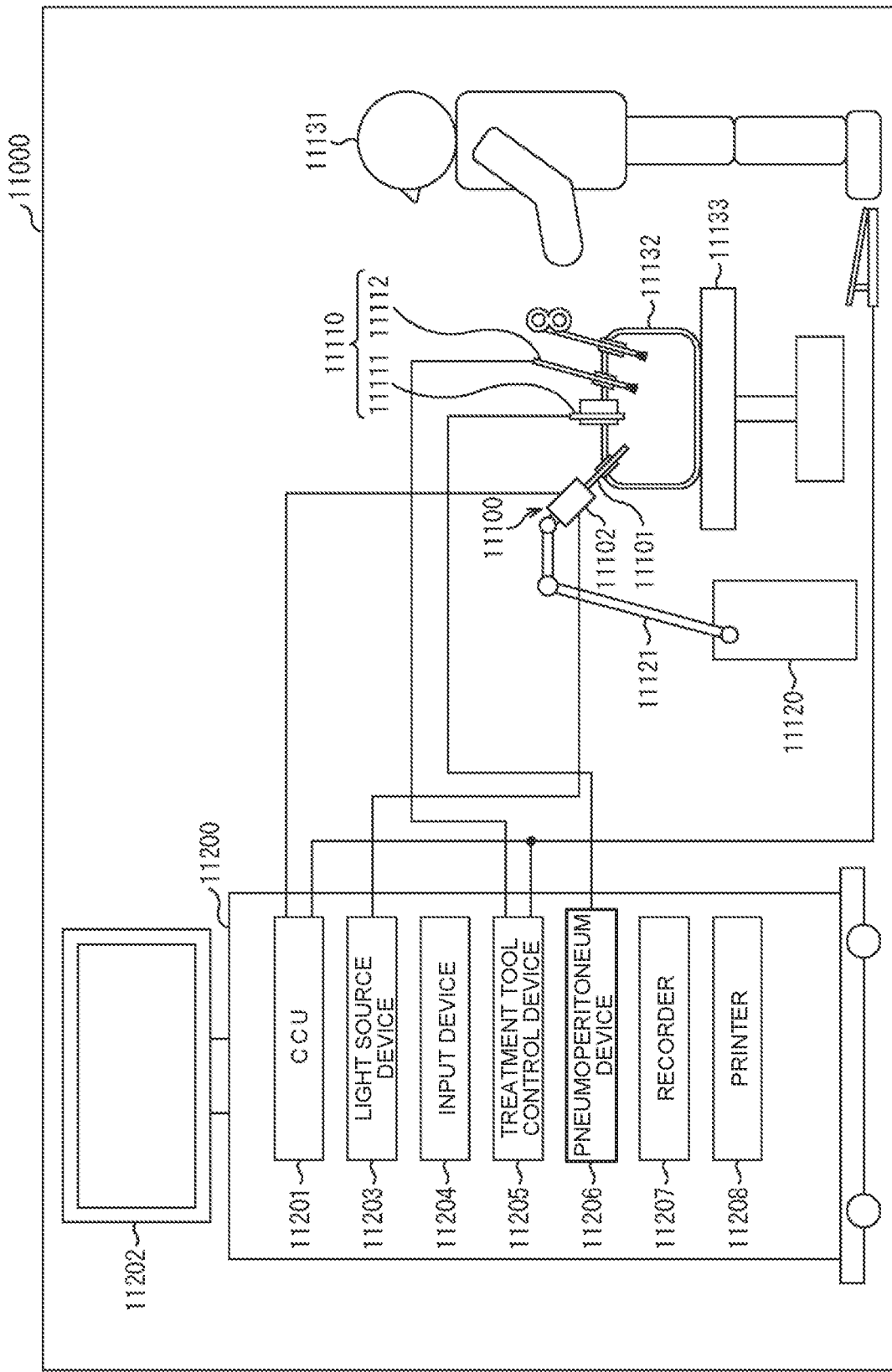
FIG. 62 is a diagram illustrating an example of a schematic configuration of an endoscopic surgery system.

FIG. 62 is a diagram illustrating an example of a schematic configuration of an endoscopic surgery system to which the technology according to the present disclosure (the present technology) can be applied.

FIG. 62 illustrates a state in which an operator (doctor) 11131 is performing surgery on a patient 11132 on a patient bed 11133 using an endoscopic surgery system 11000. As illustrated in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various devices for endoscopic surgery are mounted.

The endoscope 11100 includes a lens barrel 11101 of which a region of a predetermined length from the distal end is inserted into a body cavity of the patient 11132, and a camera head 11102 connected to a proximal end of the lens barrel 11101. In the illustrated example, the endoscope 11100 configured as a so-called rigid scope having the rigid lens barrel 11101 is illustrated, but the endoscope 11100 may be configured as a so-called flexible scope having a flexible lens barrel.

An opening portion into which an objective lens is fitted is provided at the distal end of the lens barrel 11101. A light source device 11203 is connected to the endoscope 11100, and light generated by the light source device 11203 is guided to the distal end of the lens barrel 11101 by a light guide extending inside the lens barrel 11101, and is emitted toward an observation target in the body cavity of the patient 11132 through the objective lens. Note that the endoscope 11100 may be a forward-viewing endoscope, an oblique-viewing endoscope, or a side-viewing endoscope.

An optical system and an imaging element are provided inside the camera head 11102, and reflected light (observation light) from the observation target is condensed on the imaging element by the optical system. The observation light is photoelectrically converted by the imaging element, and an electric signal corresponding to the observation light, that is, an image signal corresponding to an observation image is generated. The image signal is transmitted to a camera control unit (CCU) 11201 as RAW data.

The CCU 11201 includes a central processing unit (CPU), a graphics processing unit (GPU), and the like, and integrally controls operations of the endoscope 11100 and a display device 11202. Furthermore, the CCU 11201 receives an image signal from the camera head 11102, and performs various kinds of image processing for displaying an image based on the image signal, such as development processing (demosaic processing), on the image signal.

The display device 11202 displays an image based on the image signal subjected to the image processing by the CCU 11201 under the control of the CCU 11201.

The light source device 11203 includes a light source such as a light emitting diode (LED), for example, and supplies irradiation light for imaging a surgical site or the like, to the endoscope 11100.

An input device 11204 is an input interface for the endoscopic surgery system 11000. The user can input various kinds of information and instructions to the endoscopic surgery system 11000 through the input device 11204. For example, the user inputs an instruction or the like to change imaging conditions (kind, magnification, focal length, and the like of irradiation light) by the endoscope 11100.

A treatment tool control device 11205 controls the driving of the energy treatment tool 11112 for cauterization and incision of tissue, sealing of a blood vessel, or the like. A pneumoperitoneum device 11206 feeds gas into the body cavity of the patient 11132 through the pneumoperitoneum tube 11111 in order to inflate the body cavity for the purpose of securing a visual field by the endoscope 11100 and securing a working space of the operator. A recorder 11207 is a device capable of recording various kinds of information regarding surgery. A printer 11208 is a device capable of printing various kinds of information regarding surgery in various formats such as a text, an image, or a graph.

The light source device 11203 that supplies the irradiation light at the time of imaging the surgical site to the endoscope 11100 can include, for example, an LED, a laser light source, or a white light source including a combination thereof. In a case where the white light source includes a combination of RGB laser light sources, since the output intensity and the output timing of each color (each wavelength) can be controlled with high accuracy, adjustment of the white balance of the captured image can be performed in the light source device 11203. Furthermore, in this case, by irradiating the observation target with laser light from each of the RGB laser light sources in a time division manner and controlling the driving of the imaging element of the camera head 11102 in synchronization with the irradiation timing, it is also possible to capture an image corresponding to each of RGB in a time division manner. According to this method, a color image can be obtained without providing a color filter in the imaging element.

Furthermore, the driving of the light source device 11203 may be controlled such that the intensity of light to be output is changed every predetermined time. By controlling the driving of the imaging element of the camera head 11102 in synchronization with the timing of the change of the intensity of the light to acquire images in a time division manner and synthesizing the images, it is possible to generate an image of a high dynamic range without so-called blocked up shadows and blown out highlights.

Furthermore, the light source device 11203 may be configured to be able to supply light in a predetermined wavelength band corresponding to special light observation. In the special light observation, for example, so-called narrow band imaging is performed in which a predetermined tissue such as a blood vessel in a mucosal surface layer is imaged with high contrast by emitting light in a narrower band than the irradiation light (that is, white light) at the time of normal observation, by using wavelength dependency of light absorption in a body tissue. Alternatively, in the special light observation, fluorescence observation for obtaining an image by fluorescence generated by emitting excitation light may be performed. In the fluorescence observation, it is possible to irradiate a body tissue with excitation light to observe fluorescence from the body tissue (autofluorescence observation), or to locally inject a reagent such as indocyanine green (ICG) into a body tissue and irradiate the body tissue with excitation light corresponding to a fluorescence wavelength of the reagent to obtain a fluorescent image, for example. The light source device 11203 can be configured to be able to supply narrow band light and/or excitation light corresponding to such special light observation.

Figure 63:
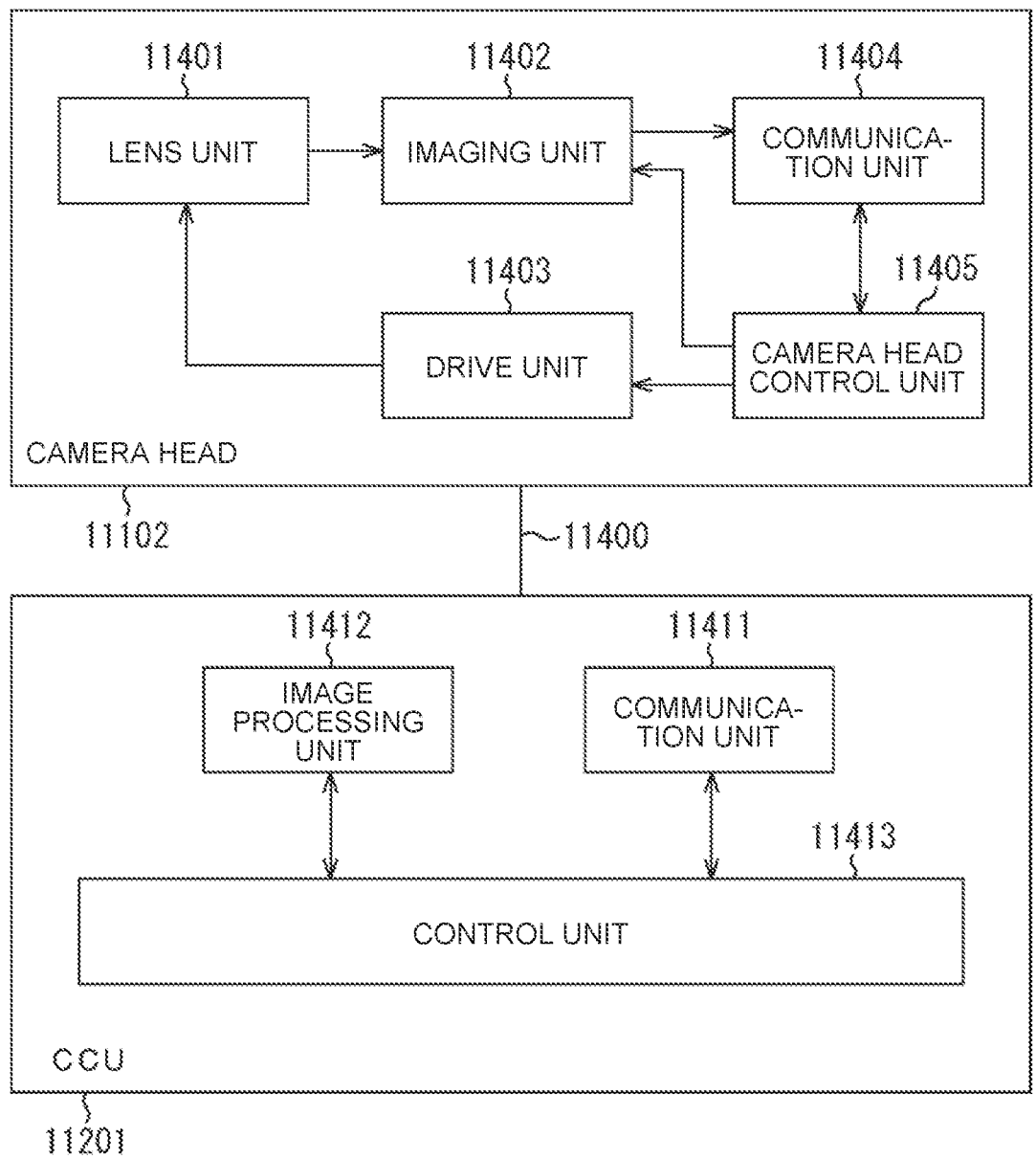
FIG. 63 is a block diagram illustrating an example of functional configurations of a camera head and a CCU.

FIG. 63 is a block diagram illustrating an example of functional configurations of the camera head 11102 and the CCU 11201 illustrated in FIG. 62.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connection portion with the lens barrel 11101. Observation light taken in from the distal end of the lens barrel 11101 is guided to the camera head 11102 and enters the lens unit 11401. The lens unit 11401 is configured by combining a plurality of lenses including a zoom lens and a focus lens.

The imaging unit 11402 includes an imaging element. The imaging element constituting the imaging unit 11402 may be one (so-called single-plate type) or a plurality of (so-called multi-plate type) imaging elements. In a case where the imaging unit 11402 is configured as a multi-plate type, for example, image signals corresponding to RGB may be generated by the respective imaging elements, and a color image may be obtained by combining the image signals. Alternatively, the imaging unit 11402 may include a pair of imaging elements for acquiring right-eye and left-eye image signals corresponding to three-dimensional (3D) display. By performing the 3D display, the operator 11131 can more accurately grasp the depth of the living tissue in the surgical site. Note that, in a case where the imaging unit 11402 is configured as a multi-plate type, a plurality of lens units 11401 can be provided corresponding to the respective imaging elements.

Furthermore, the imaging unit 11402 is not necessarily provided in the camera head 11102. For example, the imaging unit 11402 may be provided immediately behind the objective lens inside the lens barrel 11101.

The drive unit 11403 includes an actuator, and moves the zoom lens and the focus lens of the lens unit 11401 by a predetermined distance along the optical axis under the control of the camera head control unit 11405. As a result, the magnification and focus of the image captured by the imaging unit 11402 can be appropriately adjusted.

The communication unit 11404 includes a communication device for transmitting and receiving various kinds of information to and from the CCU 11201. The communication unit 11404 transmits the image signal obtained from the imaging unit 11402 as RAW data to the CCU 11201 through the transmission cable 11400.

Furthermore, the communication unit 11404 receives a control signal for controlling the driving of the camera head 11102 from the CCU 11201, and supplies the control signal to the camera head control unit 11405. The control signal includes, for example, information regarding imaging conditions such as information for specifying a frame rate of a captured image, information for specifying an exposure value at the time of imaging, and/or information for specifying a magnification and a focus of a captured image.

Note that the imaging conditions such as the frame rate, the exposure value, the magnification, and the focus may be appropriately specified by the user, or may be automatically set by the control unit 11413 of the CCU 11201 on the basis of the acquired image signal. In the latter case, a so-called auto exposure (AE) function, an auto focus (AF) function, and an auto white balance (AWB) function are installed in the endoscope 11100.

The camera head control unit 11405 controls the driving of the camera head 11102 on the basis of the control signal from the CCU 11201 received through the communication unit 11404.

The communication unit 11411 includes a communication device for transmitting and receiving various kinds of information to and from the camera head 11102. The communication unit 11411 receives the image signal transmitted from the camera head 11102 through the transmission cable 11400.

Furthermore, the communication unit 11411 transmits a control signal for controlling the driving of the camera head 11102 to the camera head 11102. The image signal and the control signal can be transmitted by electric communication, optical communication, or the like.

The image processing unit 11412 performs various kinds of image processing on the image signal that is RAW data transmitted from the camera head 11102.

The control unit 11413 performs various kinds of control relating to the imaging of a surgical site or the like by the endoscope 11100 and the display of a captured image obtained by imaging the surgical site or the like. For example, the control unit 11413 generates a control signal for controlling the driving of the camera head 11102.

Furthermore, the control unit 11413 causes the display device 11202 to display a captured image, in which a surgical site or the like is shown, on the basis of the image signal subjected to the image processing by the image processing unit 11412. At this time, the control unit 11413 may recognize various objects in the captured image using various image recognition technologies. For example, the control unit 11413 can recognize a surgical tool such as forceps, a specific body part, bleeding, mist at the time of using the energy treatment tool 11112, and the like by detecting the shape, color, and the like of the edge of the object included in the captured image. When the captured image is displayed on the display device 11202, the control unit 11413 may superimpose and display various kinds of surgery support information on the image of the surgical site by using the recognition result. Since the surgery support information is superimposed and displayed and presented to the operator 11131, the burden on the operator 11131 can be reduced, and the operator 11131 can reliably proceed with the surgery.

The transmission cable 11400 connecting the camera head 11102 to the CCU 11201 is an electric signal cable compatible with electric signal communication, an optical fiber compatible with optical communication, or a composite cable thereof.

Here, in the example illustrated in the drawing, communication is performed by wire using the transmission cable 11400, but communication between the camera head 11102 and the CCU 11201 may be performed wirelessly.

An example of the endoscopic surgery system to which the technology according to the present disclosure can be applied has been described above. The technology according to the present disclosure can be suitably applied to the imaging unit 11402 provided in the camera head 11102 of the endoscope 11100 among the above-described configurations. By applying the technology according to the present disclosure to the imaging unit 11402, the imaging unit 11402 can be downsized or have high definition, so that a small-sized or high-definition endoscope 11100 can be provided.

Although the present disclosure has been described with reference to the embodiments, the modifications, and the application examples thereof, the present disclosure is not limited to the embodiments and the like described above, and various modifications can be made. Note that the effects described in the present specification are merely examples. The effects of the present disclosure are not limited to the effects described in the present specification. The present disclosure may have effects other than those described in the present specification.

Furthermore, for example, the present disclosure can have the following configurations.

(1)

An imaging device, characterized by comprising:
a first substrate that has a pixel having a photodiode, and a floating diffusion that holds a charge converted by the photodiode;
a second substrate that has a pixel circuit, and is stacked on the first substrate, the pixel circuit reading a pixel signal based on the charge held in the floating diffusion in the pixel;
a wire that penetrates the first substrate and the second substrate in a stacking direction, and electrically connects the floating diffusion in the first substrate to an amplification transistor in the pixel circuit of the second substrate; and
a trench that is formed at least in the second substrate, runs in parallel with the wire, and has a depth equal to or greater than a thickness of a semiconductor layer in the second substrate.

(2)

The imaging device according to (1), characterized by further comprising: a shield wire that connects a conductive substance embedded in the trench to a source of the amplification transistor.

(3)

The imaging device according to (1), characterized in that a gas having a low dielectric constant is sealed in the trench.

(4)

The imaging device according to (1) or (2), characterized in that the first substrate has
a semiconductor layer, and
a wire layer that is stacked on the semiconductor layer and is formed of $SiO_2$.

(5)
The imaging device according to (1) or (2), characterized in that the first substrate has
a semiconductor layer, and
a wire layer that is stacked on the semiconductor layer, and is formed of an insulating material having a dielectric constant lower than $SiO_2$.

(6)
The imaging device according to (1), characterized in that the trench is
formed on the semiconductor layer in the second substrate to electrically separate the wire from another wire that runs in parallel with the wire.

(7)
The imaging device according to (6), characterized in that the trench is
formed on the semiconductor layer in the second substrate to surround the wire in a circular shape when viewed from a stacked surface of the second substrate.

(8)
The imaging device according to (6), characterized in that the trench is
formed on the semiconductor layer in the second substrate to surround the wire in a rectangular shape when viewed from a stacked surface of the second substrate.

(9)
An imaging device, characterized by comprising:
a first substrate that has a pixel having a photodiode, and a floating diffusion that holds a charge converted by the photodiode;
a second substrate that has a pixel circuit, and is stacked on the first substrate, the pixel circuit reading a pixel signal based on the charge held in the floating diffusion in the pixel;
a wire that electrically connects the floating diffusion in the first substrate to an amplification transistor in the pixel circuit of the second substrate, and is formed in the first substrate and the second substrate; and
a shield wire that electrically connects a gate of the amplification transistor and a source of the amplification transistor in a state where a well layer of the pixel circuit and a well layer of the amplification transistor in the pixel circuit are electrically isolated from each other, and shields the wire while running in parallel with the wire.

(10)
The imaging device according to (9), characterized in that the shield wire
shields a wire portion, which passes through at least the second substrate, of the wire connecting the amplification transistor in the second substrate to the floating diffusion in the first substrate.

(11)
The imaging device according to (9), characterized in that the shield wire
shields a wire portion, which passes through the second substrate and the first substrate, of the wire connecting the amplification transistor in the second substrate to the floating diffusion in the first substrate.

(12)
The imaging device according to (9), characterized in that at least a portion of the shield wire has a shorter distance from the wire than another wire.

(13)
The imaging device according to (9), characterized in that a coupling capacitance between the wire and the shield wire is larger than a coupling capacitance between the wire and another wire.

(14)
The imaging device according to (9), further comprising:
a column signal processing unit that is connected to a plurality of the pixel circuits through a plurality of vertical signal lines,
wherein the column signal processing unit includes an AD converter performing AD conversion on the basis of a reference signal, and a load circuit, and outputs pixel data according to a voltage of the vertical signal line.

(15)
The imaging device according to (9), further comprising:
a column signal processing unit that is connected to a plurality of the pixel circuits through a plurality of vertical signal lines,
wherein the column signal processing unit includes
a RAMP generation circuit that generates and outputs a RAMP waveform,
a comparator that compares a voltage of a pixel signal read through the vertical signal line with a voltage of the RAMP waveform,
a counter that performs counting on the basis of a comparison result signal of the comparator, and
a latch that outputs pixel data on the basis of a count value of the counter.

(16)
The imaging device according to (15),
wherein the comparator is configured as a single-slope ADC.

(17)
The imaging device according to (15),
wherein the comparator includes a transistor that has a source terminal to which the pixel signal read through the vertical signal line is applied, and a gate terminal to which the RAMP waveform is applied, and outputs a comparison result signal based on a gate-source voltage.

(18)
The imaging device according to (9), further including:
a column signal processing unit that is connected to a plurality of the pixel circuits through a plurality of vertical signal lines,
in which the signal processing unit includes
a load circuit,
a pre-circuit that connects a current generated by the load circuit to the vertical signal line, and is configured as a current reuse circuit, and
an AD converter that performs AD conversion on the basis of a predetermined reference signal, and
the column signal processing unit outputs pixel data according to a voltage of the vertical signal line.

REFERENCE SIGNS LIST

1 IMAGING DEVICE
100 FIRST SUBSTRATE
100T WIRE LAYER
200 SECOND SUBSTRATE
200T WIRE LAYER
210A PIXEL CIRCUIT
250 COMMON p-WELL LAYER

251 INDEPENDENT p-WELL LAYER
541 PIXEL
554 COMPARATOR
558 COMPARATOR
561 PRE-CIRCUIT
PD PHOTODIODE
FD FLOATING DIFFUSION
FDL FD WIRE
T TRENCH
SL SHIELD WIRE

What is claimed is:

1. An imaging device, comprising:
a first substrate that has a pixel having a photodiode, and a floating diffusion that holds a charge converted by the photodiode;
a second substrate that has a pixel circuit and is stacked on the first substrate, the pixel circuit reading a pixel signal based on the charge held in the floating diffusion in the pixel;
a wire that penetrates the first substrate and the second substrate in a stacking direction and electrically connects the floating diffusion in the first substrate to an amplification transistor in the pixel circuit of the second substrate;
a trench that is formed at least in the second substrate, runs in parallel with the wire, and has a depth equal to or greater than a thickness of a semiconductor layer in the second substrate; and
a shield wire that connects a conductive substance embedded in the trench to a source of the amplification transistor.

2. The imaging device according to claim 1, wherein a gas having a low dielectric constant is sealed in the trench.

3. The imaging device according to claim 1, wherein the first substrate has
a semiconductor layer, and
a wire layer that is stacked on the semiconductor layer and is formed of SiO$_2$.

4. The imaging device according to claim 1, wherein the first substrate has
a semiconductor layer, and
a wire layer that is stacked on the semiconductor layer, and is formed of an insulating material having a dielectric constant lower than SiO$_2$.

5. The imaging device according to claim 1, wherein the trench is formed on the semiconductor layer in the second substrate to electrically separate the wire from another wire that runs in parallel with the wire.

6. The imaging device according to claim 5, wherein the trench is formed on the semiconductor layer in the second substrate to surround the wire in a circular shape when viewed from a stacked surface of the second substrate.

7. The imaging device according to claim 5, wherein the trench is formed on the semiconductor layer in the second substrate to surround the wire in a rectangular shape when viewed from a stacked surface of the second substrate.

8. An imaging device, comprising:
a first substrate that has a pixel having a photodiode, and a floating diffusion that holds a charge converted by the photodiode;
a second substrate that has a pixel circuit and is stacked on the first substrate, the pixel circuit reading a pixel signal based on the charge held in the floating diffusion in the pixel;
a wire that electrically connects the floating diffusion in the first substrate to an amplification transistor in the pixel circuit of the second substrate; and is formed in the first substrate and the second substrate; and
a shield wire that electrically connects a gate of the amplification transistor and a source of the amplification transistor in a state where a well layer of the pixel circuit and a well layer of the amplification transistor in the pixel circuit are electrically isolated from each other, and shields the wire while running in parallel with the wire, wherein a coupling capacitance between the wire and the shield wire is larger than a coupling capacitance between the wire and another wire.

9. The imaging device according to claim 8, wherein the shield wire shields a wire portion, which passes through at least the second substrate, of the wire connecting the amplification transistor in the second substrate to the floating diffusion in the first substrate.

10. The imaging device according to claim 8, wherein the shield wire shields a wire portion, which passes through the second substrate and the first substrate, of the wire connecting the amplification transistor in the second substrate to the floating diffusion in the first substrate.

11. The imaging device according to claim 8, wherein at least a portion of the shield wire has a shorter distance from the wire than another wire.

12. The imaging device according to claim 8, further comprising:
a column signal processing unit that is connected to a plurality of the pixel circuits through a plurality of vertical signal lines,
wherein the column signal processing unit includes
a load circuit,
a pre-circuit that connects a current generated by the load circuit to the vertical signal line, and is configured as a current reuse column amplifier, and
an AD converter that performs AD conversion on a basis of a predetermined reference signal, and
the column signal processing unit outputs pixel data according to a voltage of the vertical signal line.

13. An imaging device, comprising:
a first substrate that has a pixel having a photodiode, and a floating diffusion that holds a charge converted by the photodiode;
a second substrate that has a pixel circuit and is stacked on the first substrate, the pixel circuit reading a pixel signal based on the charge held in the floating diffusion in the pixel;
a wire that electrically connects the floating diffusion in the first substrate to an amplification transistor in the pixel circuit of the second substrate; and is formed in the first substrate and the second substrate;
a shield wire that electrically connects a gate of the amplification transistor and a source of the amplification transistor in a state where a well layer of the pixel circuit and a well layer of the amplification transistor in the pixel circuit are electrically isolated from each other, and shields the wire while running in parallel with the wire; and
a column signal processing unit that is connected to a plurality of the pixel circuits through a plurality of vertical signal lines,
wherein the column signal processing unit includes an AD converter performing AD conversion on a basis of a reference signal, and a load circuit, and outputs pixel data according to a voltage of the vertical signal line.

14. The imaging device according to claim 13, wherein a coupling capacitance between the wire and the shield wire is larger than a coupling capacitance between the wire and another wire.

15. An imaging device, comprising:
- a first substrate that has a pixel having a photodiode, and a floating diffusion that holds a charge converted by the photodiode;
- a second substrate that has a pixel circuit and is stacked on the first substrate, the pixel circuit reading a pixel signal based on the charge held in the floating diffusion in the pixel;
- a wire that electrically connects the floating diffusion in the first substrate to an amplification transistor in the pixel circuit of the second substrate; and is formed in the first substrate and the second substrate;
- a shield wire that electrically connects a gate of the amplification transistor and a source of the amplification transistor in a state where a well layer of the pixel circuit and a well layer of the amplification transistor in the pixel circuit are electrically isolated from each other, and shields the wire while running in parallel with the wire; and
- a column signal processing unit that is connected to a plurality of the pixel circuits through a plurality of vertical signal lines,
wherein the column signal processing unit includes
- a RAMP generation circuit that generates and outputs a RAMP waveform,
- a comparator that compares a voltage of a pixel signal read through the vertical signal line with a voltage of the RAMP waveform,
- a counter that performs counting on a basis of a comparison result signal of the comparator, and
- a latch that outputs pixel data on the basis of a count value of the counter.

16. The imaging device according to claim 15, wherein the comparator is configured as a single-slope ADC.

17. The imaging device according to claim 15, wherein the comparator includes a transistor that has a source terminal to which the pixel signal read through the vertical signal line is applied, and a gate terminal to which the RAMP waveform is applied, and outputs a comparison result signal based on a gate-source voltage.

* * * * *